United States Patent
Nielsen et al.

(10) Patent No.: US 11,290,084 B2
(45) Date of Patent: Mar. 29, 2022

(54) APPARATUS AND METHOD FOR CONTROLLING A RESONATOR

(71) Applicant: Anlotek Limited, London (GB)

(72) Inventors: Jorgen Staal Nielsen, Calgary (CA); Richard Nichols, Manhattan Beach, CA (US)

(*) Notice: Subject to any disclaimer, the term of this patent is extended or adjusted under 35 U.S.C. 154(b) by 242 days.

(21) Appl. No.: 16/616,926

(22) PCT Filed: May 24, 2018

(86) PCT No.: PCT/IB2018/053705
§ 371 (c)(1),
(2) Date: Nov. 25, 2019

(87) PCT Pub. No.: WO2018/215973
PCT Pub. Date: Nov. 29, 2018

(65) Prior Publication Data
US 2020/0153410 A1   May 14, 2020

Related U.S. Application Data

(60) Provisional application No. 62/641,879, filed on Mar. 12, 2018, provisional application No. 62/564,149, (Continued)

(51) Int. Cl.
*H03H 9/64* (2006.01)
*H03H 9/54* (2006.01)
(Continued)

(52) U.S. Cl.
CPC .......... *H03H 9/6433* (2013.01); *H03H 9/545* (2013.01); *H03H 9/6403* (2013.01);
(Continued)

(58) Field of Classification Search
CPC ...... H03H 9/64; H03H 9/6403; H03H 9/6433; H03H 9/545; H03H 11/12;
(Continued)

(56) References Cited

U.S. PATENT DOCUMENTS 5,220,686 A   6/1993   Kasperkovitz et al.
5,291,159 A   3/1994   Vale
(Continued)

FOREIGN PATENT DOCUMENTS

CN   102098018 A   6/2011
CN   104538714 A   4/2015
(Continued)

OTHER PUBLICATIONS

International Preliminary Report on Patentability and Written Opinion dated Nov. 26, 2019, issued in corresponding International Application No. PCT/IB2018/053705, filed May 24, 2018, 14 pages.
(Continued)

*Primary Examiner* — Dean O Takaoka
(74) *Attorney, Agent, or Firm* — Christensen O'Connor Johnson Kindness PLLC

(57) ABSTRACT

A method and apparatus for modifying or controlling a resonator connected to a signal loop having an input (18828), an output (18822), and a closed loop frequency response. The signal loop has a primary resonator (18810) having a primary frequency response. There is at least one adjustable resonator (18812) having an adjustable frequency (f) and a secondary Q-factor. An adjustable scaling block (18824) applies a gain factor (g). A controller is connected to the at least one adjustable resonator (18812) and the adjustable scaling block (18824). The controller has instructions to adjust the closed loop frequency response toward a desired closed loop frequency response by controlling the
(Continued)

adjustable frequency (f) of the at least one adjustable resonator (18812) and the gain factor (g) of the adjustable scaling block (18824).

21 Claims, 202 Drawing Sheets

Related U.S. Application Data filed on Sep. 27, 2017, provisional application No. 62/563,498, filed on Sep. 26, 2017, provisional application No. 62/527,636, filed on Jun. 30, 2017, provisional application No. 62/510,634, filed on May 24, 2017.

(51) Int. Cl.
   *H03H 11/12*   (2006.01)
   *H04B 17/12*   (2015.01)
   *H04B 1/401*   (2015.01)

(52) U.S. Cl.
   CPC ............ *H03H 11/12* (2013.01); *H04B 17/12* (2015.01); *H03H 2210/012* (2013.01); *H03H 2210/015* (2013.01); *H03H 2210/017* (2013.01); *H03H 2210/021* (2013.01); *H03H 2210/025* (2013.01); *H04B 1/401* (2013.01)

(58) Field of Classification Search
   CPC ....... H03H 2210/012; H03H 2210/015; H03H 2210/017; H03H 2210/021
   See application file for complete search history.

(56) References Cited

U.S. PATENT DOCUMENTS

| | | |
|---|---|---|
| 5,311,198 A | 5/1994 | Sutton |
| 5,854,593 A | 12/1998 | Dykema et al. |
| 5,917,387 A | 6/1999 | Rice et al. |
| 5,949,290 A | 9/1999 | Bertram |
| 6,057,735 A | 5/2000 | Cloutier |
| 6,236,281 B1 | 5/2001 | Nguyen et al. |
| 6,452,465 B1 | 9/2002 | Brown et al. |
| 6,496,075 B2 | 12/2002 | Justice et al. |
| 6,587,007 B2 | 7/2003 | Exeter |
| 6,650,195 B1 | 11/2003 | Brunn et al. |
| 6,771,147 B2 | 8/2004 | Mongia |
| 6,898,450 B2 | 5/2005 | Eden et al. |
| 6,920,315 B1 | 7/2005 | Wilcox et al. |
| 6,941,118 B2 | 9/2005 | Yamamoto |
| 6,954,774 B1 | 10/2005 | Mulbrook |
| 7,098,751 B1 | 8/2006 | Wong |
| 7,158,010 B2 | 1/2007 | Fischer et al. |
| 7,174,147 B2 | 2/2007 | Toncich et al. |
| 7,400,203 B2 | 7/2008 | Ojo et al. |
| 7,414,779 B2 | 8/2008 | Huber et al. |
| 7,423,502 B2 | 9/2008 | Razafimandimby et al. |
| 7,433,668 B2 | 10/2008 | Fischer et al. |
| 7,522,016 B2 | 4/2009 | Toncich et al. |
| 7,917,117 B2 | 3/2011 | Zafonte |
| 8,000,379 B2 | 8/2011 | Kishigami et al. |
| 8,106,727 B2 | 1/2012 | Kawai et al. |
| 8,120,536 B2 | 2/2012 | Lindmark |
| 8,140,033 B2 | 3/2012 | Chan Wai Po et al. |
| 8,253,514 B2 | 8/2012 | Kharrat et al. |
| 8,294,537 B2 | 10/2012 | Kawai et al. |
| 8,565,671 B2 | 10/2013 | Robert et al. |
| 8,767,871 B2 | 7/2014 | Park et al. |
| 8,922,294 B2 | 12/2014 | Tsuzuki et al. |
| 8,981,875 B2 | 5/2015 | Park |
| 9,024,709 B2 | 5/2015 | Joshi et al. |
| 9,129,080 B2 | 9/2015 | Tsuzuki et al. |
| 9,184,498 B2 | 11/2015 | Schiller |
| 9,231,712 B2 | 1/2016 | Hahn et al. |
| 9,407,239 B2 | 8/2016 | White et al. |
| 9,634,390 B2 | 4/2017 | Onaka |
| 9,698,747 B2 | 7/2017 | Ishizuka |
| 10,050,604 B2 | 8/2018 | Nielsen et al. |
| 10,236,899 B1 | 3/2019 | Tope et al. |
| 10,396,807 B1 | 8/2019 | Dai et al. |
| 10,879,875 B2 * | 12/2020 | Nielsen .............. H03H 11/1291 |
| 2001/0043116 A1 | 11/2001 | Waltman |
| 2005/0003785 A1 | 1/2005 | Jackson et al. |
| 2007/0010217 A1 | 1/2007 | Takahashi et al. |
| 2007/0296513 A1 | 12/2007 | Ruile et al. |
| 2009/0322445 A1 | 12/2009 | Raidl et al. |
| 2010/0097152 A1 | 4/2010 | Wang et al. |
| 2010/0141355 A1 | 6/2010 | Kharrat et al. |
| 2011/0187448 A1 | 8/2011 | Koechlin |
| 2013/0065542 A1 | 3/2013 | Proudkii |
| 2013/0142089 A1 | 6/2013 | Azarnaminy et al. |
| 2013/0293291 A1 | 11/2013 | Shanan |
| 2014/0266454 A1 | 9/2014 | Testi et al. |
| 2014/0361839 A1 | 12/2014 | Scott et al. |
| 2016/0072442 A1 | 3/2016 | Testi et al. |
| 2016/0164481 A1 | 6/2016 | Madan et al. |
| 2017/0149411 A1 * | 5/2017 | Nielsen ............... H03G 3/3042 |
| 2018/0323770 A1 * | 11/2018 | Nielsen ............... H03G 3/3042 |
| 2020/0014382 A1 | 1/2020 | Ranta |

FOREIGN PATENT DOCUMENTS

| | | |
|---|---|---|
| EP | 1675263 A1 | 6/2006 |
| GB | 2 403 086 A | 12/2004 |
| GB | 2 478 585 A | 4/2010 |
| GB | 2 478 585 A | 9/2011 |
| GB | 2 494 652 A | 3/2013 |
| WO | 01/89081 A2 | 11/2001 |
| WO | 02/087071 A2 | 10/2002 |
| WO | 2011/103108 A1 | 8/2011 |
| WO | 2015/176041 A1 | 11/2015 |
| WO | 2018/215973 A1 | 11/2018 |

OTHER PUBLICATIONS

Anis, M., et al., "Fully Integrated Super-Regenerative Bandpass Filters for 3.1-to-7GHz Multiband UWB System," Proceedings of the IEEE International Symposium on VLSI Design, Automation and Test (VLSI-DAT), Apr. 23-25, 2008, Hsinchu, Taiwan, 4 pages.

Anis, M., et al., "Low Power Complementary-Colpitts Self-Quenched Super-Regenerative Ultra-Wideband (UWB) Bandpass Filter in CMOS Technology," Proceedings of the IEEE MTT-S International Microwave Symposium Digest, Jun. 15-20, 2008, Atlanta, pp. 1047-1049.

Bahl, I.J., "High-Performance Inductors," IEEE Transactions on Microwave Theory and Techniques 49(4):654-664, Apr. 2001.

Bhattacharya, A., et al., "A 1.3—2.4-GHz 3.1-mW VCO Using Electro-Thermo-Mechanically Tunable Self-Assembled MEMS Inductor on HR Substrate," IEEE Transactions on Microwave Theory and Techniques 63(2):459-469, Feb. 2015.

Chen, J.-Y., et al., "A Fully Integrated Auto-Calibrated Super-Regenerative Receiver in 0.13-μm CMOS," IEEE Journal of Solid-State Circuits 42(9): 1976-1985, Sep. 2007.

Chen, Y.-M., et al., "A 1-1.5 GHz Broadband Tunable Bandpass Filter," Proceedings of the Asia-Pacific Microwave Conference (APMC), Kaohsiung, Taiwan, Dec. 4-7, 2012, pp. 738-740.

Duncan, R., et al., "A Q-Enhanced Active-RLC Bandpass Filter," IEEE Transactions on Circuits and Systems—II: Analog and Digital Signal Processing 44(5):341-347, May 1997.

Entesari, K., et al., "A 25—75—MHz RF MEMS Tunable Filter," IEEE Transactions on Microwave Theory and Techniques 55(11):2399-2405, Nov. 2007.

Frey, D.R., "Improved Super-Regenerative Receiver Theory," IEEE Transactions on Circuits and Systems—I: Regular Papers 60(12):3267-3278, Dec. 2013.

Georgescu, B., et al., "Tunable Coupled Inductor Q-Enhancement for Parallel Resonant LC Tanks," IEEE Transactions on Circuits and Systems—II: Analog and Digital Signal Processing 50(10):705-713, Oct. 2003.

(56) References Cited

OTHER PUBLICATIONS

Golaszewski, A., and A. Abramowicz, "Voltage Tunable Bandpass Filter," Proceedings of the Signal Processing Symposium (SPSympo), Debe, Poland, Jun. 10-12, 2015, 4 pages.
Guyette, A.C., "Alternative Architectures for Narrowband Varactor-Tuned Bandpass Filters," Proceedings of the European Microwave Conference (EuMC), Rome, Sep. 29-Oct. 1, 2009, pp. 1828-1831.
He, X., and W.B. Kuhn, "A Fully Integrated Q-Enhanced LC Filter With 6 dB Noise Figure at 2.5 GHz in SOI," Proceedings of the IEEE Radio Frequency Integrated Circuits (RFIC) Symposium, Fort Worth, Texas, Jun. 6-8, 2004, pp. 643-646.
International Search Report and Written Opinion dated Feb. 8, 2017, issued in corresponding International Application No. PCT/GB2016/053686, filed Nov. 23, 2016, 10 pages.
Kuhn, W.B., et al., "Q-Enhanced LC Bandpass Filters for Integrated Wireless Applications," IEEE Transactions on Microwave Theory and Techniques 46(12):2577-2586, Dec. 1998.
Luo, X., et al., "Tunable Bandpass Filter With Two Adjustable Transmission Poles and Compensable Coupling," IEEE Transactions on Microwave Theory and Techniques 62(9):2003-2013, Sep. 2014.
Nosrati, M., and Z. Atlasbaf, "A New Miniaturized Electronically Tunable Bandpass Filter," Proceedings of the Seventh International Symposium on Antennas, Propagation & EM Theory (ISAPE '06), Guilin, China, Oct. 26-29, 2007, 5 pages.
Piazza, G., "MEMS Resonators for Frequency Control and Sensing Applications," presentation, University of Pennsylvania, Philadelphia [at least as early as Apr. 24, 2015], 104 pages.
Psychogiou, D., et al., "V-Band Bandpass Filter With Continuously Variable Centre Frequency," IET Microwaves, Antennas & Propagation 7(8):701-707, Jun. 2013.
Quednau, P., et al., "A Small Size Low Cost Electronically Tunable Bandpass Filter With Integrated Bias Control," Proceedings of the IEEE International Conference on Microwaves, Communications, Antennas and Electronic Systems (COMCAS), Tel Aviv, Israel, Oct. 21-23, 2013, 4 pages.
Ramadan, A.H., et al., "A Narrowband Frequency-Tunable Antenna for Cognitive Radio Applications," Proceedings of the Sixth European Conference on Antennas and Propagation (EuCAP), Mar. 26-30, 2012, Prague, 5 pages.
Ramadan, A.H., et al., "A Tunable Filtenna for Cognitive Radio Applications," Proceedings of the Ninth European Conference on Antennas and Propagation (EuCAP), Apr. 13-17, 2015, Lisbon, Portugal, 2 pages.
Soorapanth, T., and S.S. Wong, "A 0-dB IL 2140 ± 30 MHz Bandpass Filter Utilizing Q-Enhanced Spiral Inductors in Standard CMOS," IEEE Journal of Solid-State Circuits 37(5):579-586, May 2002.
Sunca, A., et al., "A Wide Tunable Bandpass Filter Design Based on CMOS Active Inductor," Proceedings of the Eighth Conference on Ph.D. Research in Microelectronics and Electronics (PRIME), Session TF3—Microwave and RF, Aachen, Germany, Jun. 12-15, 2012, pp. 203-206.
Wang, S., and R.-X. Wang, "A Tunable Bandpass Filter Using Q-Enhanced and Semi-Passive Inductors at S-Band in 0.18-µM CMOS," Progress in Electromagnetics Research B 28:55-73, 2011.
Written Opinion of the International Preliminary Examining Authority dated Feb. 5, 2018, issued in corresponding International Application No. PCT/GB2016/053686, filed Nov. 23, 2016, 6 pages.
He, X., and W.B. Kuhn, "A 2.5-GHz Low-Power, High Dynamic Range, Self-Tuned Q-Enhanced LC Filter in SOI," IEEE Journal of Solid-State Circuits, vol. 40, No. 8, Aug. 2005, 1618-1628.
Gao, W. and W.S. Snelgrove, "A 950MHz Second-Order Integrated LC Bandpass Modulator" 1997 Symposium on VLSI Circuits Digest of Technical Papers, pp. 111-112.

\* cited by examiner

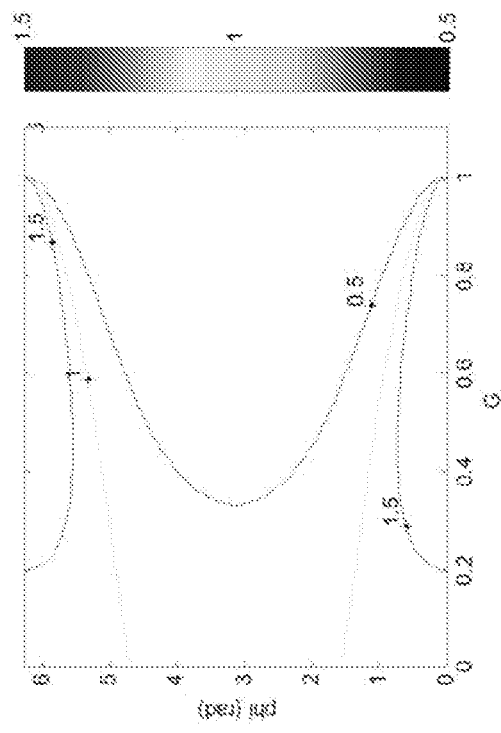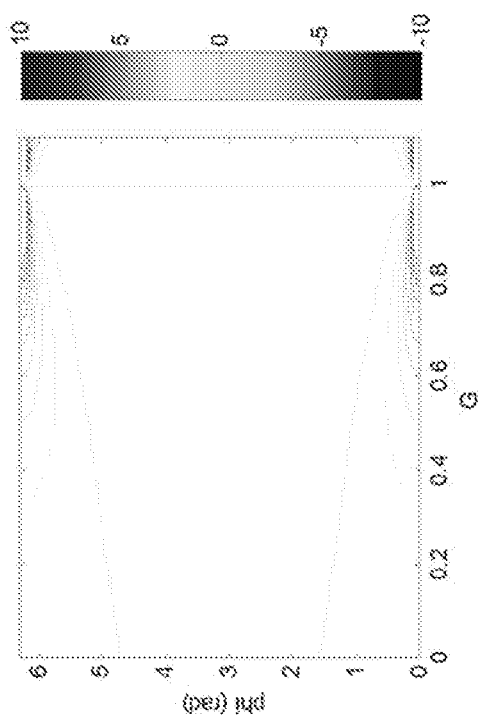
FIG. 83

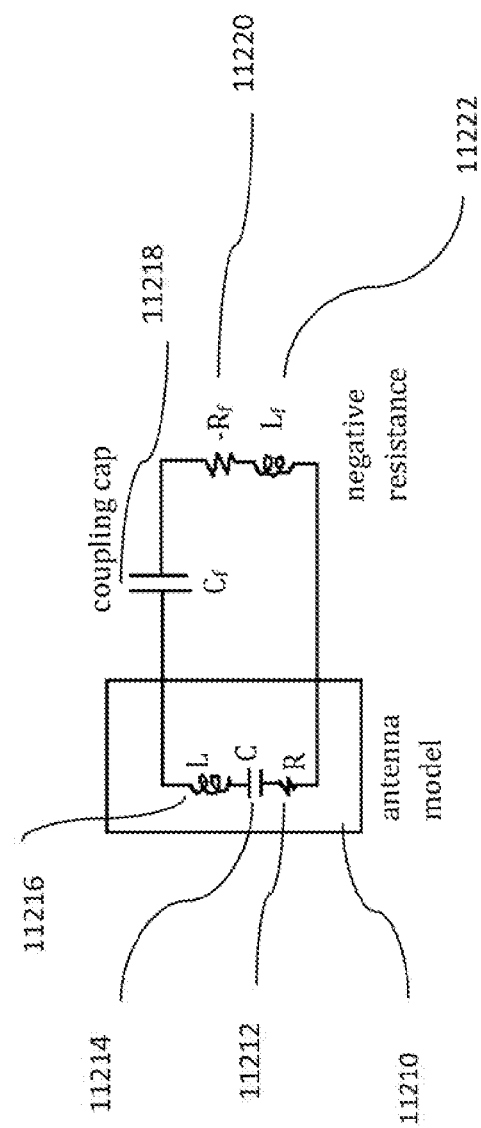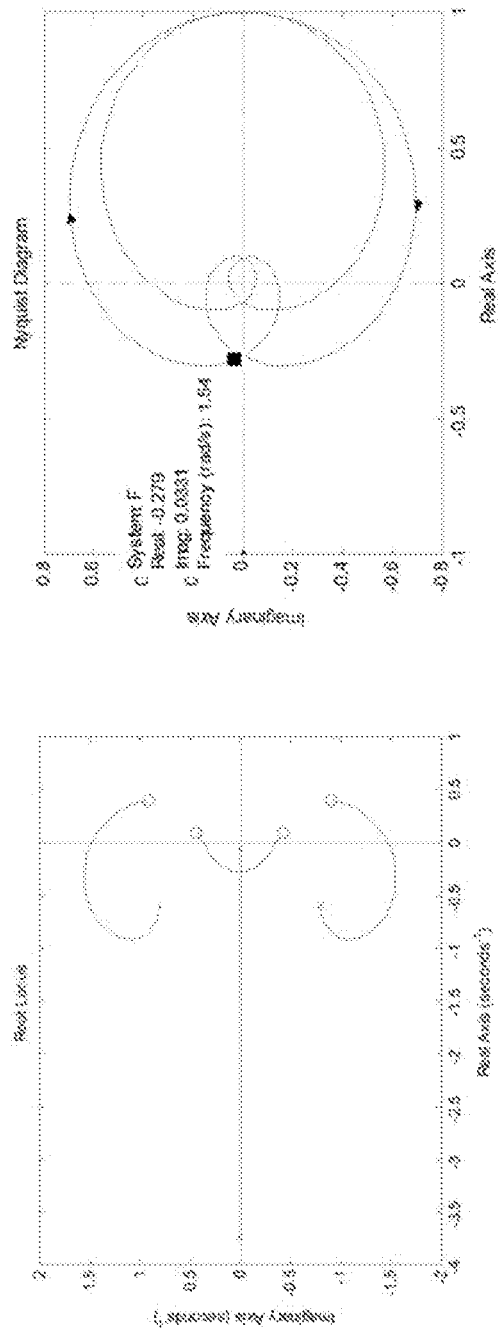
FIG. 112

APPARATUS AND METHOD FOR CONTROLLING A RESONATOR

TECHNICAL FIELD

This disclosure relates to the coupling of resonant structures—a primary resonator of interest, and a secondary variable resonator—in a manner such that the closed loop characteristics of the primary resonator is modified by adjusting elements in a signal loop that also includes the primary resonator.

BACKGROUND

Resonant structures are a common element of many electronic circuits. These resonant structures may have a fixed performance characteristic, or they may be adjustable based on control signals applied to the resonant structure or physical changes to the resonant structures. Resonators are deployed in all manner of communication circuits, one example of which is radio frequency (RF) filters.

RF filters with moderate to high Qs on the order of 100 or more may also be found in communication circuits. Mechanical resonator filters, such as MEMs, are also finding a place in modern technology circuits.

Antennas as Resonators:

Some resonator applications are found within antennas, where the antenna circuit is designed to both tune the antenna to a specific frequency band and provide impedance matching, generally to a common reference impedance of 50Ω. Antenna impedance matching, especially for electrically small antennas (ESA) in RF applications, has been generally accomplished by use of lumped impedance matching components that provide a fixed antenna impedance. These ESA antennas are commonly, but not exclusively, half-wavelength dipole or even quarter wave monopole antennas that must be designed for a specific application frequency or frequency range.

Saw/Baw Resonators:

Other high-performance resonator applications are in the domain of Surface Acoustic Wave (SAW) filters and related Bulk Acoustic Wave (BAW) filters. SAW and BAW RF filters provide very narrow bandwidth (high Q) filtering for communication applications below approximately 6 GHz carrier frequency. Because of the technology deployed, these SAW/BAW devices are subject to thermal variations and aging effects that substantially reduce the filtering effectiveness. Various technology overlays are used in the manufacturing process to either mitigate or eliminate this thermal effect—both at an increased unit price.

SUMMARY

According to aspects of the present discussion, there are provided various circuit designs that allow the frequency response of a primary resonator to be modified. In one example, in connection with high performance tunable active RF filters, filters used as a resonator element coupled with external resonators may modify and enhance the performance of an external resonator. System level enhancements may be made, for example, with high performance tunable RF active filters coupled to a) an electrically small RF antenna, and b) a SAW/BAW RF filter. The primary resonator may be a resonator of different types, such as electrical, electromagnetic, electromechanical, piezoelectric, optical, etc.

Examples of suitable adjustable resonators that may be used are presented in detail in PCT publication no. WO 2017/089803 (Nielsen et al.) entitled "Variable Filter" (herein "Nielsen"), which is incorporated herein in its entirety.

According to certain aspects, the resonator being controlled or modified may be an external (i.e. off chip) resonator, and is preferably a high Q resonator, relative to the adjustable resonators. However, this need not be the case. The resonator being controlled may be on chip and/or may be a lower Q (i.e. closer to the Q of the adjustable resonator). The resonator may also be an antenna in some embodiments.

The references to high and low Q as used herein are general terms, the meaning of which may vary depending on the context in which they are used, as will be understood by those skilled in the art. In some cases, the Q of the primary resonator may be considered high relative to the adjustable resonator, where a high Q resonator may be considered to be a factor of 10 greater, or even a factor of 100 greater, than the adjustable resonator.

According to certain aspects, there is provided an apparatus and method of actively coupling two separate resonators in a signal loop, where one resonator is generally external and, but not exclusively, a generally high Q fixed performance resonator, while the other is a low Q variable resonator. The objective of the coupling to control the s-plane poles of the coupled external resonator, and thus its performance metrics, by means of controlling the low Q variable resonator. Two detailed examples are provided where the external resonator is first an antenna, and then a BAW/SAW RF filter. Detailed attention is paid to the issues and resolutions thereof of incorporating the concept onto a chip.

In certain aspects, the concepts of "on-chip" and "off-chip" may be used and discussed. In general context, and in the context of this document, these terms refer to an integrated circuit that has been reduced from bulk components down to a relatively small size. The term "Small" may be used, which is a relative term that will depend on the context in which it is used, as the physical size is driven by a large set of variables. Additionally, substrate technology will generally determine the choice of the chip implementation. This translates to the likelihood that implementation of complex technology leads to having multiple chips that need to be interconnected at some level. So this discussion will be looking at the case where a portion of a circuit may be implemented on one type of substrate, with one or more other components of the circuit on a different substrate. These other components are "off-chip" relative to the chip holding the majority of components. Off-chip resonators of very high Q in the multi-thousand range, such as SAWs and/or BAWs, may be employed as frequency tuning elements of a communication circuit. Such high Q resonator SAW/BAW filters, for example, are generally of fixed frequency and bandwidth, but are subject to performance variations in the manufacturing process, in addition to performance variation with operating temperature.

According to an aspect, there is provided a resonant circuit, comprising a signal loop having an input, an output, and a closed loop frequency response, the signal loop comprising: a primary resonator having a primary frequency response, and a primary Q-factor; at least one adjustable resonator having an adjustable frequency and a secondary Q-factor, the primary Q-factor being greater than the secondary Q-factor by a factor of about 10 or more; and an adjustable scaling block that applies a gain factor. A controller connected to the at least one adjustable resonator and the adjustable scaling block, the controller comprising instructions to adjust the closed loop frequency response toward a desired closed loop frequency response by controlling the adjustable frequency of the at least one adjustable resonator and the gain factor of the adjustable scaling block.

According to other aspects, the resonant circuit may include one or more of the following elements, alone or in combination: the primary Q-factor may be greater than the secondary Q-factor by a factor of about 100 or more; the primary frequency response of the primary resonator may be within a predetermined error factor of the desired frequency response, and the controller controls the closed loop frequency response within the predetermined error factor of the primary resonator; the primary resonator may be a fixed resonator or a resonator that is tunable in frequency; the primary resonator may be an antenna, and the antenna may comprise the input of the signal loop; the signal loop may further comprise a phase shifter that applies an adjustable delay factor, the controller being connected to control the phase shifter; the resonant circuit may further comprise a plurality of adjustable resonators connected in series or in parallel; the primary resonator may be an electrical resonator, an electromagnetic resonator, a mechanical resonator, or a resonator based on material properties; the resonant circuit may further comprise a plurality of primary resonators connected in parallel or in series within the signal loop; the signal loop may comprise a first component comprising the primary resonator and a second component comprising the at least one adjustable resonator, where the first component may be fabricated from a first material, and the second component is fabricated from a second material that is different than the first material, and further; and further where the first component and the second component may be fabricated as separate and distinct components.

According to an aspect, there is provided a method of modifying a closed loop frequency response of a resonant circuit, the resonant circuit comprising a signal loop having an input, an output, a primary resonator that has a primary frequency response, at least one adjustable resonator having an adjustable frequency, and an adjustable scaling block having a gain factor, the method comprising the steps of: controlling the frequency of the at least one adjustable resonator and the gain factor of the adjustable scaling block to adjust the closed loop frequency response of the resonant circuit toward a desired closed loop frequency response, wherein a Q-factor of the primary resonator is greater than a Q-factor of the at least one adjustable resonator by a factor of about 10 or more.

According to other aspects, the method may include one or more of the following aspects, alone or in combination: the Q-factor of the primary resonator may be greater than the Q-factor of the at least one adjustable resonator by a factor of about 100 or more; the method may further comprise the step of adjusting the primary frequency response of the primary resonator; the primary resonator may be an antenna, and the antenna may comprise the input of the signal loop; the signal loop may further comprises a phase shifter, and wherein adjusting the closed loop frequency response may further comprise adjusting the phase of the phase shifter; a plurality of adjustable resonators may be connected in series or in parallel; the primary resonator may be an electrical resonator, an electromagnetic resonator, a mechanical resonator, or a resonator based on material properties; a plurality of primary resonators may be connected in parallel or in series within the signal loop; the signal loop may comprise a first component comprising the primary resonator and a second component comprising the at least one adjustable resonator, wherein the first component may be fabricated from a first material, and the second component is fabricated from a second material that is different than the first material, and further wherein the first component and the second component are fabricated as separate and distinct components.

According to an aspect, there is provided a resonant circuit, comprising a signal loop having an input, an output, and a closed loop frequency response, the signal loop comprising: a first component comprising a primary resonator, the primary resonator having a primary frequency response; a second component comprising at least one adjustable resonator, the at least one adjustable resonator having an adjustable frequency. An adjustable scaling block applies a gain factor. The first component is fabricated from a first material, and the second component is fabricated from a second material that is different than the first material. A controller is connected to the at least one adjustable resonator and the adjustable scaling block, the controller comprising instructions to adjust the closed loop frequency response toward a desired closed loop frequency response by controlling the adjustable frequency of the at least one adjustable resonator and the gain factor of the adjustable scaling block.

According to other aspects, the resonant circuit may include one or more of the following aspects, alone or in combination: the first component and the second component may be fabricated as separate and distinct components; the primary resonator may have a primary Q-factor that is greater than a Q-factor of the at least one adjustable resonator by a factor of about 10 or more, or of about 100 or more; the primary frequency response of the primary resonator may be within a predetermined error factor of the desired frequency response, and the controller controls the closed loop frequency response within the predetermined error factor of the primary resonator; the primary resonator may be a fixed resonator or a tunable resonator; the primary resonator may be an antenna, and the antenna comprises the input of the signal loop; the signal loop may further comprise a phase shifter that applies an adjustable delay factor, the controller being connected to control the phase shifter; the resonant circuit may further comprise a plurality of adjustable resonators connected in series or in parallel; the primary resonator may be an electrical resonator, an electromagnetic resonator, a mechanical resonator, or a resonator based on material properties; the resonant circuit may further comprise a plurality of primary resonators connected in parallel or in series within the signal loop.

According to an aspect, there is provided a method of modifying a closed loop frequency response of a resonant circuit, comprising the steps of: providing a resonant circuit comprising a signal loop having an input, an output, a first component comprising a primary resonator where the primary resonator having a primary frequency response, a second component comprising at least one adjustable resonator where the at least one adjustable resonator having an adjustable frequency, and an adjustable scaling block applying a gain factor; wherein the first component is fabricated from a first material, and the second component is fabricated from a second material that is different than the first material; and controlling the frequency of the at least one adjustable resonator and the gain factor of the adjustable scaling block to adjust the closed loop frequency response of the resonant circuit toward a desired closed loop frequency response.

According to other aspects, the method may include one or more of the following aspects, alone or in combination: the primary resonator may have a primary Q-factor that is greater than a Q-factor of the at least one adjustable resonator by a factor of about 10 or more or about 100 or more; the method may further comprise the step of adjusting a resonant operating frequency of the primary resonator; the primary resonator may be an antenna, and the antenna may comprise the input of the signal loop; there may be a phase shifter, and wherein adjusting the closed loop frequency response further comprises adjusting the phase of the phase shifter; a plurality of adjustable resonators may be connected in series or in parallel; the primary resonator may be an electrical resonator, an electromagnetic resonator, a mechanical resonator, or a resonator based on material properties; a plurality of primary resonators may be connected in parallel or in series within the signal loop.

According to an aspect, there is provided a communications circuit, comprising: an antenna block that receives a desired electromagnetic signal; a signal loop comprising an input port, an output port, and a signal conditioning block between the input port and the output port, the antenna block being in bidirectional communication with the input port of the signal loop, wherein the signal conditioning block applies a phase shift and a gain factor to the desired signal; and a controller block that is configured to adjust the phase shift and the gain factor of the signal conditioning block to improve a signal quality factor of the desired signal from the antenna block.

According to other aspects, the communication circuit may include one or more of the following aspects, alone or in combination: the signal conditioning block may comprise one or more variable frequency resonators and a gain block that applies the gain factor; the controller block may adjust the phase shift by adjusting the one or more variable frequency resonators; the controller block may control the signal conditioning block to match the impedance of an antenna of the antenna block; the signal quality factor may comprise at least one of a measure of available antenna power transferred to the output port and a signal-to-noise ratio of the desired signal, and the controller may adjusts the gain factor to improve the signal-to-noise ratio or to modify a bandwidth of the desired signal; the communication circuit may further comprise a receiver block that receives the desired signal from the signal conditioning block and processes the desired signal, and the desired signal may be modulated onto a carrier wave, and the receiver block comprises a demodulator; a bidirectional coupling element may be connected to the antenna block and the signal conditioning block; the signal conditioning block may adjust the impedance of the communications circuit to enhance available energy transfer from an antenna of the antenna block to the receiver block; the signal loop may comprise an encoder that encodes a data stream onto a return path from the signal loop to the antenna block to be transmitted by the antenna block; the data stream to be encoded onto the return path is supplied by a sensor; the signal conditioning block may comprise a negative impedance element and a phase shifter element; the signal conditioning block may comprise a phase shifter that applies the phase shift and a gain block that applies the gain factor; the controller may be configured to improve the signal quality factor by changing the gain factor between positive and negative values.

According to an aspect, there is provided a method of encoding and reflecting an electromagnetic signal received by an antenna, the method comprising the steps of: coupling the electromagnetic signal received by the antenna into a signal loop; applying a phase shift and a gain factor to the received electromagnetic signal in the signal loop; using an encoder in the signal loop, encoding a data stream onto the received electromagnetic signal; and coupling the encoded electromagnetic signal from the signal loop to the antenna for transmission by the antenna.

According to other aspects, the method may include one or more of the following aspects, alone or in combination: adjusting the phase shift may comprise adjusting one or more variable frequency resonators; the antenna may be in communication with the signal loop by a bidirectional connection; the antenna may be connected within the signal loop.

According to an aspect, there is provided a communications circuit, comprising: a signal loop comprising a signal conditioning block, an antenna that receives an electromagnetic signal and is connected to communicate the electromagnetic signal to the signal loop where the signal conditioning block applying a phase shift and a gain factor to the desired signal in the signal loop, and an encoder that encodes a data stream onto the electromagnetic signal in the signal loop. The antenna is connected to the signal loop such that the encoded electromagnetic signal is transmitted by the antenna. The antenna block may be in bidirectional communication with the input port of the signal loop, or connected in series with the signal conditioning block. The data stream may be supplied by a sensor.

BRIEF DESCRIPTION OF THE DRAWINGS

These and other features will become more apparent from the following description in which reference is made to the appended drawings, the drawings are for the purpose of illustration only and are not intended to be in any way limiting, wherein:

FIG. 83 is plots showing the real part of the impedance into port 1 of the circulator. The left plot is the contour plot of Re(Zr) and the right plot is the specific contour lines for Re(Zr) in the vicinity of 1.

FIG. 112 is a diagram and plots showing root locus and Nyquist plots for equivalent circuit of ATLF as a fixed frequency negative resistance.

FIG. 121 is an open loop Nyquist plot of ATLF combined with 3 cascaded ATL1 s.

FIG. 122 is a Nyquist plot of the circuit of FIG. 121 with transport delay.

FIG. 123 is a corrected Nyquist locus of FIG. 122 by tuning of the resonators to ωr=1.037

FIG. 124 is a corrected Nyquist locus of FIG. 122 by tuning of the resonators to ωr=0.919

FIG. 125 is a plot of the Nyquist locus for a transport delay of 3 radians.

FIG. 126 is a plot of the Nyquist locus of the ATLF with detuned resonators.

FIG. 127 is an initial Nyquist plot with the two possible resonance frequencies.

FIG. 128 is a plot of stable and unstable regions demonstrating what can go wrong.

FIG. 129 is a plot showing that inwardly oriented Nyquist loops are possible but cannot make the ATLF unstable.

FIG. 130 is a plot showing a portion of the Nyquist plot for the calibrated ATLF with Nyquist locus changing due a change in the antenna impedance.

FIG. 131 is a plot depicting a change in the passband characteristics of the ATLF resulting from a change in antenna impedance per FIG. 130.

FIG. 132 is a plot showing the Nyquist locus when the ATLF is unstable.

Figure 133:
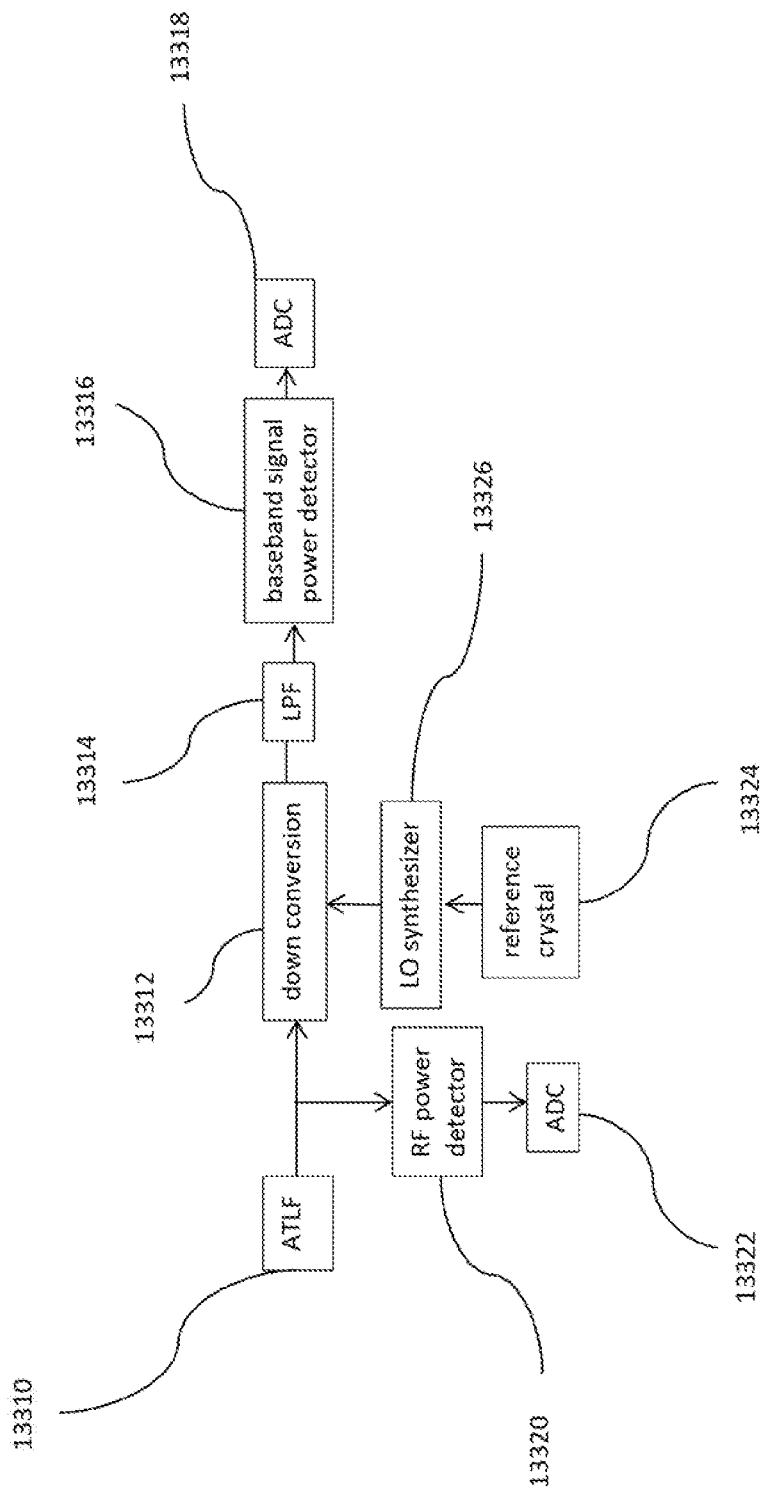

FIG. 133 is a block diagram showing a low power oscillation and frequency detection circuit.

Figure 134:
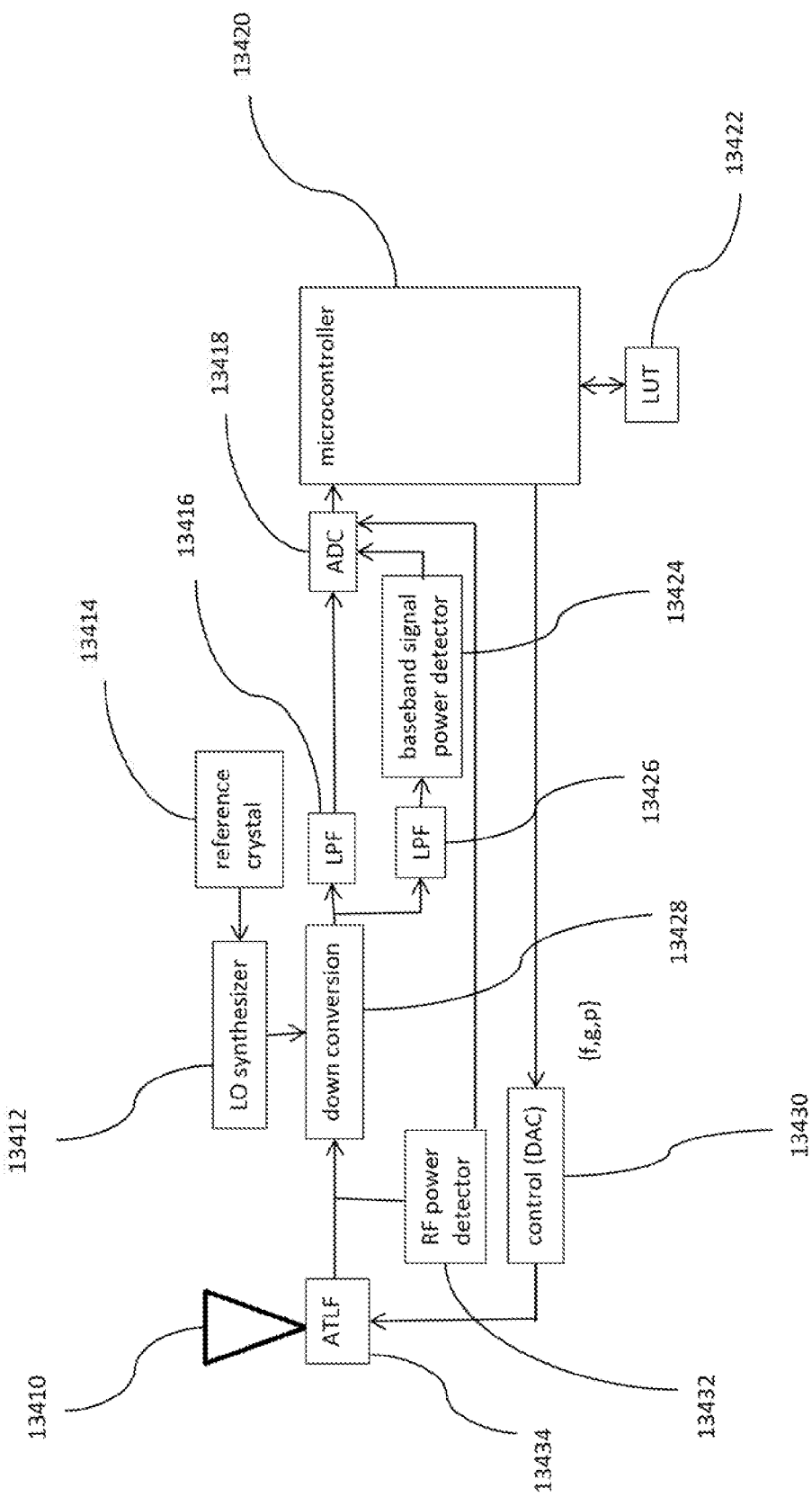

FIG. 134 is a block diagram of an ATLF based transceiver.

Figure 135:
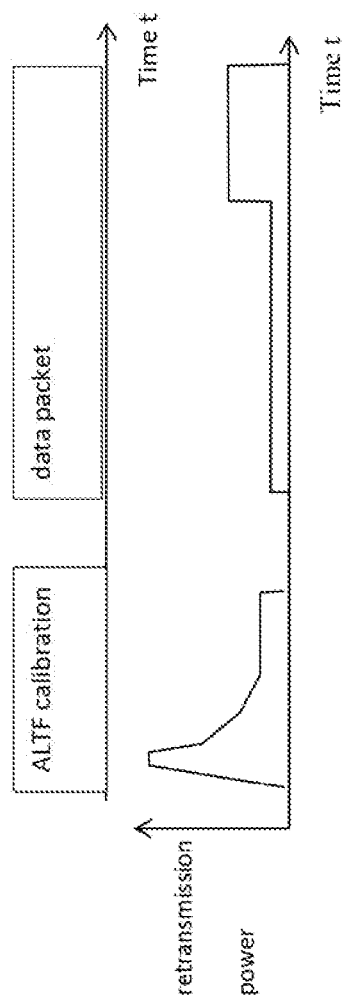

FIG. 135 is a diagram showing the time sequence for the active ATLF calibration referenced to a data packet receive epoch.

Figure 136:
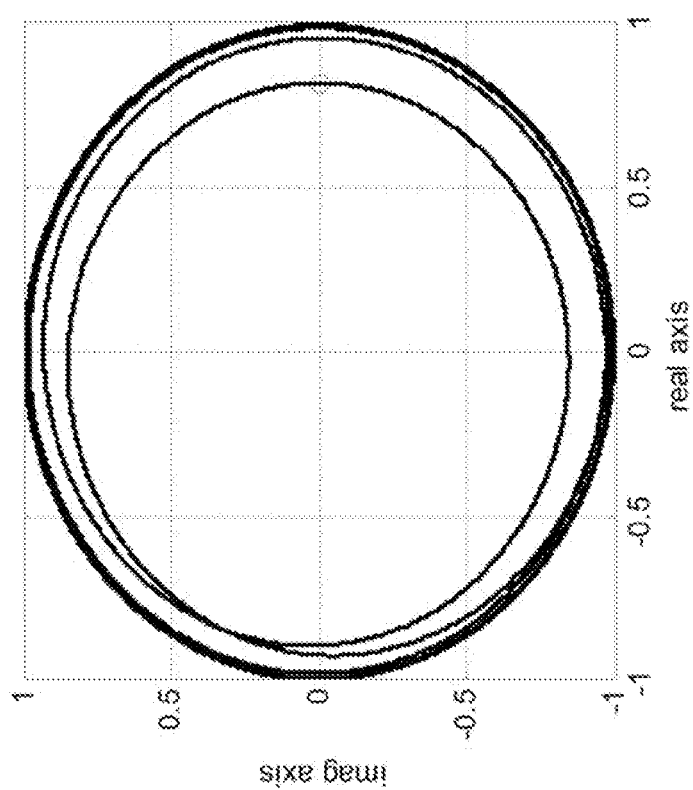

FIG. 136 is the Nyquist plot of a resonant model of the antenna with pure delay.

Figure 137:
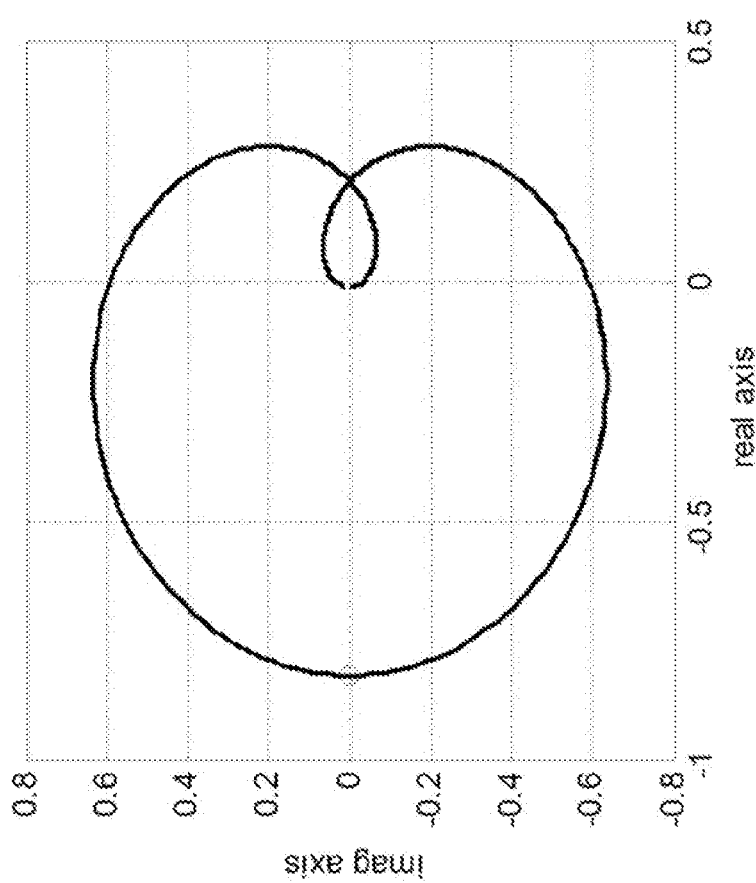

FIG. 137 is a Nyquist plot of combined antenna and ATL3 resonators.

Figure 138:
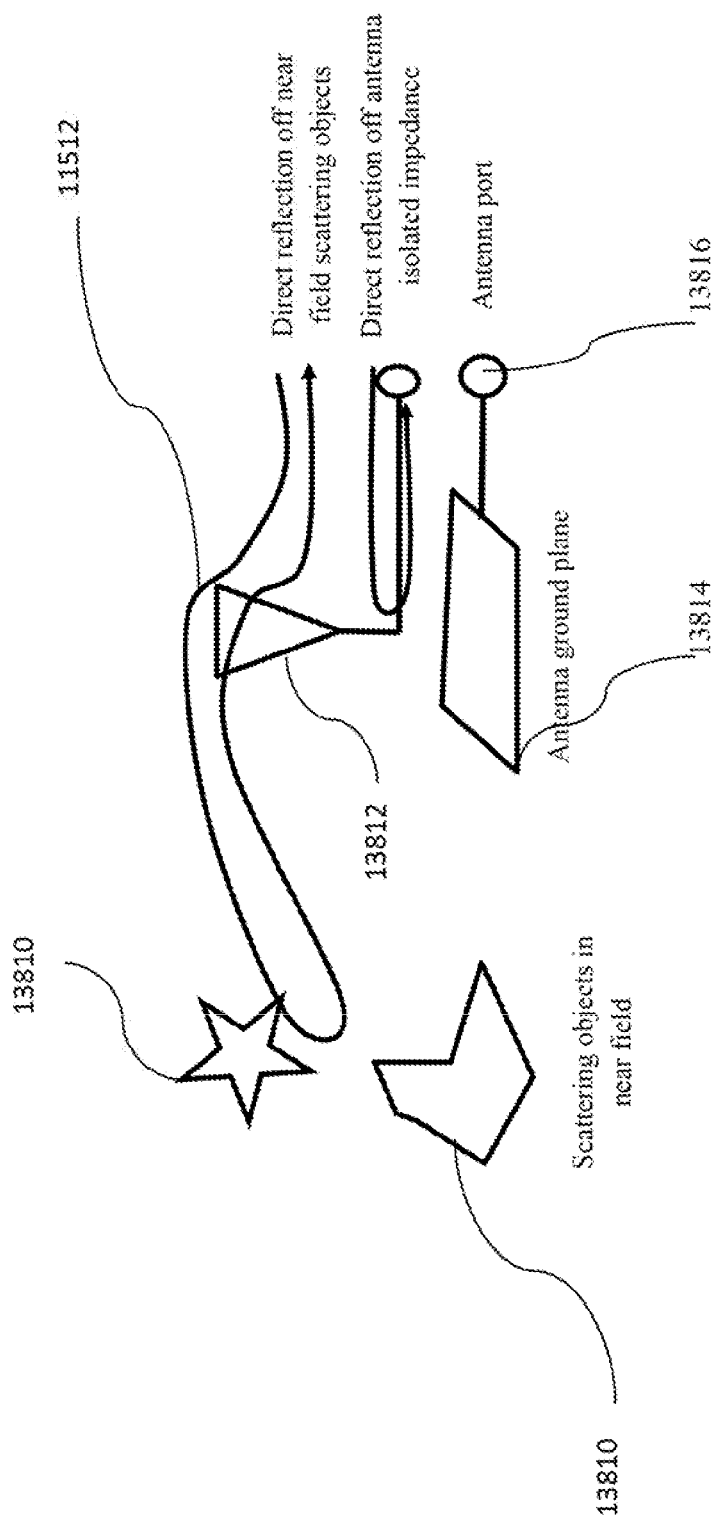

FIG. 138 is a diagram depicting scattering sources that affect antenna.

Figure 139:
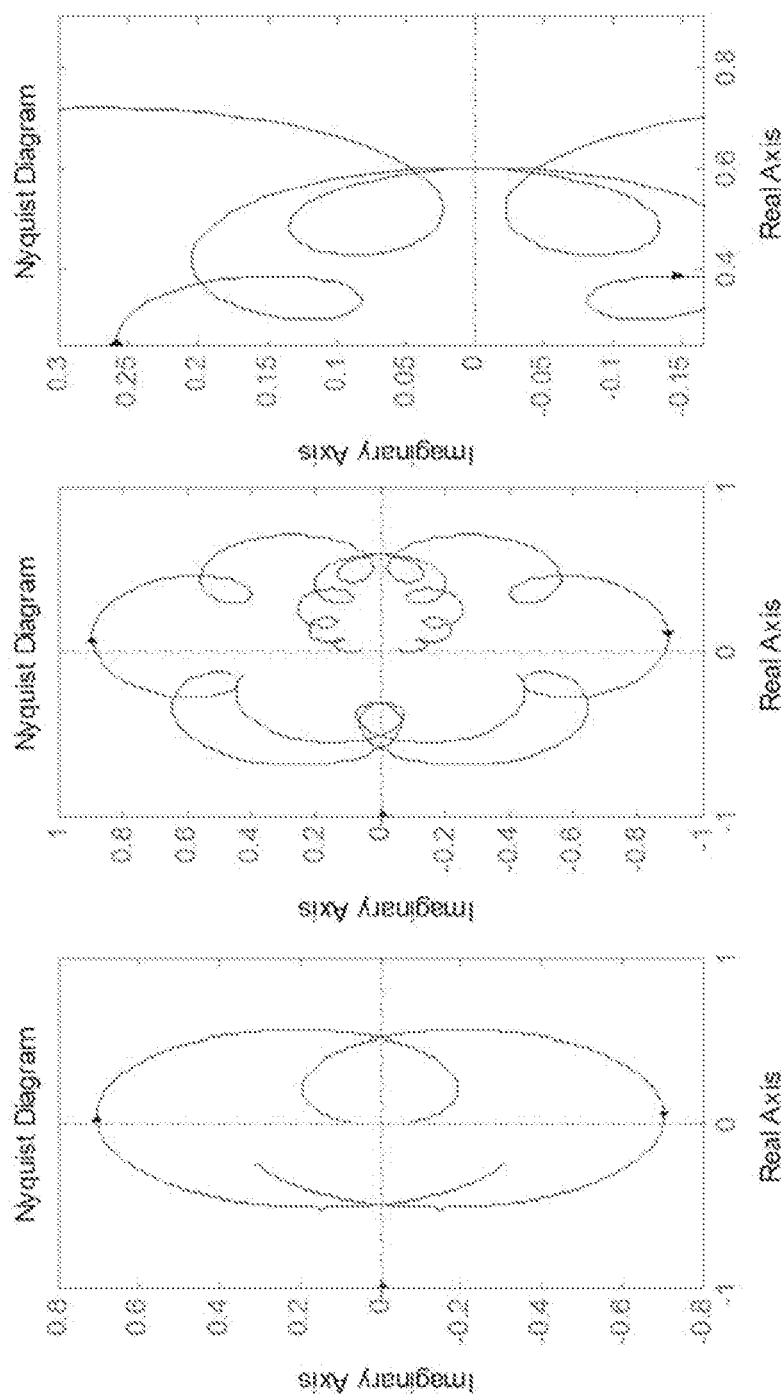

FIG. 139 is a series of plots showing potential Nyquist plots of antenna in various environments.

Figure 140:
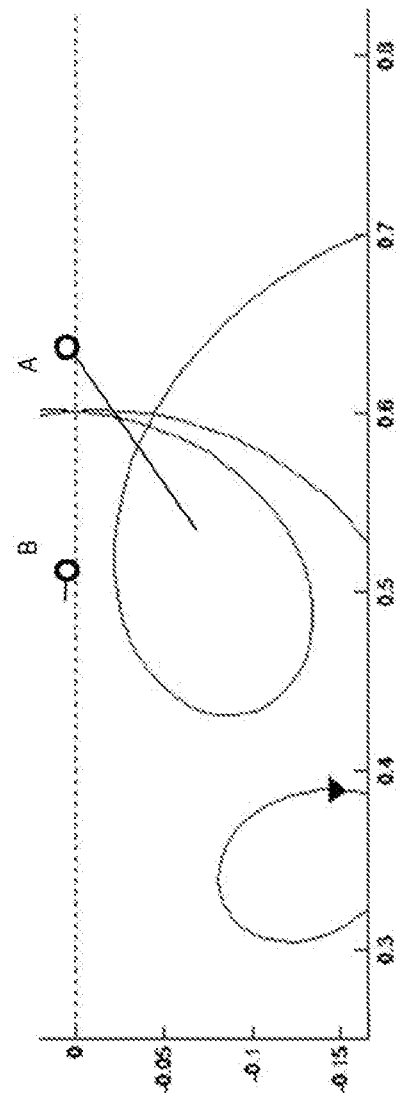

FIG. 140 is a detailed Nyquist plot with interferers.

Figure 141:
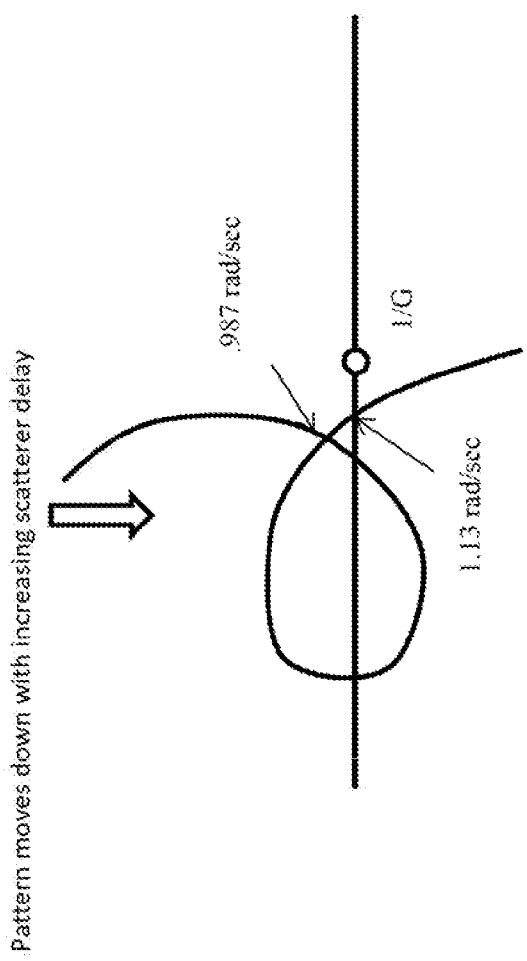

FIG. 141 is a plot showing the effect of phase shifter control that moves the Nyquist loop up and down causing a jump in the pass band frequency.

Figure 142:
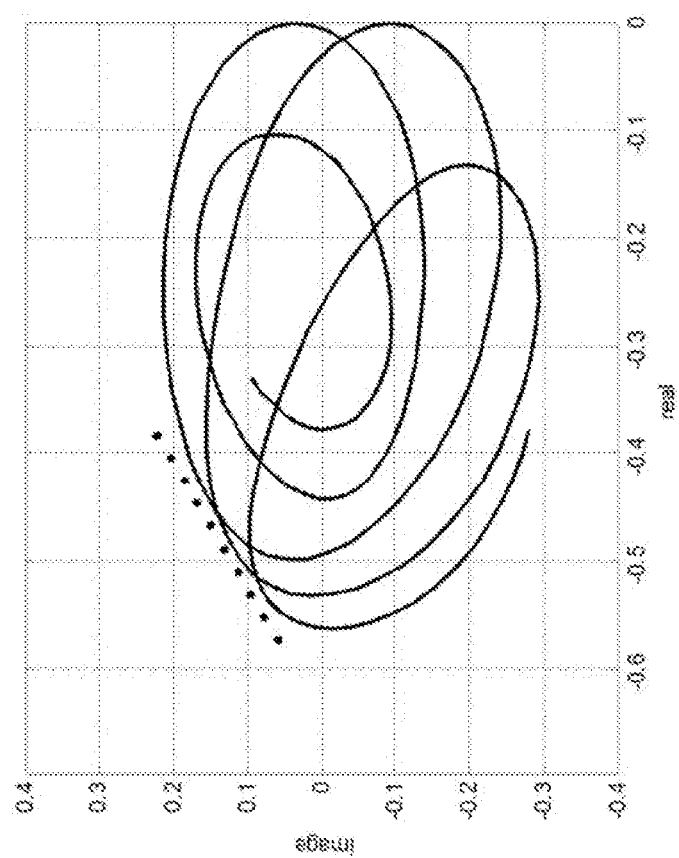

FIG. 142 is a plot showing intertwined Nyquist loops of single antenna reflection coefficient moving over a ground plane in presence of scatterers.

Figure 143:
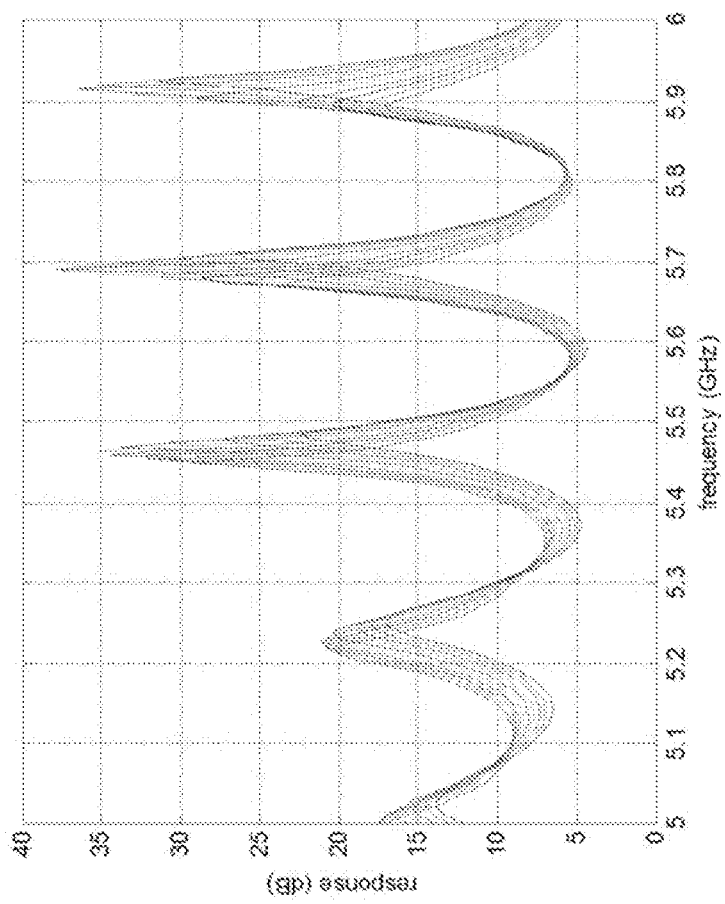

FIG. 143 is a plot showing frequency responses corresponding to the 1/G operating points of FIG. 142.

Figure 144:
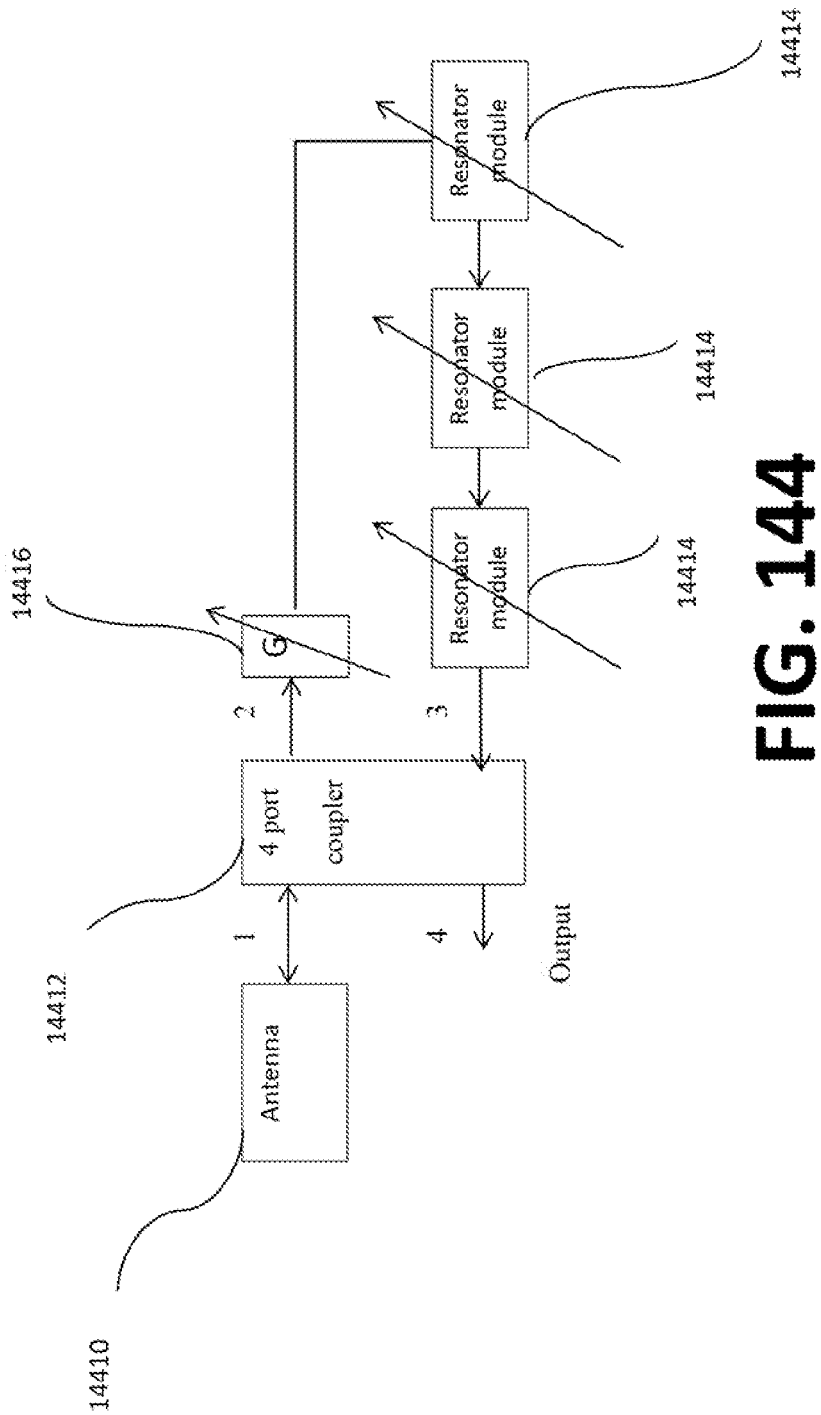

FIG. 144 is a block diagram showing the ATL3 incorporated into the antenna resonator loop.

Figure 145:
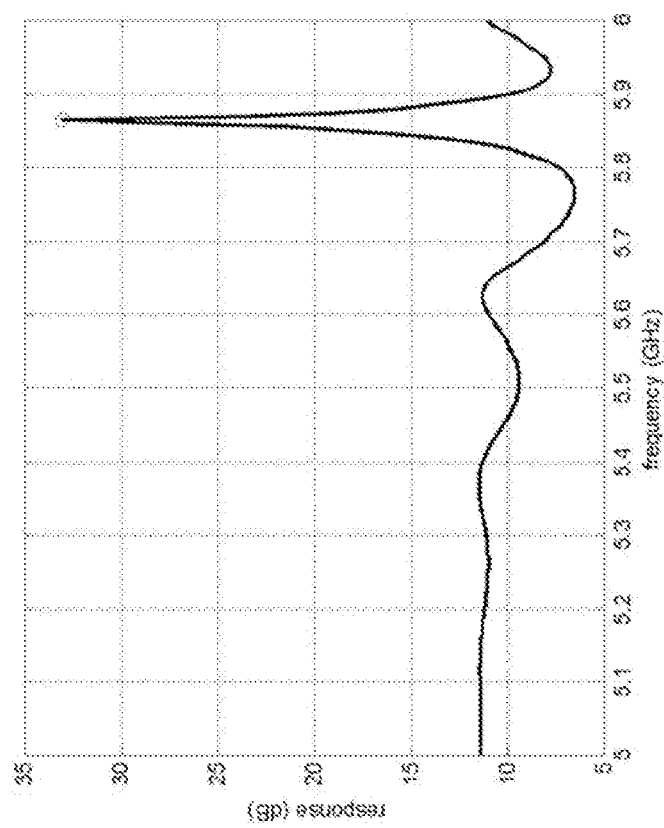

FIG. 145 is a plot showing ATL3 Q-enhanced enabled frequency response when scattering off near field objects.

Figure 146:
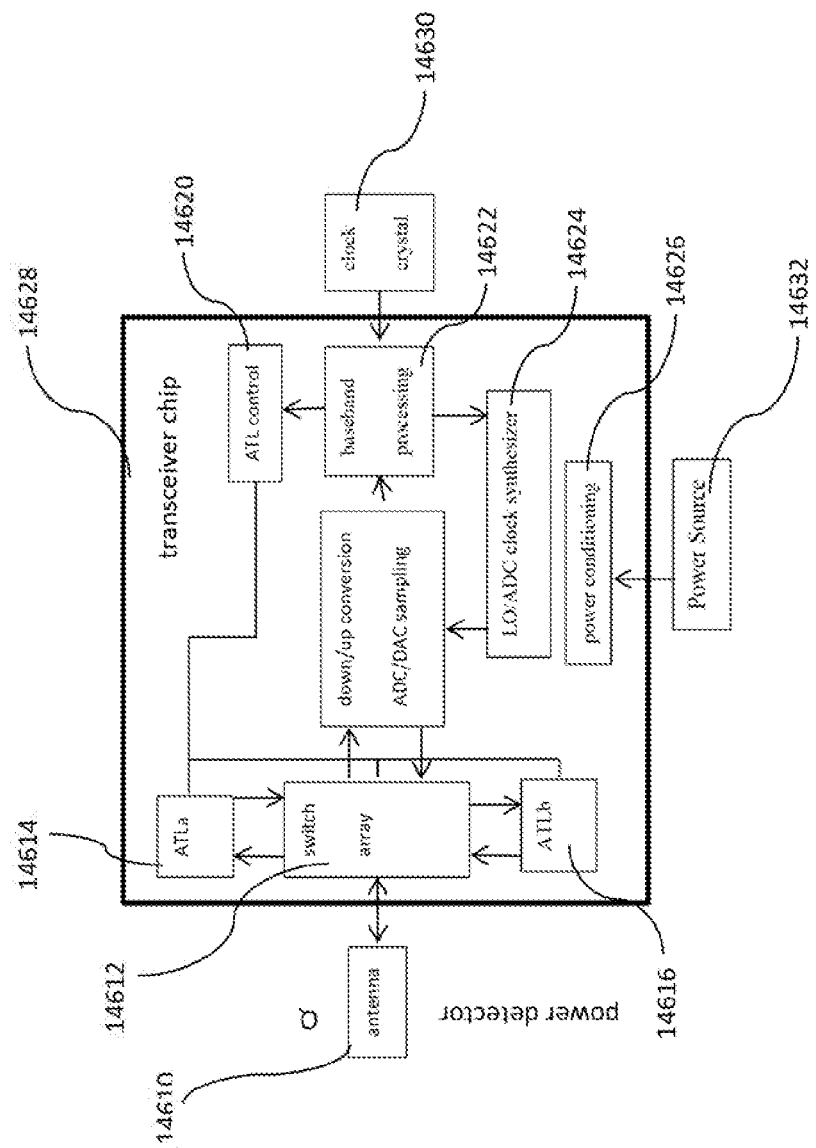

FIG. 146 is a block diagram of an overall wireless sensor transceiver system consisting of a minimal four components.

Figure 147:
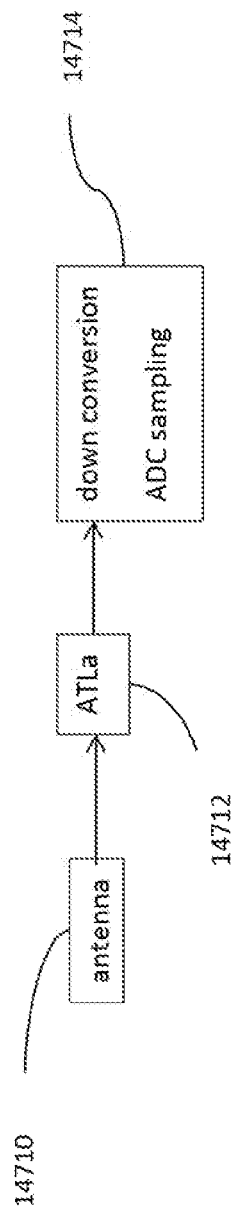

FIG. 147 is a block diagram showing receiver mode 1, with ATL1a as an RF filter.

Figure 148:
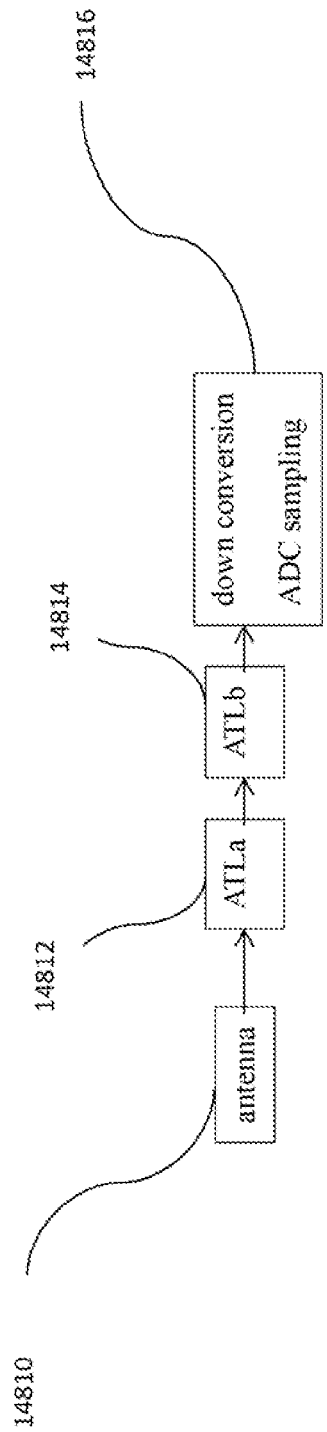

FIG. 148 is a block diagram showing mode 2 where ATL1a and ATL1b are cascaded.

Figure 149:
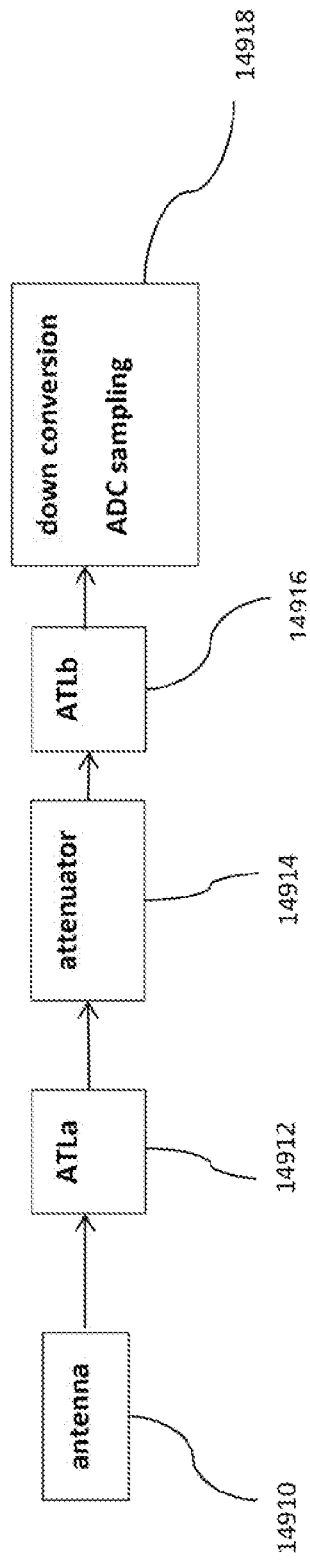

FIG. 149 is a block diagram showing mode 2 with a switched in attenuator.

Figure 150:
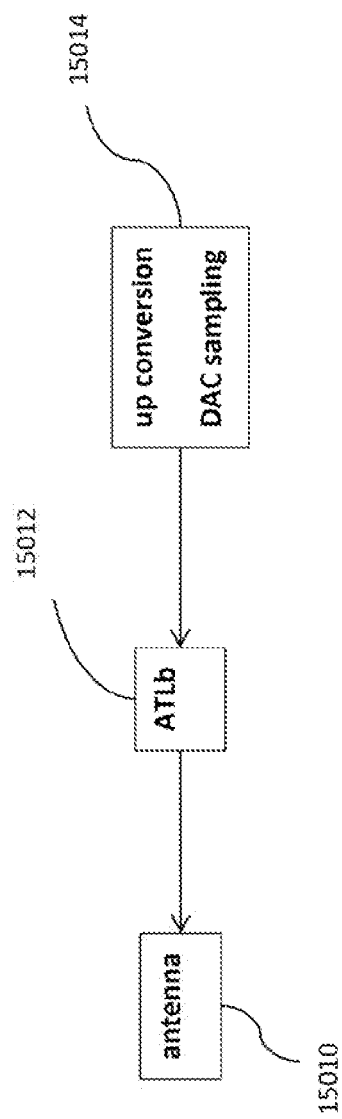

FIG. 150 is a block diagram showing mode 3 for transmitting, working in conjunction with Mode 1.

Figure 151:
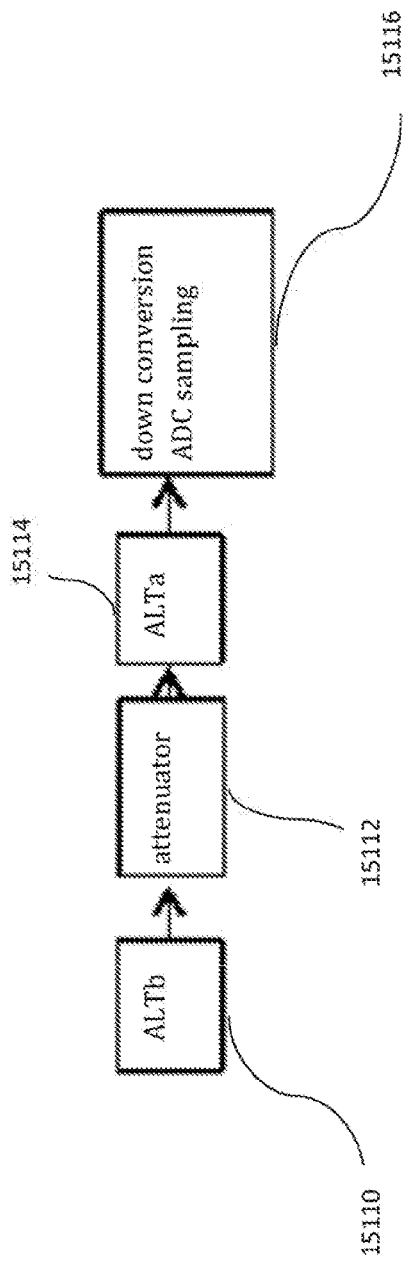

FIG. 151 is a block diagram showing mode 4 for calibration.

Figure 152:
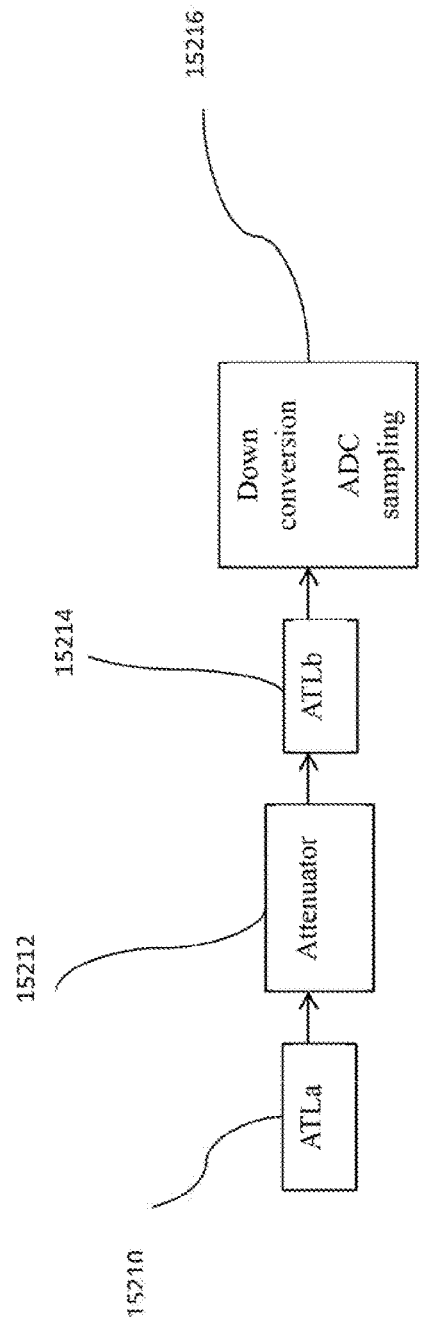

FIG. 152 is a block diagram showing mode 5 for calibration.

Figure 153:
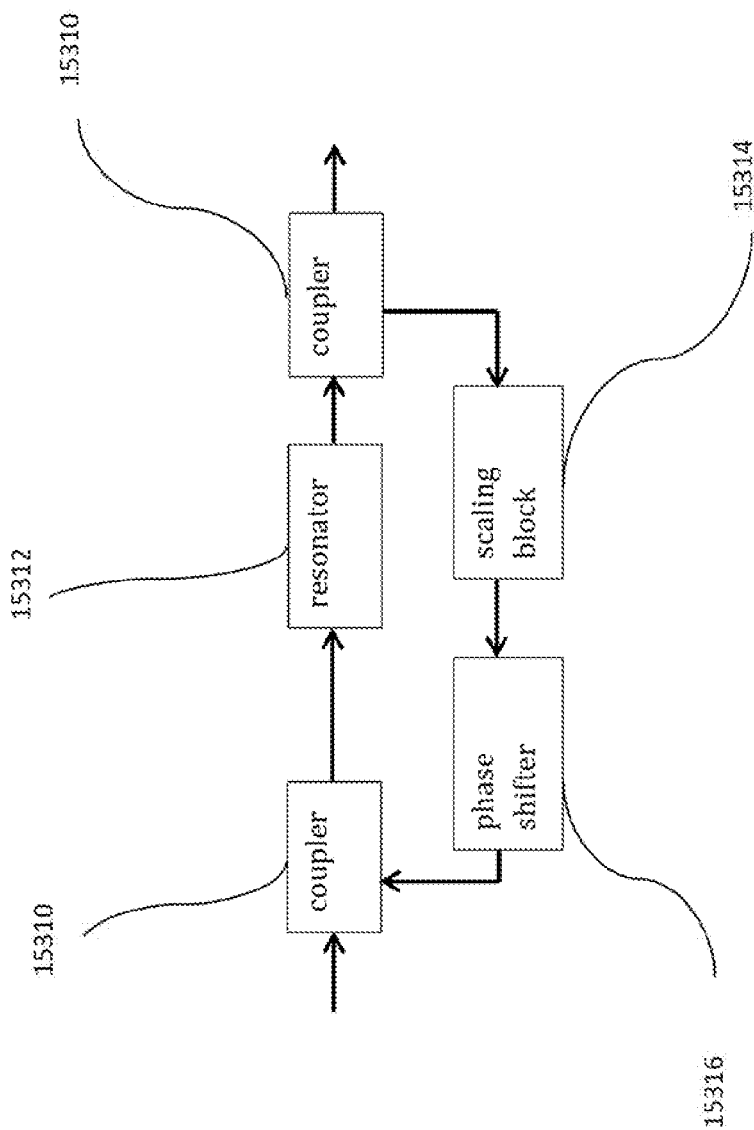

FIG. 153 is a block diagram where ATLa and ATLb are identical ATL1 s with a resonator in the through path, and a scaling block and phase shifter in the feedback path.

Figure 154:
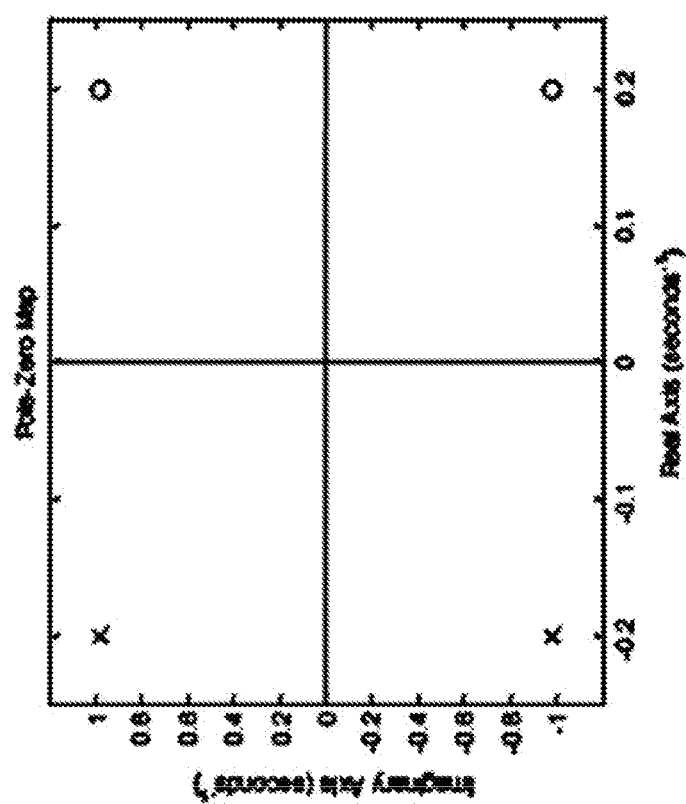

FIG. 154 is a pole zero plot of all-pass filter representing the phase shifter.

Figure 155:
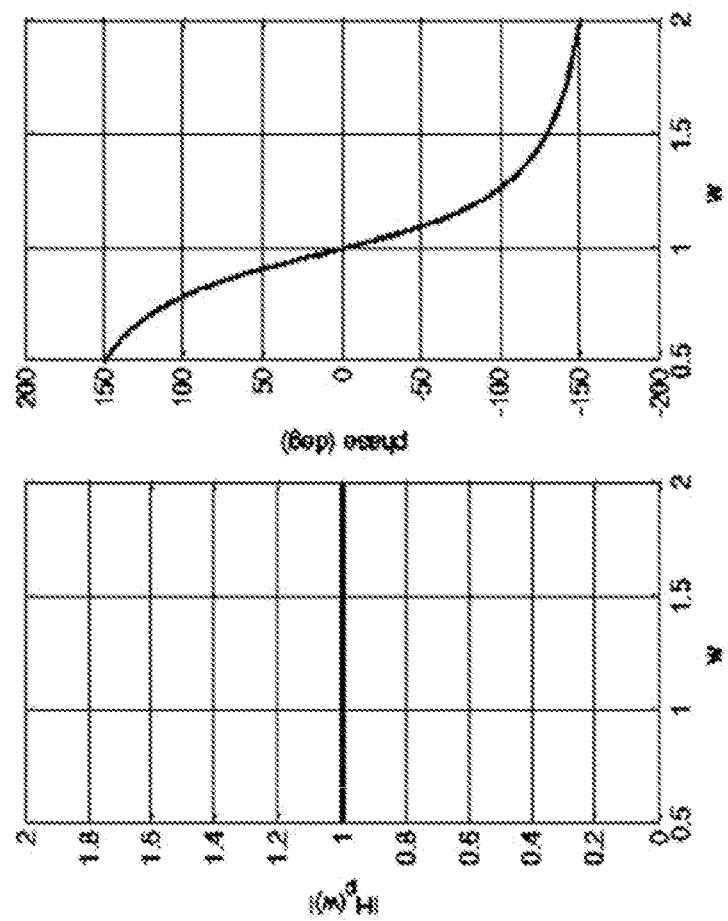

FIG. 155 is a plot showing frequency dependence for an all pass filter.

Figure 156:
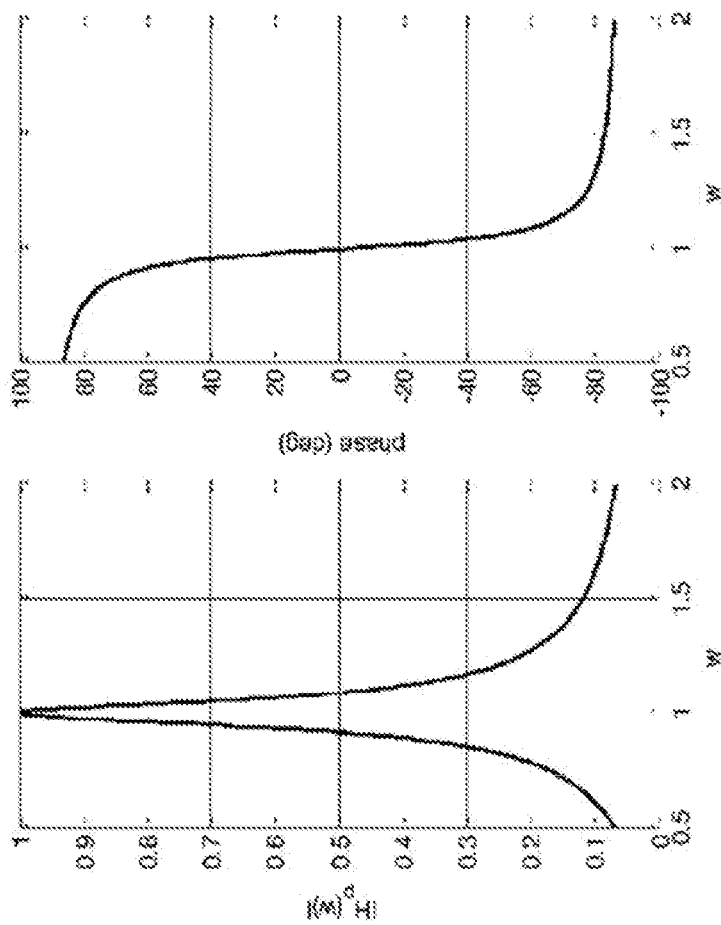

FIG. 156 is a frequency plot of the resonator for open loop Q=10 ($\omega r=1$ and Dr=0.05).

Figure 157:
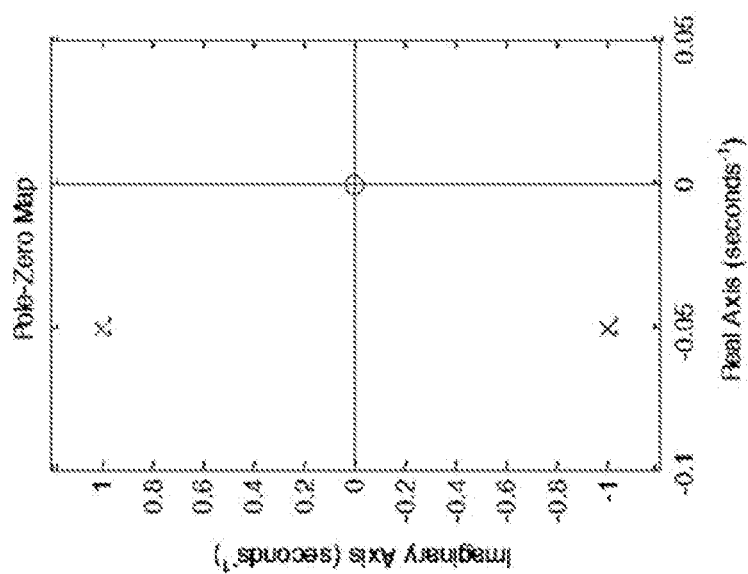

FIG. 157 is a pole zero plot of the resonator of FIG. 156.

Figure 158:
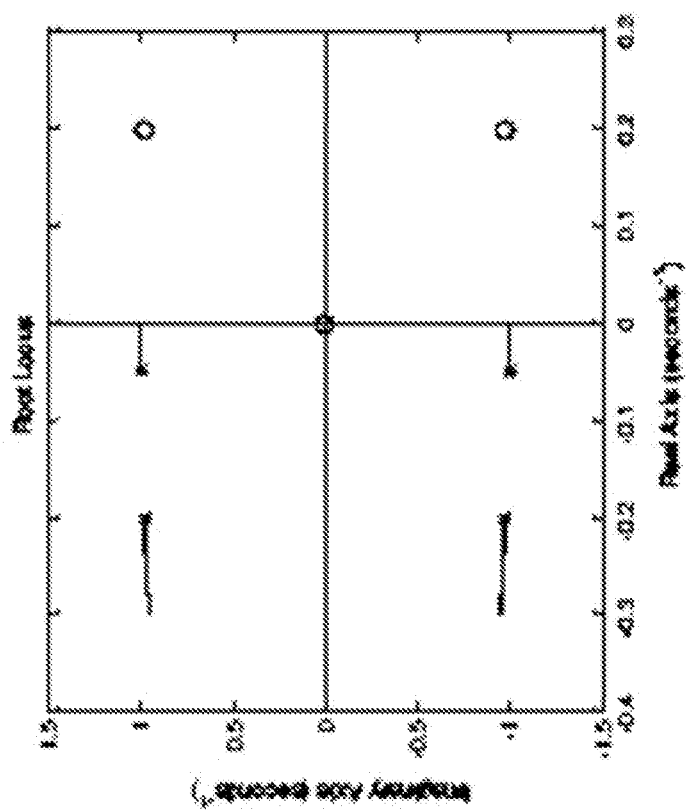

FIG. 158 is a plot of a zero degree root locus of the resonator in FIG. 156.

Figure 159:
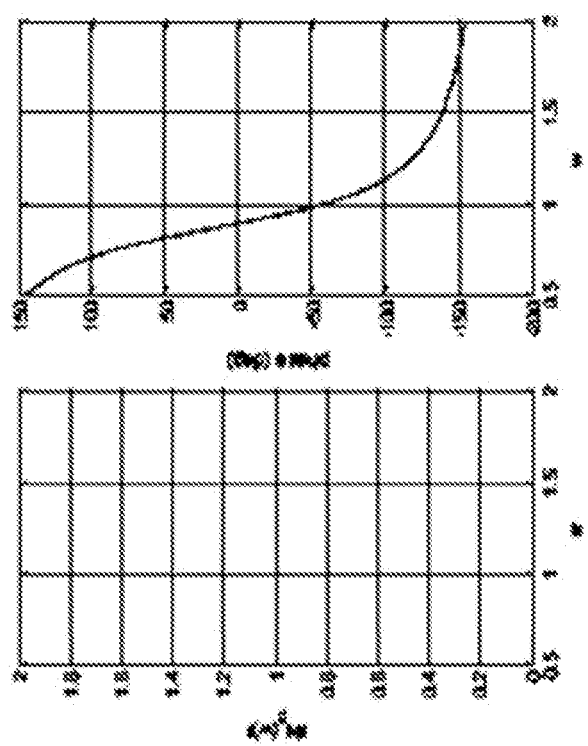

FIG. 159 is a phase plot of the phase shifter after a 50 degree mismatch is implemented.

Figure 160:
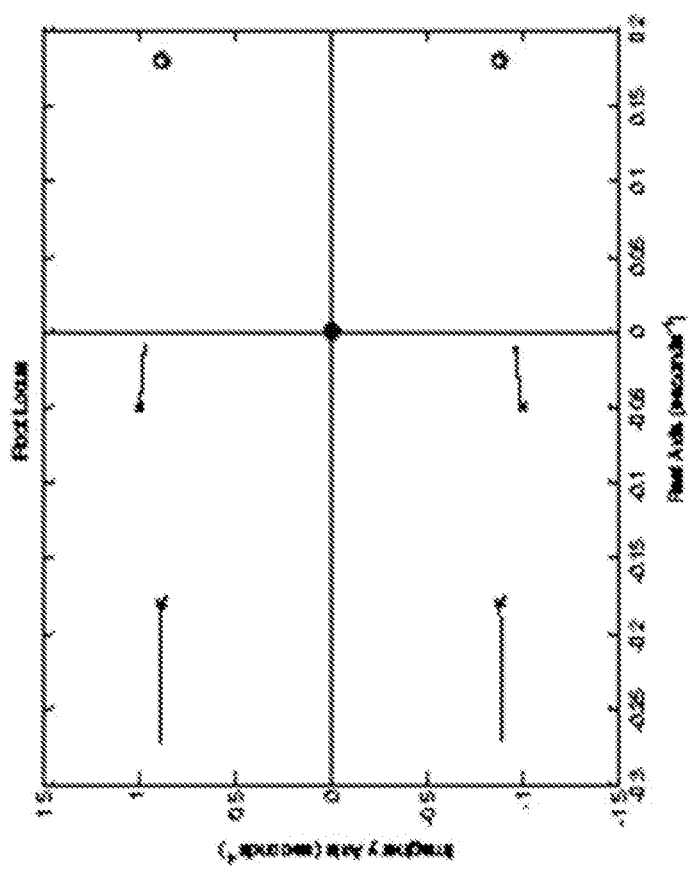

FIG. 160 is a plot of a zero degree root locus of ATL1 for the mismatched phase of FIG. 159.

Figure 161:
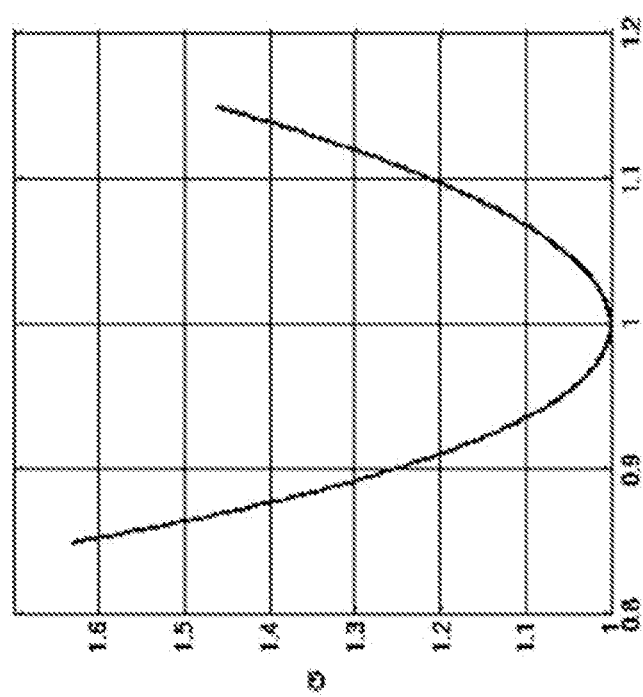

FIG. 161 is a plot of the loop gain required to reach the oscillation condition as a function of the phase shifter mismatch of FIG. 159.

Figure 162:
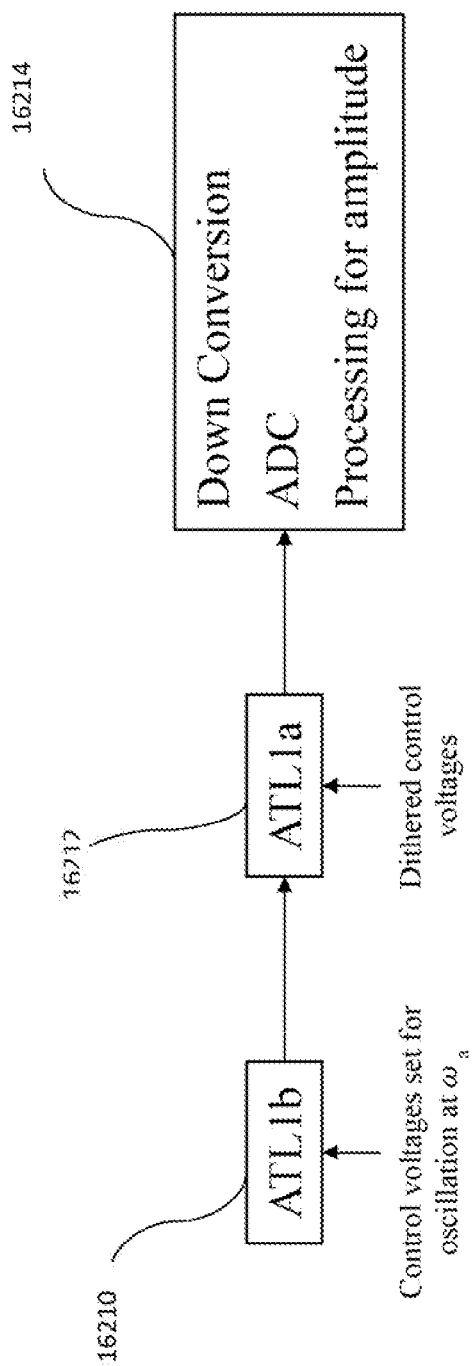

FIG. 162 is a block diagram of a configuration for passband calibration of ATLa.

Figure 163:
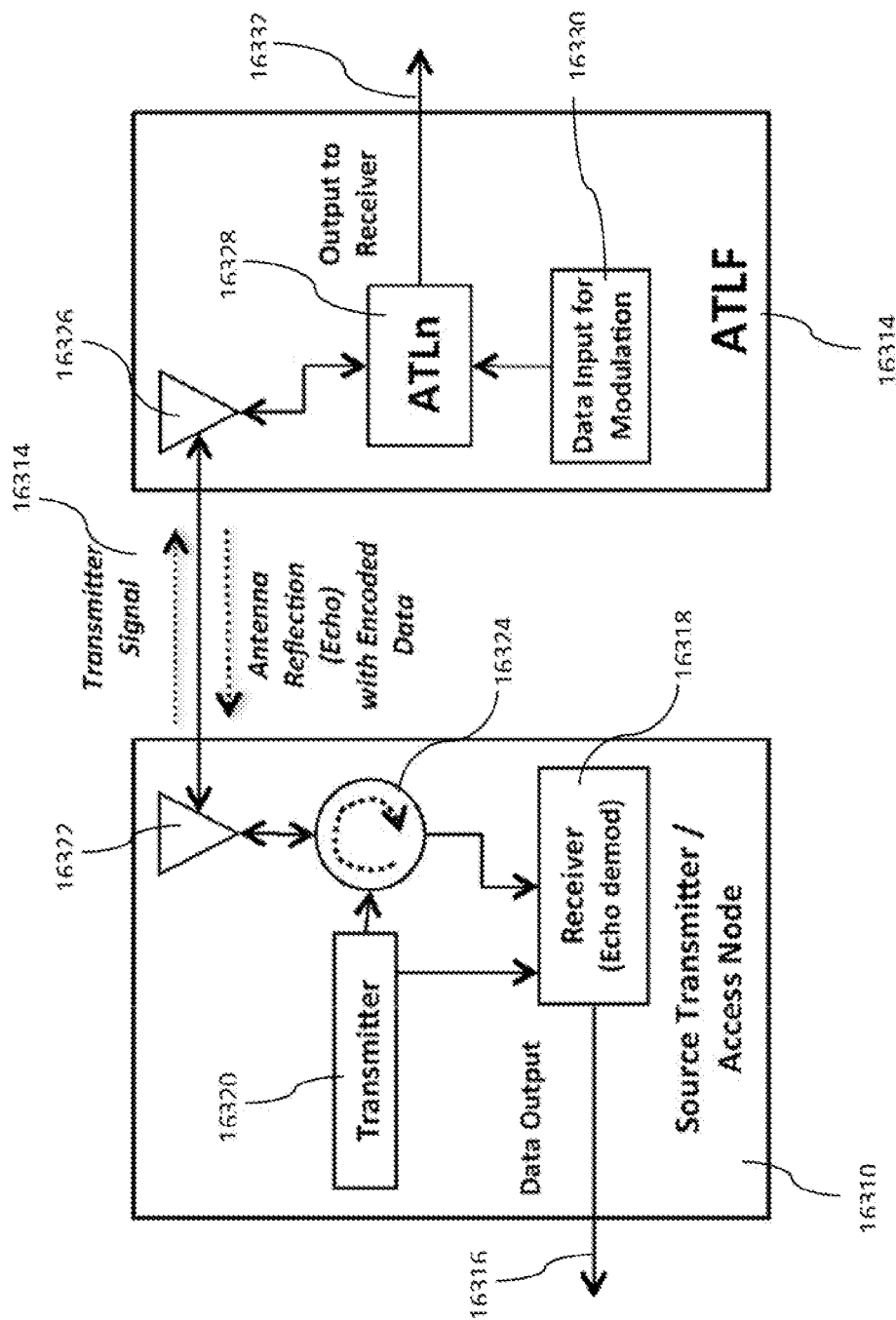

FIG. 163 is a block diagram of an ATLF configuration to provide full duplex communication without a transmitter.

Figure 164:
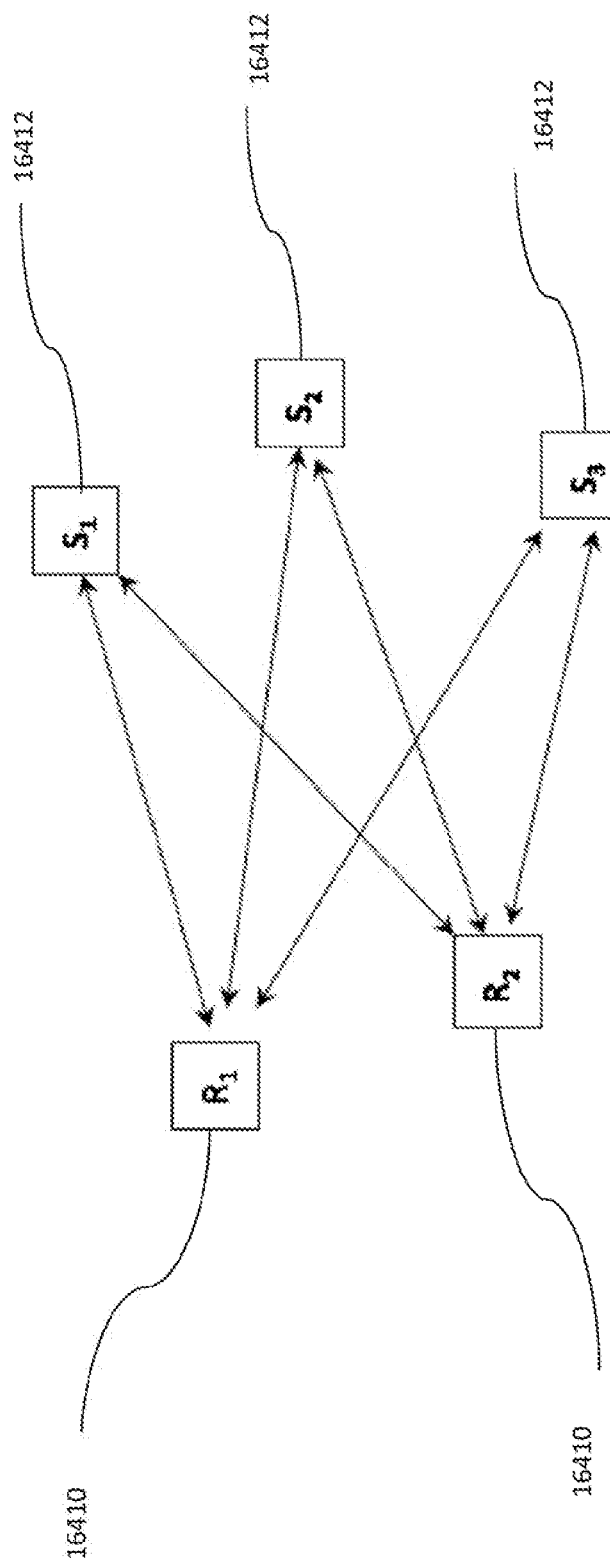

FIG. 164 is a block diagram showing a network of multiple readers (R) and multiple sensors (S).

Figure 165:
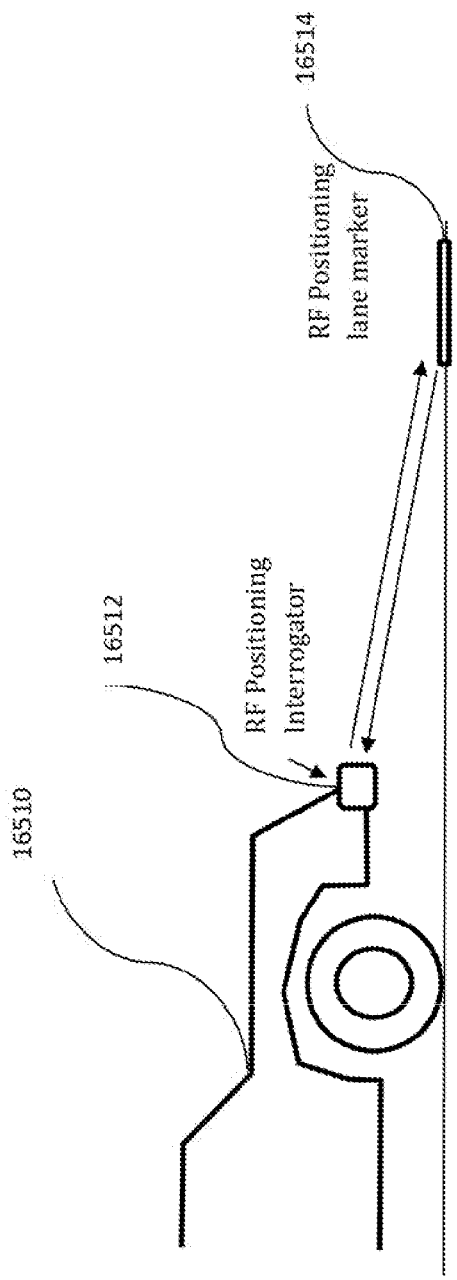

FIG. 165 is a diagram showing an AV approaching an RF lane marker (RFLM).

Figure 166:
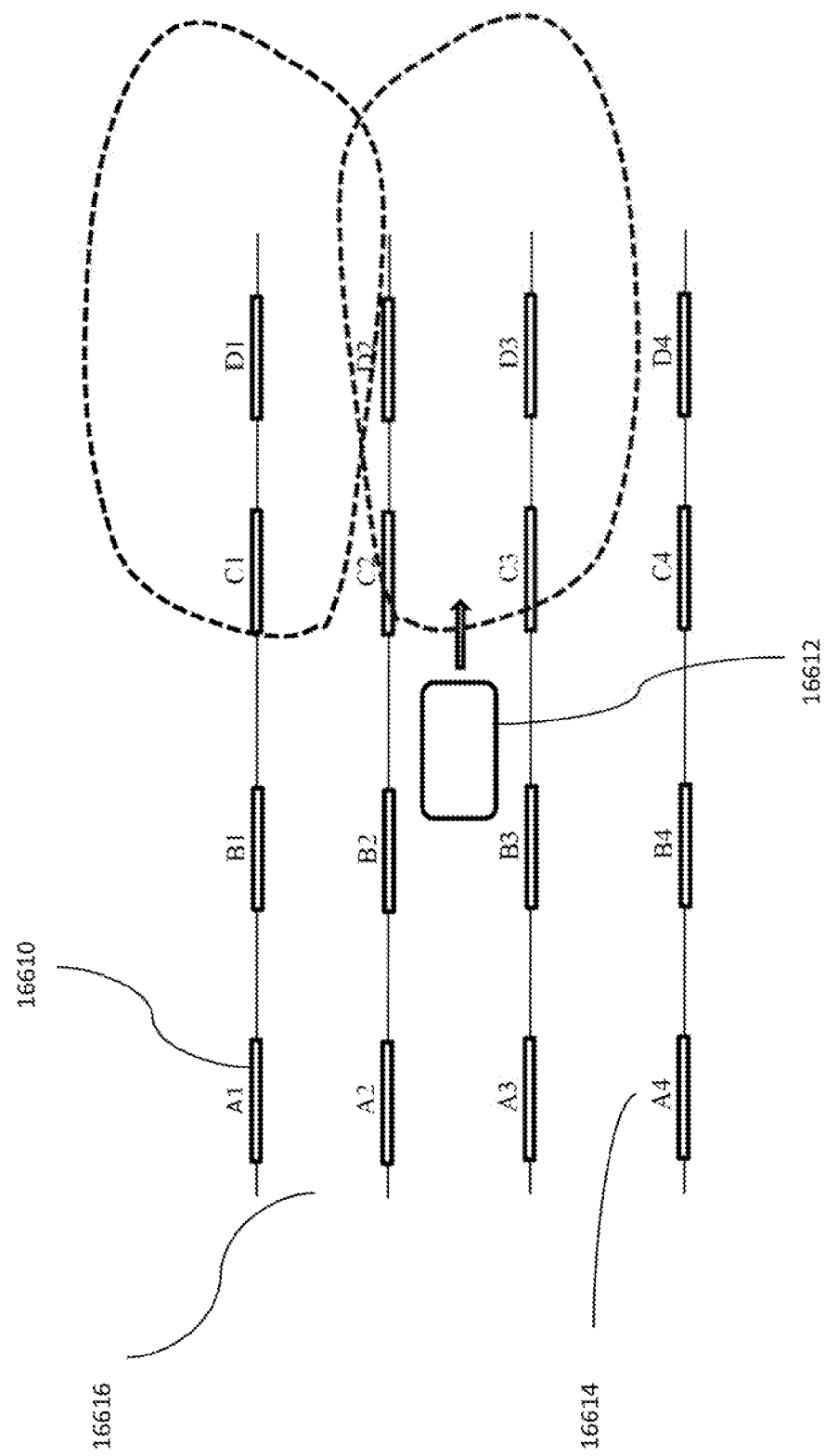

FIG. 166 is a diagram showing a multi-lane roadway depicting each RFLM with a unique ID.

Figure 167:
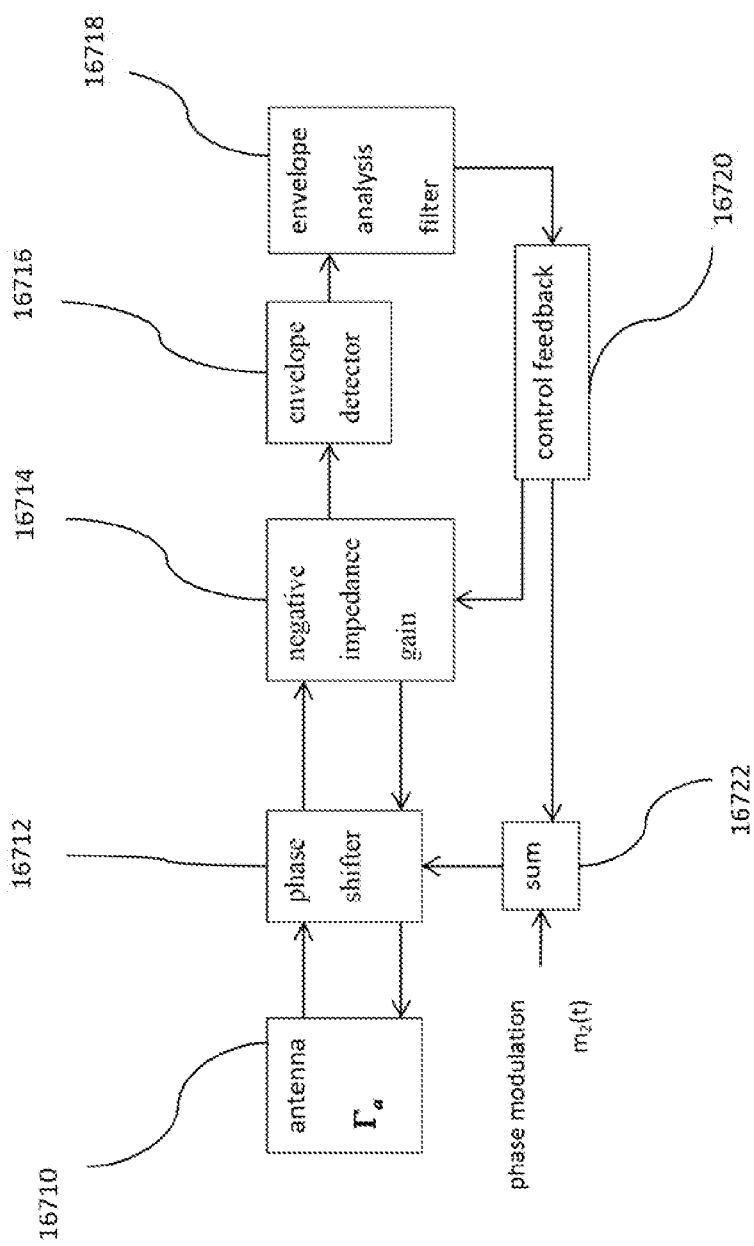

FIG. 167 is a block diagram of simple envelope analysis processing.

Figure 168:
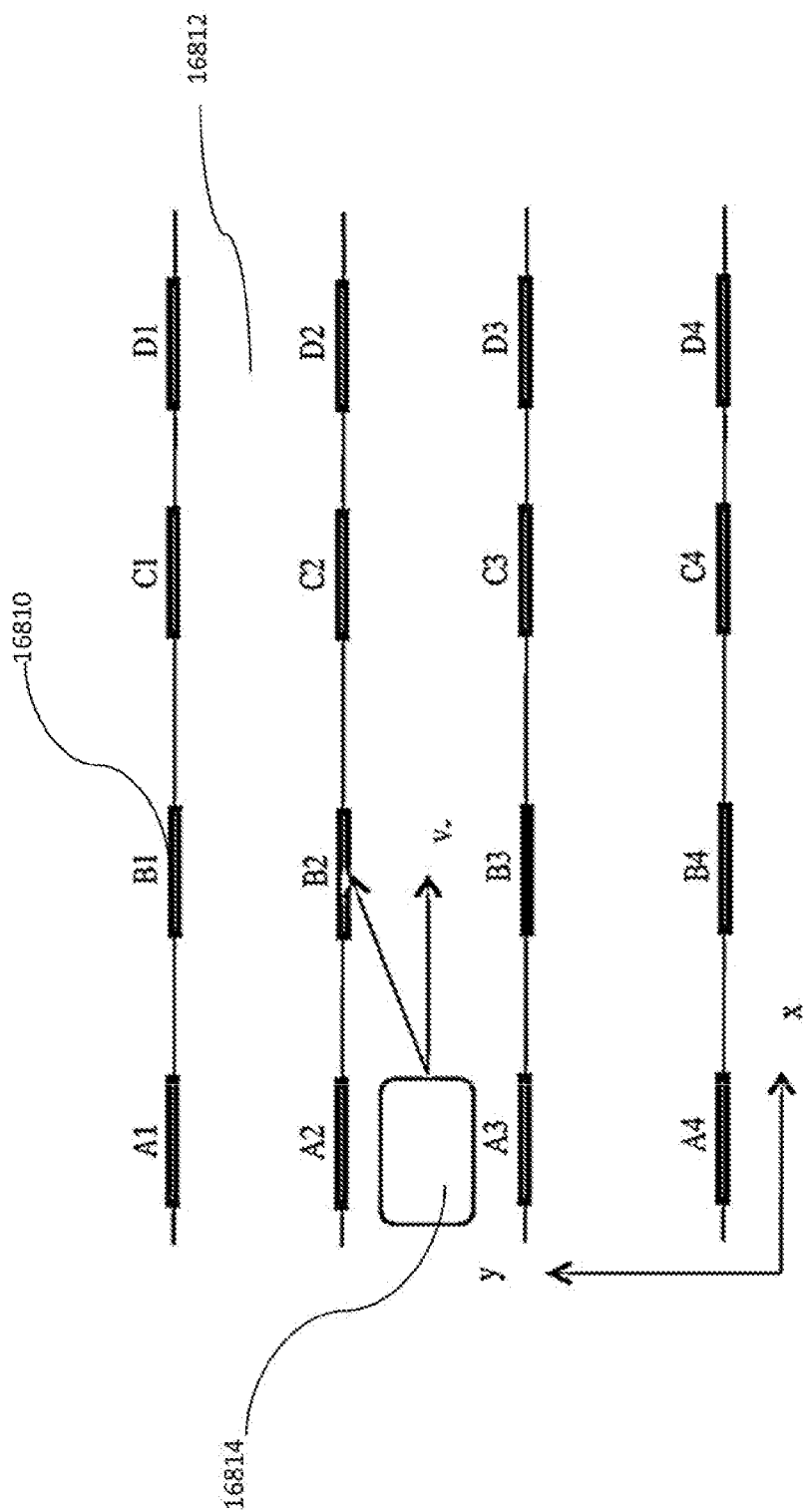

FIG. 168 is a diagram showing a 2D roadway surface for a simplified simulation.

Figure 169:
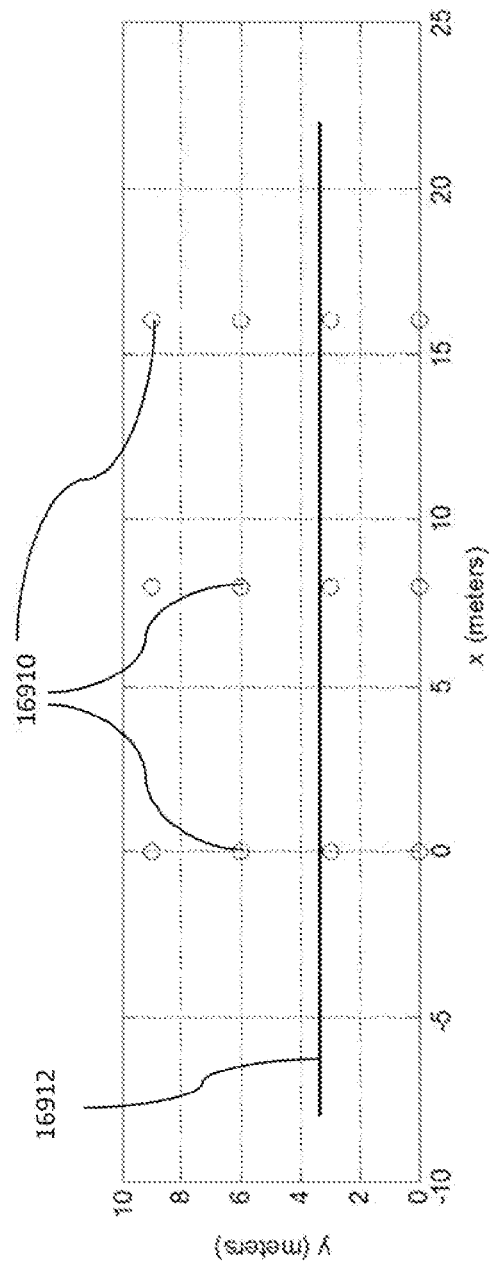

FIG. 169 is a plot of the location of the RFLMs (circles) and the trajectory of the car AVPI (bold).

Figure 170:
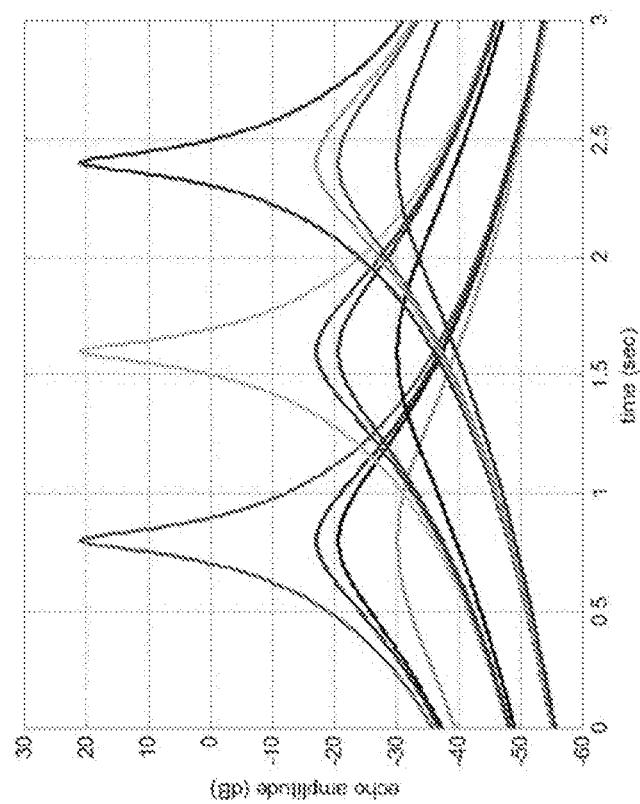

FIG. 170 is a plot of the signals at the RFLMs due to the signal from the passing AVPI.

Figure 171:
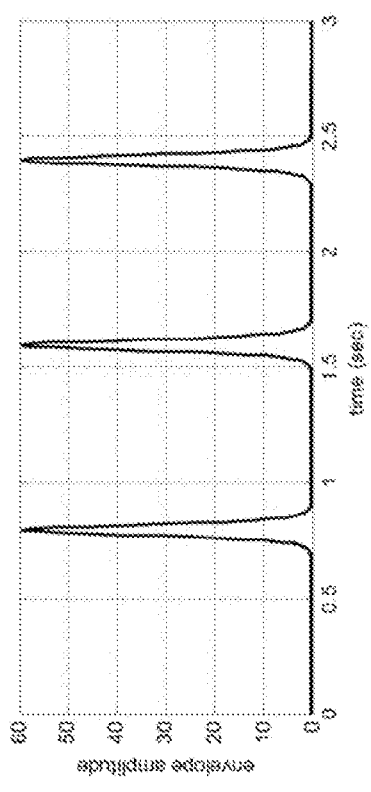

FIG. 171 is a plot showing the coherent demodulation and envelope processing of the superimposed RFLMs of FIG. 170.

Figure 172:
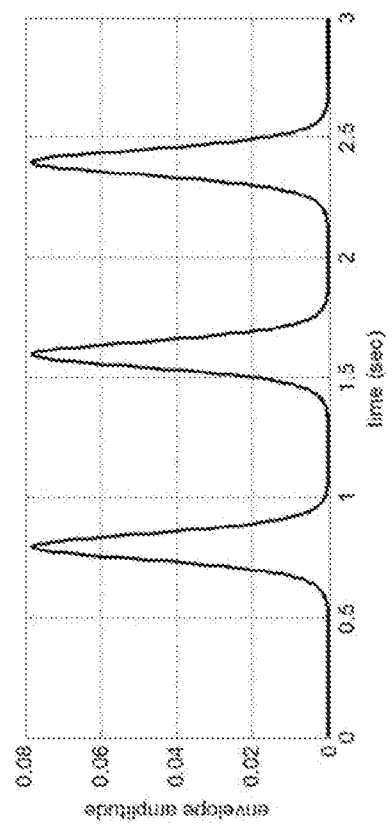

FIG. 172 is a plot showing the envelope when the AVPI is in the middle of the lane.

Figure 173:
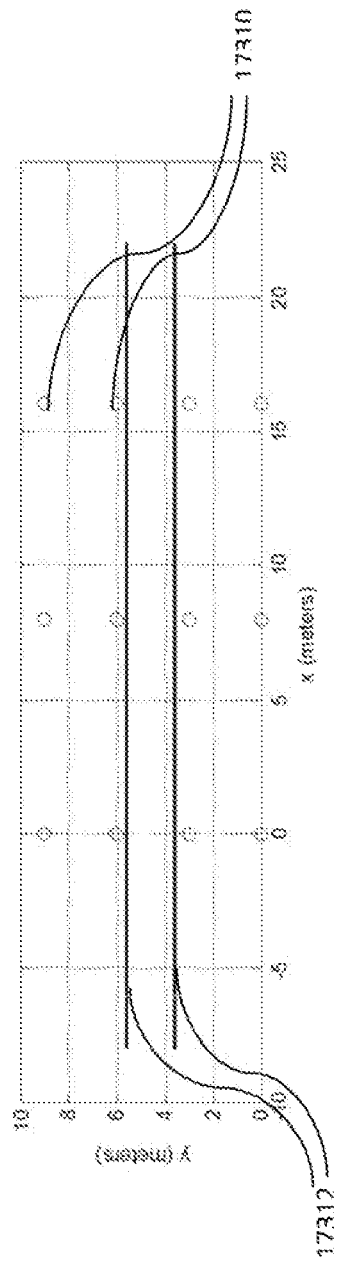

FIG. 173 is a plot showing two parallel trajectories corresponding to two (2) AVPIs located on the right and left side of single AV along the road.

Figure 174:
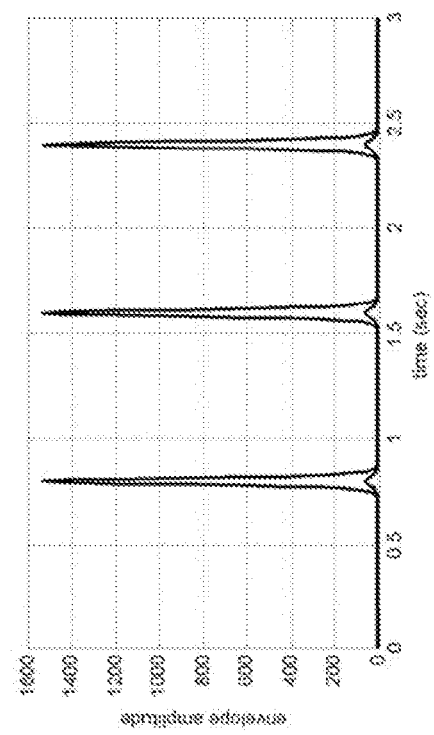

FIG. 174 is a plot showing the two-position interrogation response signal envelopes from the AVPIs of FIG. 173.

Figure 175:
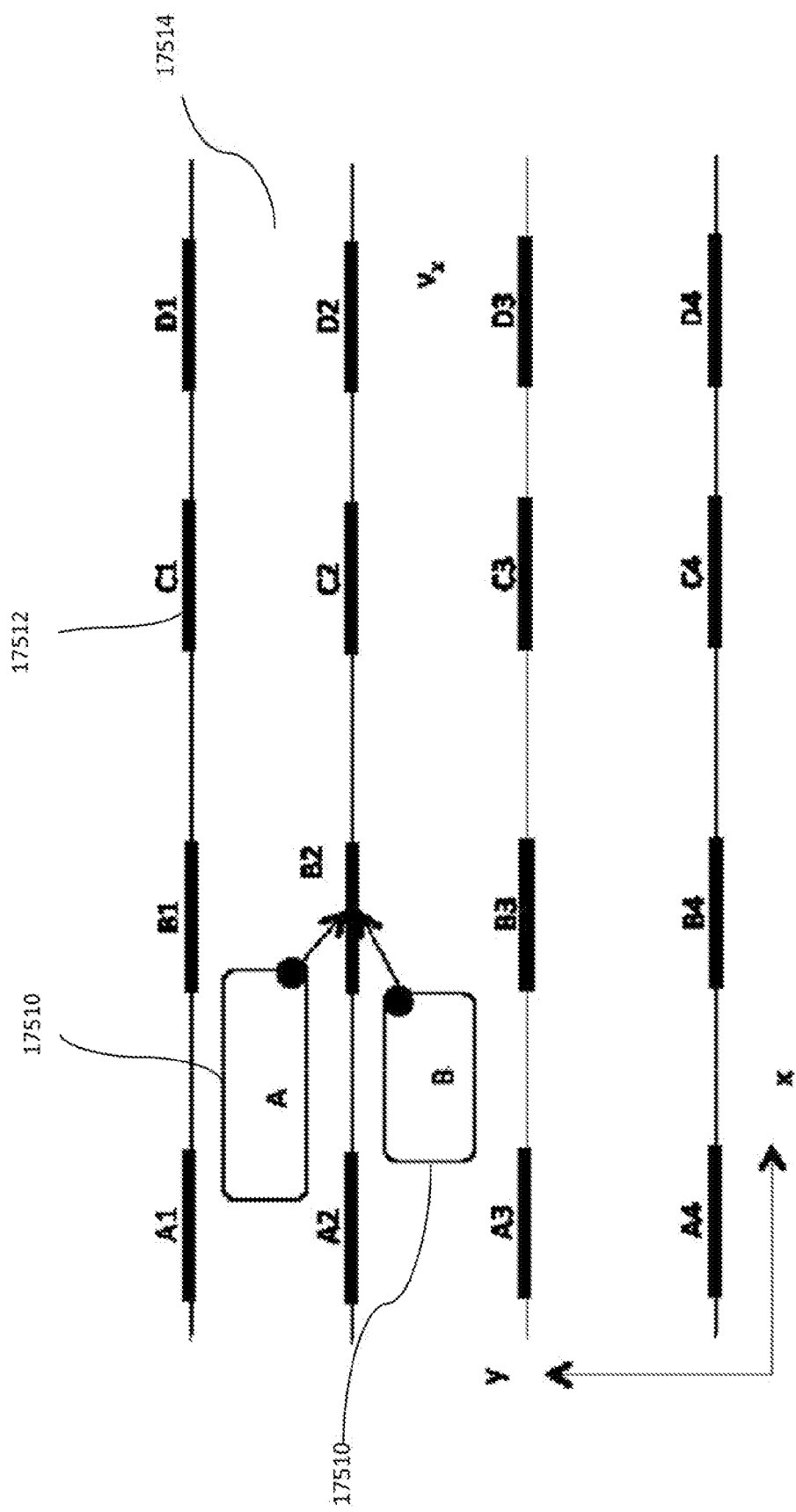

FIG. 175 is a diagram showing two AVs side by side, with AVPIs approximately equal distant from the RFLMs in row 2.

Figure 176:
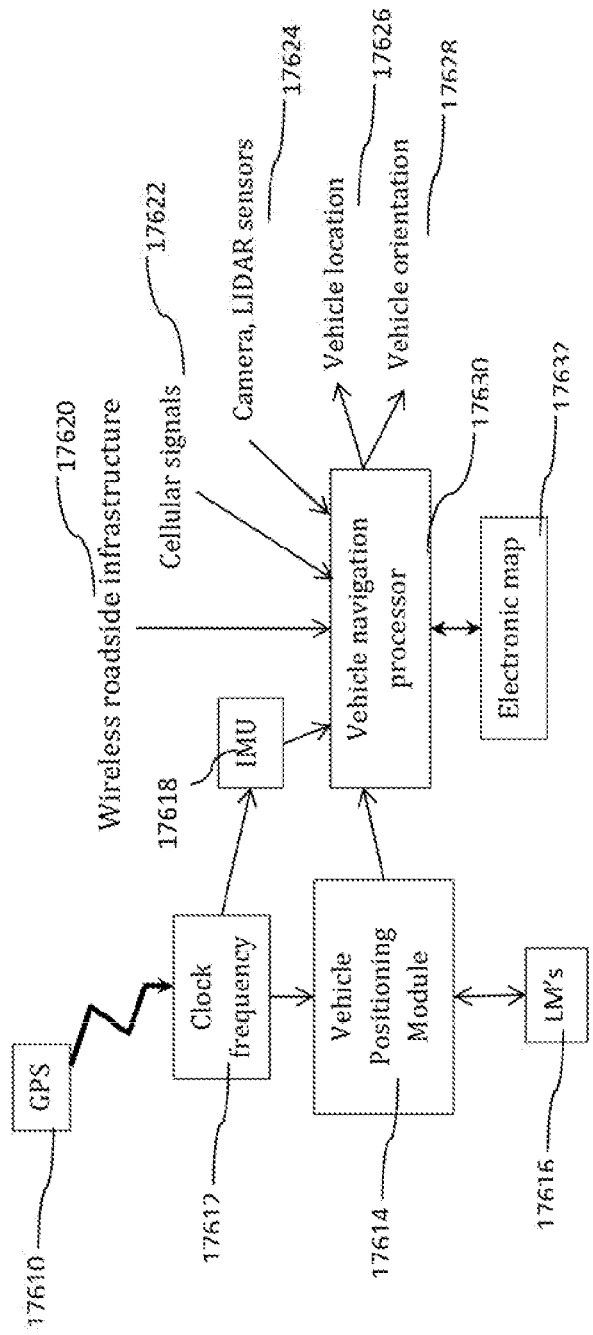

FIG. 176 is a block diagram of an overall vehicle navigation system.

Figure 177:
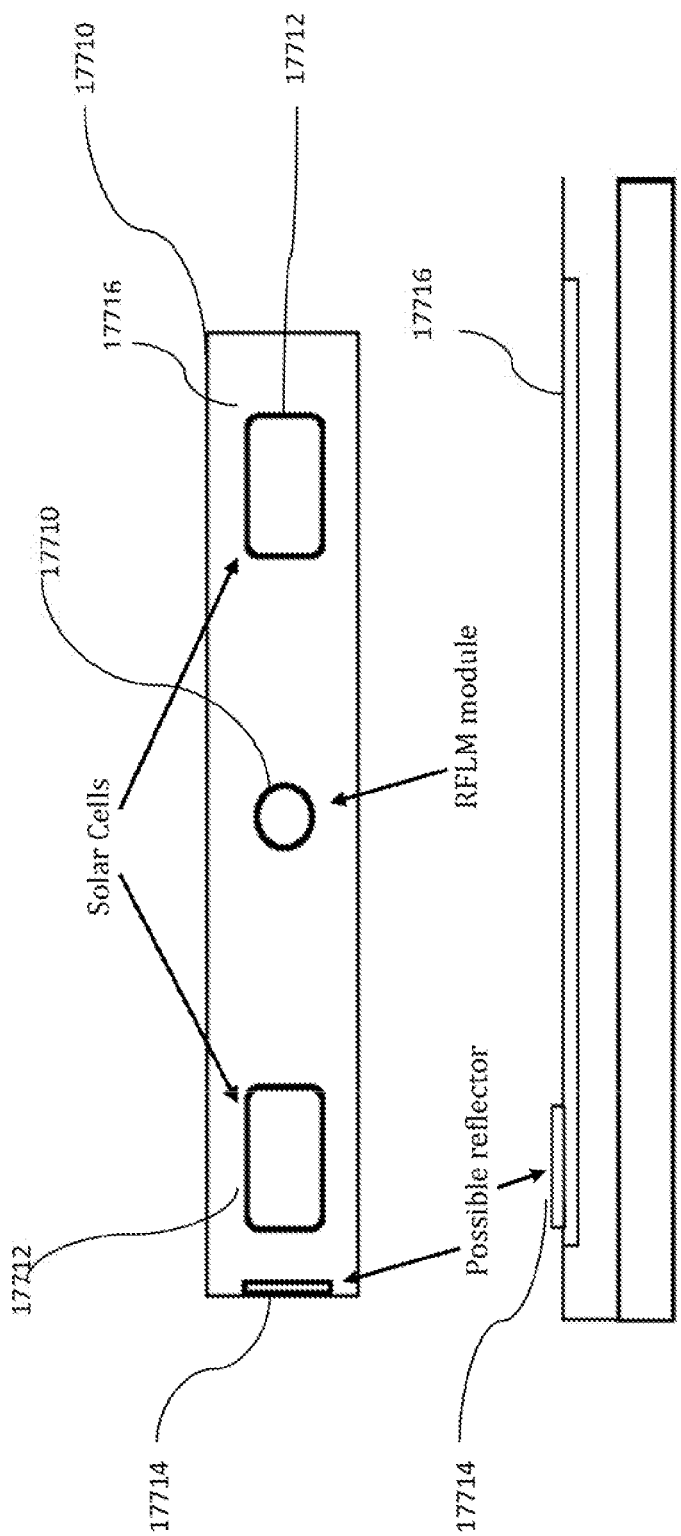

FIG. 177 is a block diagram of a possible implementation of a ruggedized RFLM.

Figure 178:
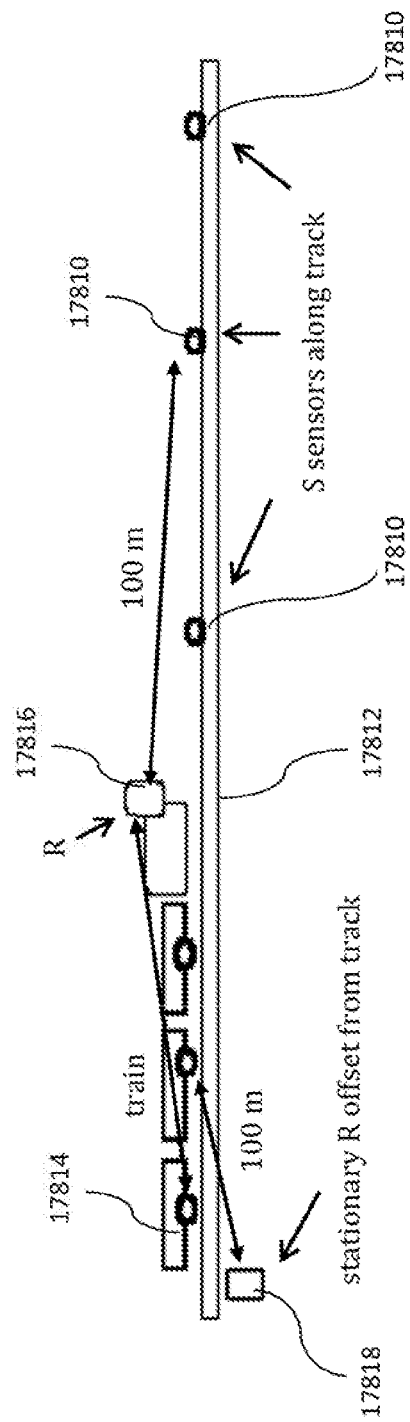

FIG. 178 is a block diagram showing a train sensor network application.

Figure 179:
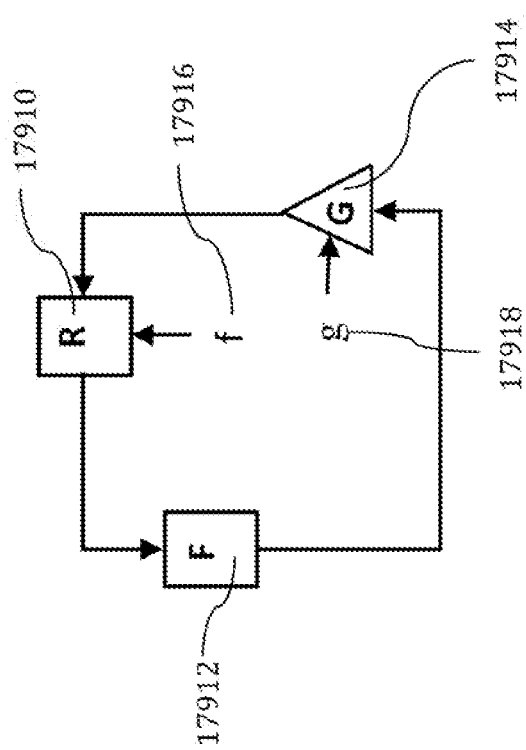

FIG. 179 is a block diagram showing the basic ATLXR circuit.

Figure 180:
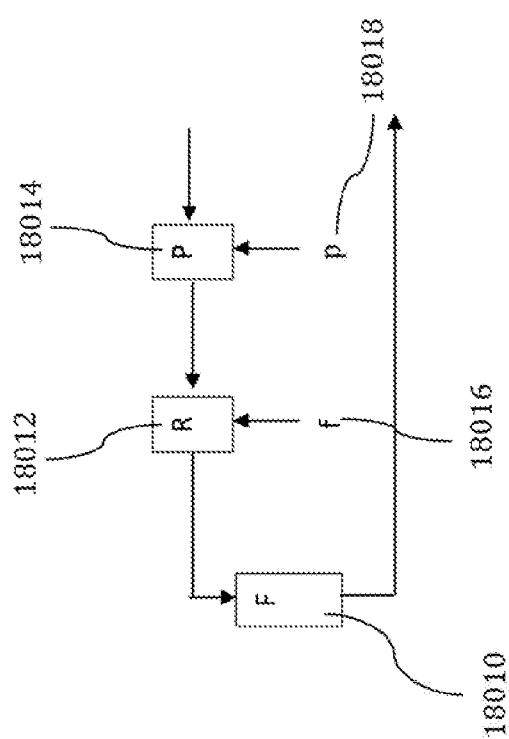

FIG. 180 is a block diagram showing the basic ATLXR open loop circuit.

Figure 181:
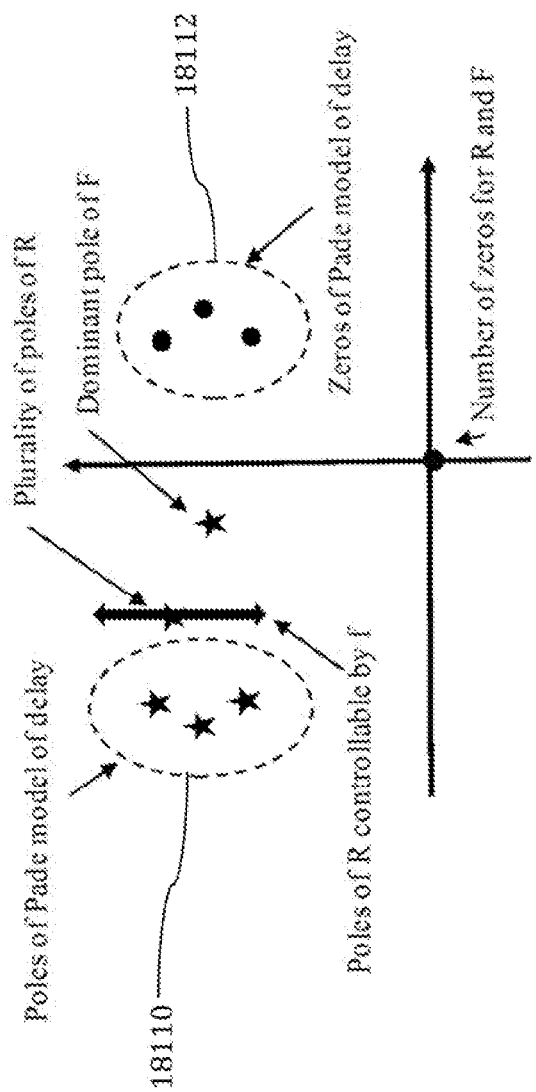

FIG. 181 is the open loop pole zero plot of the ATLXR of FIG. 180.

Figure 182:
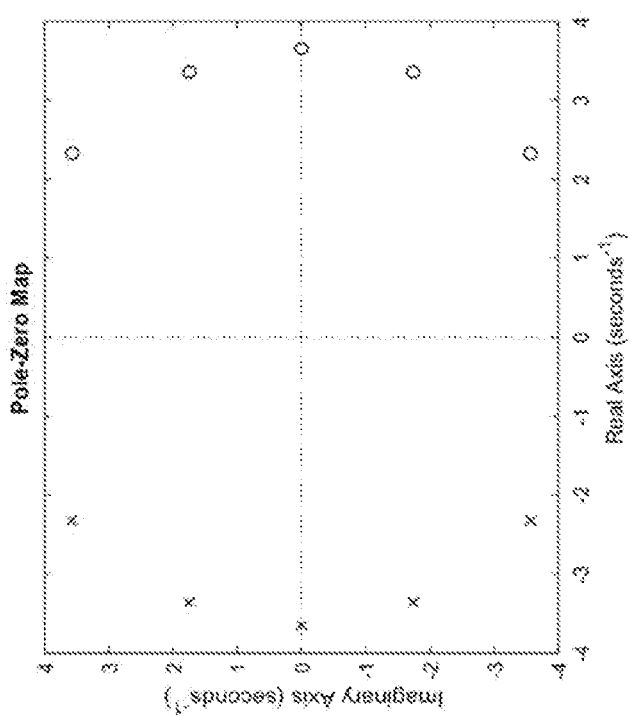

FIG. 182 is a plot showing a Pade equivalent polynomial representation of the loop delay.

Figure 183:
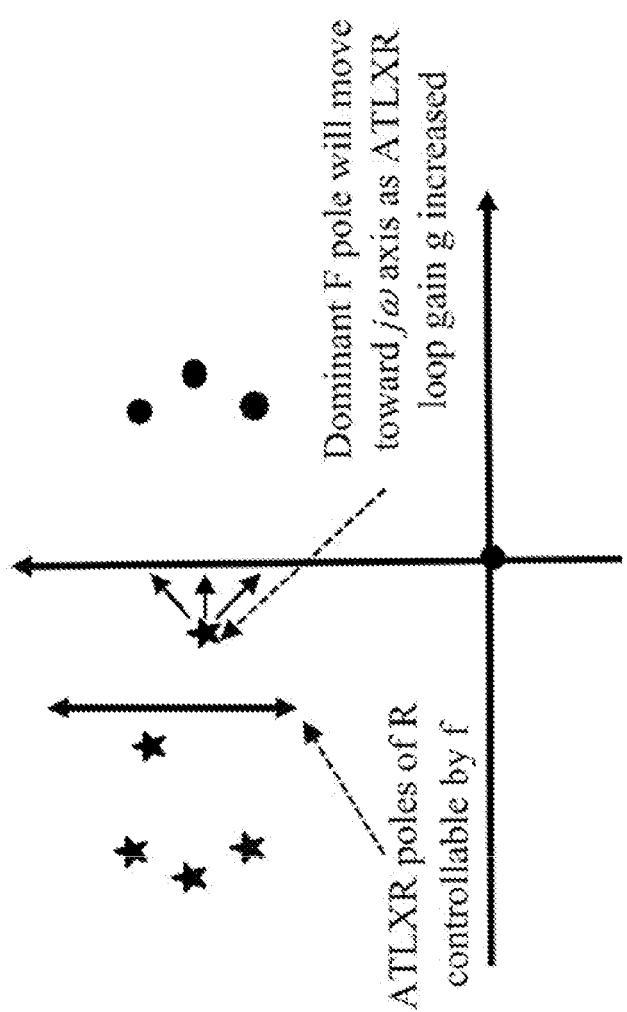

FIG. 183 is a plot showing the closed loop trajectory of the high Q pole of F.

Figure 184:
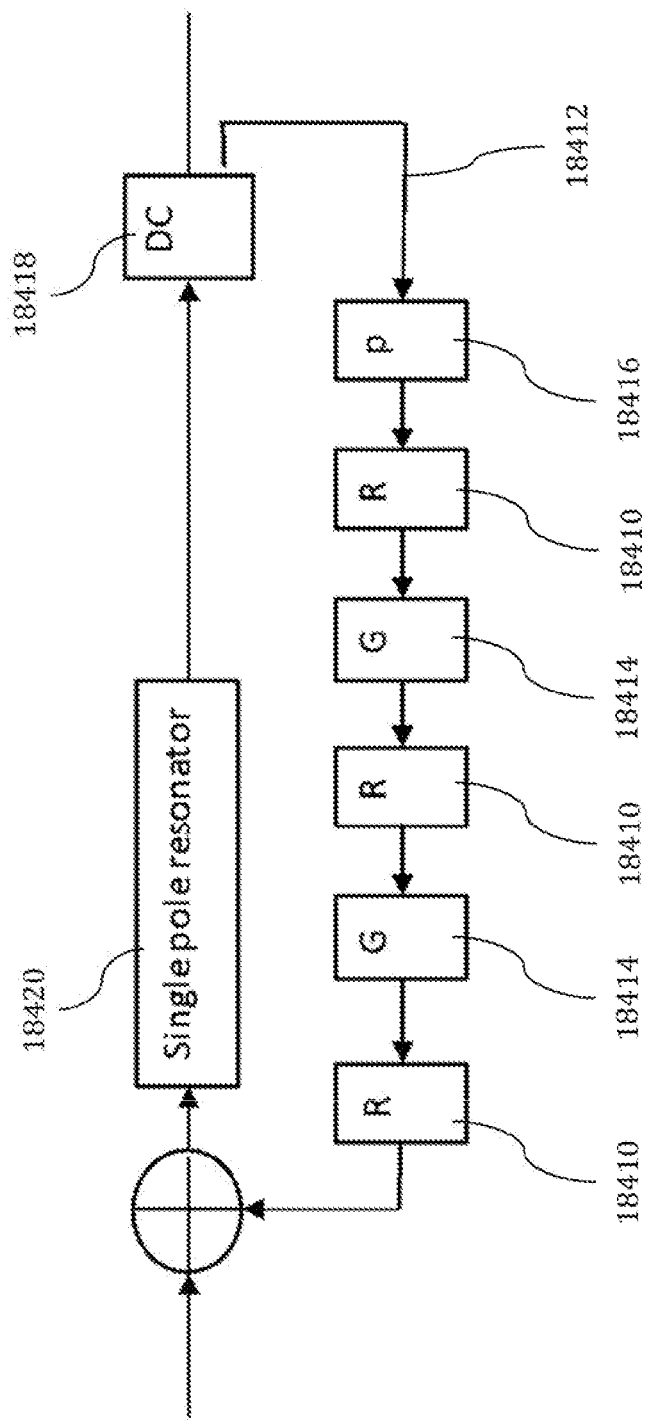

FIG. 184 is a plot showing an ATLXR having a general single pole primary resonator F and three secondary tunable Rs.

Figure 185:
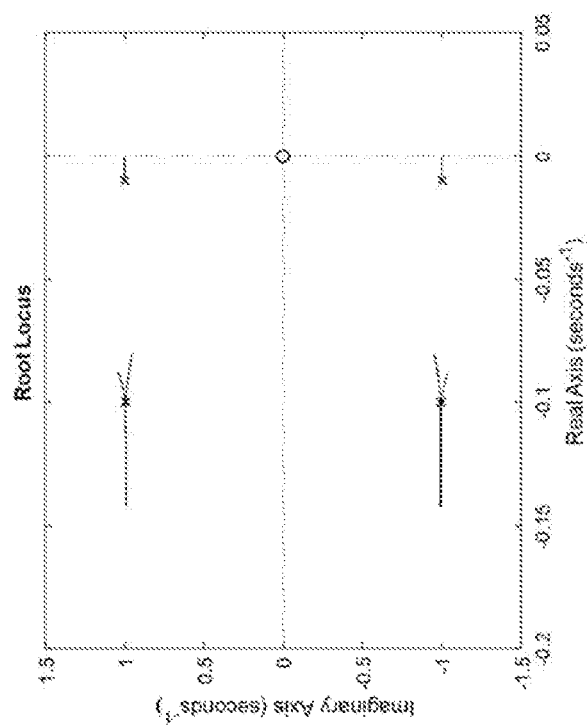

FIG. 185 is a plot showing a typical Q enhancement of the primary resonator F.

Figure 186:
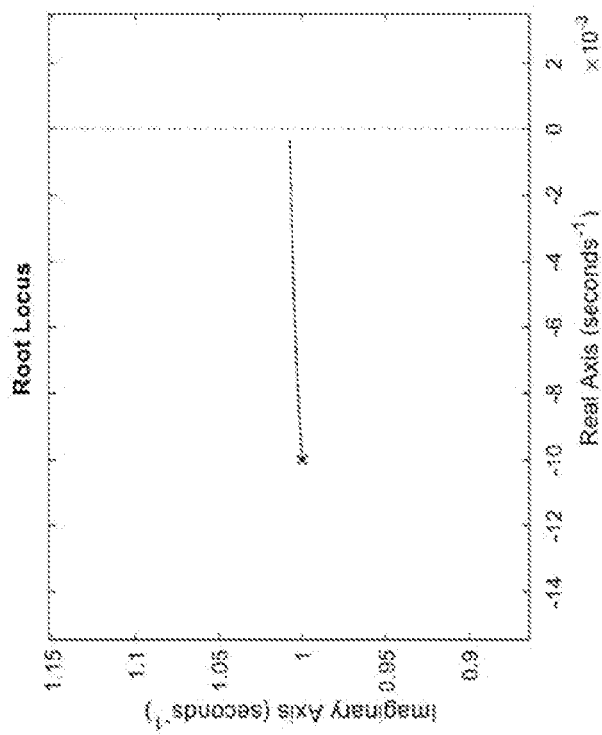

FIG. 186 is a plot showing a shift in frequency of the Q enhanced primary resonator F pole.

Figure 187:
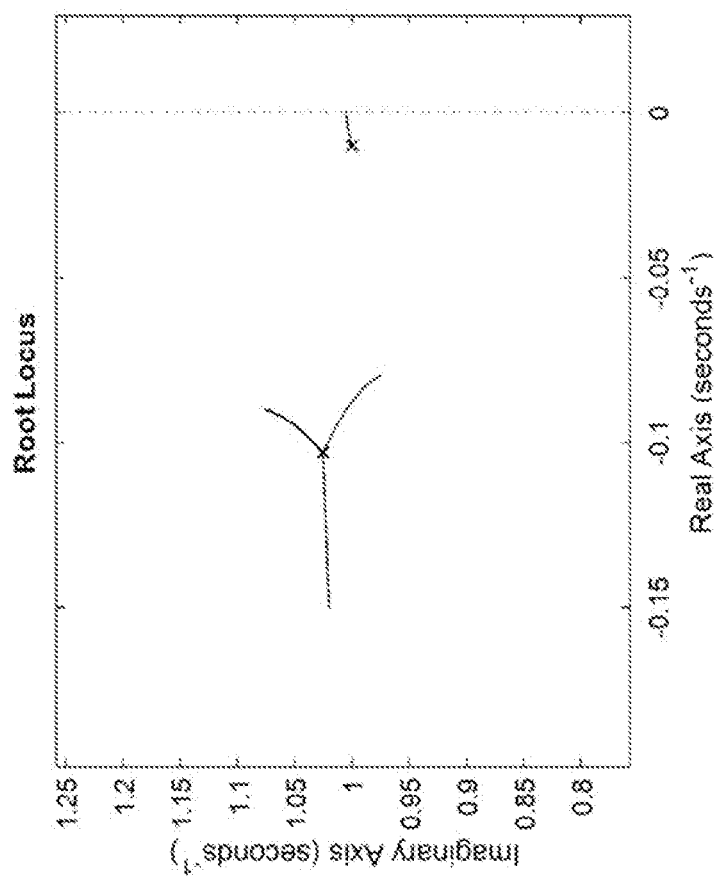

FIG. 187 is a plot showing the root locus for the case of a 90 degree phase shift caused by parasitic delay.

Figure 188:
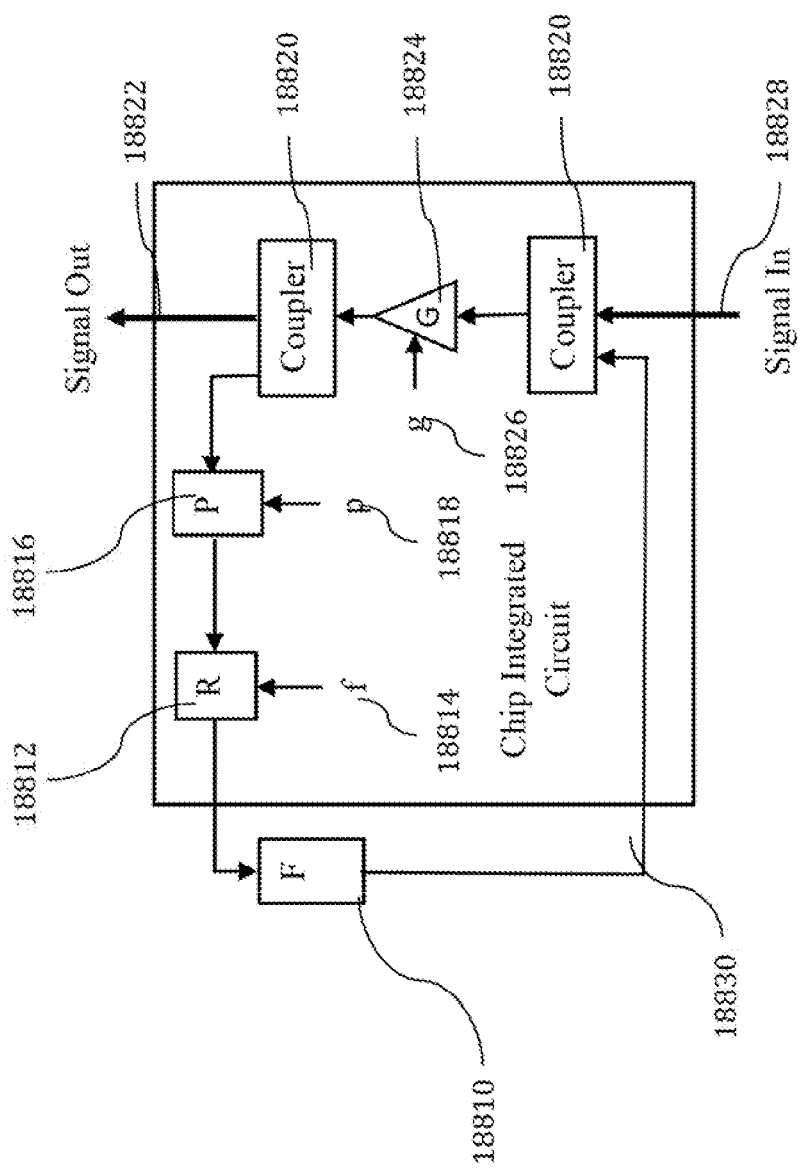

FIG. 188 is a block diagram showing a preferred embodiment of the ATLXR

Figure 189:
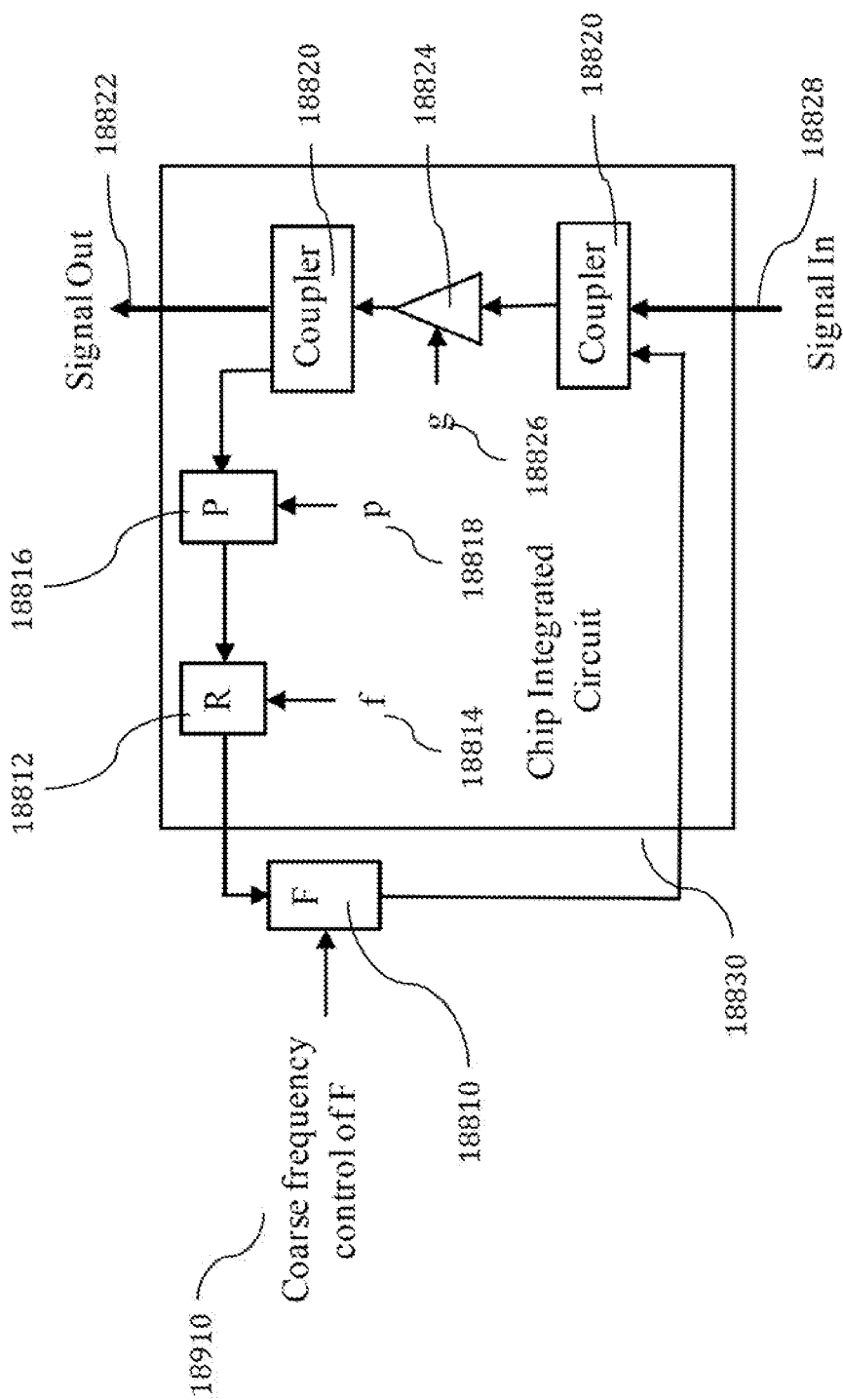

FIG. 189 is a block diagram showing an embodiment of the ATLXR wherein both a slow coarse frequency control and a fast control of the closed loop pole is provided by the ATLXR feedback loop via the {f,p,g} control.

Figure 190:
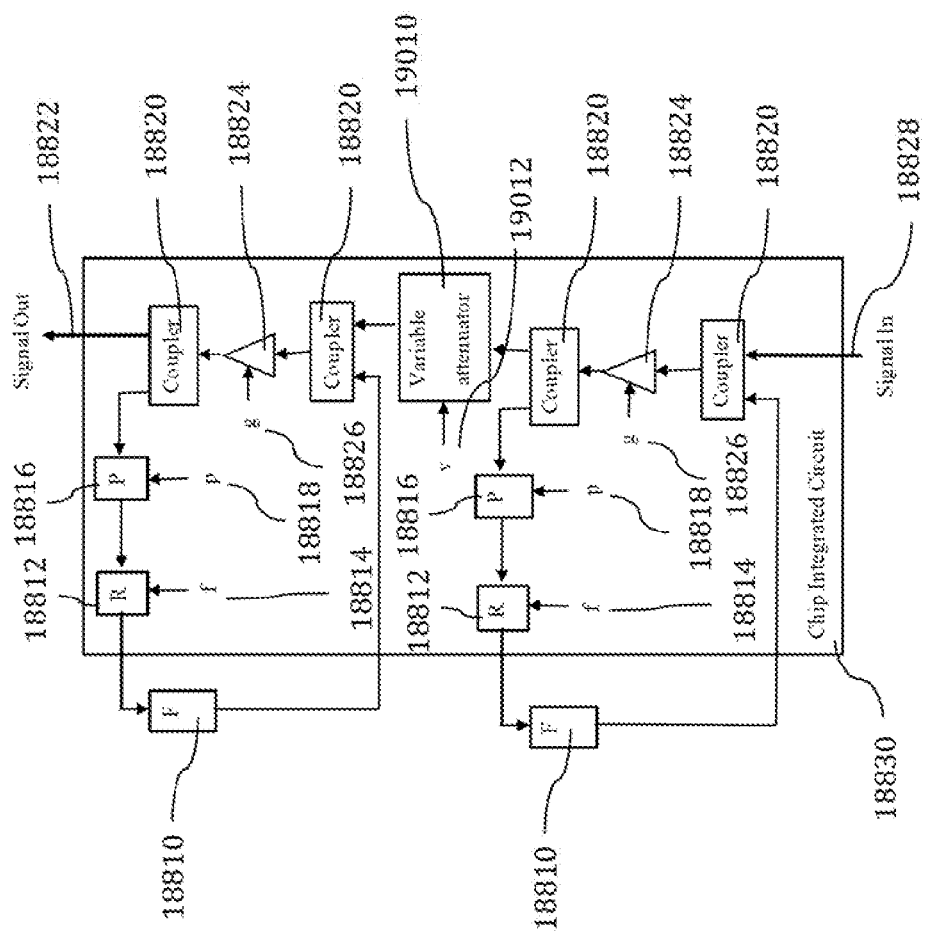

FIG. 190 is a block diagram showing multiple ATLXR circuits resulting in multi-pole bandpass filter.

Figure 191:
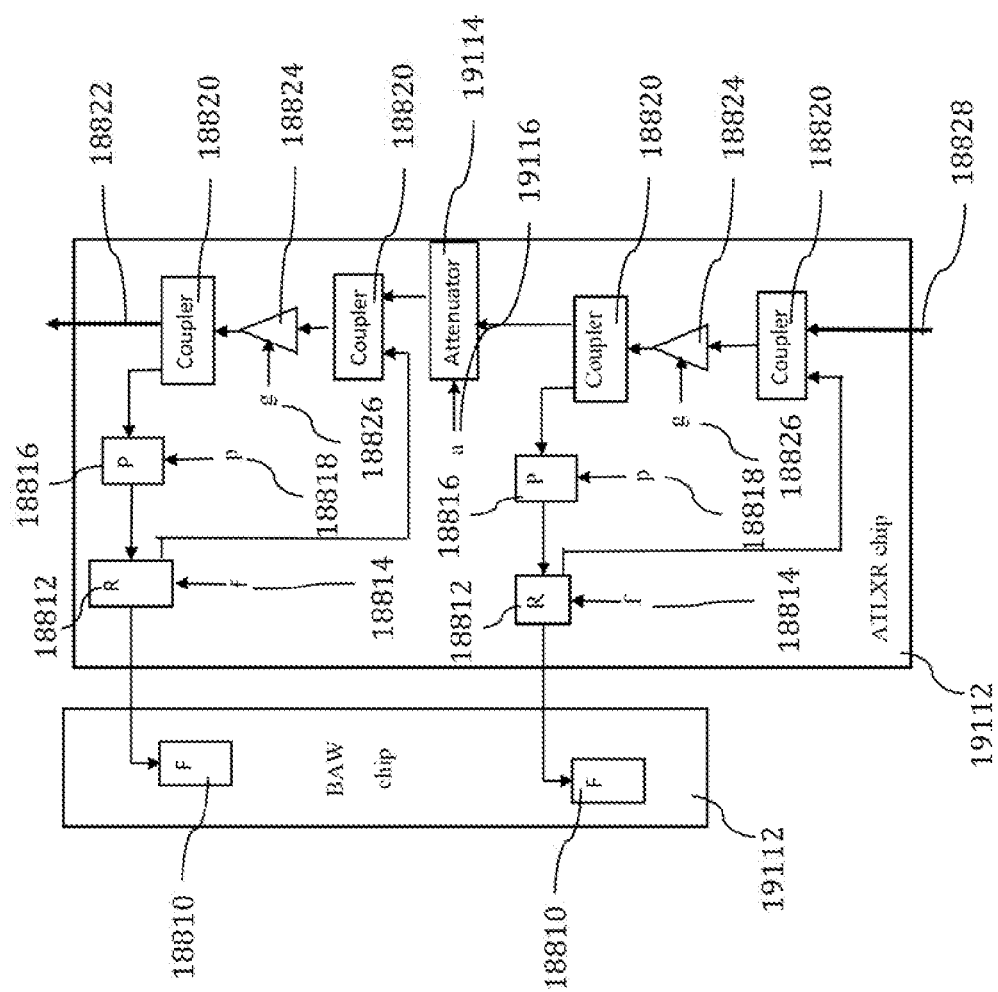

FIG. 191 is a block diagram showing a practical implementation with a multi-resonator BAW chip with single port resonators.

Figure 192:
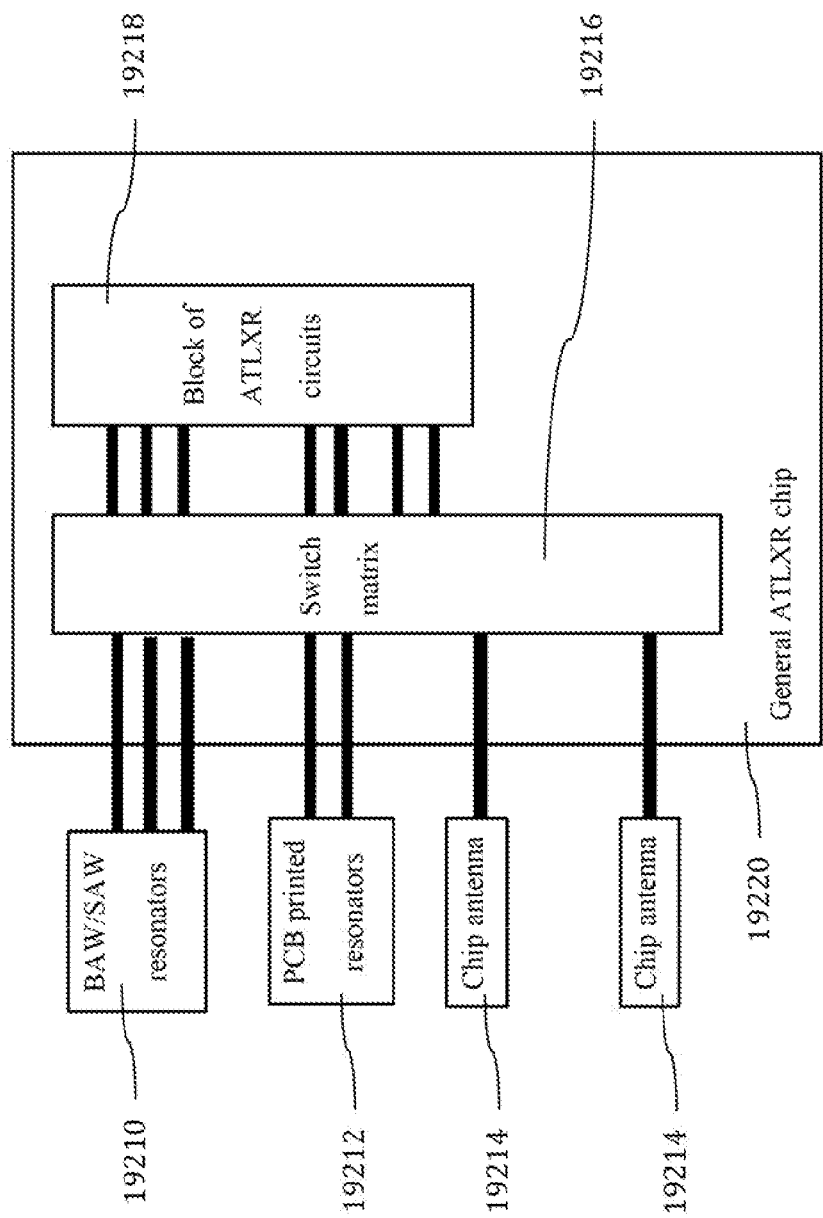

FIG. 192 is a block diagram showing a general ATLXR chip with a switch matrix and block of selectable ATLXR circuits.

Figure 193:
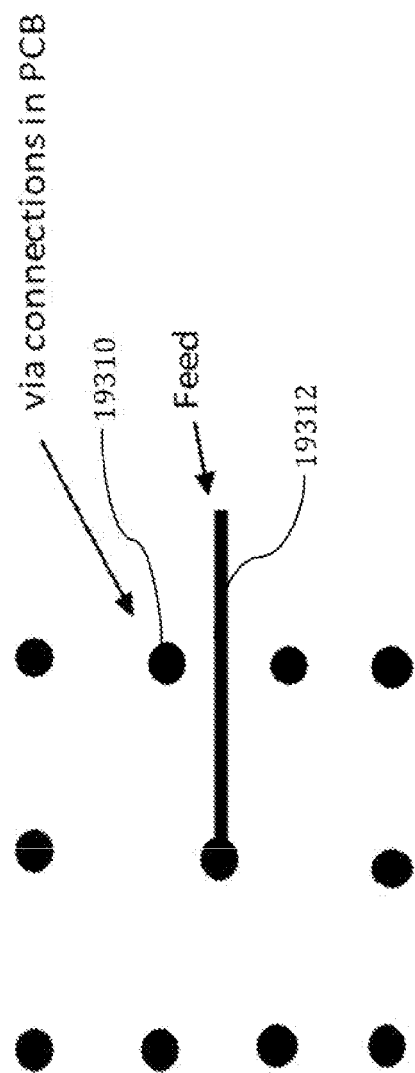
Figure 194:
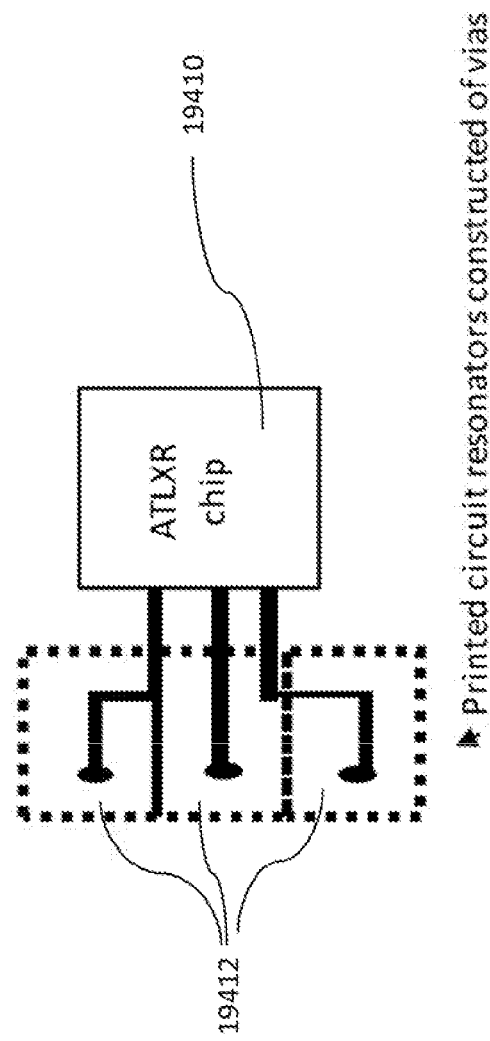

FIG. 193 is a diagram showing a moderately high Q resonator made with via connections in a PCB FIG. 194 is a diagram showing ATLXR Q enhancing resonators printed on circuit board.

Figure 195:
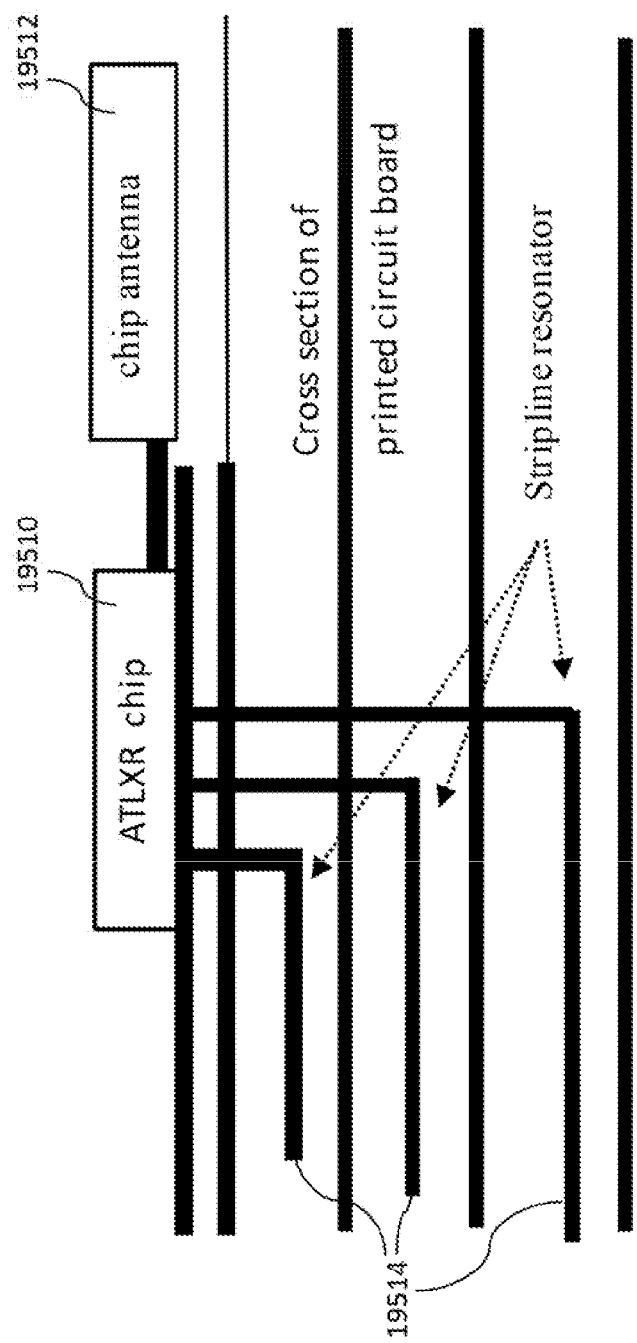

FIG. 195 is a diagram showing ATLXR Q enhancing strip line resonators printed on layers of a circuit board to save space with a chip antenna.

Figure 196:
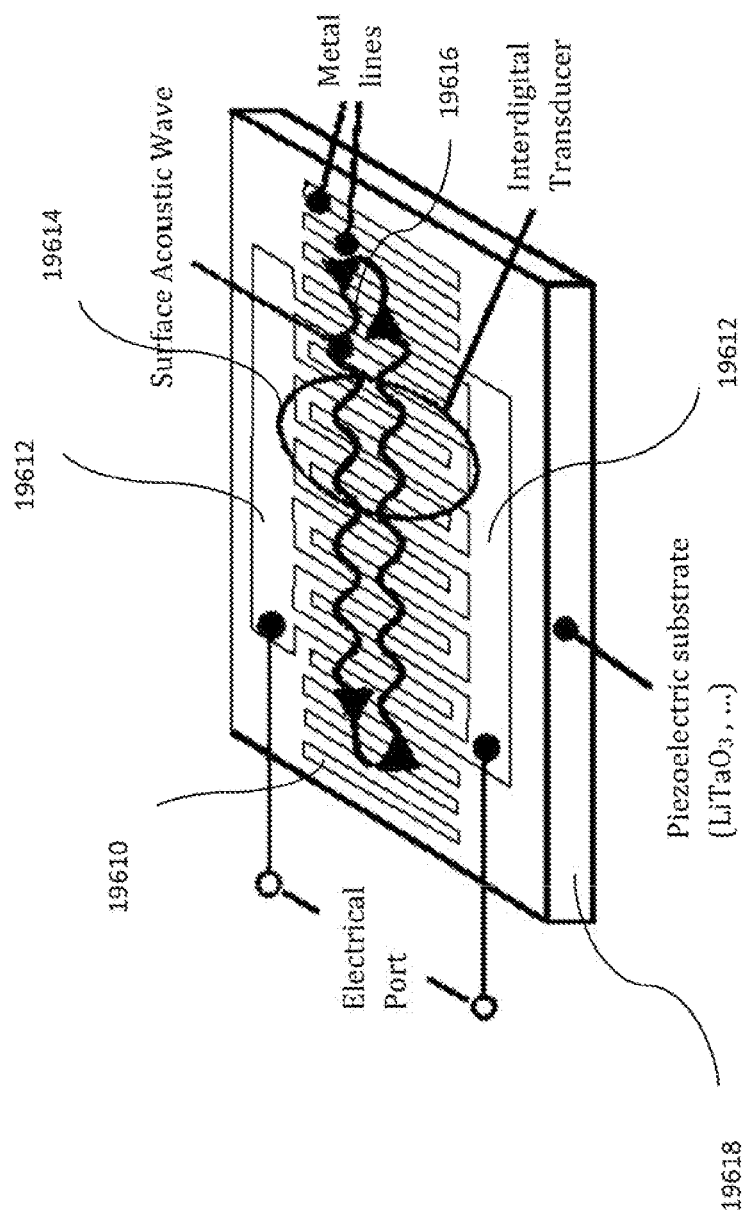

FIG. 196 is an illustration of a SAW resonator device.

Figure 197:
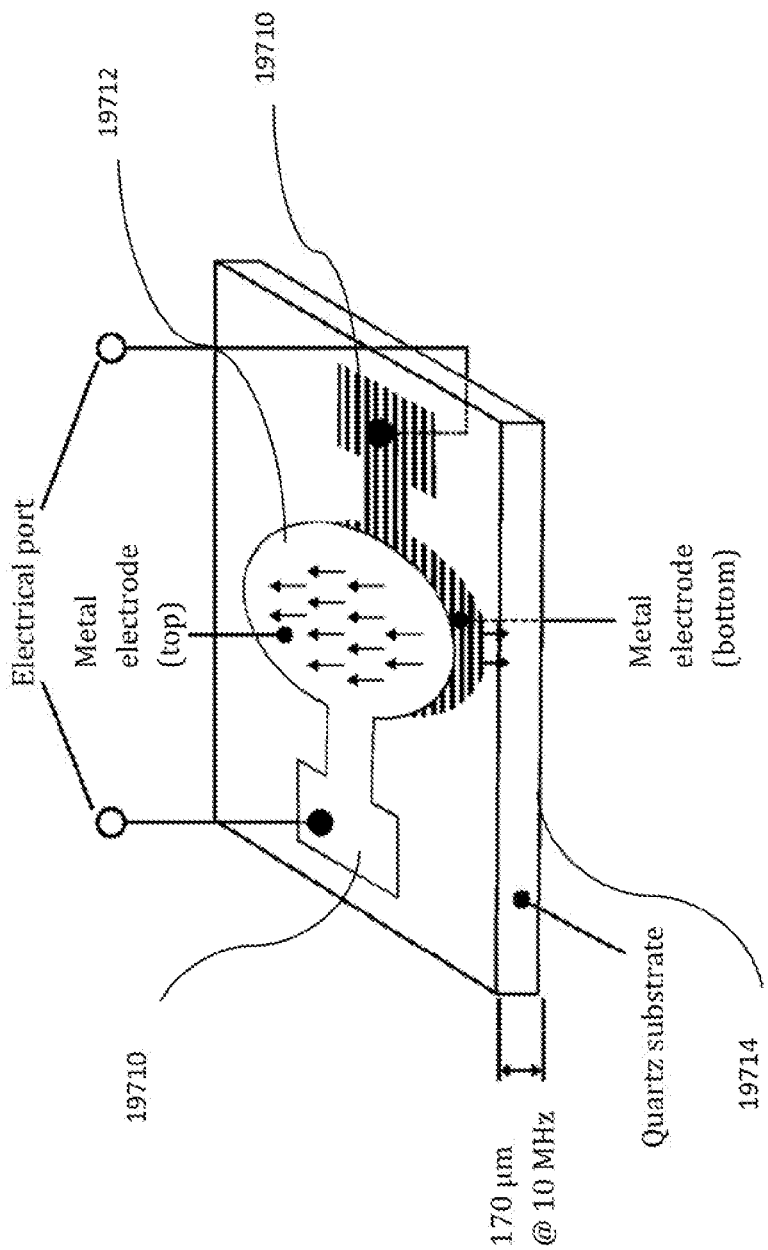

FIG. 197 is an illustration of a BAW resonator device.

Figure 198:
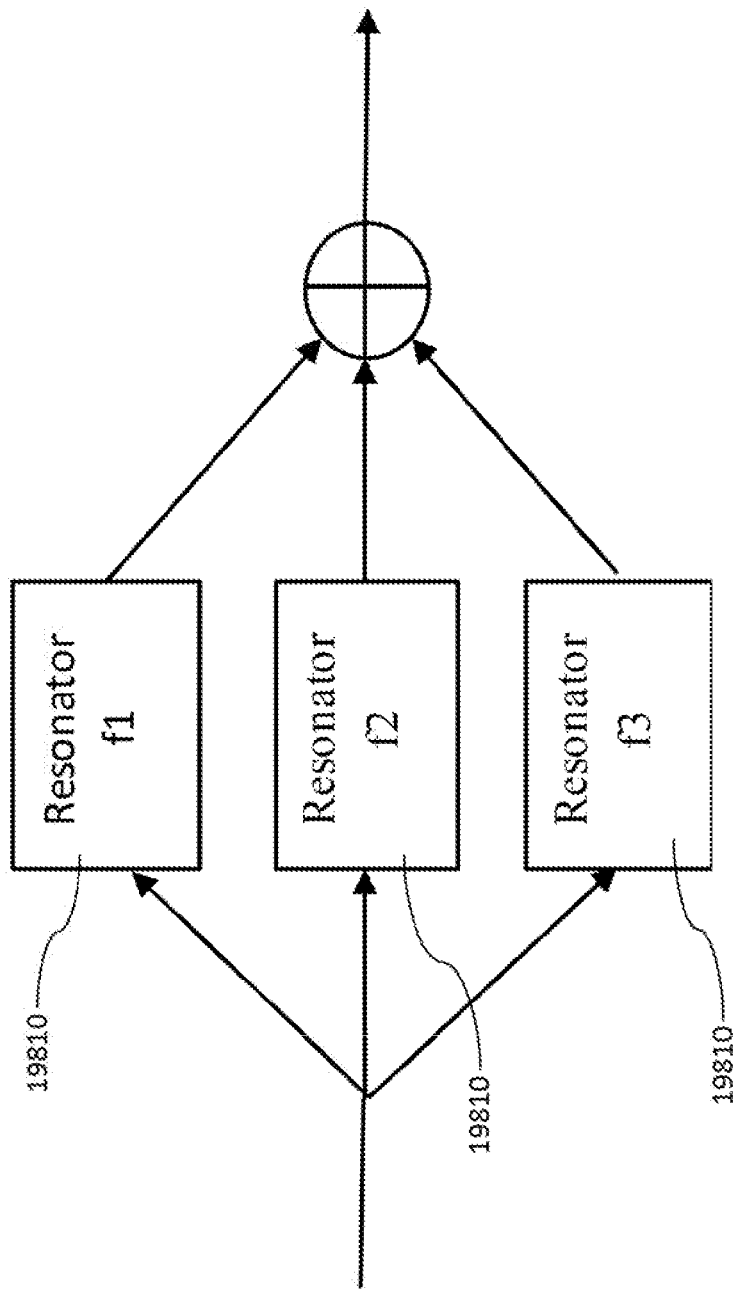

FIG. 198 is an illustration of an external BAW with three parallel resonators resonating at distinct frequencies of f1, f2, and f3, with each resonance associated with a Q on the order of 100.

Figure 199:
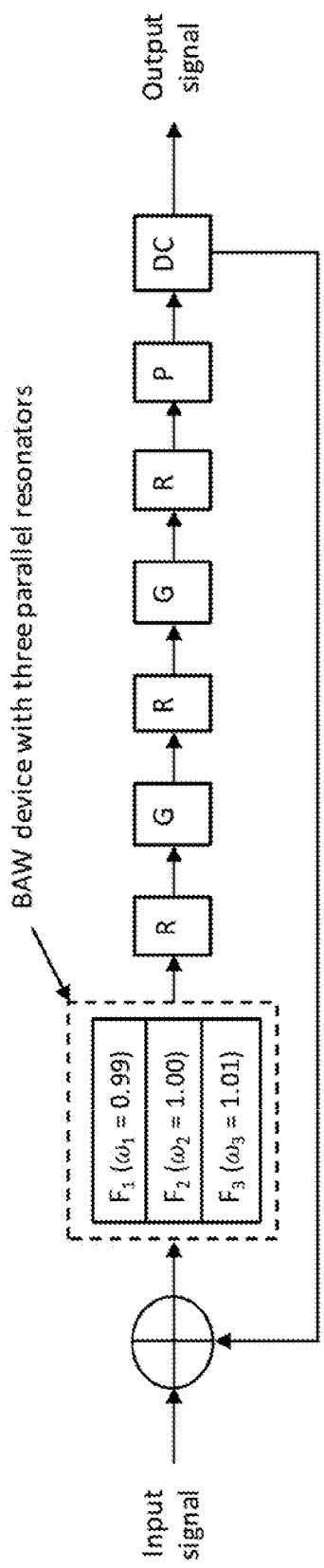

FIG. 199 is a block diagram of ATLXR implementation with a high Q primary resonator triplet coupled to a feedback path with three variable secondary ATL resonators with low Q.

Figure 200:
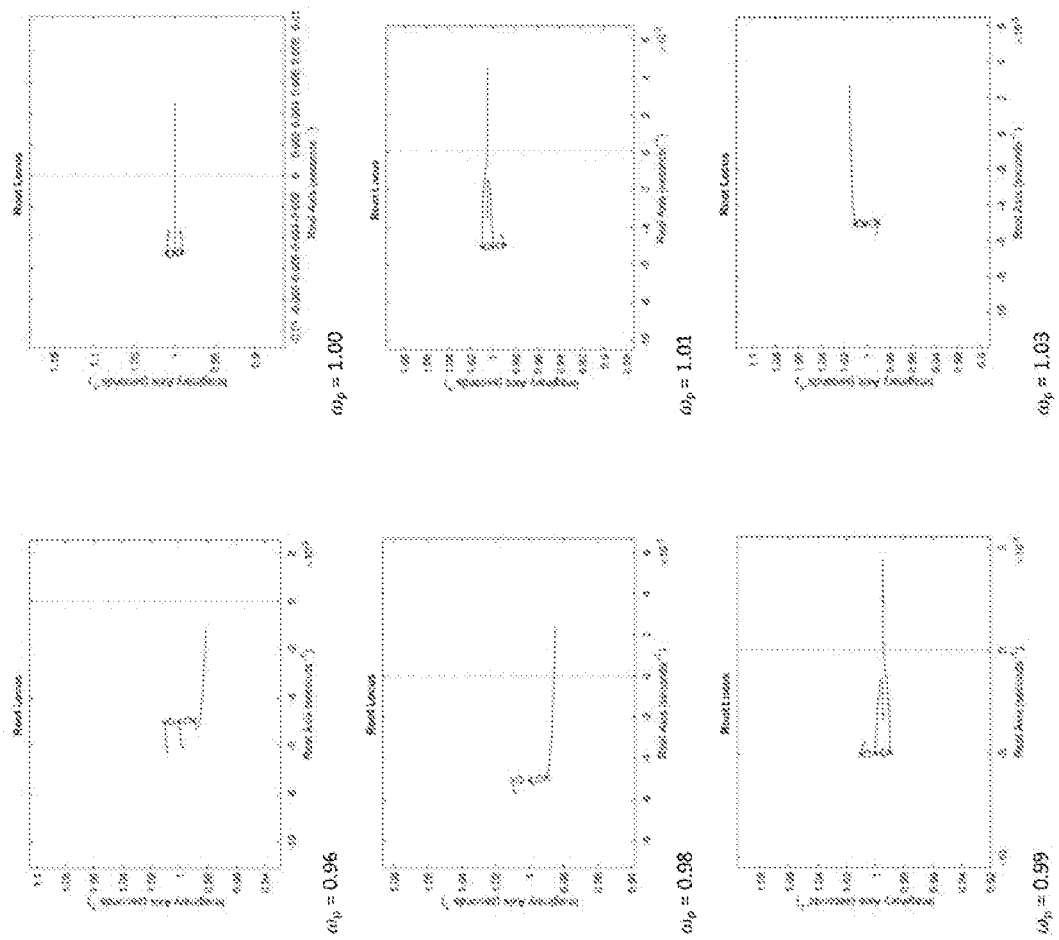

FIG. 200 is a series of root locus plots of ATLXR feedback example of FIG. 199 as the coupled resonant ATL frequency of R is varied.

Figure 201:
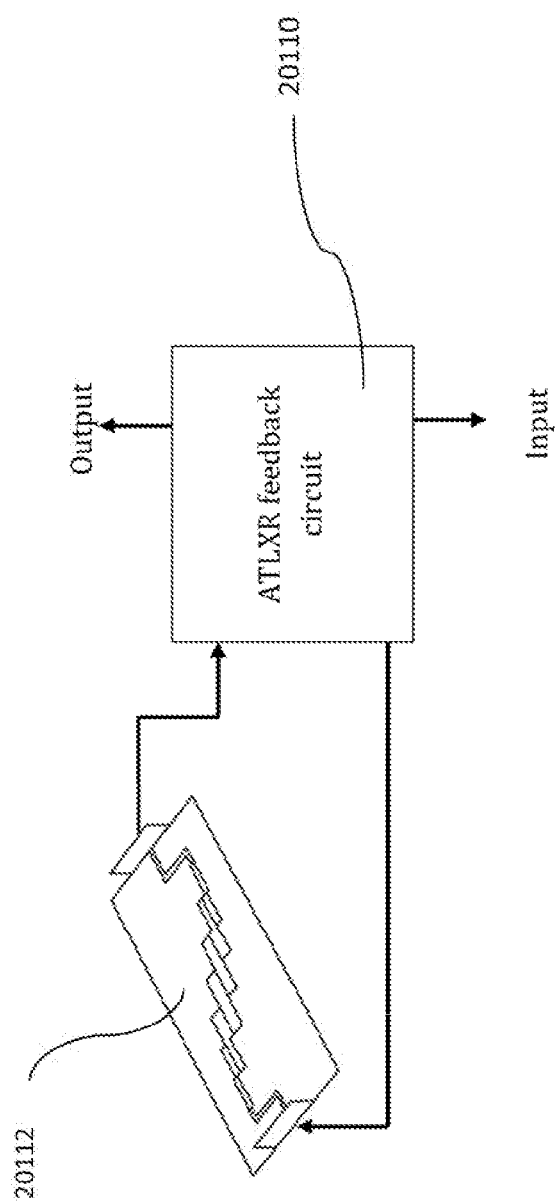

FIG. 201 is a diagram of a coupled line bandpass filter (circuit board) which may be considered as a general resonator.

Figure 202:
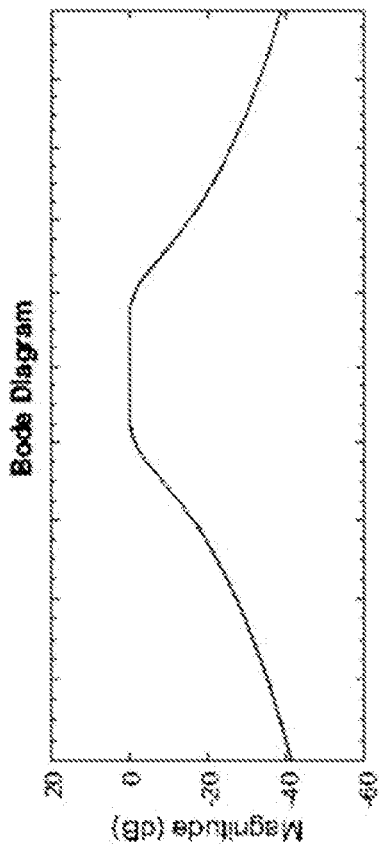

FIG. 202 is a plot of a filter response of a third order Butterworth filter as the primary ATLXR resonator.

Figure 203:
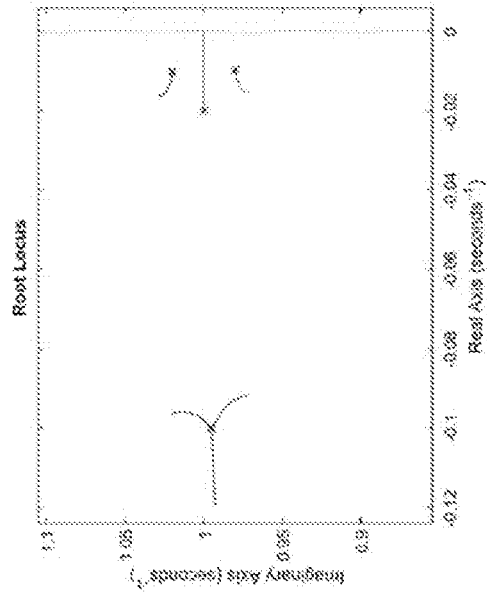

FIG. 203 is a plot of a root locus of the coupled external Butterworth filter showing Q enhancement of the center pole.

Figure 204:
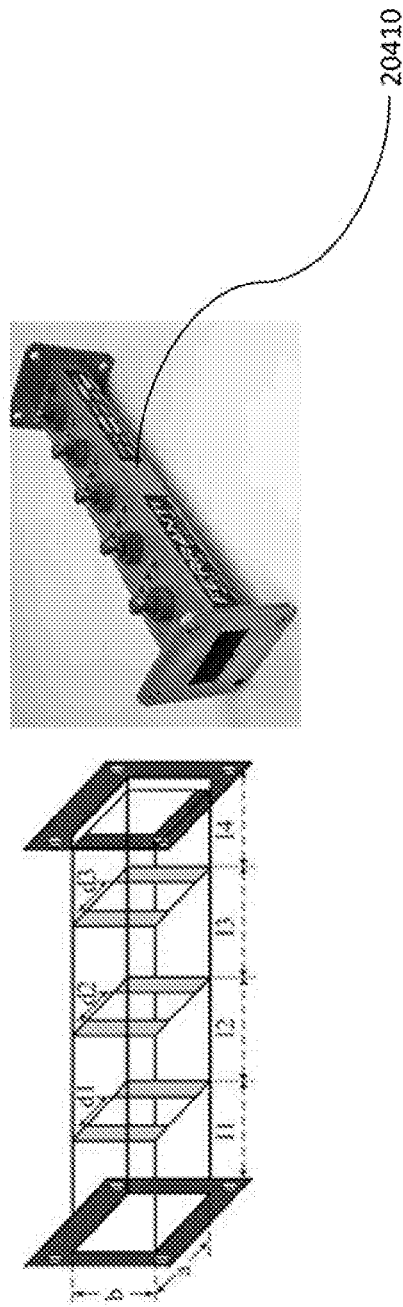

FIG. 204 is a diagram of waveguide filters that may be used as primary resonators for the ATLXR.

Figure 205:
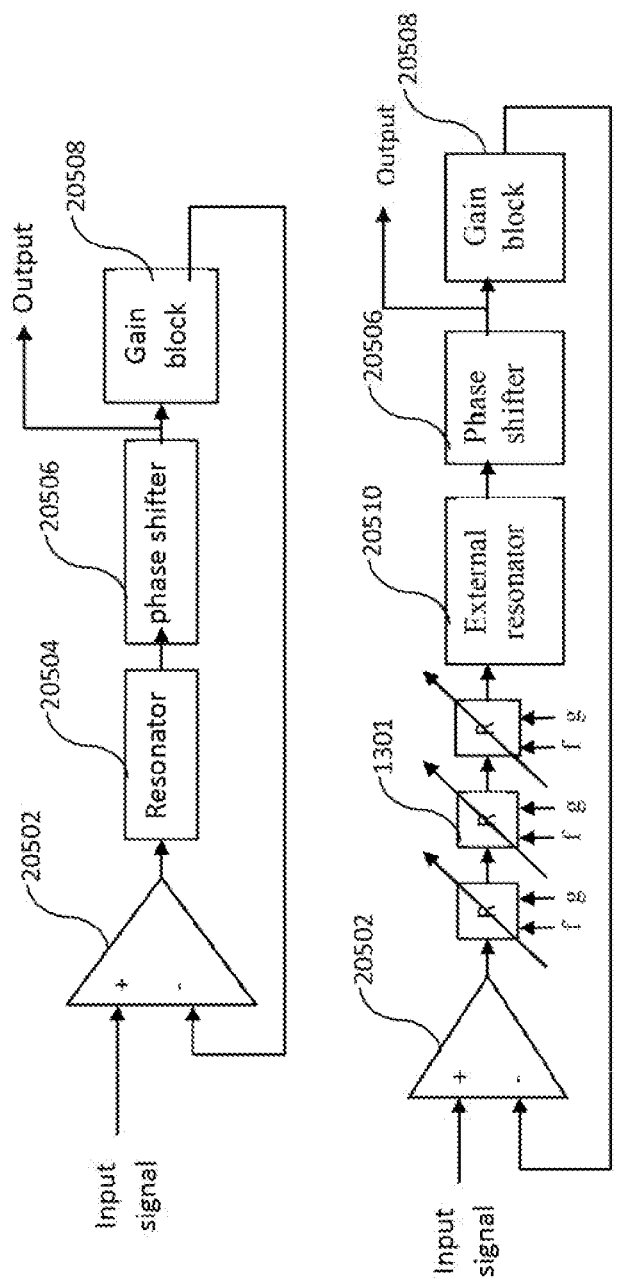

FIG. 205 is a block diagram showing an active amplifier enabling unidirectional ATLXR Category 1 coupling.

Figure 206:
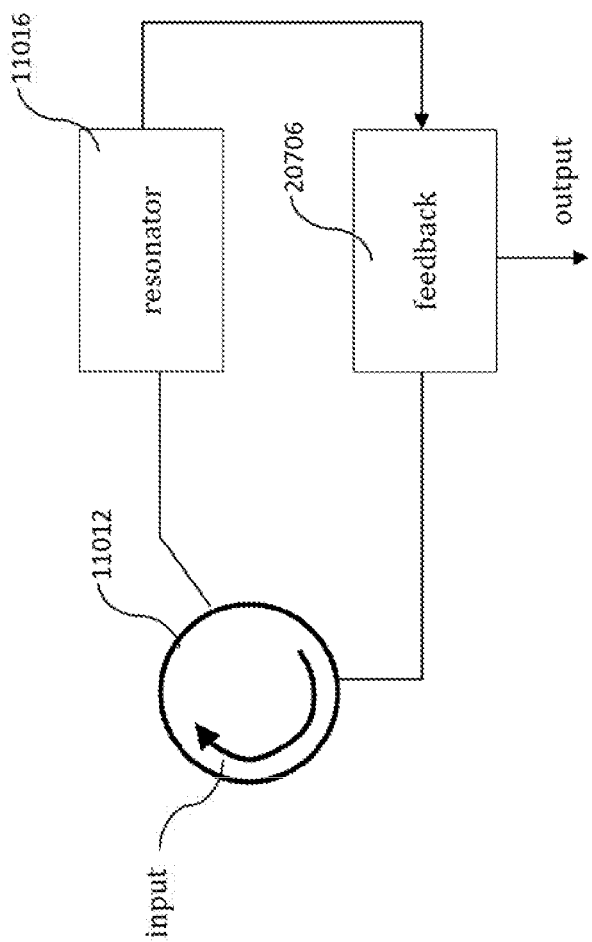

FIG. 206 is a block diagram showing an ATLXR Category 2 Bidirectional implementation with a circulator.

Figure 207:
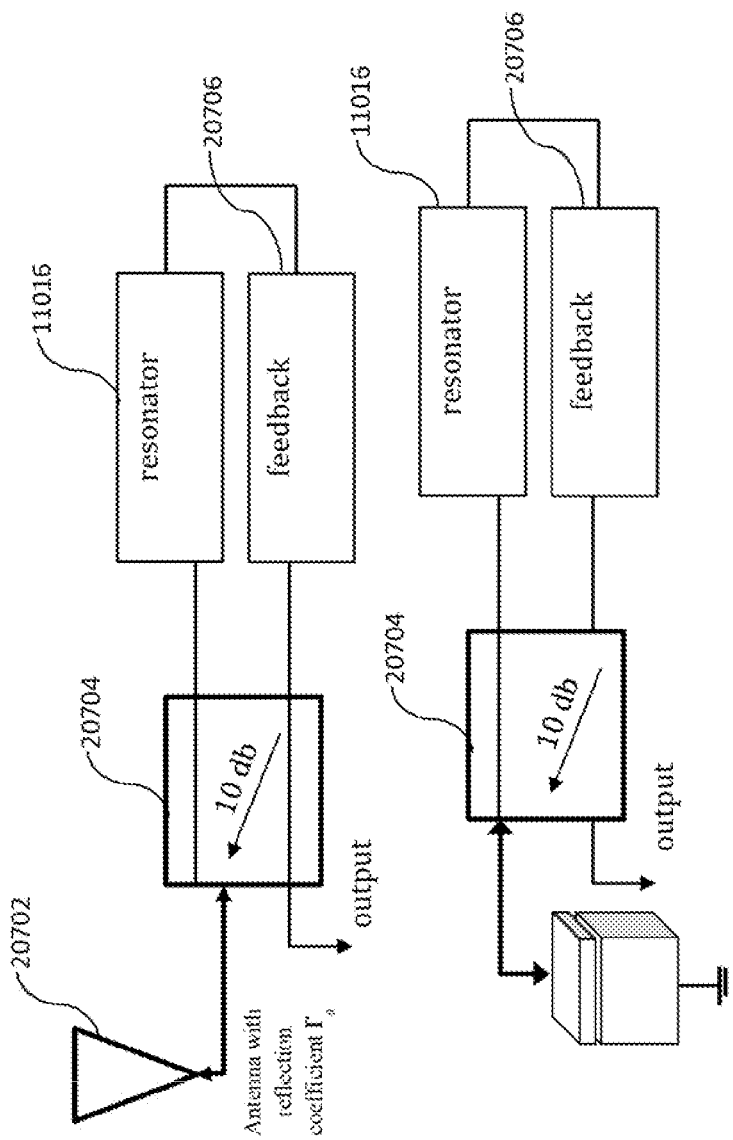

FIG. 207 is a block diagram showing the signal flow exchange of a Category 2 ATLXR implementation.

Figure 208:
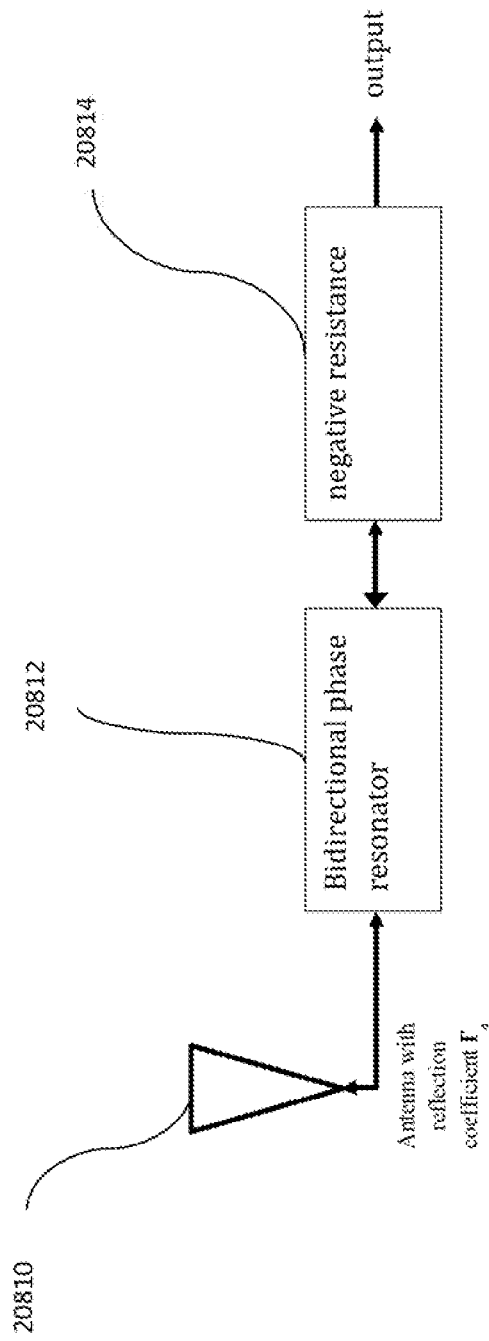

FIG. 208 is a block diagram showing a Category 3 ATLXR implementation.

Figure 209:
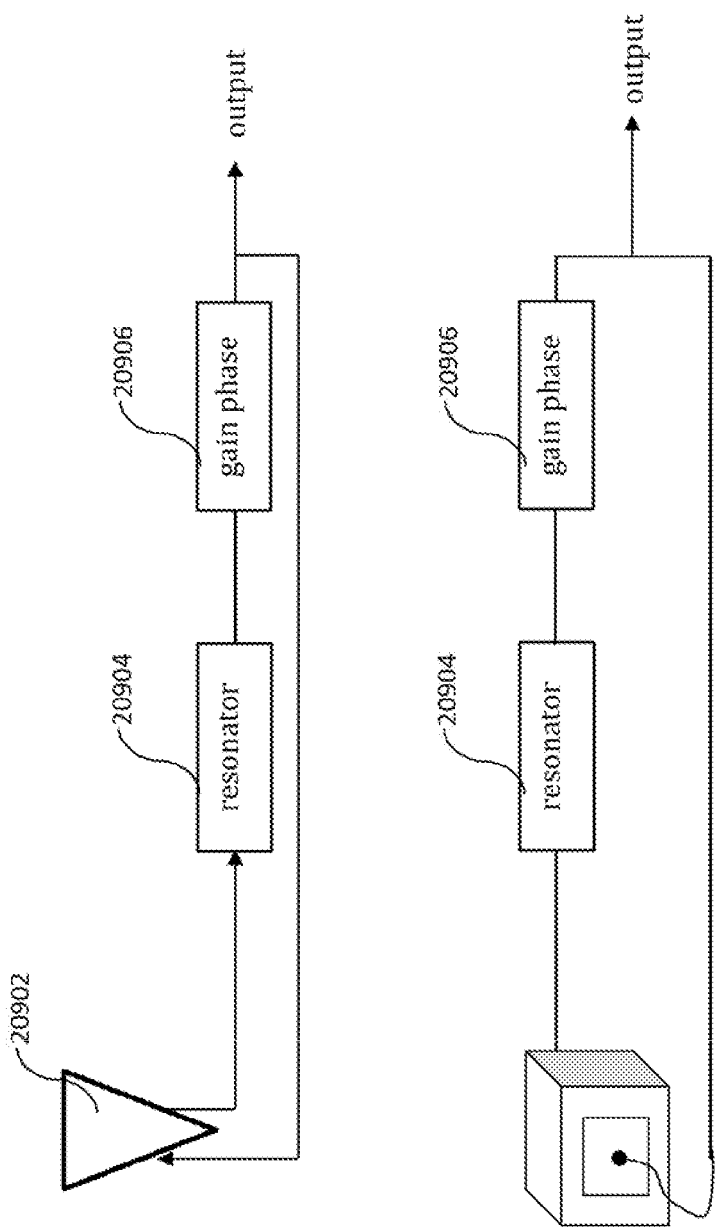

FIG. 209 is a block diagram showing an ATLXR Category 4 configuration.

Figure 210:
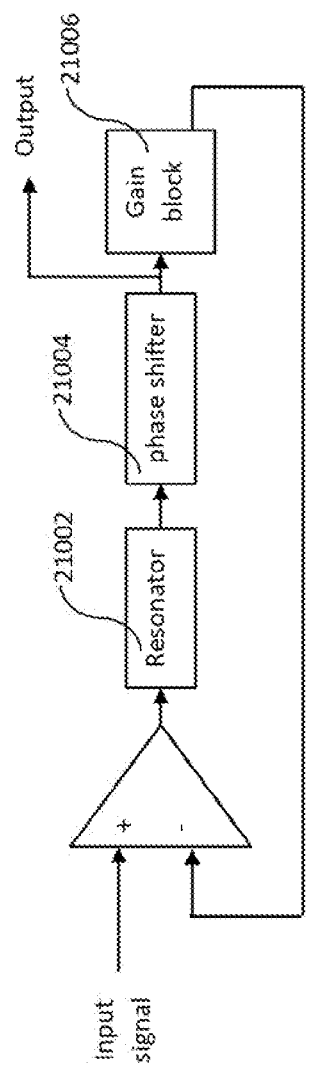

FIG. 210 is a block diagram of an ATLXR configuration with high Q primary resonator in series.

Figure 211:
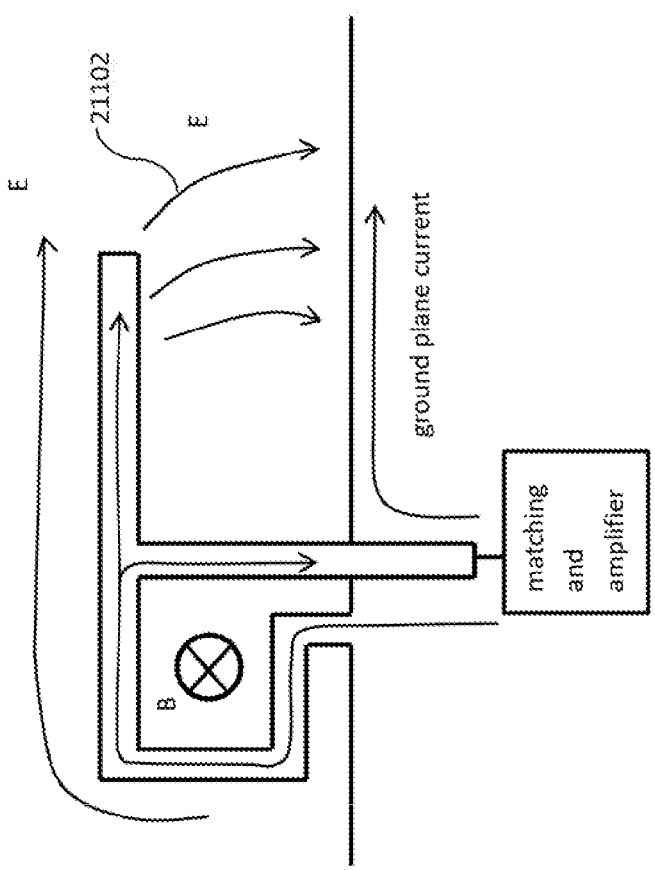

FIG. 211 is a block diagram showing the current flow and the resultant field generation, complicated by the current flow in the ground plane.

Figure 212:
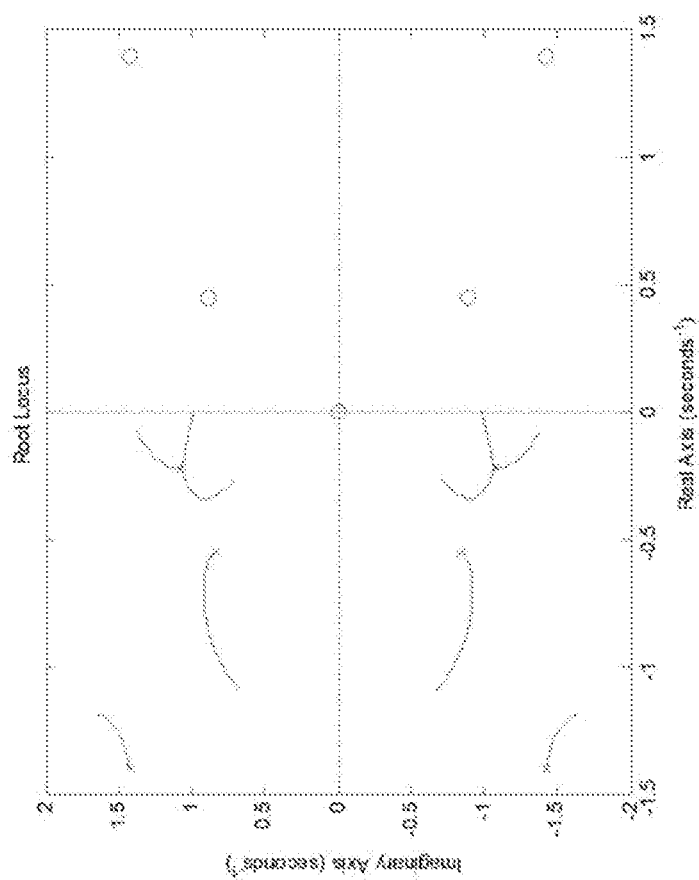

FIG. 212 is a graph showing the root locus of the ATL filtenna based on ATL3.

Figure 213:
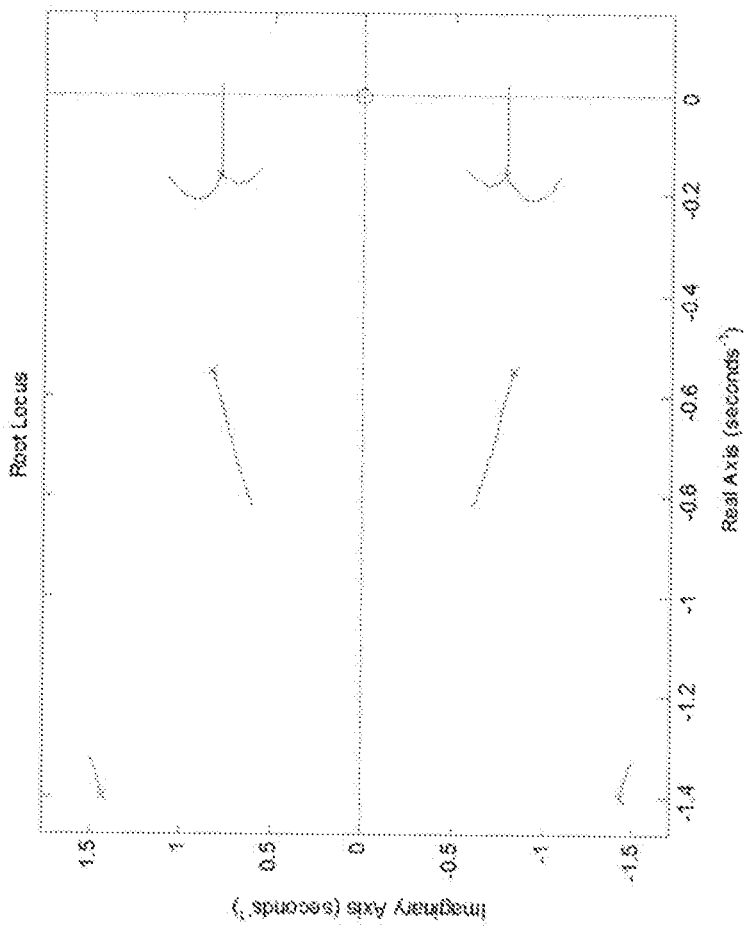

FIG. 213 is a graph showing the root locus of the ATL filtenna/ATL3 when varactors are set optimally.

DETAILED DESCRIPTION

There will first be described examples of variable resonators that may be used to control a primary resonator. There will then be described examples in which these variable resonators may be used, such as with antennas and filters such as SAW/BAW filters.

In addition to adjustable resonators and scaling blocks, modification of a primary resonator may also be achieved using an adjustable phase shifter, examples of which will also be described below.

Overview of ATL Active Analog Variable Bandpass Filter

In the present discussion, the variable resonator is preferably a resonator element of variable frequency that may be adjusted. The bandwidth of the tunable resonator filter may be controlled with feedback across the resonator element. The resonator bandwidth is preferably narrow enough to avoid spurious passband responses but still be able to tune over a broad range in frequency. There may also be a gain element, which may also be referred to herein as a scaling block, is adjustable to provide positive gain, negative gain, or zero gain. As will be described in more detail below, this allows the scaling block to act selectively as a Q-enhancer and a Q-spoiler, if required by the circumstances.

As used herein, the term "resonator" may be used to describe a simple resonant element, such as an LC tank circuit. The term may also be used in some cases to refer to a resonator in combination with a scaling block. In the discussion below, a resonator in combination with a scaling block connected in a signal loop is referred to as an ATL1 and will be described in greater detail below. Other, more complex resonant circuits will be described below, such as circuits that include multiple resonant elements, multiple scaling blocks, multiple loops, etc. Example of suitable variable resonators that may be used may be referred to herein as the ATL filter, which is described in greater detail in Nielsen. While other variable resonators may also be used, it has been found that such a circuit may be used in providing a workable circuit, and therefore a detailed description of the ATL is provided below.

In particular, the ATL may be considered as a variable analog filter, comprising a signal loop that includes a signal path and a feedback path connected between a signal input and a signal output. Multiple resonators and other loop control elements such as adjustable scaling gain blocks may be combined in the signal loop.

A controller is connected to tune the frequency tunable resonators and to adjust the gain factor of each adjustable scaling block toward a desired frequency response.

The ATL may be of different orders, such as a first, second and third order filter. The order of the ATL depends on the filter order of the resonator. The ATL may be designed with higher orders beyond the third order, although the complexity of controlling higher order circuits will increase. Some general comments on the filter order are:

A first order ATL (ATL1) would include one resonator that has a single dominant resonance pole pair.

A second order ATL (ATL2) would include two such resonators that have two dominant pole pairs, an example being a cascade of two coupled LC tank resonators.

A third order ATL (ATL3) would include three such resonators having three dominant pole pairs.

Fourth and higher order ATLs are possible, however these may result in spurious resonance bands when a scaling block feedback is applied, and generally result in a band pass filter (BPF) with more challenging tuning characteristics.

Figure 29:
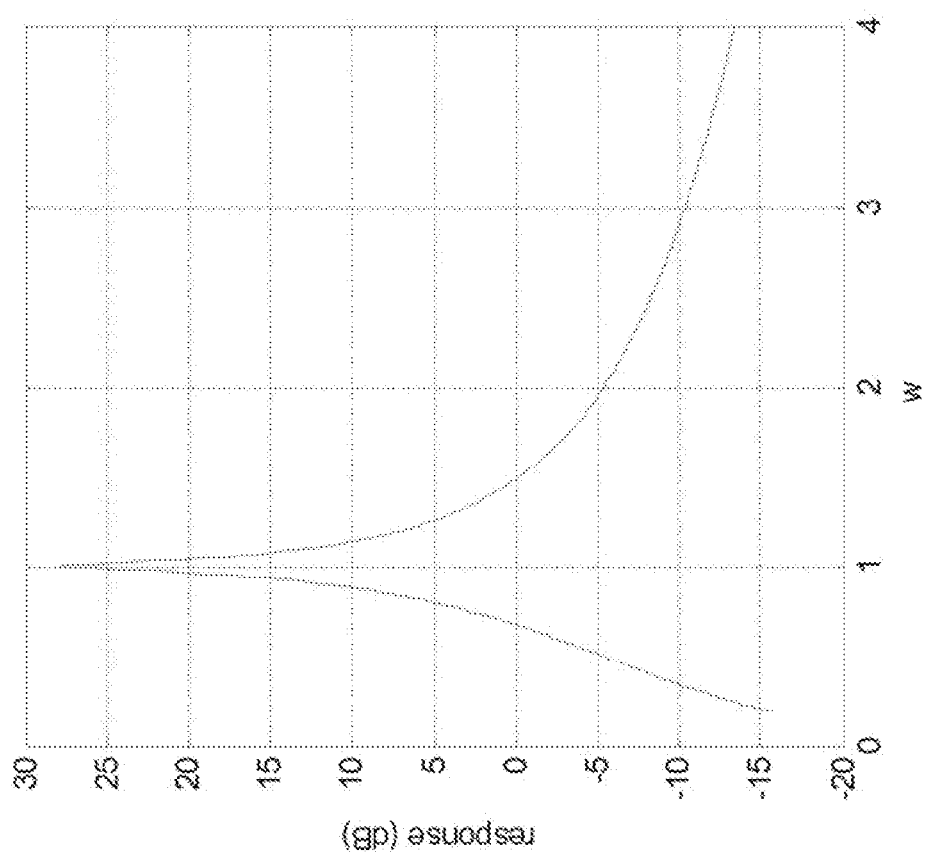
FIG. 29 is the frequency response of an example ATL1 after tuning.
Figure 30:
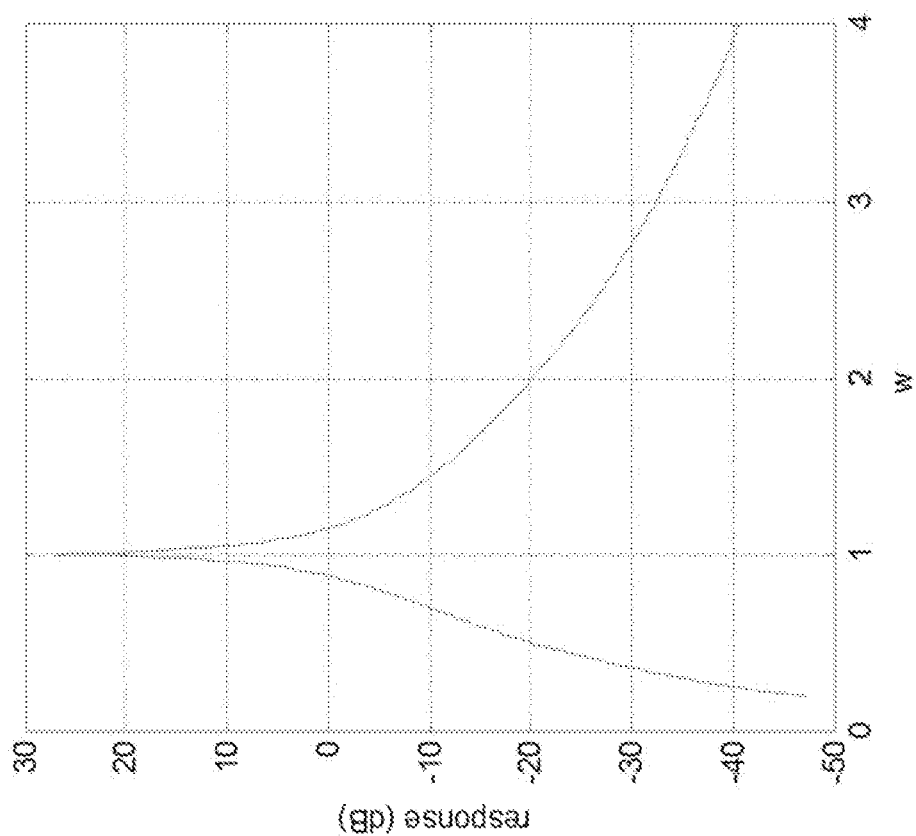
FIG. 30 is the frequency response of an example ATL3 after tuning.
Figure 31:
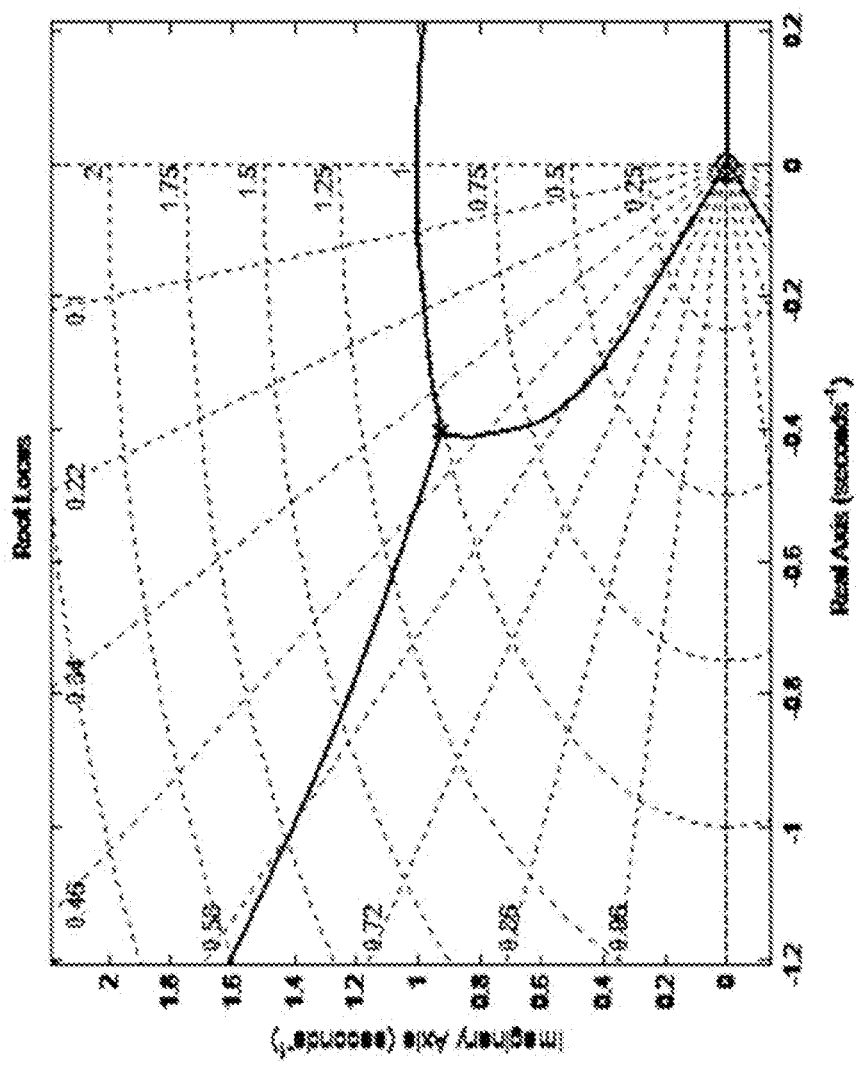
FIG. 31 is the root locus diagram of the example ATL3.

FIG. 29 shows the frequency response of an example ATL1 after tuning, while FIG. 30 shows the frequency response of an example ATL3 after tuning. FIG. 31 is the root locus diagram of the example ATL3 shown in FIG. 30.

Figure 1:
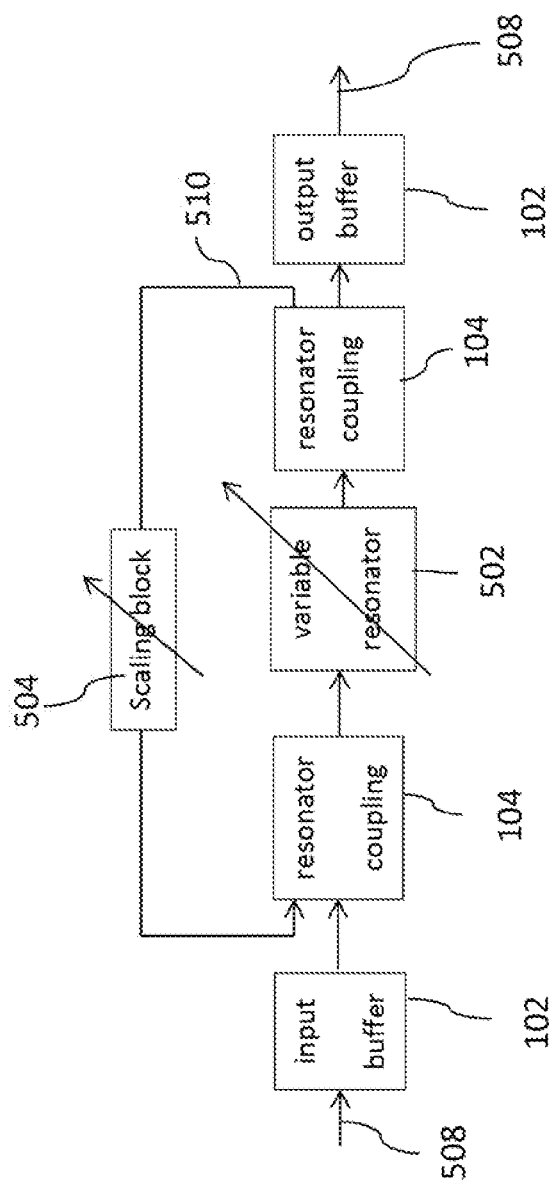
FIG. 1 is a block diagram of a variable filter with a variable resonator and a variable scaling block in a signal loop.

A block diagram of the simplest form ATL1 is shown in FIG. 1, with a single variable resonator 502 and a variable scaling block 504 in a signal loop. FIG. 1 also shows input and output buffers 102 and resonator couplings 104 on main path 508, with scaling block 504 being placed on feedback path 510. The ATL is intended to be used in the transmitting, receiving, and/or processing of communications signals for various purposes. Generally speaking, a communication signal is a modulated signal used to transmit information or data. Typically, this involves an analog carrier frequency that has been encoded with an information signal, using known methods, such as, but not limited to, frequency modulation, amplitude modulation, or phase modulation.

Figure 2:
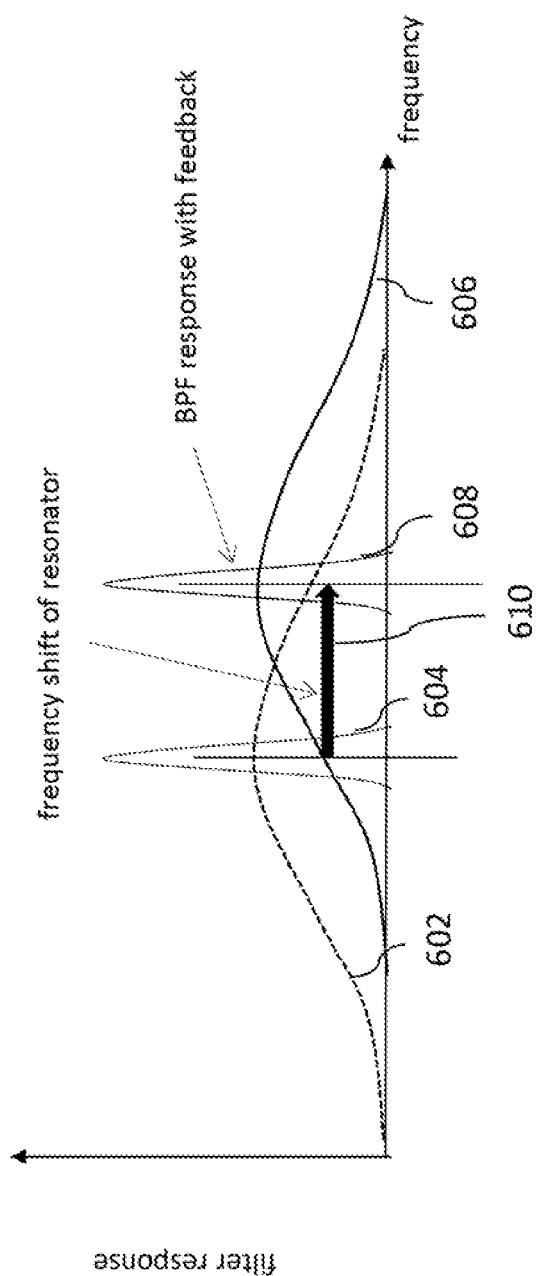
FIG. 2 is a graph showing the bandpass characteristics of a variable filter.

The fundamental operating principle of the ATL, which offers control of bandpass characteristics, is shown in FIG. 2, where the wide dashed trace 602 is the resonator frequency response at an initial setting. The narrow dashed trace 604 is the sharper frequency response of the closed loop filter set for a narrower bandwidth (higher Q) at the initial frequency setting. Assume that the resonator is now tuned upward in frequency to the wide solid trace 606 as indicated by the black arrow 610. The narrow solid trace 608 is the closed loop response that results at the new resonator response frequency.

The examples discussed herein will relate primarily to first (ATL1), second (ATL2) and third order (ATL3) ATLs, although it will be understood that the teachings herein may also apply to higher order filters if desired.

In the various examples presented herein, the circuits are, for convenience, typically depicted in the style of FIG. 1, which shows an arrangement having a main path 508 and a feedback path 510, and with the gain block 504 (which may also be referred to as a scaling block and which may have both positive or negative values) on the feedback path 510. This is done for consistency and to make it easy to compare circuits. However, the circuit is more appropriately considered as a loop with appropriate input and output couplings, where the loop is formed from what would otherwise be the main path 508 and the feedback path 510, and the elements are connected in series within the loop. As a loop, the order of the components in the loop may be changed while still being able to provide the desired resonance characteristics.

Elements of the ATL

Before turning to the structure of the ATL, the following ATL elements are discussed:

Tunable Resonator

Bandwidth or Q control scaling block

Phase shifter

Tunable ATL Resonator (R)

Figure 3:
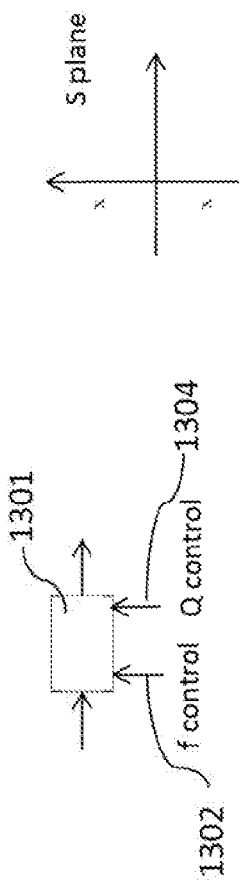
FIG. 3 is a visual definition of an elemental resonator, with S-plane poles.
Figure 4:
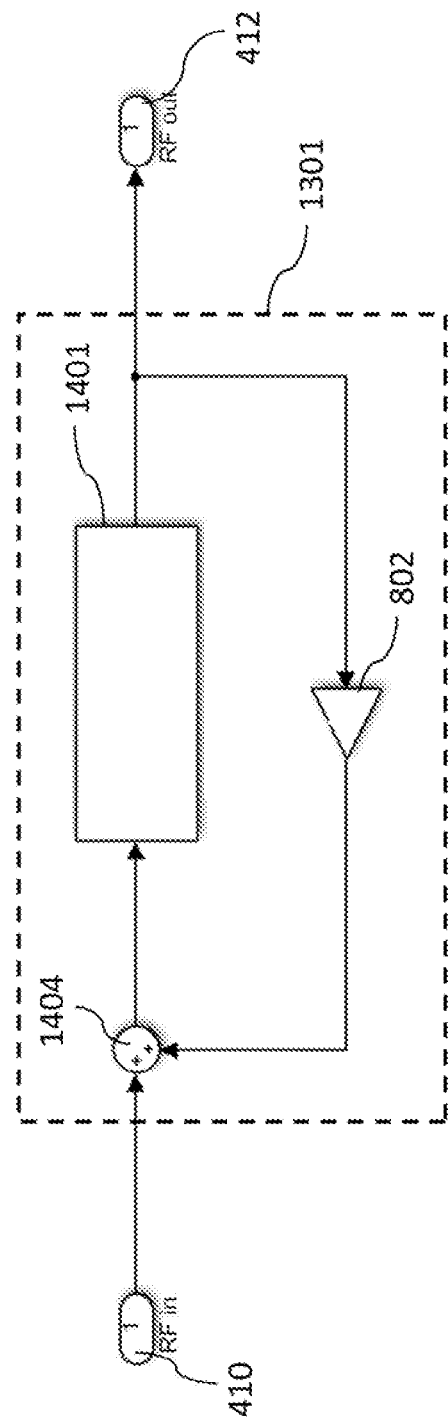
FIG. 4 is a block diagram of a first order variable filter ATL-1.

Referring to FIG. 3, a visual definition of an elemental resonator having s-plane poles is shown. The resonator block 1301 is shown in FIG. 3. Resonator 1301 is represented by two poles in the S-plane as is also shown in the diagram on the right of FIG. 3. The two poles are represented by 'x'. Resonator 1301 incorporates a feedback loop across a resonator element 1401 as shown in FIG. 4, which makes Q control possible. FIG. 4 is a block diagram showing a first order variable filter ATL-1, having an input 410, an output 412, and a resonator element 1301 having a combiner 1404, a resonator 1401, and a gain or scaling block 802. As depicted in FIG. 3, resonator block 1401, connected in a signal loop with gain or scaling block 802 as shown in FIG. 4 is the basic ATL resonator element 1301 that has two control inputs 1302 and 1304: one for changing the frequency (1302), and the other for changing the Q (1304).

Figure 8:
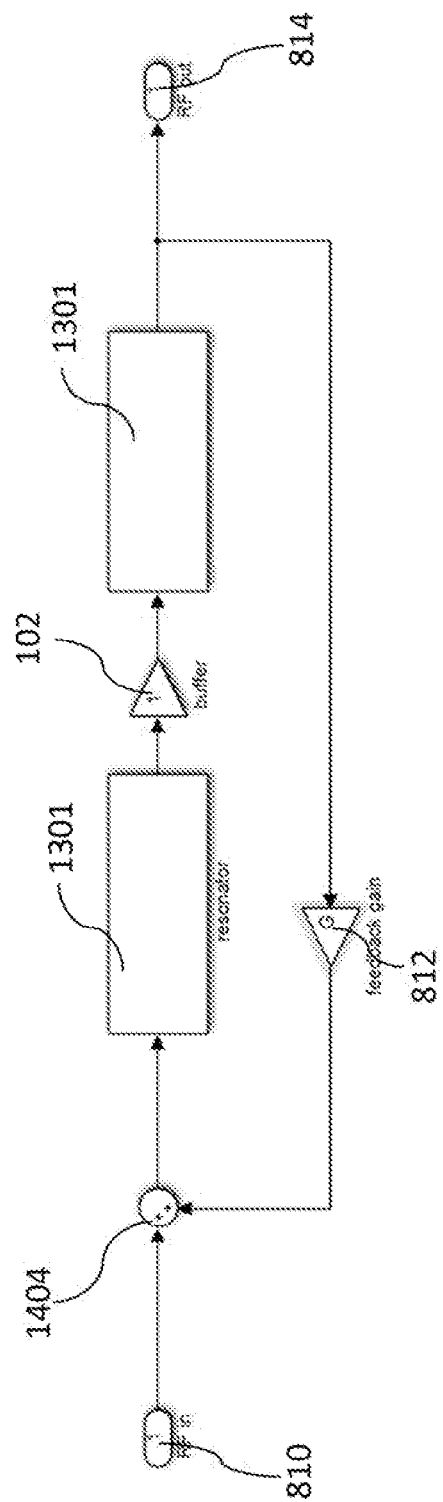
FIG. 8 is a block diagram of a second order variable filter ATL-2.
Figure 9:
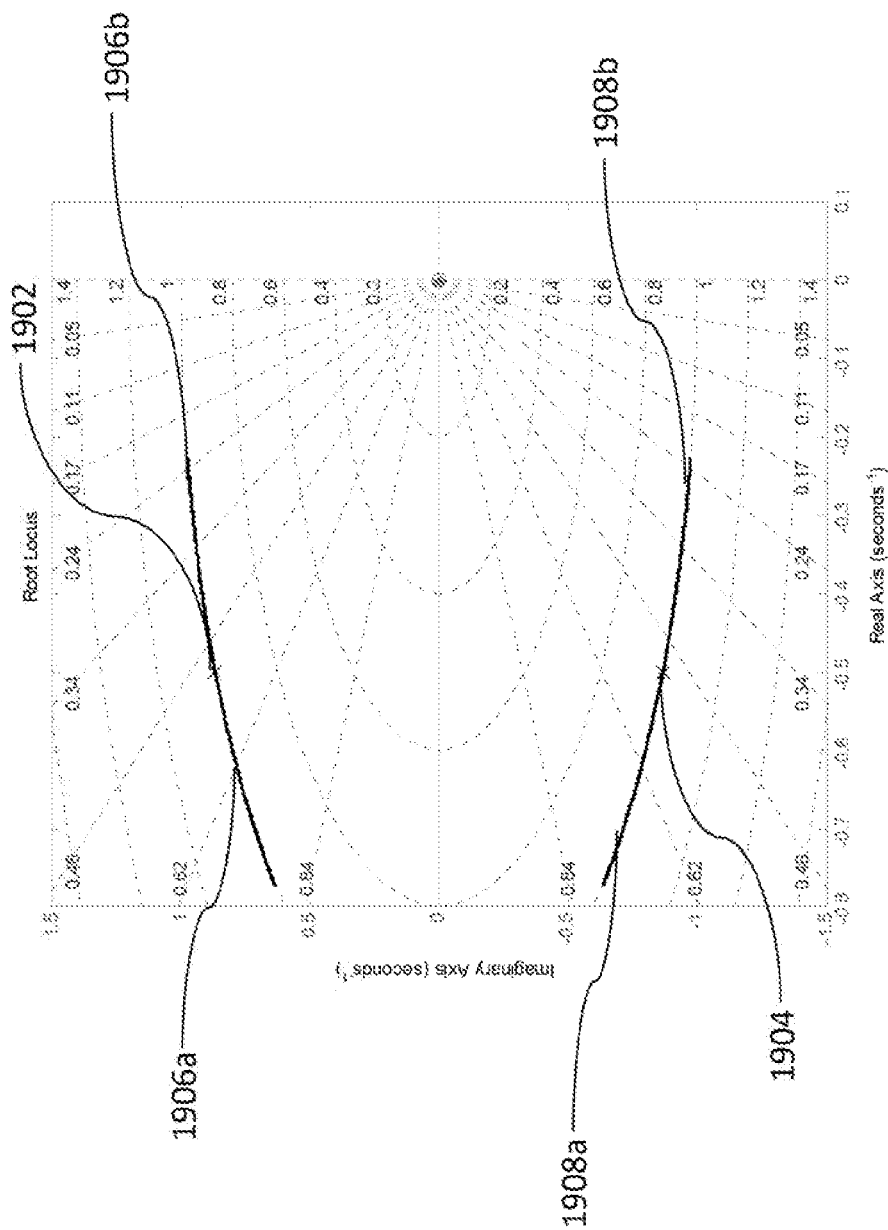
FIG. 9 is a root locus of the second order variable filter of FIG. 8.

Depending on the circuit being implemented, the resonator may be implemented either as a resonator element, such as a LC tank circuit, or as a Second Order Section (SOS) filter element. The SOS implementation will be discussed in more detail below. Referring to FIG. 8, a block diagram of a second order variable filter ATL-2 is shown, having input 810, combiner 1404, resonators 1301, gain buffers 102, gain block 812, and output 814. FIG. 9 shows a root locus of the second order variable filter of FIG. 8, with open loop roots indicated by 'x' and two poles located at and two conjugate poles at 1904 for this dual SOS resonator configuration. The dominant root trajectories 1906b and 1908b move toward the jω axis as the closed loop gain G is increased, while the other set of trajectories 1906a and 1908a move away from the jω axis.

As will be understood from the discussion herein, there are a number of possible combinations of resonators and scaling blocks, and signal paths that may be used in designing an ATL. The particular design will depend on the desired circuit performance, as is discussed elsewhere. Generally speaking, the ATL will include a feedback loop comprising a desired number of resonators and a scaling block. Each ATL may be connected in parallel or in series with other ATL elements, or other circuit elements, and may have an additional Level Two feedback loop that comprises multiple ATL. In addition, there may be nested loops within an ATL element, comprising a loop for each resonator, or subset of resonators. As used herein, the term "Level Two feedback" is intended to refer to a feedback or circuit loop that provides a feedback path around multiple ATLn elements in series. This may also include what could otherwise be referred to as a level three or level four feedback.

The resonant frequency of R 1401 may be varied with some component included in the resonator circuit. Typically, this may be accomplished using a varactor diode, or a variable dielectric capacitor may be used for a variable capacitance, in which case the 'f control' in FIG. 3 would be an analog bias voltage. Other variants that allow the resonant frequency to be varied are well known, such as a discrete capacitance that is switched in or out of the circuit and hence 'f control' may be a digital signal. Another variant is that a MEMS variable capacitor or a MEMS variable inductor could be used where 'f control' is a bias control voltage or current signal applied to the MEMS device. The variable capacitance or inductance may also be realized by mechanical tuning of a component. For instance, R 1401 could be a microwave resonance cavity in which one or more dimensions of the cavity are mechanically adjustable by some mechanism supplying 'f control'.

The two poles of R 1401 are a conjugate pair and cannot be controlled individually. Hence to simplify the description we consider only the positive frequency pole. We therefore consider the elemental resonator as having a single pole in the domain of s (that is the region of s with positive imaginary component). Element 1301 of FIG. 4 is a two port device with a transfer function given in the Laplace domain, denoted as above as a standard second order bandpass transfer function $H_R(s)$:

$$H_R(s) = as/s^2 + 2D\omega_n s + \omega_n^2$$

Q-Control Scaling Block

The 'Q control' 1304 in FIG. 3 above may comprise a control device associated with the resonator that controls the component Q of the capacitance or the inductance or resonant cavity. If the Q control increases the component Q, this is referred to herein as Q-enhancement. If the Q control decreases the component Q of the resonant cavity, this is referred to herein as Q-spoiling. Q-enhancement is equivalent to decreasing D, thus moving the resonant pole of R closer to the jω axis of the S-plane. Q-spoiling is equivalent to increasing D, thus moving the resonant pole of R further from the jω axis hence increasing D. It has been found that Q-enhancement and Q-spoiling may be used selectively to move a resonant pole towards or away from the jω axis to synthesize an arbitrary multi-pole filter function (plurality of R's).

Scaling blocks 802, as in FIG. 4, are provided in order to enable better control over the feedback response. The gain factor for each scaling block 802 is variable and comprises a gain that includes both positive and negative gain values. For example, if the gain of the scaling block 802 is greater than zero, there results Q-enhancement. If the gain of the scaling block 802 is less than zero, there results Q-spoiling.

Q-spoiling may be alternately implemented within the resonator element itself by inserting an FET circuit across the resonator element that increases the loss of the resonator. In this manner, the scaling block 802 need only have positive gain.

In general, there will be an additional scaling block for each loop or secondary loop in an ATLn element as discussed below. As an example, for a ATL3 circuit element (see FIG. 20 for reference), where a series of three ATL1 core modules are connected within a loop and may be separately controlled, there may be four scaling blocks—one surrounding each resonator element in loops 110, and one Level Two feedback scaling block in loop 110a, as will be discussed below.

Generally, each scaling block will be capable of enabling Q-enhancement resonators and Q-spoiling resonators independently. Alternatively, the resonator may be a Q-enhanced resonator, which uses an amplifier that only allows for Q-enhancement. As noted above, the Q-enhanced resonator would still be nested within the feedback loop of the ATLn element comprising a scaling block to override the Q-enhancement and provide a desired Q-spoiled performance as required. This will, of course, be apparent from the fact that the resonator may be any type of frequency tunable resonator comprising, but not limited to, a varactor diode, a switched discrete capacitor, a variable dielectric capacitor, a variable capacitor, such as a MEMS variable capacitor, a fixed inductor, a variable inductor, such as a MEMS variable inductor, or a mechanically adjustable resonator.

ATL Phase Shifter

It has been found that the closed loop passband of the ATL1 core module consists of a range of frequencies where the open loop phase shift of the center frequency is a multiple of 360 degrees. Consequently, a number, n, of serially connected ATL1 core modules must have phase control across the serial connection. For example, when n=3 and we have three ATL1 core modules connected in series creating the ATL3 mentioned above, the phase control must be provided such that the end to end phase shift is a multiple of 360 degrees.

We shall show later that there are a variety of ways to accomplish this phase control.

Topology of the ATL1 Core Module

There will now be described a first order of the ATL circuit, denoted ATL1, which comprises a single resonator component 1401, a single gain or scaling block 802, and a combiner for closing the feedback loop as depicted in FIG. 4. The ATL1 is the core module of the ATL variable filter in that all variants of the ATL variable filter use various combinations of this ATL1 core module.

ATL1 core module may be described in a simplified way if the center frequency control of the ATL1 core module is omitted. This provides an intuitive method of understanding the ATLn variants, all based on this ATL1 core module. In one example, resonator 1301 may be a second order bandpass filter with a transfer function of:

$$\frac{1}{s^2 + 2D\omega_o s + \omega_o^2}$$

with coefficients evaluated based on D and $\omega_o$. The gain G 802 is variable and controls the closed loop Q. Note that at resonance the phase shift through the resonator 1401 is ideally 0 degrees. In the physical implementation the phase shift will not be zero in general due to parasitics and transport effects, but these may be ignored in this evaluation: the implemented circuit may require a phase shifting element associated with G 802 that will compensate for any parasitic and transport phase effects, as is discussed later. To vary the frequency, it is necessary to change $\omega_o$ of the resonator in the ATL1, but this is ignored in this section.

It should be noted that, according to the notation used herein, the first order ATL1 core module has a resonator of first order. What is referred to in "order" is the number of Second Order Sections (SOS) used that make up the overall resonator. An SOS transfer function refers to a Laplace function of frequency variables that are second order in the denominator. In the present context the SOS, as seen above, will always have the form of $$H_{SOS}(s) = \frac{as}{s^2 + 2D\omega_o s + \omega_o^2}$$

where $\omega_o$ is the resonance frequency in radians per second, D is the damping coefficient, and a is a real constant. The mapping to fin FIG. 3 is $$f_n = \omega_n/2\pi$$

The mapping to Q is given by the conventional definition of $$Q = \frac{\text{center frequency}}{3 \text{ dB bandwidth}} = \frac{\omega_n}{2D\omega_n} = \frac{1}{2D}$$

In this discussion, $\{f_n, Q\}$ may then be used interchangeably with $\{\omega_n, D\}$.

Figure 5:
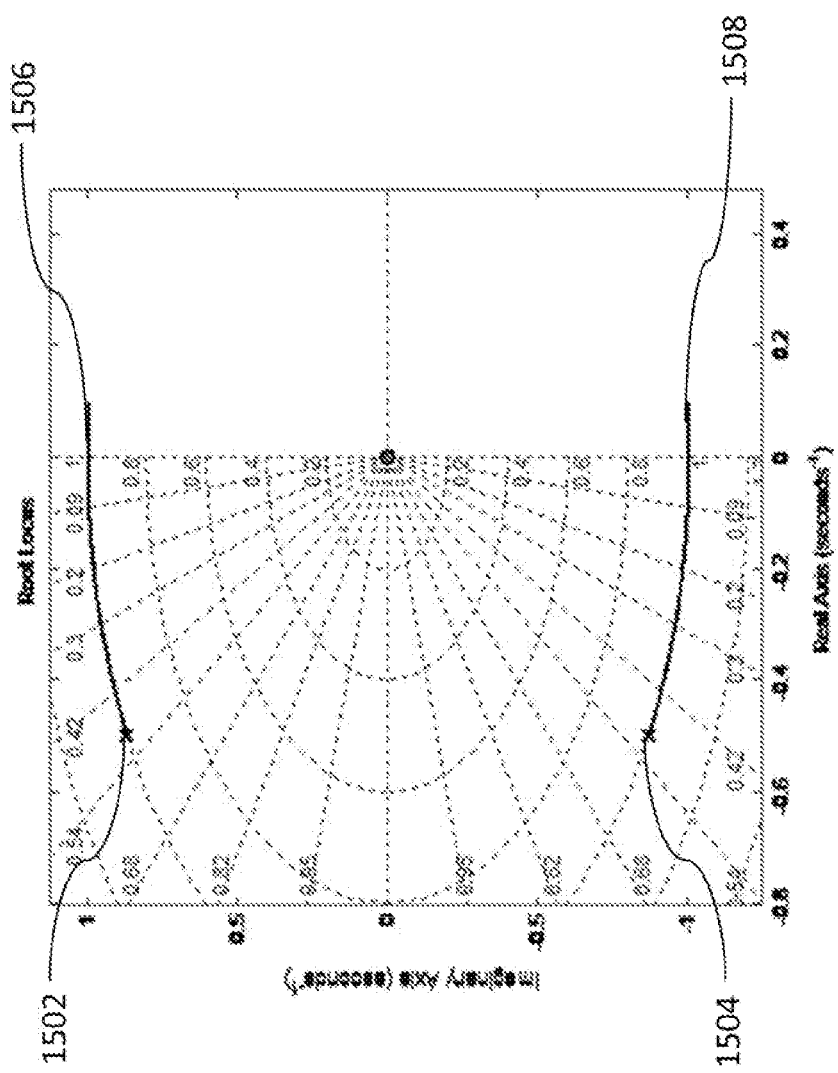
FIG. 5 is a root locus of the first order variable filter of FIG. 4.
Figure 6:
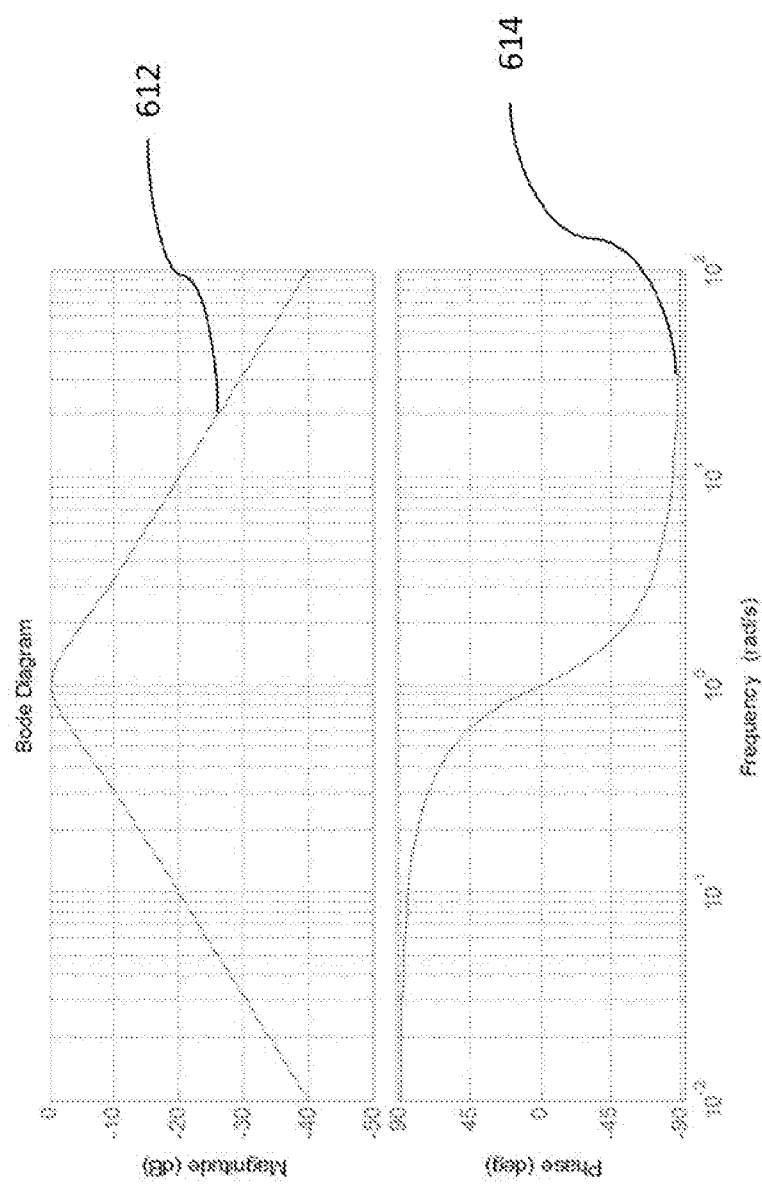
FIG. 6 is a Bode plot of the first order variable filter of FIG. 4.

An insightful analysis of the operation of the ATL1 is possible with the use of the root locus method. The root locus is a standard method of determining the poles of a closed loop system given a variable loop gain. The outcome of the root locus calculation in the present context is the trajectory of these closed loop poles as they change with variations in the loop gain G as shown in FIG. 5 for example. FIG. 5 is a root locus of the first order variable filter shown in FIG. 4. The poles are shown at 1502 and 1504, while the root locus of the poles are shown at lines 1504 and 1508. With this we can get an understanding of any spurious passbands and any tuning limitations of the ATL1. As an initial illustrative example let us assume that $\omega_o=1$ and D=0.5, in which the ATL1 SOS resonator has a very low Q for this example. The Bode plot of the transfer function of the resonator is shown in FIG. 6, which is a bode plot of the first order variable filter shown in FIG. 4. FIG. 6 shows a plot of the magnitude 612 and phase 614 changes with frequency. Note that the phase change with frequency is rather gradual around resonance due to the high damping factor (low Q) assumed in this example.

Now we consider the effect of the feedback gain G on the closed loop poles. This is calculated by the 0 degree root locus calculation and is shown in FIG. 5. Here the poles of the ATL1 core module SOS resonator are represented by an x (1502 or 1504). Line 1506 is the closed loop root trajectory as the closed loop gain G is increased from 0 to 1.2. This is the trajectory for the pole indicated by number 1502. The root locus of the conjugate closed loop root trajectory 1504 is line 1508. Note that these move towards the jω axis of the S-plane (root locus in the domain of the complex frequency variable s=σ+jω) indicating a progressively higher Q as the closed loop gain G is increased. If the closed loop gain was decreased as with Q spoiling, then the root locus of the poles 1506 and 1508 would move away from the jω axis (not shown in FIG. 5). In FIG. 5, when the root locus trajectory crosses into the right hand plane, the closed loop roots are unstable.

In this unstable region of operation the ATL1 is not usable and root trajectories cease to be meaningful. Hence we only need to plot over the range of G in which the closed loop poles remain in the left hand plane (LHP). Incidentally, for the value of G for which the closed loop poles coincide with the $j\omega$ axis, the ATL1 oscillates at the resonant frequency of $\omega_o$, which is normalized in this example to $\omega_o=1$. The radial dotted lines in the root graph indicate the damping value of D. Q may be related to D based on the relation of $Q=\frac{1}{2}D$, as shown above. Also, in this example, the gain G value where the root trajectories cross the $j\omega$ axis and the ATL1 becomes unstable is G=1.

As the Q of the open loop SOS ATL1 resonator is decreased, the filtering in the initial forward path is limited by the 20 dB per decade change in the frequency. A problem with this is that the out of band signals and broadband noise is not significantly attenuated by the first forward pass through of the signal. As the ATL1 Q increases, these out of band signals are eliminated in the output only if they are subtracted at the summing block 1404 in the ATL1 circuit of FIG. 4. This implies that the signal flowing through the gain block 802 has to be large. To reduce this, one has the option of 1) raising the Q of the SOS feedback resonator, or 2) adding an additional SOS feedback resonator.

Adding an additional SOS feedback resonator results in an ATL2. Adding a third additional SOS feedback resonator results in an ATL3.

Figure 7:
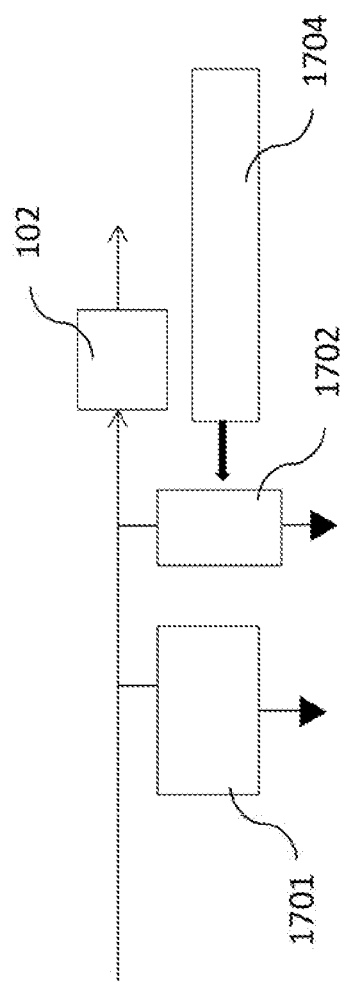
FIG. 7 is a block diagram of a Q-spoiler based on a resonant block in parallel with a FET variable resistor.

Another way of implementing a variable Q for the SOS resonator is the 'Q-spoiler', which is implemented via a variable resistive element in the SOS such as a variable FET circuit or PIN diode that can increase the loss of the SOS, thus reducing Q. This affects the damping coefficient of the SOS which could have been designed to have a higher Q than typically desired. The variable resistor reduces (spoils) the Q such that the poles of the SOS are further from the $j\omega$ axis into the LHP as mentioned above. This is a degree of freedom (DOF) that allows for higher attenuation of outliers than if an SOS with a fixed lower Q was implemented. One embodiment of the Q-spoiler circuit is shown in FIG. 7 based on a parallel resonance SOS 1701. In this case the Q-spoiler is implemented with a FET 1702 operating in the triode region in parallel with a resonator and controlled by a Q-spoiler control voltage 1704 to provide an equivalent variable resistor function. In another implementation the FET 1702 could be implemented with a PIN diode. It will be understood that these design options may be incorporated into any of the adaptive filter circuits described herein.

ATL1 Detailed Example

Figure 14:
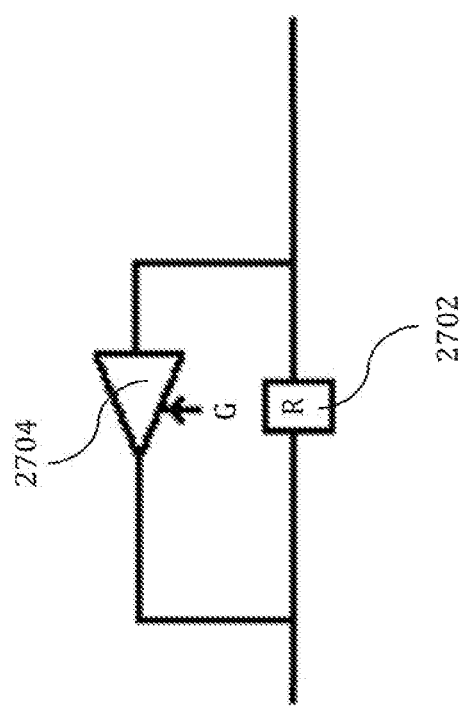
FIG. 14 is a simplified block diagram of an example of a first order variable filter.

Referring to FIG. 14, the single resonator 2702 is a fixed resonator circuit with a feedback gain 2704. For simplicity, alternate ways to modify the Q of this circuit and use a bi-polar gain element G of gain block 2704, where G may be negative for Q-spoiling or positive for Q-enhancement will be ignored. It is understood that while gain block 2704 is shown as a two-port gain block that it may be arranged as a one port gain block with either negative or positive resistance. Negative resistance would result in G being equivalently greater than zero and provide Q-enhancement. Positive resistance, on the other hand, is equivalent to a negative G providing Q-spoiling.

Figure 15:
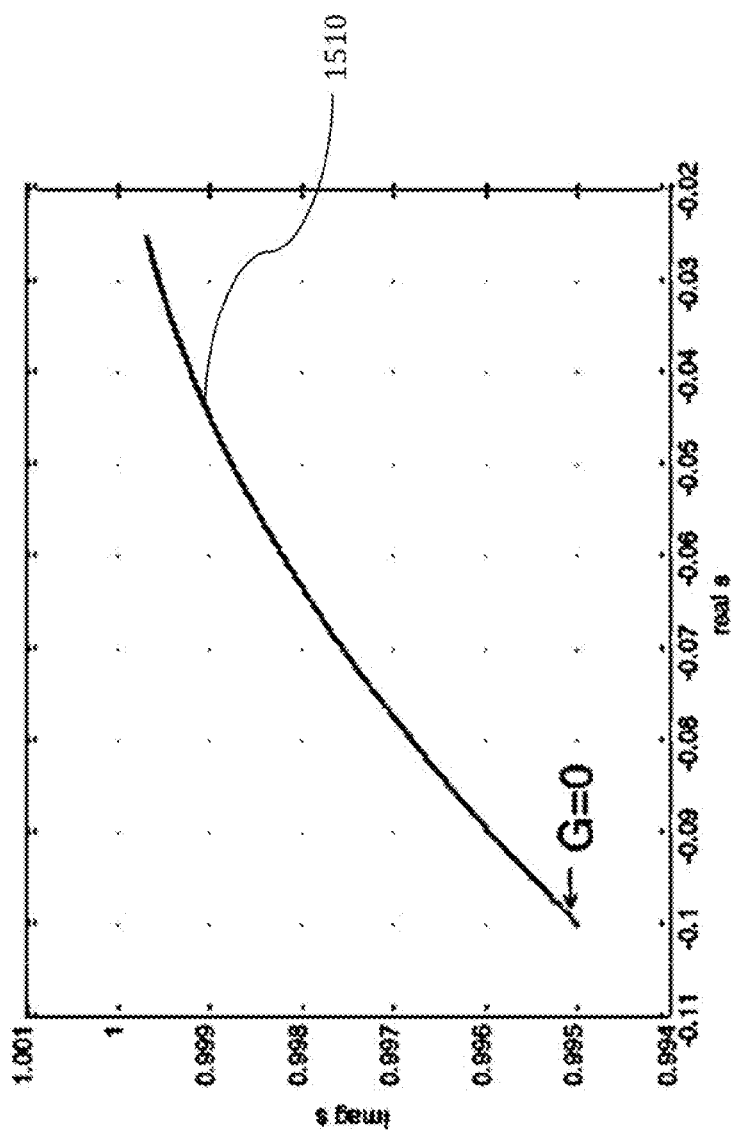
FIG. 15 is a root locus of the adaptive filter depicted in FIG. 14 with Q-enhancement.
Figure 16:
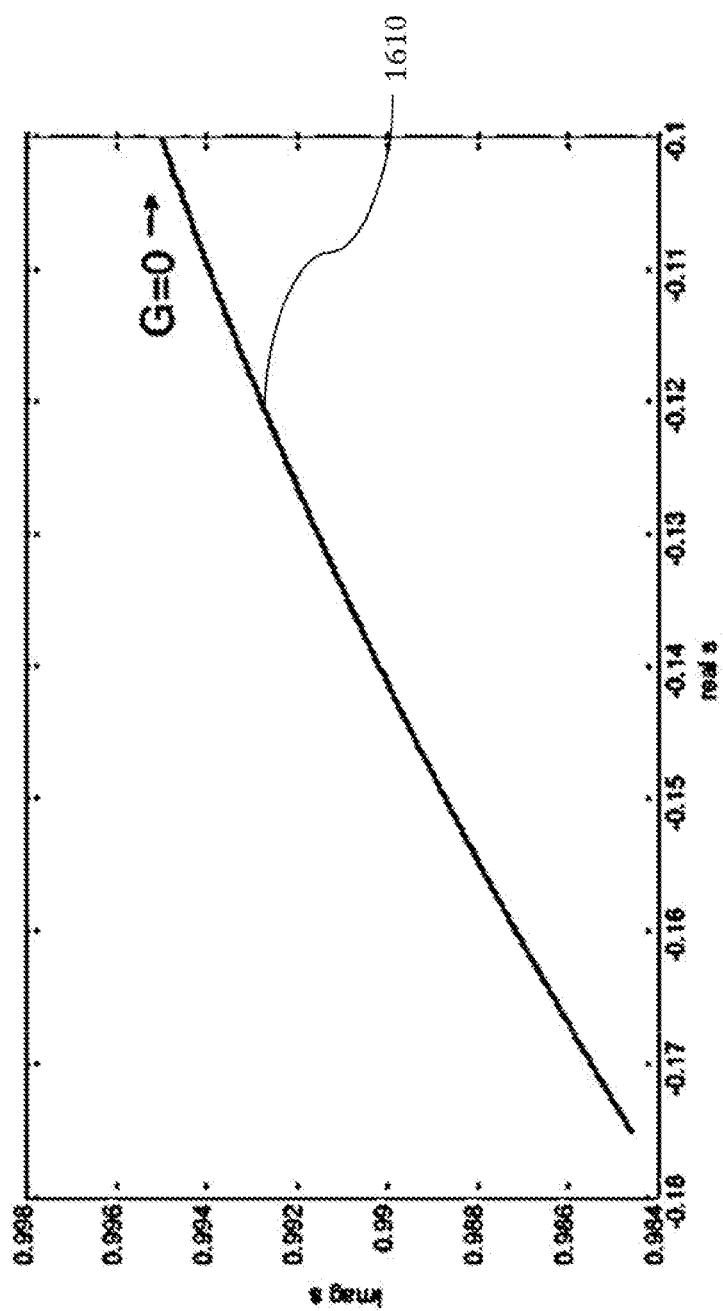
FIG. 16 is a root locus of the adaptive filter depicted in FIG. 14 with Q-spoiling.

The root locus of the positive frequency closed loop pole for positive G 1510 is shown in FIG. 15. This corresponds to the Q-enhancement case where the close loop pole moves towards the $j\omega$ axis. Likewise, the root locus for negative G 1610 is shown in FIG. 16. This corresponds to the Q-spoiling where the close loop pole moves away from the $j\omega$ axis.

Figure 17:
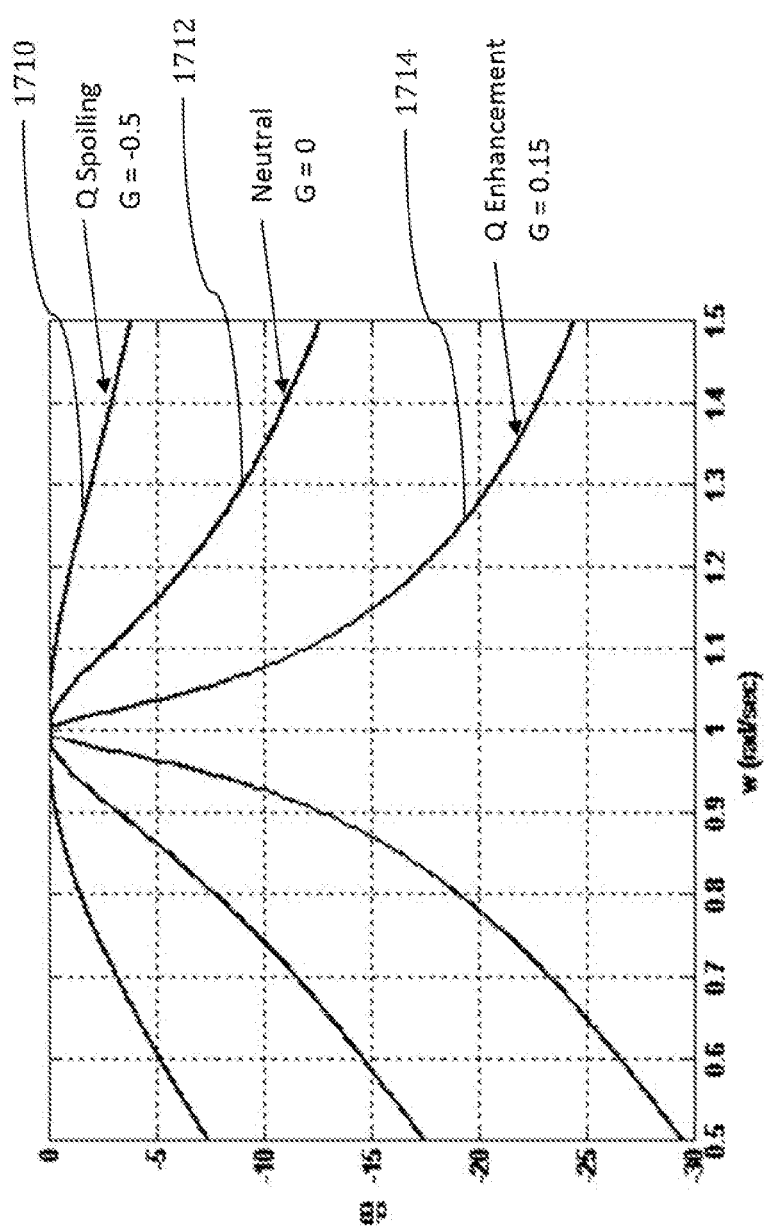
FIG. 17 is a plot of the pass band of the adaptive filter depicted in FIG. 14 comparing Q-enhancement and Q-spoiling.

FIG. 17 shows an example of the passband response with neutral Q (G=0) 1710, Q-enhancement (G=0.15) 1712 and Q-spoiling (G=−0.5) 1714. Note how the bandwidth is easily modulated with a small change in the feedback gain G.

Figure 18:
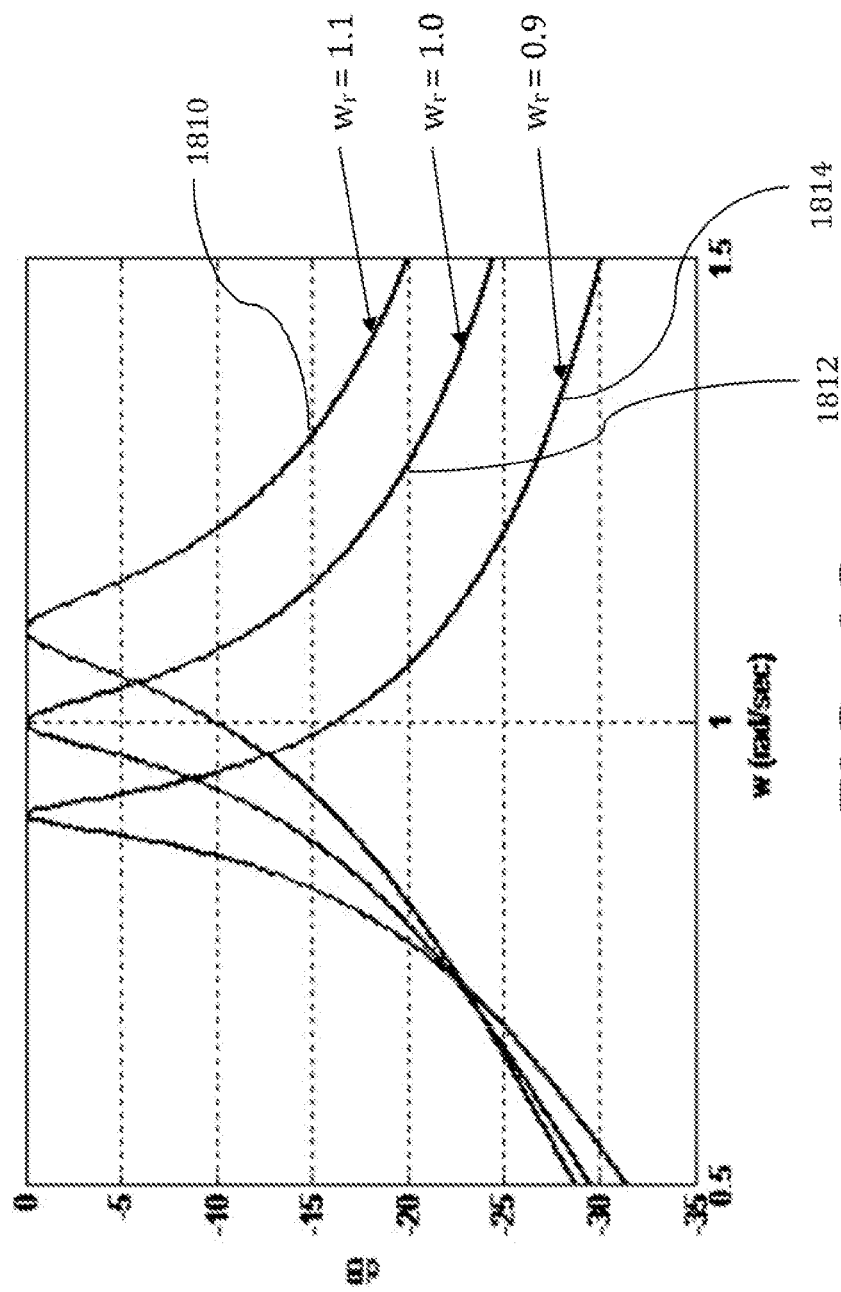
FIG. 18 is a plot showing the effect of varying the resonant frequency on the pass band of the adaptive filter of FIG. 14.

Consider the case where the resonator R comprises a means to vary the resonance frequency of the ATL1. A frequency response example is given in FIG. 18 in which the resonance of R has normalized frequency values $\omega$ of 0.9 (line 1810), 1 (line 1812) and 1.1 (line 1814) for G=0.15. The time required to tune from one frequency to the next is approximately equal to the reciprocal of the bandwidth of the ATL1.

Topology of the ATL3

Figure 10:
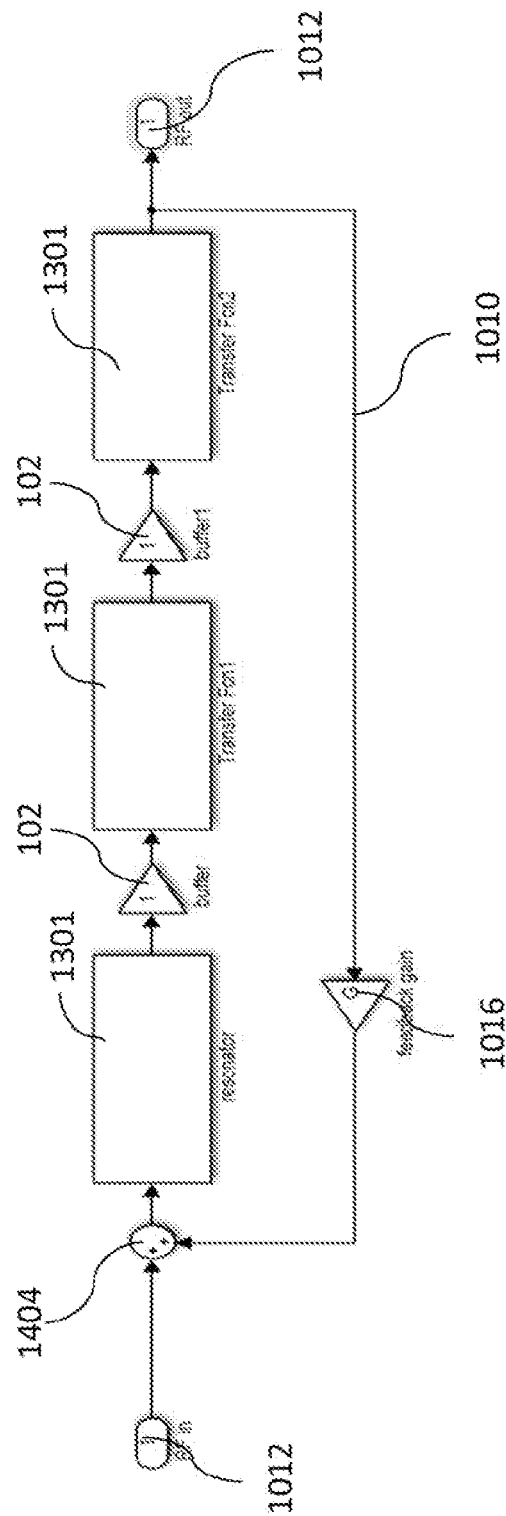
FIG. 10 is a block diagram of a third order variable filter ATL3.

The topology of the third order variable filter ATL3 is shown in FIG. 10, comprising three cascaded ATL1 SOS resonators, each of which includes a feedback loop 1010, a method for changing the center frequency of the resonator, and a method for changing the Q of the resonator. As with the ATL2, unit gain buffers 102 are placed between all of the resonators 1301 for isolation, and a combiner 1404 to close the feedback loop. FIG. 10 also shows input 1012, output 1014, and gain block 1016. It is important to note the fundamental ability to individually control both the center frequency and gain of the individual resonators in this and other ATLn configurations. Initially, we shall set the center frequency of each resonator to be the same and will discuss the ATL3 with different center frequencies later.

Figure 11:
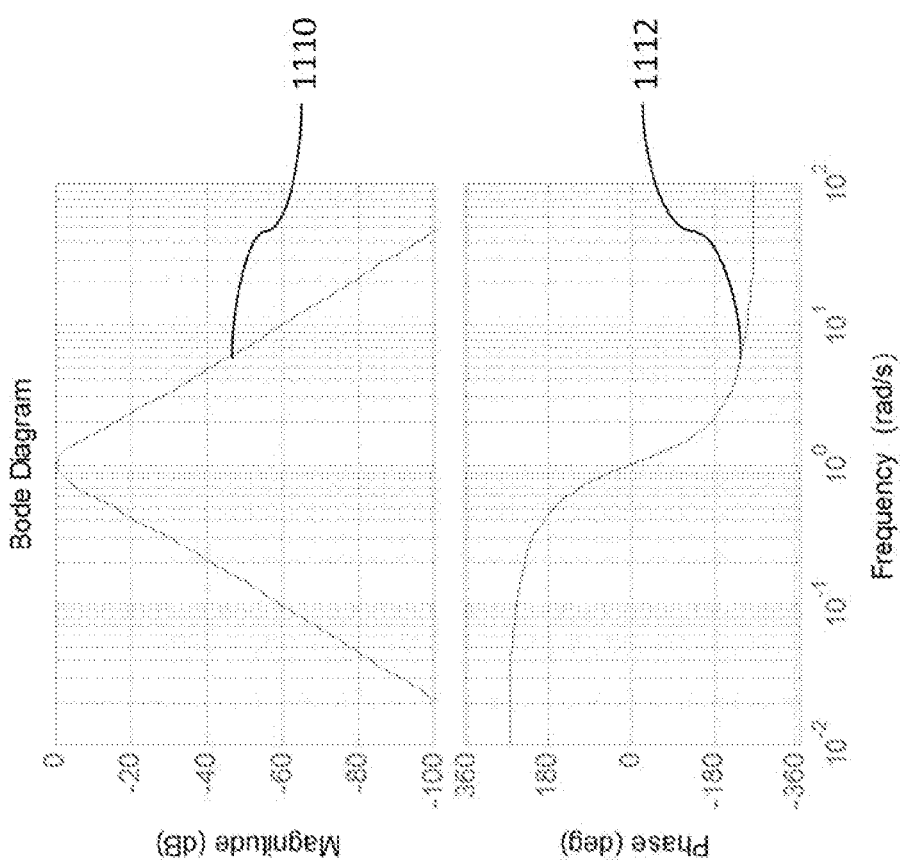
FIG. 11 is a Bode plot of the third order variable filter of FIG. 10.
Figure 12:
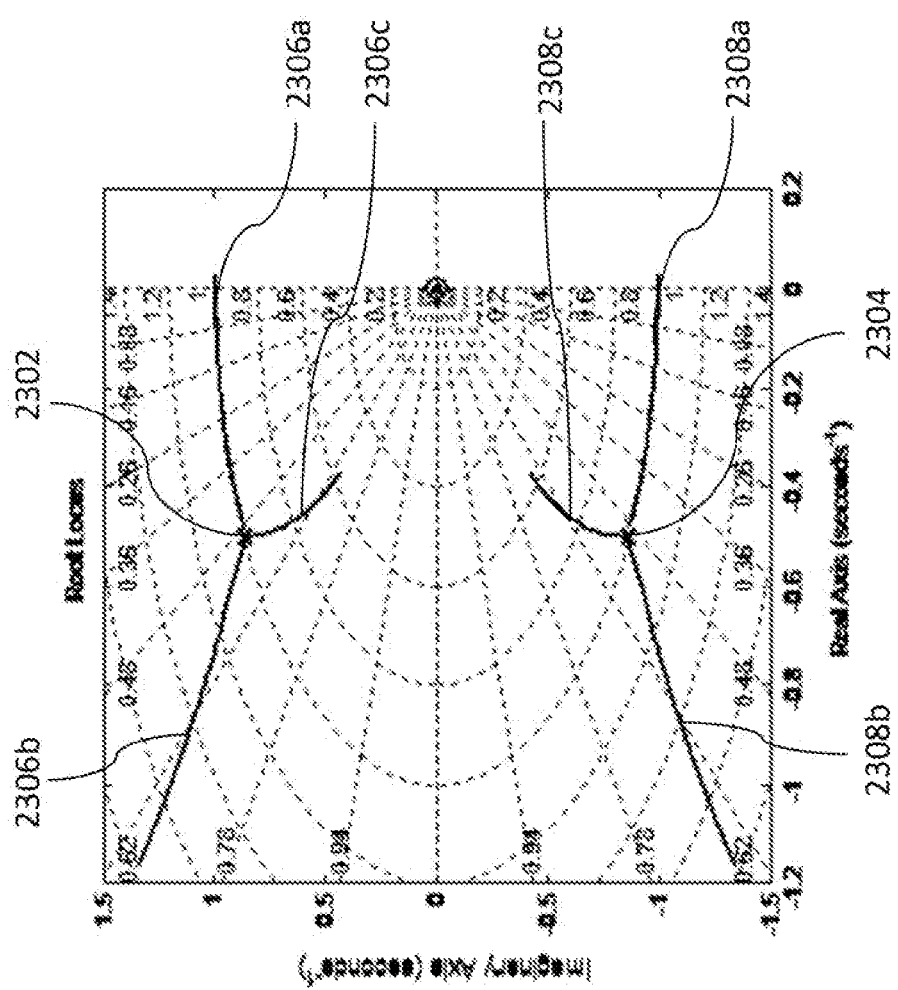
FIGS. 12 and 13 are root locus of the third order variable filter of FIG. 10 with different values for Q.
Figure 13:
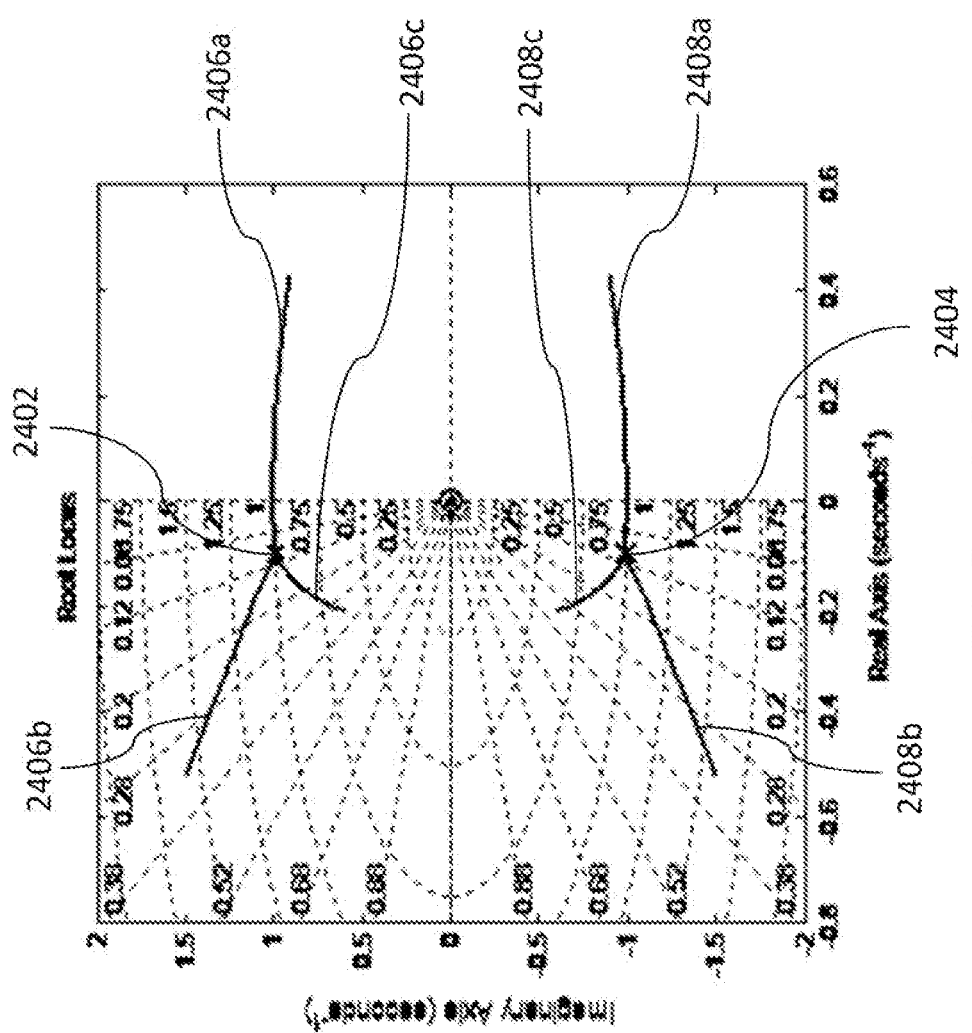

The Bode plot of the triple resonator, each with the same center frequency, is shown in FIG. 11 where the out of band open loop attenuation of the triple resonator is seen to be 60 dB per decade in frequency which is of significance as it is based on low Q resonators. FIG. 11 shows the plot of the magnitude 1110 and phase 1112. The zero degree root locus is shown in FIG. 12 for a D=0.5 or a Q=1. The root locus is interesting in that there are three root trajectories 2306a/b/c and 2308a/b/c emanating from each triple of open loop poles 2302 and 2304 marked again by the 'x', although image scaling makes the three individual roots impossible to differentiate. Note that one of the root trajectories 2306a/2308a follows the contour exactly as before, while the other root 2306b/2308b goes further into the left-hand plane (LHP) and does not influence the circuit. However, the third pole trajectories 2306c/2308c start to move toward the $j\omega$ axis. This potentially gives rise to a spurious mode that is at much lower frequency than the intended passband. However, at the gain G where the dominant pole gets sufficiently close to the $j\omega$ axis to realize the desired higher Q closed loop poles, this potentially troublesome pole is still far from the $j\omega$ axis and causes a negligible spurious response in a practical implementation. Serendipitously, as the Q of the ATL3 SOS resonators are increased such that D decreases, this potentially troublesome root goes further into the LHP as shown in the zero degree root locus example of FIG. 13 which is calculated for a D=0.1, or a resonator Q=5, with trajectories 2406c from pole 2402 and 2408c from pole 2404. As with all ATLn implementations, stability is achieved when the root locus stays in the LHP, which occurs for closed loop gain G<1 for each individual resonator. This will be discussed more fully below.

Figure 19:
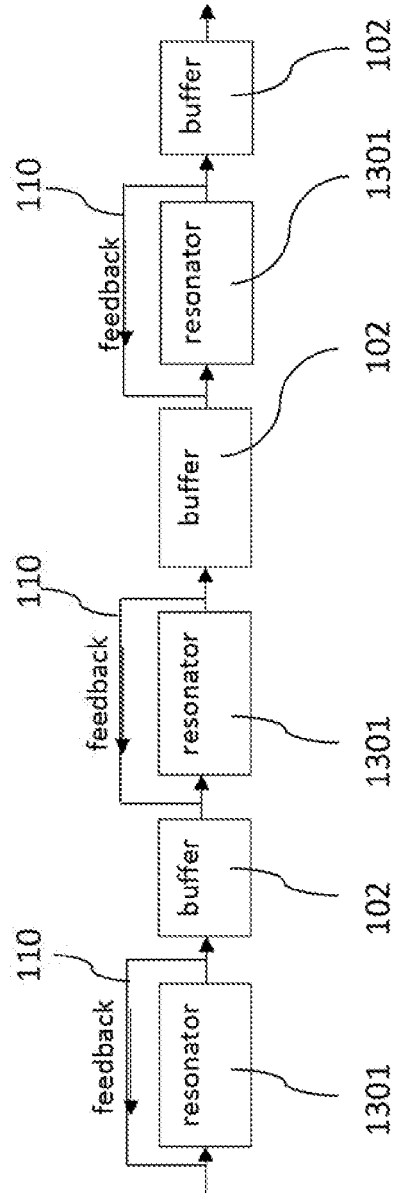
FIG. 19 is a block diagram of three first order variable filters connected in series.

There are three possible topologies of the ATL3:

ATL3 Topology 1 (ATL3 T-1), seen in FIG. 19, consists of three individual ATL1 modules, each with separately tunable center frequency and Q, and each incorporating a feedback loop with adjustable gain. This configuration provides the 6 degrees of adjustment needed to uniquely resolve a third order filter. FIG. 19 shows resonators 1301, feedback loops 110, and buffers 102. The pole movement of this ATL3 T-1 in the S-plane as illustrated in the left hand side of FIG. 21.

Figure 38:
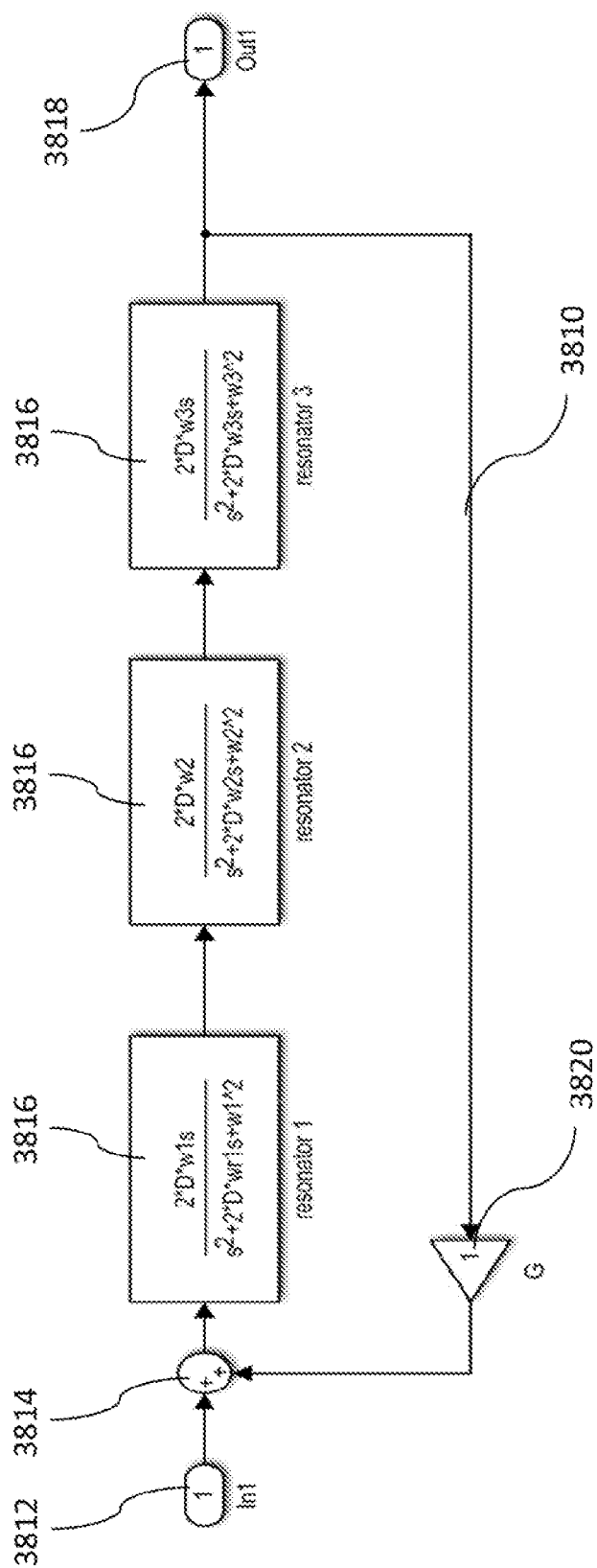
FIG. 38 is topology 2 of ATL3 (ATL3 T-2).

ATL3 Topology 2 (ATL3 T-2), seen in FIG. 38, considers adding a single feedback loop around the three series ATL1 core modules, connecting the output of the final ATL1 to the input of the first ATL1. As shown, FIG. 38 has input 3812, combiner 3814, resonators 3816, output 3818, and gain block 3820. ATL3 T-2, however, has no feedback loops within the individual ATL1 core modules. As will be pointed out, this topology results in an under-specified design situation, meaning that the performance of this topology might not meet stringent design performance criteria. But there are possible advantages, driven as always by design tradeoffs.

Figure 20:
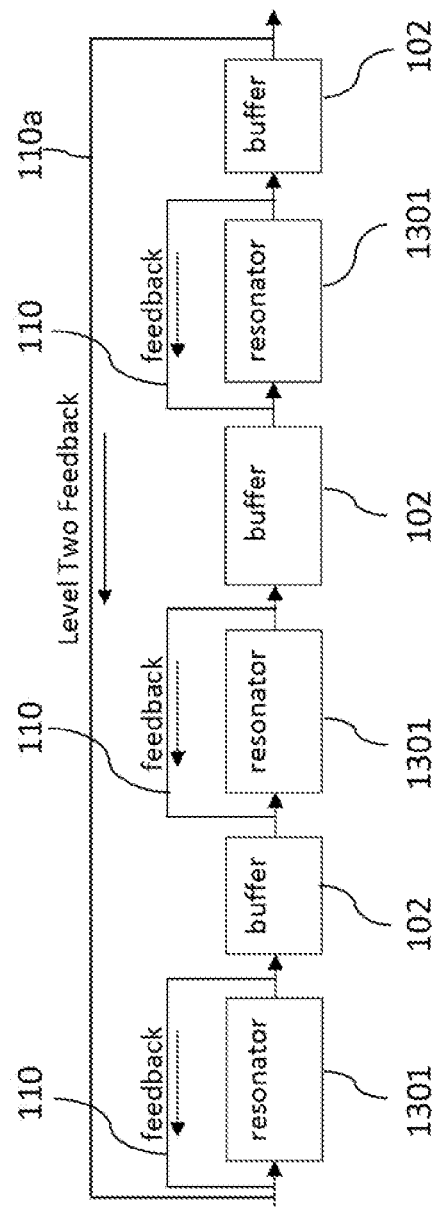
FIG. 20 is a block diagram of three first order variable filters connected in series with an additional feedback path.
Figure 21:
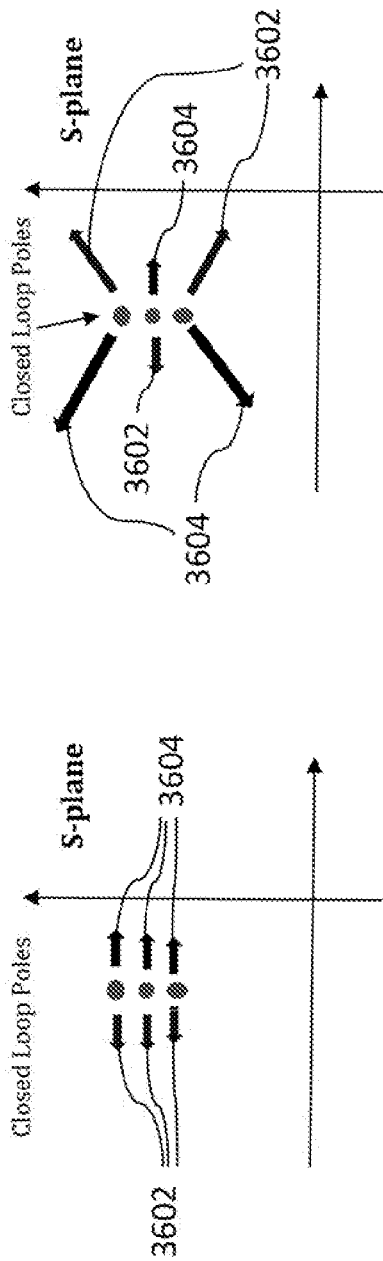
FIG. 21 shows notional graphs depicting the effect of an additional feedback path on the movement of filter poles.

ATL3 Topology 3 (ATL3 T-3), seen in FIG. 20, where a Level Two feedback path 110a is wrapped around the three ATL1 core modules, with the individual ATL1 core modules containing independent Q and center frequency control. FIG. 20 shows resonators 1301, buffers 102, and feedback loops 110, in addition to level two feedback path 110a. With the additional ATL3 Level Two feedback loop 110a, the pole movement will be as illustrated in the right hand side of FIG. 21. The arrows 3602 in FIG. 21 are for negative feedback (Q-spoiling) and the arrows 3604 are for positive feedback (Q-enhancement). The pole movement of this ATL3 T-3 in the S-plane as illustrated in the right-hand side of FIG. 21. Note that only the dominant poles move toward or away from the j& axis.

Because of this pole control, the ATL3 T-3 is the preferred embodiment and all future references to the ATL3 will refer to this topology.

The pole control of the tunable analog ATL3 enables a variety of complex filter responses with control of the passband for the variable bandwidth filter. The nature of the dominant pole that arises with this ATL3 topology leads one to consider this ATL3 topology as a single pole filter implementation, a fact that will be amplified upon later.

We will also show later that any required phase control for the ATL variable filter may be implemented via slight detuning of the ATL1 core modules that comprise the ATL3. In this manner, no separate phase control element is necessary, simplifying design and fabrication.

Butterworth Bandpass Filter Response Replication Example

We will first consider, as an example, the classic third order passive Butterworth filter as a bandpass filter that is centered at a normalized frequency of ω=1. Butterworth filters are specifically used when linear passband phase and hence near constant group delay is desired.

The total transfer function of this classic passive Butterworth filter is written as:

$$H = \frac{(0.001s^3)}{(s^6 + 0.2s^5 + 3.012s^4 + 0.4s^3 + 3.005s^2 + 0.199s + 0.9925)}$$

Figure 35:
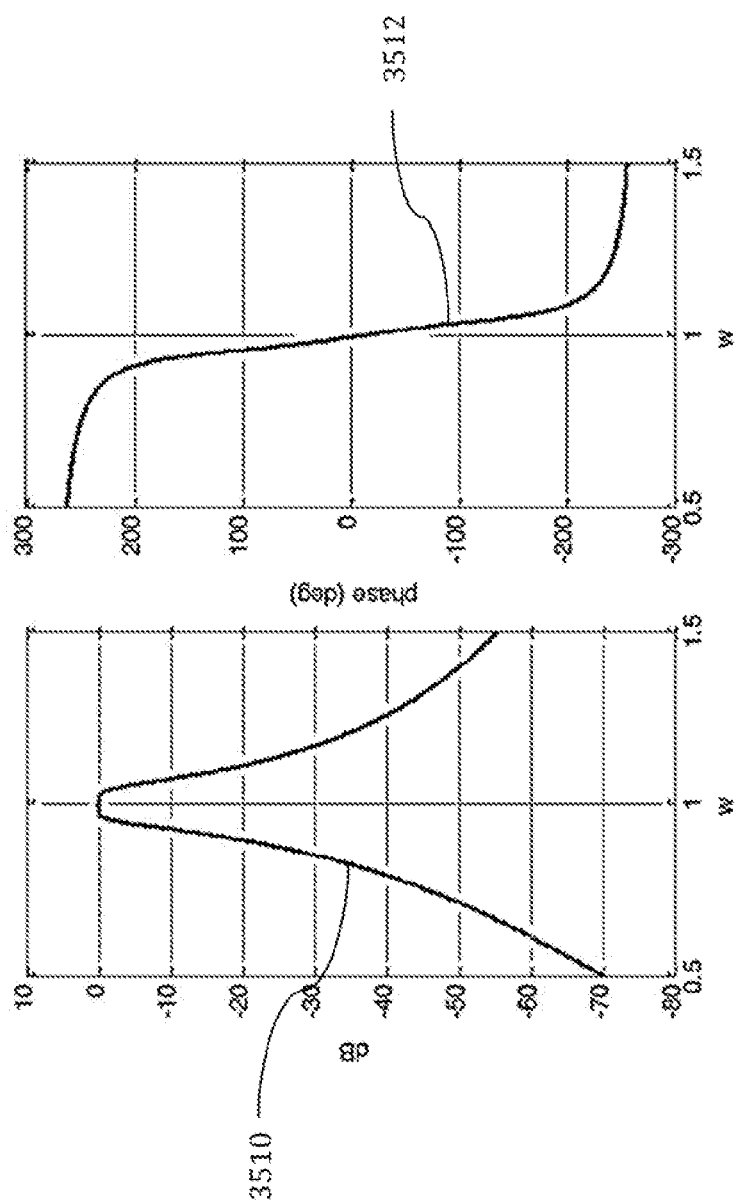
FIG. 35 is the frequency and phase response of a classical passive Butterworth filter of order 3.

This is a sixth order filter with 6 poles and 3 zeros at DC (0,0). The frequency (3510) and phase (3512) response is presented in FIG. 35.

Figure 36:
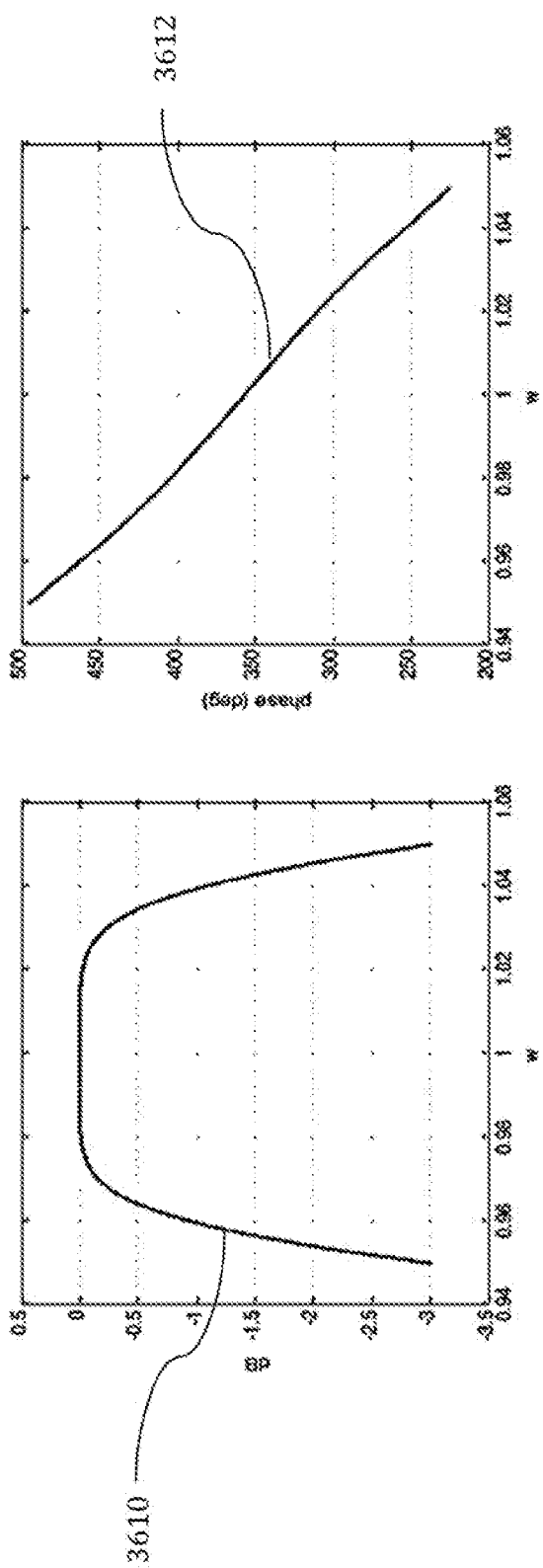
FIG. 36 is graphs showing detail of a classical Butterworth near the center frequency: frequency response (left) and phase (right).

Detail of the frequency (3610) and phase (3612) response around this Butterworth center frequency is shown in FIG. 36, where it is seen that the phase shift is fairly linear, although not exactly so.

Figure 37:
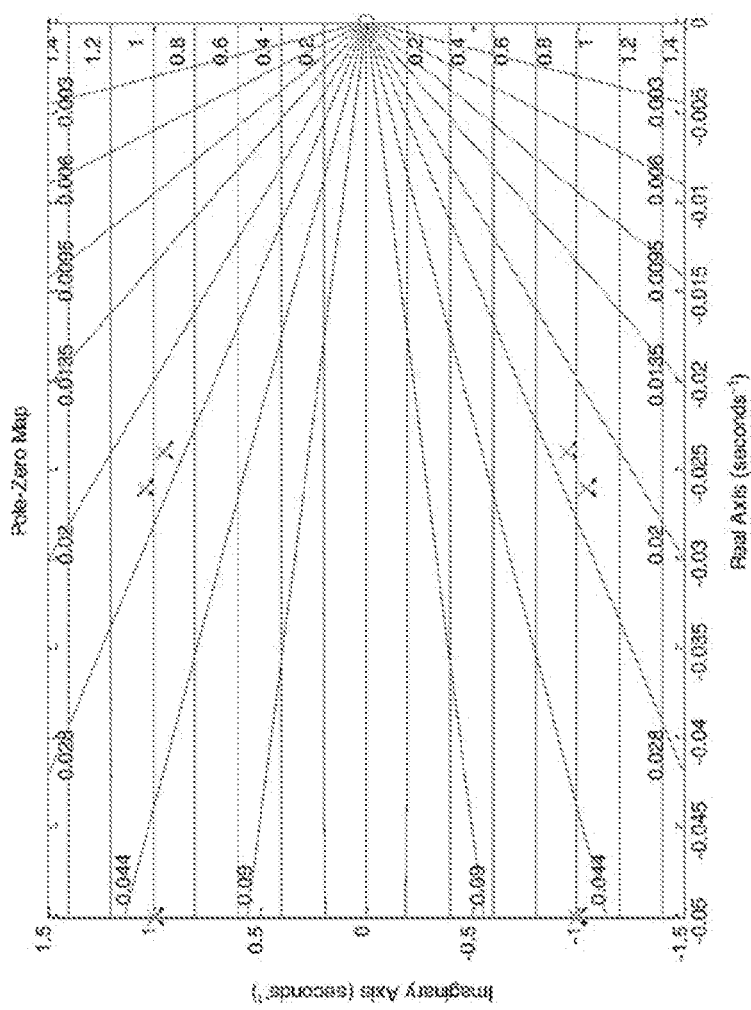
FIG. 37 is the pole zero map of 3rd order classic Butterworth filter showing 3 pole pairs and 3 zeros.

This Butterworth pole-zero map is shown in FIG. 37. One will notice for this classical passive Butterworth filter:

The phase shift is 0 degrees at the center frequency;

We see the 6 poles and 3 zeros. We will only consider the poles for positive frequencies and hence talk about a 3rd order filter understanding that each pole has a conjugate pole.

Note that the two flanking poles are about half the distance to the jω axis as the center pole. This implies that these passive Butterworth poles have twice the Q of the center pole.

ATL3 Preferred Topology Results for Butterworth and Chebyshev Filter Performance Replication For the preferred ATL3 topology, the arrangement of three ATL1 core modules can realize three resonant poles as discussed. As with the classic passive Butterworth filter discussed above, this may also be used to provide similar results as a classic passive third order Chebyshev type bandpass filter.

Referring to FIG. 19, an equivalent Chebyshev scheme is shown using three ATL1 core modules, where the resonators 1401 each have a feedback path 110 with a scaling block (not shown) and are separated by buffers 102. In this example, the poles of the three ATL1 core modules are generated as described above and may be set arbitrarily close to the jω axis.

If arbitrary placement of the poles to realize a certain filter response is desired, then it is possible to provide a Q-enhance/spoil for each individual ATL1 core module of FIG. 19. However, the control becomes more complex as six controls are necessary. Also, there is redundancy in the control as the order of the resonators is generally irrelevant. This adds confusion to the pole placement stability tracking algorithm that will be discussed later.

Level Two Feedback for Simplified Bandwidth Control

A simpler bandwidth control is that of implementing the Level Two feedback loop 110a as shown in FIG. 20. In that case, the feedback around each ATL1 core module is driven from a common control source (not shown), and each ATL1 core module feedback loop has a gain block (not shown), as described above. Hence the first level control for the ATL1 core modules moves the three poles in unison towards or away from the jω axis, as shown diagrammatically in the left side of FIG. 21.

The outer Level Two control loop 110a that is around the three individual ATL1 core modules also has a gain block (not shown). With the addition of the preferred ATL3 implementation Level Two control, we can spread the outer flanking poles and cause the center dominant pole to move either toward or away from the jw axis, as shown diagrammatically in the right side of FIG. 21. It is important to note that the three poles can move in opposite directions. This important result enables controlling the bandwidth of the filter with relative ease, while maintaining a similar frequency response.

For this ATL3 implementation evaluation, there will be considered three ATL1 core module resonators with the following attributes:

| Resonator | Normalized resonance frequency (f) | Damping factor (D) |
|---|---|---|
| 1 | 1.00 | 0.40 |
| 2 | 0.95 | 0.42 |
| 3 | 1.05 | 0.38 |

This locates the pole at:

$$s = 2\pi f D + j2\pi f\sqrt{1-D^2}$$

Now consider that each of these three ATL1 core module resonators are with feedback loops such that there are 3 cascaded individual ATL1 core modules. The root locus is shown in FIG. 22.

Figure 22:
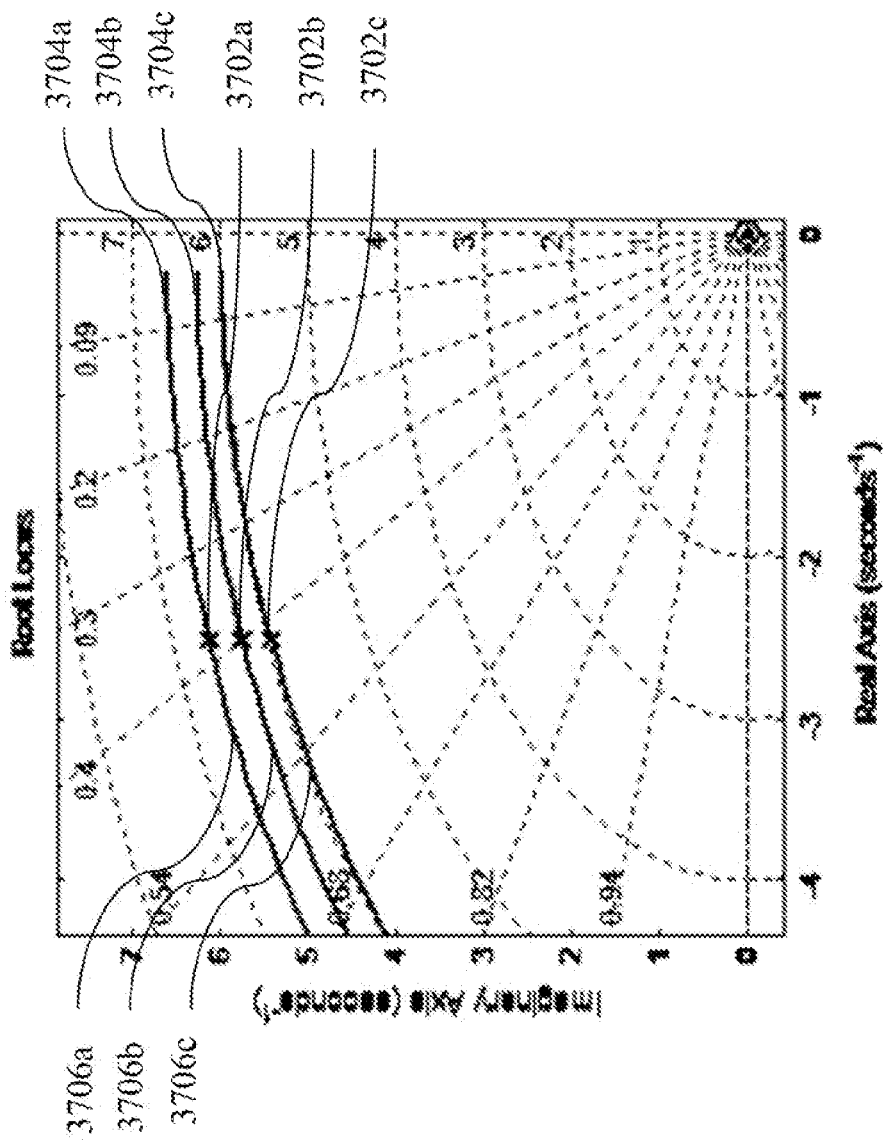
FIG. 22 is a root locus of three cascaded, first order variable filters.

Referring to FIG. 22, the 'x' 3702*a/b/c* designate the positions of the poles with feedback gain of 0. The gain is positive for right excursions 3704*a/b/c* towards the jω axis (Q-enhancement) and negative for excursions 3706*a/b/c* to the left (Q-spoiling). In terms of negative resistance amplification (Q-enhancement), it would imply that the resistance is zero at the position of the 'x', with positive resistance (Q-spoiling) for left excursions of the root trajectory and negative resistance for right excursions. Note how the control goes along a contour of constant natural resonance frequency. The range of the feedback gain for each root trajectory is −1<G<0.9.

Figure 23:
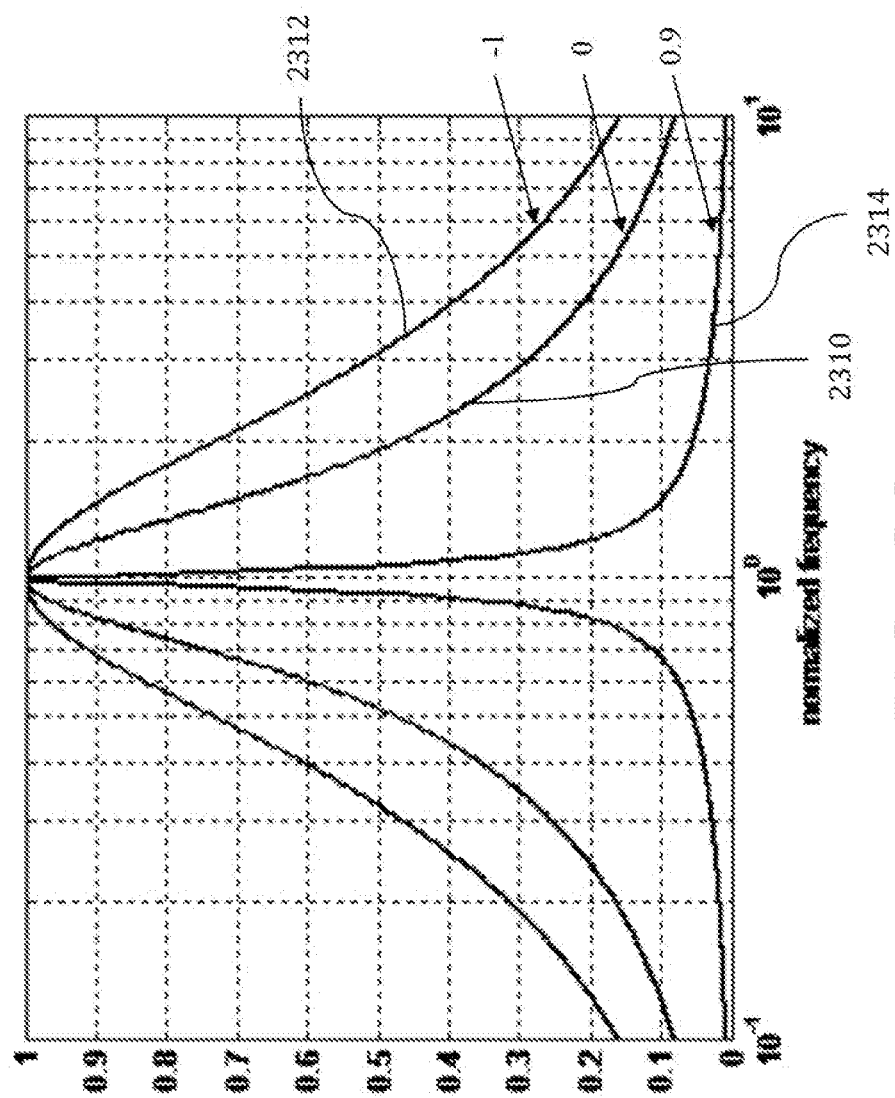
FIG. 23 is a frequency response of the adaptive filter shown in FIG. 19 for different values of G.

FIG. 23 shows the normalized frequency response of the three ATL1 core modules when the feedback gain is 0 (line 2310), −1.0 (line 2312) and 0.9 (line 2314) showing the effect of Q-enhancement (positive G) and Q-spoiling (negative G) compared to neutral gain (G=0). Note that for this plot the peak amplitude has been normalized to 1 to make the plot clearer.

Figure 24:
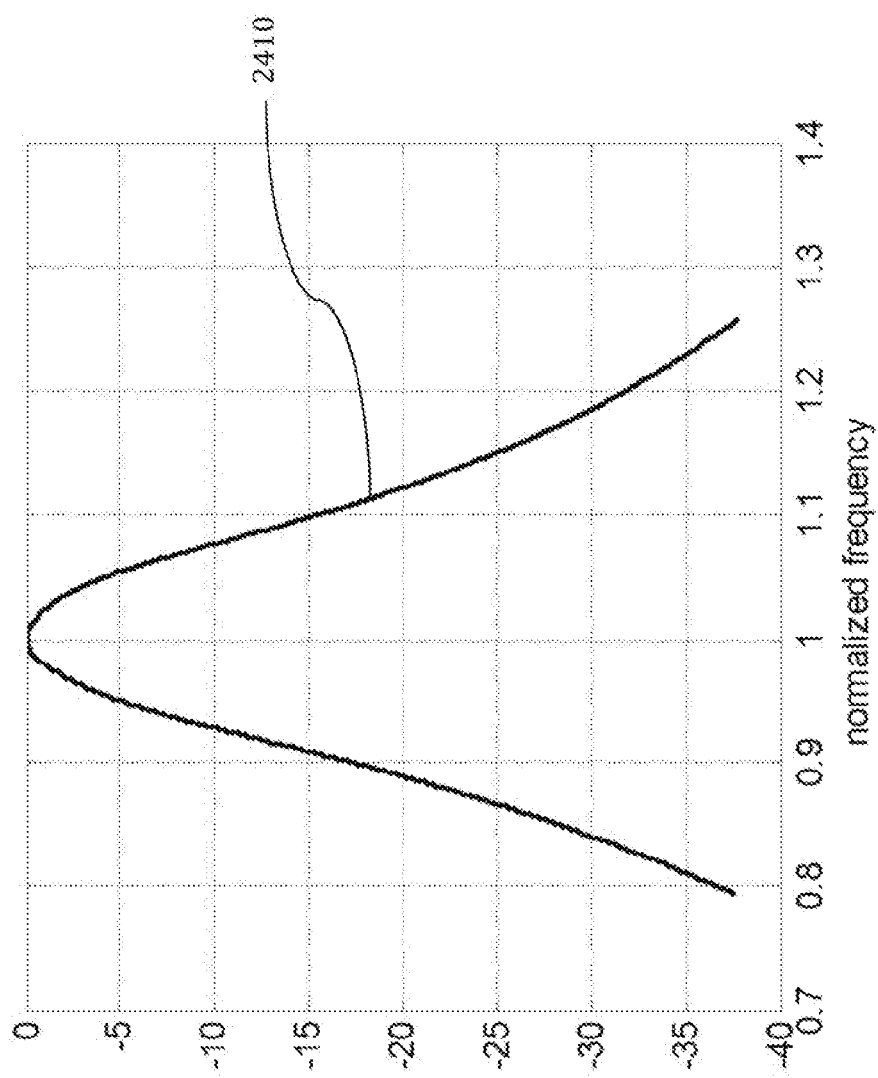
FIG. 24 is a frequency response of the adaptive filter shown in FIG. 20 with neutral Level Two feedback.

Next consider a modified preferred ATL3 topology with three resonators in which the resonators are ATL1 core modules that have been Q-spoiled with a gain of G=−0.9. FIG. 24 shows the frequency response 2410 when such a preferred ATL3 topology when Level Two feedback gain is G=0.

Next consider how we can make this look like a third order passive Chebyshev bandpass filter response by changing the preferred ATL3 topology Level Two feedback.

Figure 25:
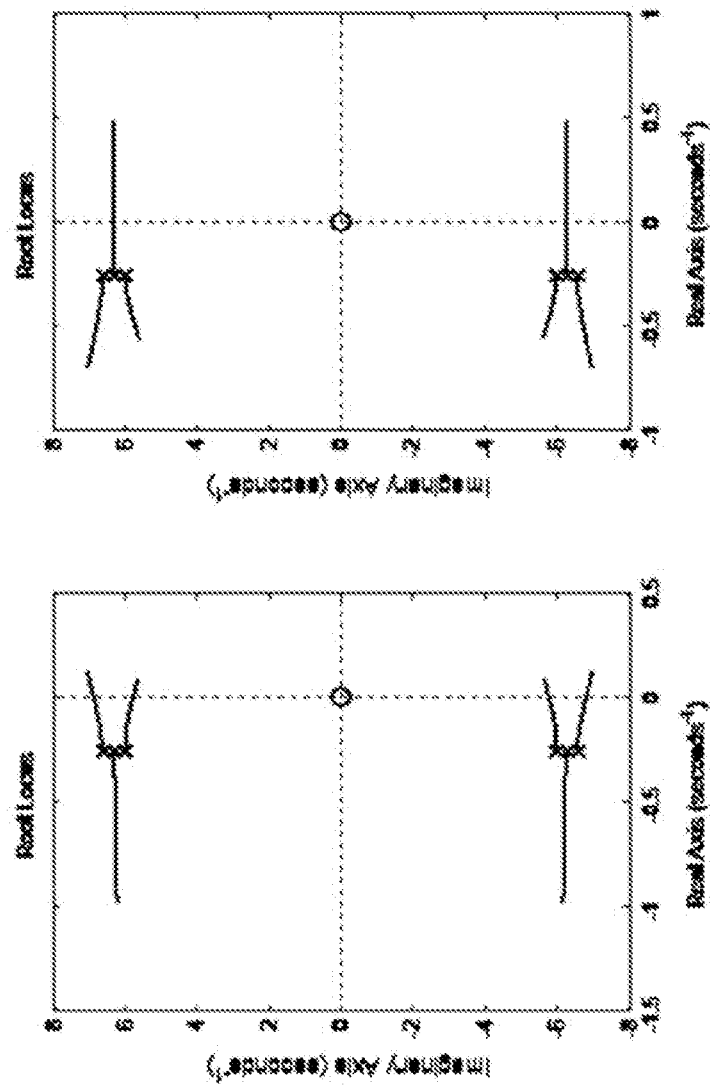
FIG. 25 is a root locus for negative (left) and positive (right) Level Two feedback of the adaptive filter shown in FIG. 20.

Referring to FIG. 25, the left plot is for the negative preferred ATL3 topology Level Two feedback and the right plot is for the positive preferred ATL3 topology Level Two feedback. Note how we can use this to adjust the position of the flanking poles relative to the center pole as discussed above.

Figure 26:
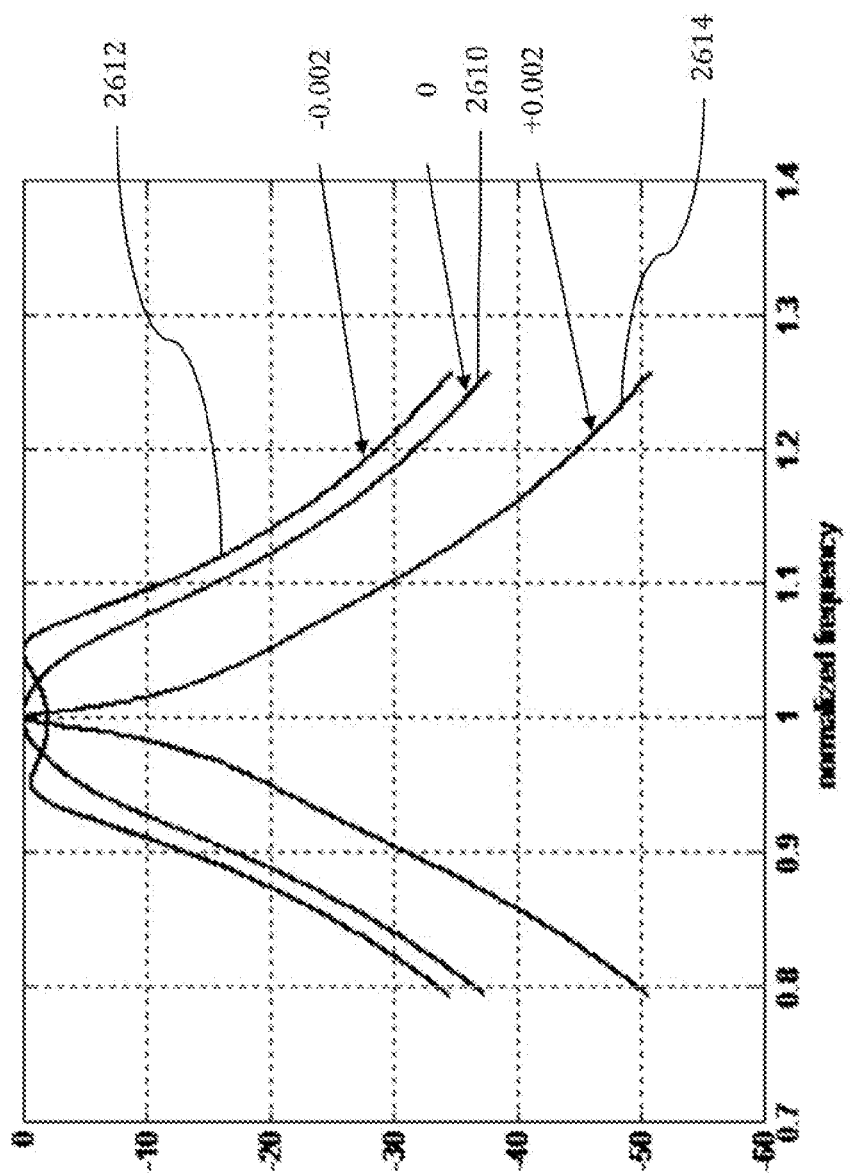
FIG. 26 is a plot of the frequency response of the adaptive filter shown in FIG. 20 with positive, neutral, and negative Level Two feedback.

FIG. 26 shows how the preferred ATL3 topology Level Two feedback may be used to control the bandwidth of the filter. Positive Level Two feedback narrows the filter bandwidth and negative Level Two feedback broadens it. Only a very small amount of preferred ATL3 topology Level Two feedback is needed for this control. In FIG. 26, the Level Two feedback was 0 (line 2610), −0.002 (line 2612), and +0.002 (line 2614), as indicated.

As may be seen, the preferred ATL3 topology Level Two feedback control of FIG. 20 allows for an effective means of bandwidth control that may be practically implemented.

Staggering Center Frequencies in the Preferred ATL3 Topology

Figure 27:
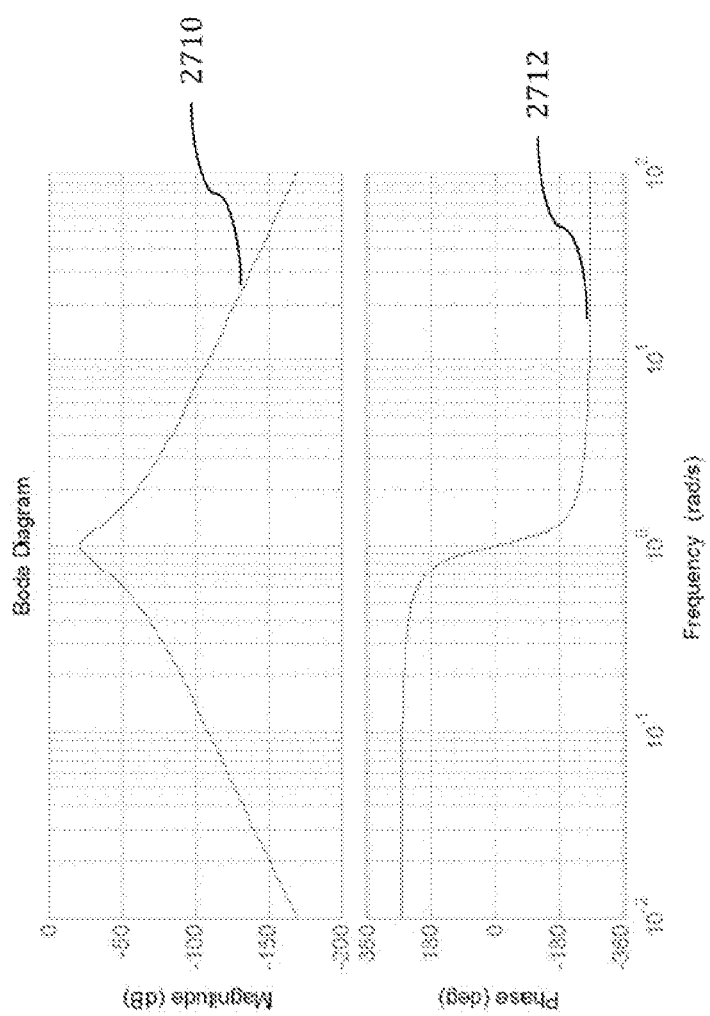
FIG. 27 is a Bode plot of the adaptive filter shown in FIG. 20 with staggered resonator frequencies.

Consider now a modification to the preferred ATL3 topology shown in FIG. 20, in which the SOS resonator 1401 pole locations are staggered in frequency and consequently not collocated in the S-plane, as was considered earlier. This may provide more flexibility in the control of the preferred ATL3 topology closed loop frequency response. The advantage of this increased flexibility is that different frequency responses may be achieved. This additional flexibility is of significance in some applications which are beyond the scope of this disclosure. As an example of staggered frequency resonators, consider the case of normalized SOS resonator natural frequencies of ω=0.9 rad/sec, 1.0 rads/sec and 1.1 rads/sec, with D fixed at 0.15 (Q=3.33) for all three resonators. The Bode plot of these three SOS resonators cascaded is given in FIG. 27 indicating the potential of a more flattened pass band, with the magnitude shown at 2710 and the phase shown at 2712.

Figure 28:
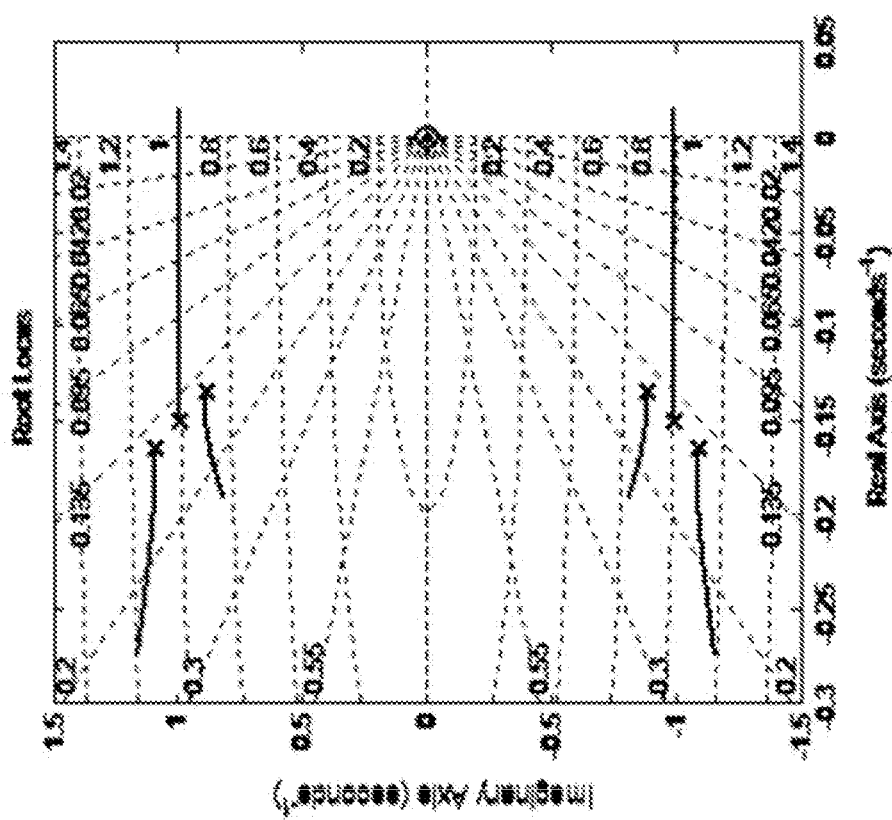
FIG. 28 is a root locus of the adaptive filter shown in FIG. 20 with staggered resonator frequencies.

FIG. 28 shows the zero degree root locus of this configuration, which is very similar to that shown in FIG. 12 where each of the three SOS resonators has the same center frequency.

ATL Topology Summary

In summary, the ATL1 core module may provide good band pass filtering performance for many applications. The ATL1 core module provides the basic frequency tuning and Q adjustment of the ATL concept.

However, the ATL2 and ATL3 filters may give more flexibility for tailoring to an application. The ATL3 will provide the best rejection of the out of band signals for typically encountered closed loop Q values.

By the decoupling of the pole root trajectories, implementation of a Level Two feedback provides an unparalleled ability to configure root trajectories of the closed loop ATLn poles for n≥2. This pole decoupling shown in FIG. 28 and illustrated in FIG. 21, is a key attribute of the ATL3.

Phase Shift Control for the ATLn

General Phase Shift Control Considerations

As noted above, an adjustable phase shifter may also be used to provide some circuit control. There will be described below some examples of adjustable phase shifters that may be used in the context of ATL-based circuitry. Other types of phase shift elements that provide an adequate level of performance may also be used.

As the ATL3 is comprised of three ATL1 core modules, it is important to examine the phase control of this ATL1 core module. It has been found that the closed loop passband of the ATL1 core module forms around the range of frequency where the open loop phase shift is a multiple of 360 degrees. As it is desired to have only a single passband, the passband of the resonator may be arranged to coincide with the frequency of a multiple of 360 degrees phase shift. If the resonator peak frequency is misaligned, then the closed loop response peak will still coincide with the frequency at which a multiple of 360 degrees is achieved, although the passband may be distorted.

Figure 39:
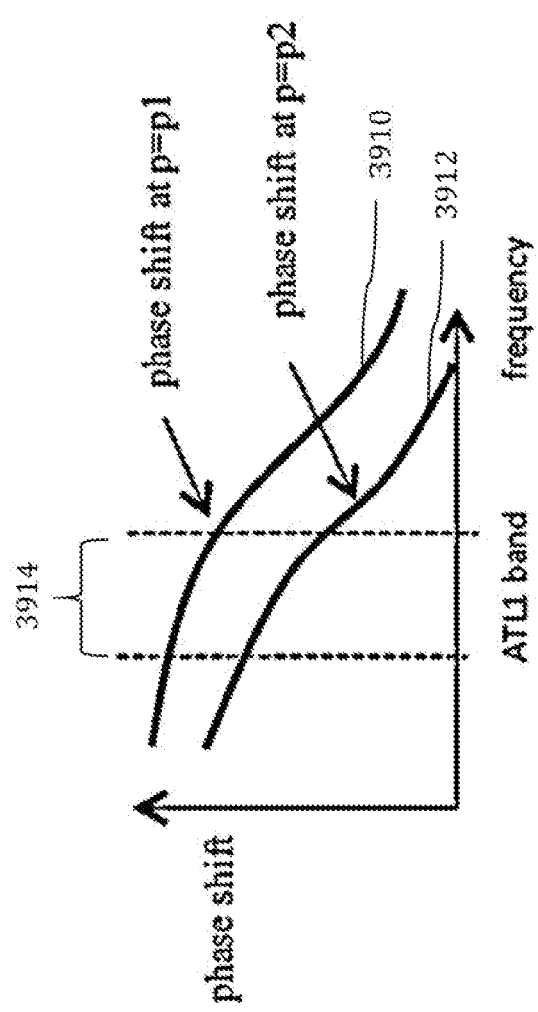
FIG. 39 is an acceptable phase shifter function over a notional ATL1 passband for two values of phase shift control voltage: p1 and p2.

The phase control may in principle be any circuit that can alter the signal phase shift at the resonance frequency. It does not have to provide a constant phase shift across a band of frequencies, nor does it have to provide a constant delay across a band of frequencies. The required characteristics of the phase shift function are:

The phase shift provided must be relatively smooth throughout the closed loop Q-dependent bandwidth of the ATL1;

The phase shift across the band follows the control voltage (p). This is illustrated in FIG. 39, where p1 (line 3910) and p2 (line 3912) denote two distinct values of the control voltage p and the curves show typical phase responses with frequency. FIG. 39 also shows ATL1 band 3914.

The magnitude of the transfer function through the phase shifter should not vary drastically over the Q-dependent bandwidth of the ATL1.

A variable phase shift may be introduced by starting with a variable delay line that is made up of a uniform sequence of varactor diodes along a transmission line. By varying the varactor voltage, the group delay may be varied, and by changing the group delay, the phase may be shifted.

As the array of varactors is finite in length and spacing, it will have a non-uniform amplitude response in terms of frequency. In this context, a single varactor will act similar to a low Q resonator with a variable capacitance, and three varactors will act similar to three coupled resonators as in the ATL3. Thus, a small number of varactor diodes may be used to approximate a variable delay line by creating a structure that has variable group delay with a reasonably uniform magnitude response over a desired frequency range. Similarly, 90 degree hybrid couplers used in a quadrature modulator chip are essentially Hilbert transformers that work over a modest frequency range. In other words, variable phase shifters, resonators, delay lines and quadrature modulators may be considered as circuits arranged and optimized to provide a variable delay over a range of frequencies.

By generalizing the variable resonator and variable phase shifter and recognizing that they are functionally similar in the context of application to the ATLn, it is possible to use a plurality of sub-circuits in the loop, where each sub-circuit may be controlled to give a desired delay and amplitude response that may be controlled by a plurality of control voltages.

Phase Shift Control for the ATL1

The ATL1 core module is a single variable resonator sub-circuit. Potentially, with careful design, the phase shift may be a multiple of 360 degrees at a desired frequency within the passband of the resonator. Shifting the resonant frequency equivalently shifts the phase. The ATL1 response peak will occur where the loop phase shift is a multiple of 360 degrees. The limitation of the ATL1 with only a variable resonator is that the phase shift adjustment of the resonator is limited. Hence if the loop has a large phase error, then there is not enough range with the single resonator, requiring a variable and fixed phase shifter to be added. However, based on the above discussion of general phase shift control considerations, this is equivalent to stringing a number of delay controllable sub-circuits in series.

Figure 34:
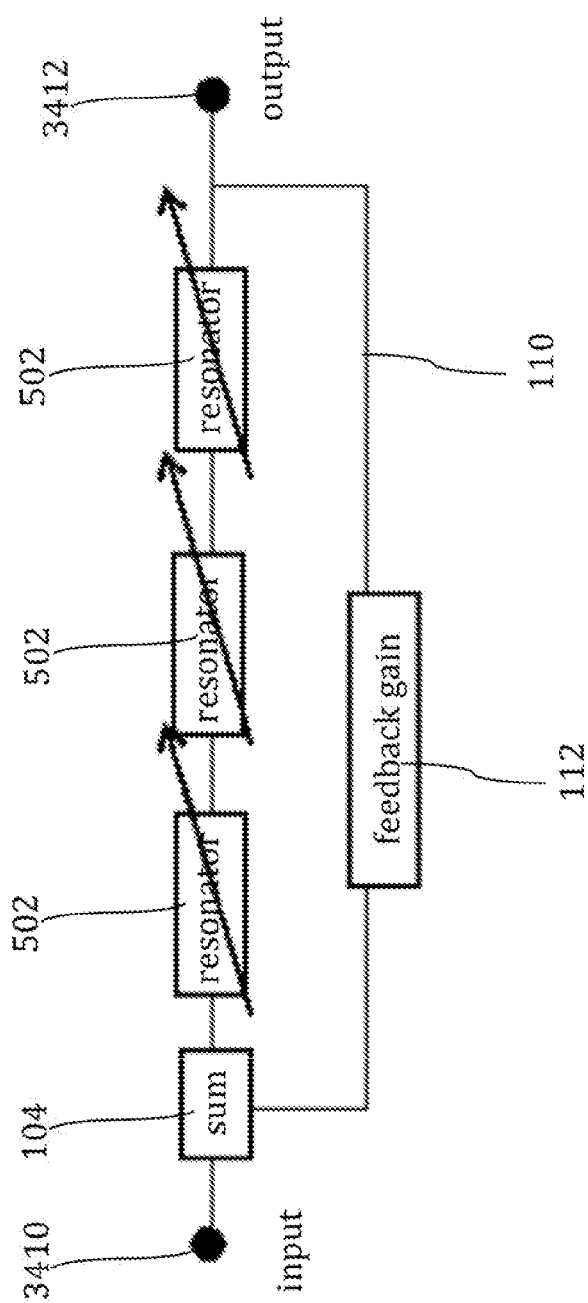
FIG. 34 shows a special case ATL3 circuit for potential phase control application.

Now consider substituting another resonator for the variable phase shifter. The phase shifter has a flatter frequency response in terms of magnitude and may therefore be used over a larger frequency range, but this comes at a cost of adding more components, some of which are difficult to integrate into a chip. If three resonators are added, this is equivalent to a special case architecture of the ATL3. This is shown in FIG. 34, with input 3410, output 3412, three variable resonators 502, which may be ATL1 elements, a feedback path 110, a coupler 104, and a gain element 112, which may be controllable.

It will be recognized that there may also be more than three resonators sections. With more controllable resonators present, we have the important result that more delay adjustment is possible and this implies a broader frequency range of tuning without having to add fixed or variable phase shifting elements.

In addition, as discussed above, it has been found that a detuned resonator adds a controllable phase shift. This important fact can be used to add a controllable modest phase shift without resorting to a separate phase shifting control element.

Figure 40:
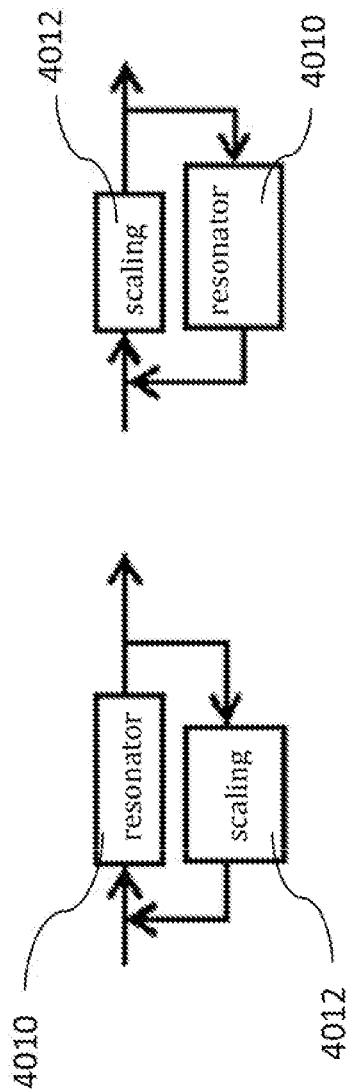
FIG. 40 is an idealized model of ATL1 with two implementations.

As stated, a phase shifter is necessary to compensate for the excess phase that will inevitably build up in the ATL1 closed loop design. The object is to bring the phase to a multiple of degrees at the intended resonance frequency. Hence the phase shifter control is a parameter that does not enhance the performance of the ATL1 further than the idealized model shown in FIG. 40 but is necessary for practical implementation. FIG. 40 shows an idealized model of ATL1 with two implementations, having resonator 4010 and scaling block 4012 in different positions.

Figure 41:
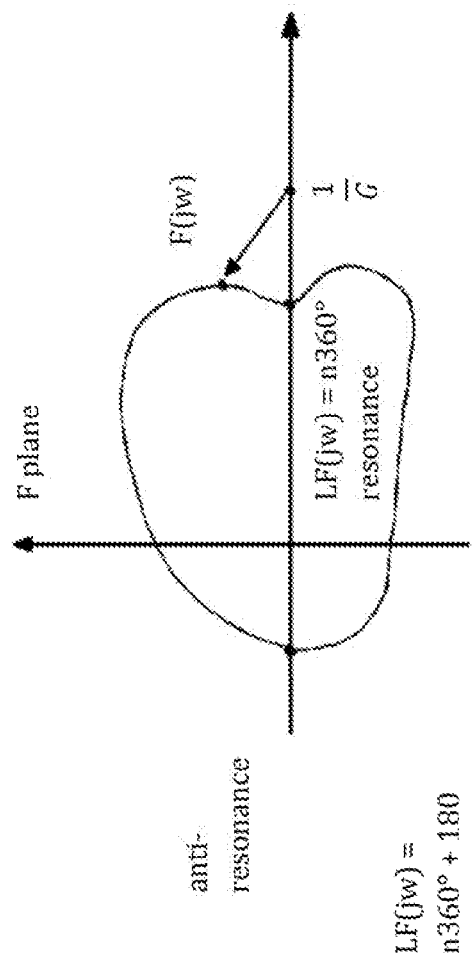
FIG. 41 is a typical Nyquist stability plot showing the phasor of the inverse frequency response.

Regardless of the implementation, the phase shift function has a denominator in the transfer function of $$D(s)=1+GF(s)$$

where XR(s) is the open loop transfer function and G is the loop gain. A typical Nyquist stability plot is shown in FIG. 41 where the points of the locus crossing the positive portion of the real axis are coincident with the open loop phase being a multiple of 360 degrees.

The frequency response may be determined (relative to the closed loop denominator) as the inverse of the phasor shown between the real axis point of 1/G and the open loop transfer function F(jw). As such, we generally have a set of resonance and anti-resonance points as shown in FIG. 41. As G increases, 1/G will move towards the left eventually intercepting the outermost resonance point, which is where the oscillation will occur. Note that this is the same as with the root locus where the pole crosses the jw axis.

Figure 42:
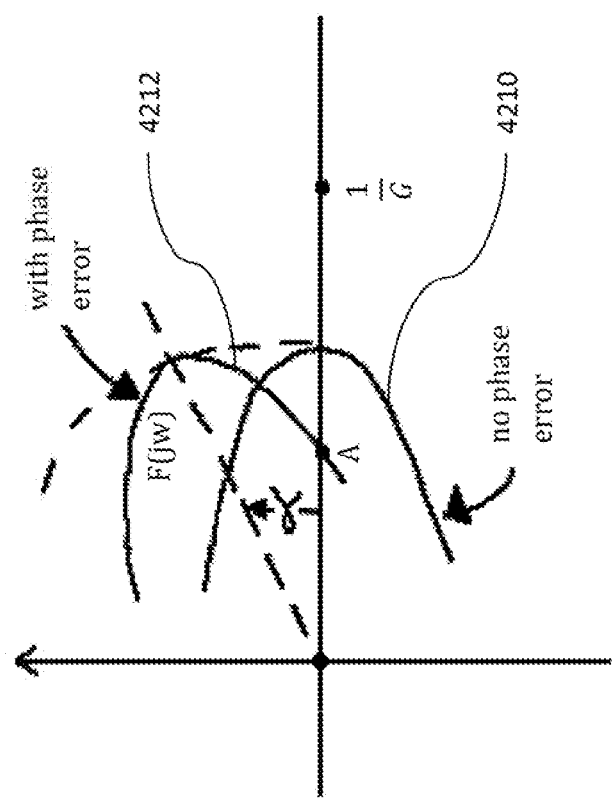
FIG. 42 is the Nyquist plot of phase shifted open loop transfer function.

A pure phase shifter results in $$D(s)=1+Ge^{j\alpha}F(s)$$

which rotates the Nyquist plot clockwise by an angle of a radians. However, a pure phase shift is not possible to implement as the circuit becomes infinitely complex. We can only implement this approximately over a narrow frequency range. Consider FIG. 42 wherein we show the Nyquist plot of a resonator over a small frequency range as curve 4210. Next assume a phase shift of a is applied. Now the resonance response decreases as the phasor length from 1/G to the resonance point increases. As G increases, the ATL1 will peak at the point A instead of the resonance point. Note also that as G increases, the peak closed loop response of the ATL1 will shift in frequency, which is not desirable. Hence, we want to add a phase shift of $-\alpha$ that will compensate the Nyquist curve 4212 back to the curve 4210.

We see that the peak response for finite Q is not necessarily the frequency coincident with an open loop phase shift that is a multiple of 360 degrees. However, as Q increases to large values the loop phase will asymptotically approach a multiple of 360 degrees. Rotating the open loop transfer function such that its peak is along the real axis can set the phase shift correctly. In this case, the frequency will not shift as the Q is enhanced or spoiled. Hence to set phase correctly we can either look at how the peak passband frequency changes with an increase in G, so that at the desired Q, the smallest value of G is obtained.

Also evident from this discussion is that the phase shifter function that is required is not a constant but rather a smooth function over the range of the closed loop narrowband response of the ATL1. Consider the simplest phase shifter circuit as an RC circuit with a phase shift of $$\theta = a\,\tan(\omega RC)$$

An issue with this phase shifter is that as the varactor capacitance C increases, so does the loss of the circuit. Also, the range of phase shift is not sufficient. To solve this multiple RC segments may be used. This solves both problems but requires higher complexity.

The desired chip implementable phase shifter is a type of resonant delay circuit that provides a smoothly varying delay over a relatively small bandwidth. Such a phase shifter is the all-pass circuit shown in FIG. 43, having resistors 4310, capacitor 4312, inductor 4314, and difference amplifier 4316.

Figure 43:
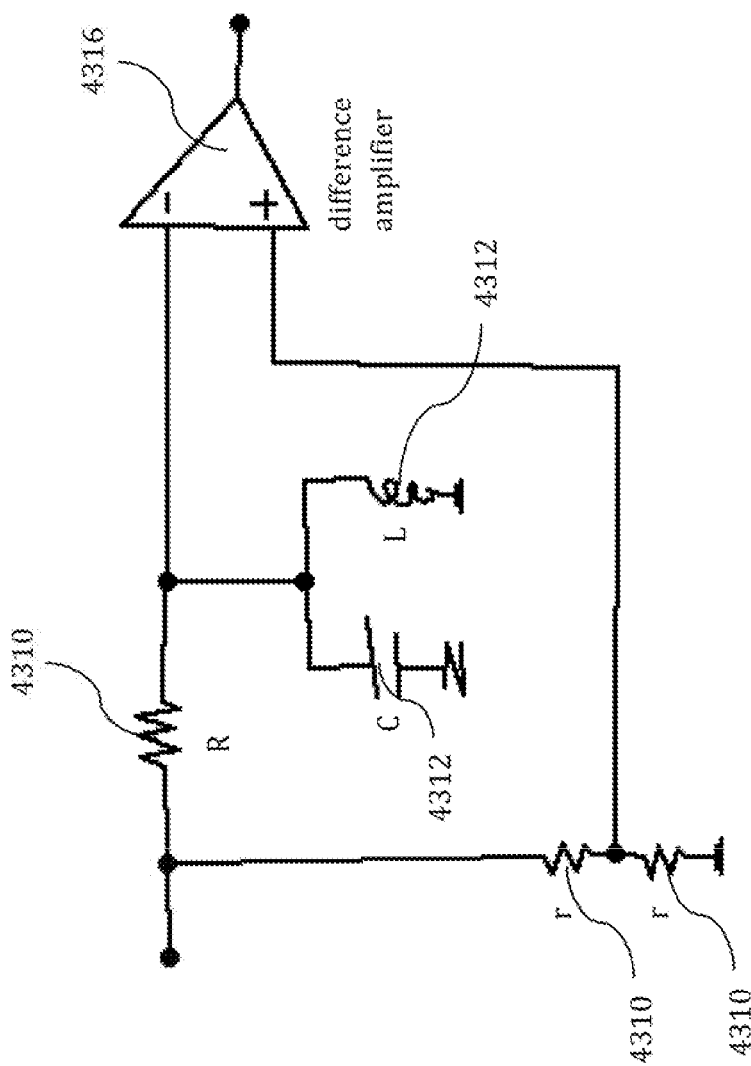
FIG. 43 is a diagram of a possible active all pass circuit used as an ATL1 phase shifter.
Figure 44:
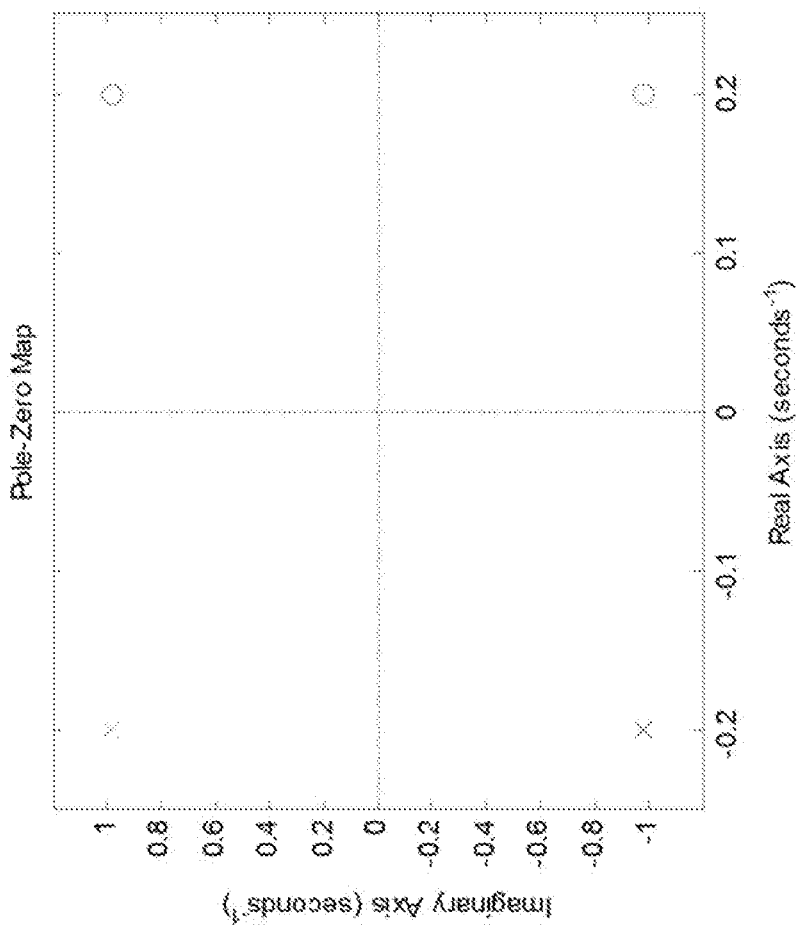
FIG. 44 is the pole zero plot of all-pass filter representing the phase shifter ($\omega p=1$, $Dp=0.2$).

The transfer function of this all-pass circuit is $$H_p(s) = -\frac{s^2 - \frac{L}{R}s + \frac{1}{LC}}{s^2 + \frac{L}{R}s + \frac{1}{LC}}$$

which can be put into the form of $$H_p(s) = -\frac{s^2 - 2D_p\omega_p s + \omega_p^2}{s^2 + 2D_p\omega_p s + \omega_p^2}$$

from which $\omega_p$ and $D_p$ can be extracted. In the circuit of FIG. 43, R can be implemented with a combination of a FET and capacitor implemented as a varactor diode, which allows for controlling the position of the poles and zeros. If R is increased then the poles are moved toward the $j\omega$ axis, and the phase shift will be steeper as a function of frequency. Likewise, we can move the poles vertically by changing the varactor capacitance. The pole-zero diagram for this all-pass network with normalized frequency is shown in FIG. 44.

Figure 45:
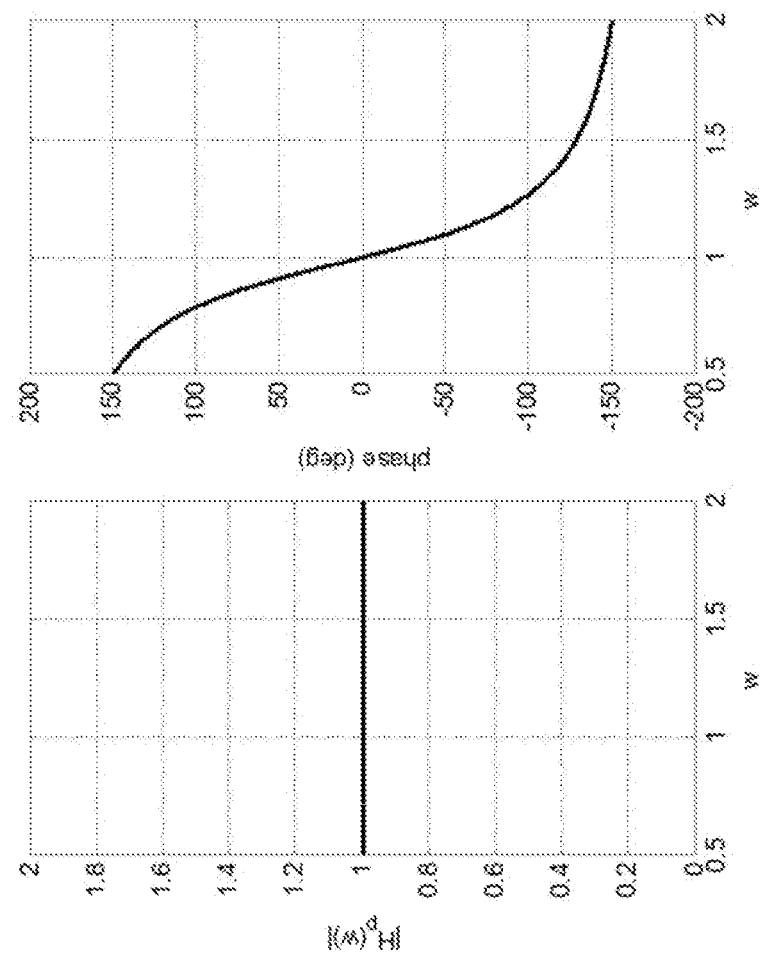
FIG. 45 is the normalized frequency response for an all-pass filter.

The normalized frequency response of this all-pass circuit is shown in FIG. 45. Note that the signal magnitude response is:

Flat as desired, allowing orthogonal control of phase separate from the controls on frequency and varactor control voltage g; and The phase is smoothly varying over the passband of the ATL1, showing a decreasing slope with frequency.

By changing the all-pass frequency $\omega_p$, the phase curve can be shifted left or right, providing phase control for a given passband. The constant amplitude response of FIG. 45 is an advantage in that the phase can be changed without changes to the loop gain. Also, note that this phase shifter has a range approaching 360 degrees.

ATLn Phase Shift Control Considerations

The ATLn is a bandpass filter comprised of a series of "n" each ATL1 core modules, in one of three possible topologies as discussed above. Each of the ATL1 modules is independent in performance and may be adjusted for both the center frequency and the Q value of the resonator and may include an amplifier in a feedback loop around the resonator. Each ATL1 is isolated from the other ATL1 modules using circuit coupling buffers, which ideally introduce zero phase shifts.

Ideally the open loop phase shift of the ATL1 resonator should be zero degrees at the center frequency of the passband, and highly linear throughout the passband. This can be achieved with an ideal resonator without any parasitics. As is known in the art, the phase of a signal may be affected by many different factors as it passes through a circuit, some of which include stray component capacitances and inductances that may be referred to as "parasitics". There are parasitics associated with the ATL1 resonator (or resonators as in the ATLn), and there is phase shift associated with the buffer amplifiers. In the ATLn, where n≥2, the excess phase shift may exceed 360 degrees. Certainly excess phase needs to be considered.

In general, for an ATLn circuit that is implemented on a chip, where parasitics are generally minimal, well modeled and understood, and where the ATLn circuit is intended to be used over a modest frequency tuning range, a fixed phase shifter may be adequate. In other circumstances, such as when the ATLn is implemented as discrete components or with surface mount architectures, it may be necessary to incorporate a variable phase shifter to correct the phase of a signal passing through the circuit.

The phase shifter used will depend on the actual implementation of the circuit. Various types of phase shifters are known in the art, and a person of ordinary skill may incorporate a suitable phase shifter into an ATLn as needed. Within the ATLn topologies discussion above, we showed that it is not necessary to implement a separate phase shifter element, as it is possible to easily control net loop phase error by minor frequency adjustments to the ATL1 core modules that comprise the ATLn. This important result applies to all ATLn variants of the ATL variable filter for n>1.

Gain Polarization Switching and ATL1 Phase Shift Control

Figure 46:
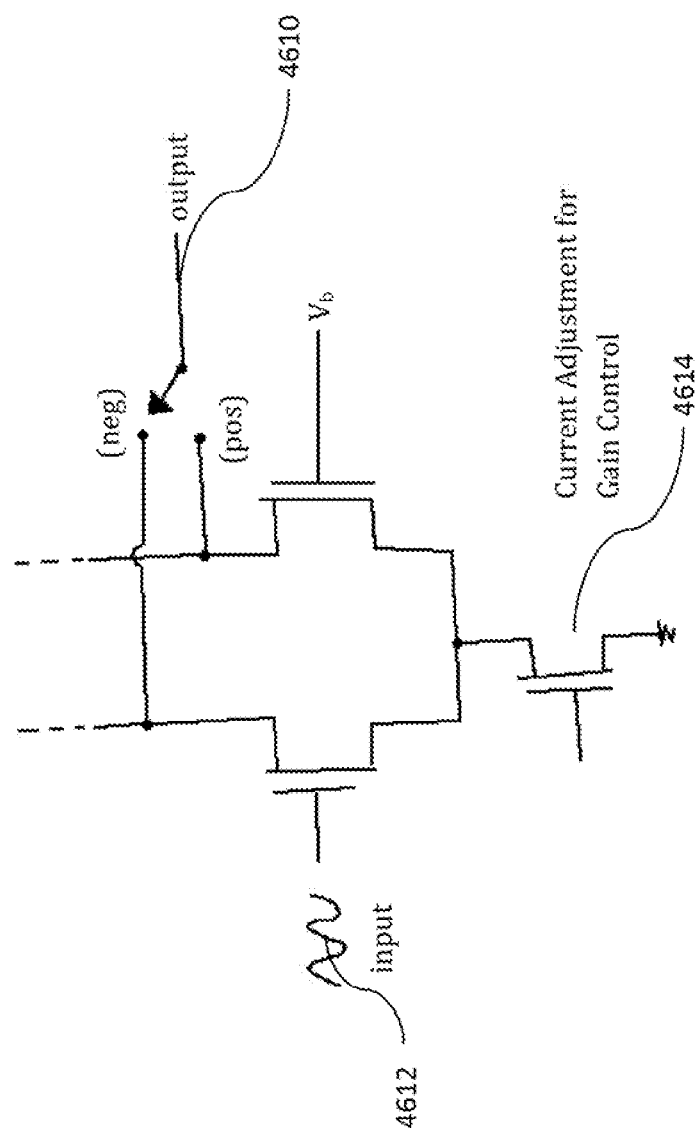
FIG. 46 is a schematic for providing variable gain with a polarization selectable output.

To achieve full 360-degree parasitic phase shift control, an alternative is to add polarization selection on the output of the variable gain block working with the all-pass phase shifter. The gain block can be realized with a differential amplifier and a FET to control the source current and hence the gain of the differential amplifier. One of the two outputs of the differential amplifier can be selected with a switch. A simplified schematic of the variable gain with a polarization selectable output 4610 is shown in FIG. 46, having input 4612 and current adjustment for gain control 4614.

This gain polarization switching circuit is a simple integration of a differential amplifier with a control for the gain based on adjusting the current through the differential FET pair via the bottom FET shown. Selection of the outputs from the two differential outputs provides the polarity selection. An alternative might be to use a full Gilbert cell integration. A Gilbert cell is more elaborate than what is required for the ATL3 implementation. However, there may be other considerations not considered here that may deem the Gilbert cell as a better choice.

This circuit is set up at the desired frequency of the ATL1, which in this case is normalized to $\omega=1$ and then the all-phase phase shifter with the polarization control compensates for the parasitic phase shifts. The closed loop center frequency will be at the correct frequency when phase shift at that frequency is a multiple of 360 degrees.

Figure 47:
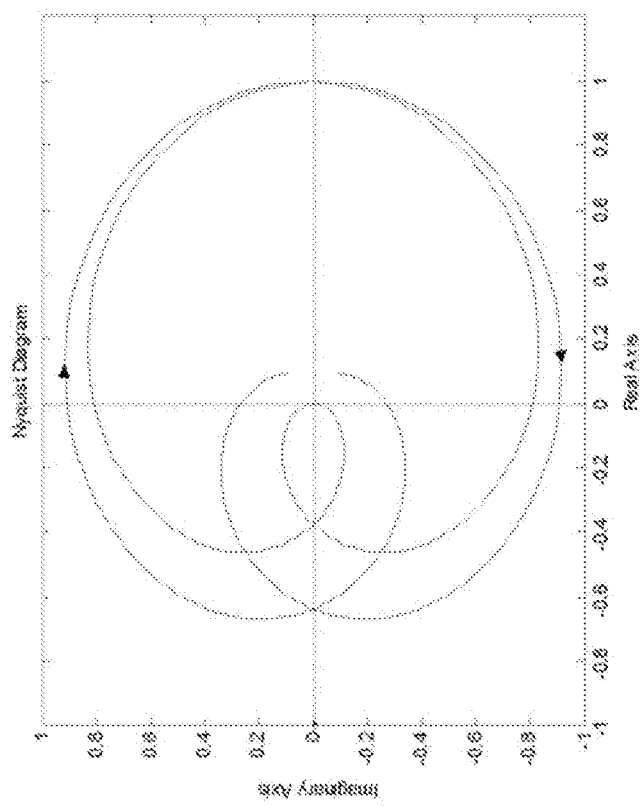
FIG. 47 is a Nyquist plot of ATL1 using a phase selectable gain block and an all pass phase shifter.
Figure 48:
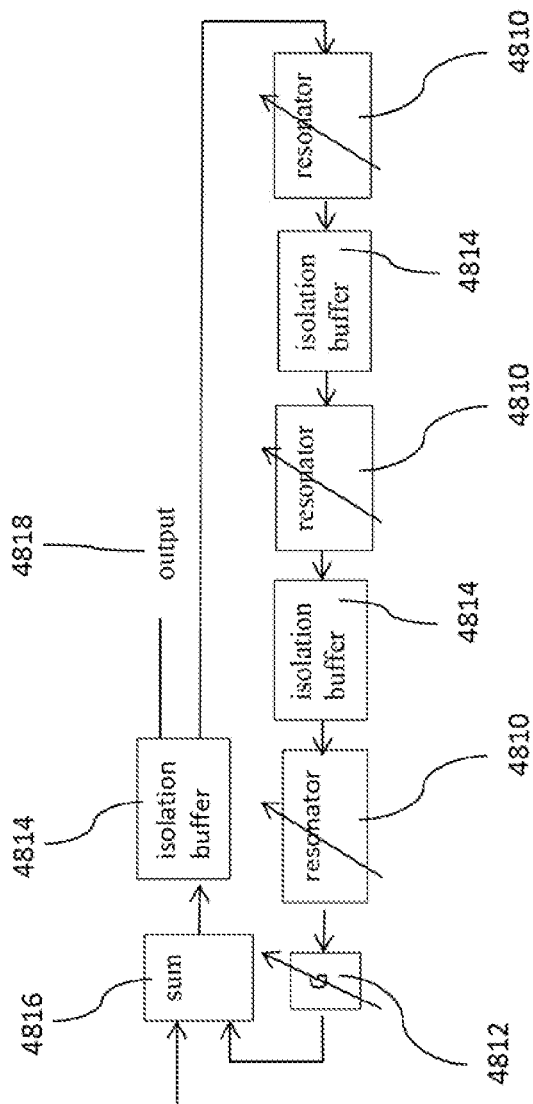
FIG. 48 is a block diagram of an ATL3 configured for phase shifting using gain polarization switching.

A typical Nyquist plot based on this ATL1 phase shift control implementation is shown in FIG. 47. In this case, a parasitic delay resulted in a phase shift of 0.6 radians. The all-pass circuit compensated for this with a resonance at 1.02 such that the $\omega=0$ point is coincident with the intercept point on the real axis.

Use of this technique may be extended to ATLn implementations.

Gain Polarization Switching Plus the ATLn Based Phase Shift Control

As the all-pass network is based on a resonator, we now investigate the implementation of an ATLn circuit for phase shifting, including the gain switching described above, as an alternative to an all-pass network circuit for phase control preferred for the ATL1 phase control. Elimination of the active all-pass network's additional parts is a reasonable objective. In addition, the all-pass phase shifter provides constant magnitude which is not needed for phase shifting.

We may improve the tunability slightly by adding an additional resonator such that we have three resonators as in the ATL3. The motivation is to have less detuning of the resonators to accommodate an arbitrary parasitic phase shift. This results in the Nyquist locus at the real axis intercept being more perpendicular to the real axis, which results in less bandpass skewing and more independent control of the closed loop passband center frequency and bandwidth. FIG.

48 shows a block diagram of the ATL3 with three cascaded resonators 4810, with a variable gain block 4812, a gain polarity selection buffers 4814, sum 4816, and output 4818.

Figure 49:
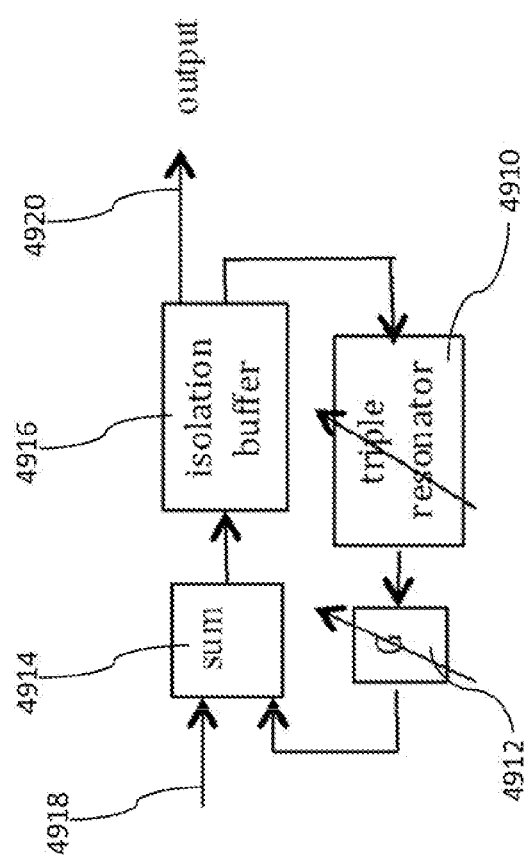
FIG. 49 is a block diagram showing an ATL3 for phase shifting reconfigured as a triple resonator.
Figure 50:
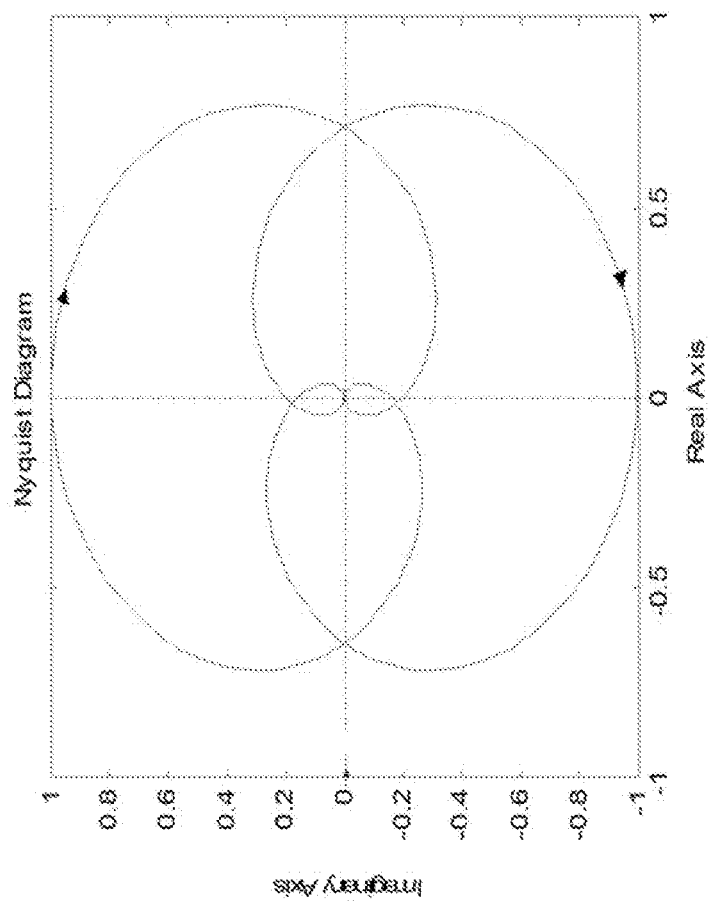
FIG. 50 is a Nyquist plot after ATL3 compensation for a parasitic delay of 1.5 radians using gain polarization switching.

As with the ATL2, isolated resonators 4910 are not necessary and we can group the three required resonators into a composite bandpass filter with three poles as shown in FIG. 49. Also shown in FIG. 49 are gain block 4912, sum 4914, isolation buffer 4916, input at 4918, and output at 4920. We feed a parasitic phase error of 1.5 radians into this ATL3. The resonators only need to be detuned by about 5% each to accommodate this worst case parasitic phase shift. Also, as described before, if the parasitic phase shift is increased beyond 1.5 radians then the other polarization output of the variable gain block is used. FIG. 50 shows the Nyquist plot of the detuned ATL3 resonators with gain switching compensating for 1.5 radian parasitic phase error. Note that when the phase error is around $\pm\pi/2$, the Nyquist plot is approximately symmetrical with respect to the imaginary axis. This implies that either polarization of G will give about the same performance for Q enhancement.

It is interesting to consider the root locus plot of the ATL3 in this case. Unfortunately, parasitic delays cannot be directly represented in a root locus plot. However we may get a reasonable idea of behavior by ignoring the parasitic delay for this instance. The root locus is plotted in FIG. 51 for the case of the three resonator poles at $\omega=1$ with a damping coefficient of D=0.1, corresponding to a Q of 5.

Figure 51:
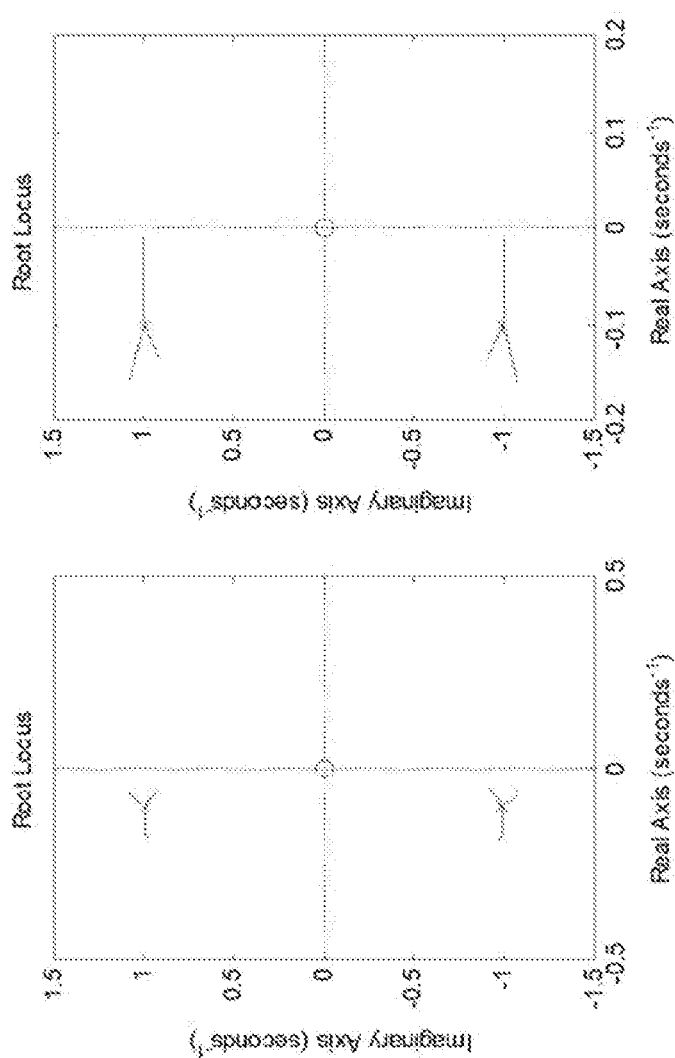
FIG. 51 is an estimated root locus plot for the Nyquist case shown in FIG. 56.

What is interesting in the FIG. 51 plots is how the closed loop poles split for the two polarizations of the loop gain G.

In the 180-degree root locus plot on the left, there are two dominant poles that move toward the j$\omega$ axis. Hence there is Q enhancement of both of these poles.

In the 0 degree root locus plot on the right, only on pole is Q enhanced.

Figure 52:
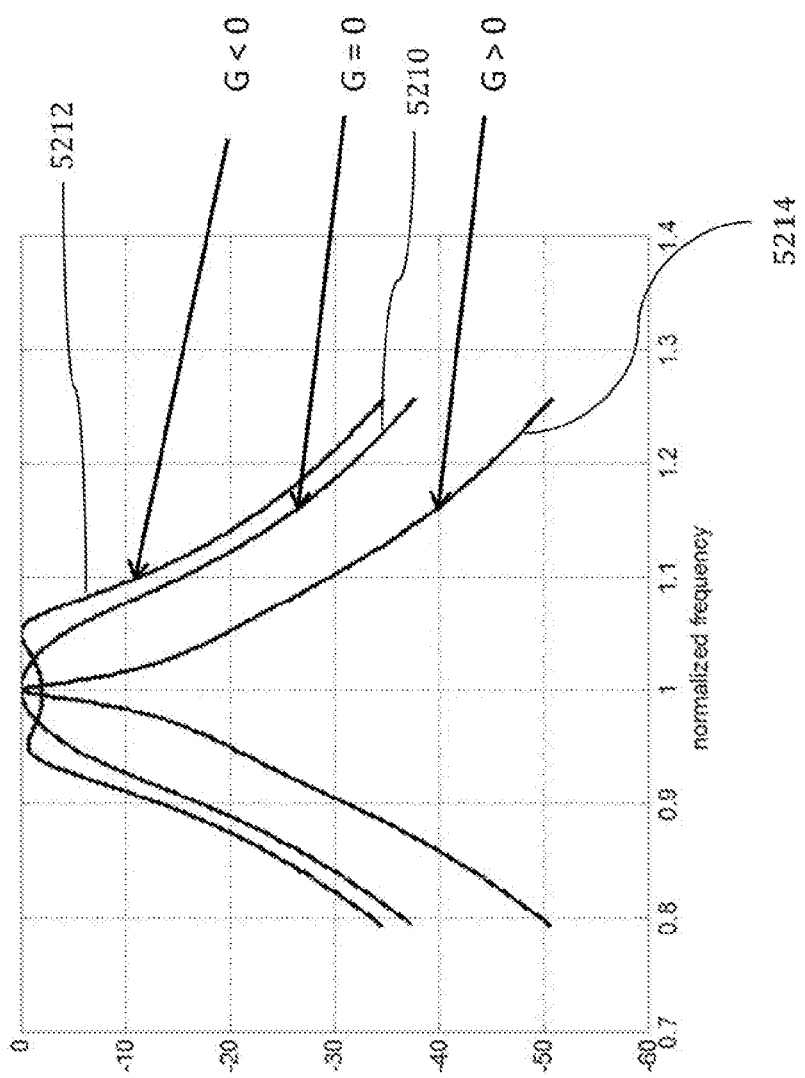
FIG. 52 is a plot showing the effect of gain polarization switching on the frequency response bandwidth.

What this results in is a simple bandwidth control as shown by the frequency plots in FIG. 52, having line 5210 showing G=0, line 5212 showing G<0, and line 5214 showing G>0. By varying the G control with the polarization switch, we can switch between two controllable bandwidths.

Self-Calibration of the ATLn

There will now be described a way in which the ATLn may be used as a subsystem in a given application. In this example, control voltages may be set that adapt the performance of the ATLn for the target application, based on the following principles:

The resonator block may be based on controlling voltages of varactor diodes for center frequency selection;

The gain block may require a control voltage for controlling the scaling of the signal or the feedback gain and overall bandwidth (Q) of the ATLn;

The signal phase shifter, implemented with varactor diodes, may require additional control voltages.

Signal phase shifting arises from the delay and phase shift of components and interconnections for implementations at either a) bulk component level; b) component surface mount level; or c) integrated chip level. It is necessary to compensate these phase changes in the feedback loop(s) with a phase shifter that can properly restore the overall phase shift of the loop.

Summing up, there are three control voltages to set:
f: center frequency control voltage
g: loop gain and bandwidth control voltage
p: phase adjustment control voltage These control voltages, as determined, are placed into a Look Up Table (LUT) which provides a mapping between the application or user parameters for bandwidth (denoted by B) and center frequency (denoted by F) and outputs {f,g,p}. The LUT actually consists of three individual and independent tables with input variables including {B,F} and individual settings for f, g, and p As the set of LUT manifold functions are rather smooth, accurate interpolation from a small set of calibration points in the {B,F} space is sufficient.

In this example, the basic ATL1 calibration data is resident in the LUTs. For the ATLn there will be 3n calibration LUT, each LUT containing
An entry for the phase
An entry for the loop gain and bandwidth control, and
An entry for setting the frequency for each of the n resonators.

Thus, for the ATL1, there may be three such LUTs, while for the ATL3, there may be 9 LUTs.

Below is a discussion of various considerations that may or may not be relevant to any particular implementation.

ATL1 Calibration and Stability Control

Figure 32:
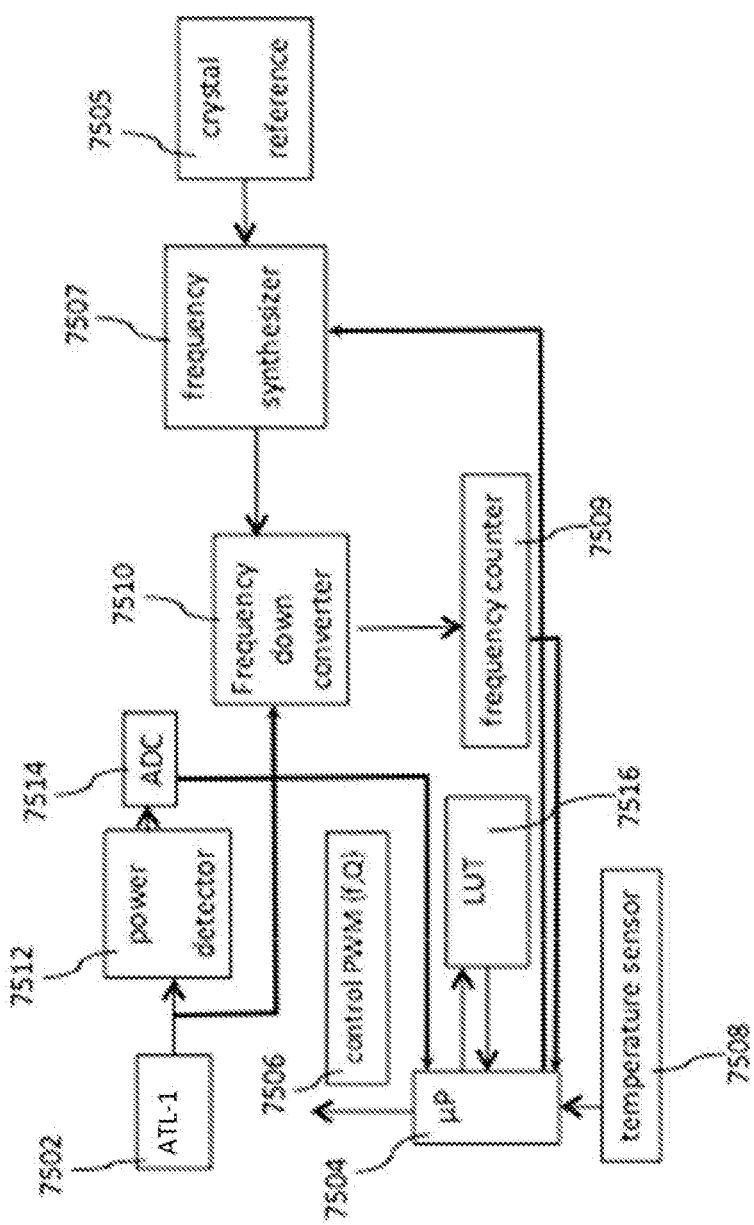
FIG. 32 is a block diagram of ATL1 core module calibration and stabilization.

We first address an example of the calibration and stabilization of a single ATL1 core module. FIG. 32 presents a circuit that has processing built in for the purpose of calibrating and stabilizing the response of an ATL1 block 7502. FIG. 32 shows ATL-1 7502, power detector 7512, ADC 7514, frequency down converter 7510, frequency counter 7509, temperature sensors 7508, µP 7504, LUT 7516, control PWM (f, Q) 7506, frequency synthesizer 7507, and crystal reference 7505.

Referring to FIG. 32, the microprocessor 7504, generally a system asset, adjusts the control for the frequency and Q of the ATL1 7502 through a digital to analog converter (DAC) implemented as a pulse width modulation (PWM) circuit 7506, and based on readings from a temperature sensor 7508. The microprocessor drives the ATL1 7502 to the start to self-oscillation. The frequency of this self-oscillation is down converted in block 7510 by a frequency synthesizer signal generated by a crystal reference 7505 and a frequency synthesizer 7507 that is set also by the microprocessor 7504. A frequency counter 7509 or other measurement means determines the frequency of the down-converted signal. In this way the resonant frequency of the ATL1 core module may be determined. Also, there is a power detector 7512 and analog to digital converter (ADC) block 7514 that can estimate the rate of increase of the self-oscillation signal at the output of the ATL1 7502. The microprocessor 7504 estimates this exponential rise of power and from this determines where the closed loop pole of the ATL1 7502 is. Presently it will be just to the right of the jw axis. If the Q-enhancement is decreased slightly then the self-oscillation will continue at the same frequency to a high accuracy but will begin to decay exponentially. Now the pole is on the left hand side of the jw axis. Again, based on the power detector 7512, this exponential decay may be measured, and the operating point measured. By repeatedly bringing the ATL1 7502 into self-oscillation and then reducing the Q-enhancement by a controlled amount, the mapping of the ATL1 to the f and Q control signals may be completed. This calibration may be done based on circuitry on chip that requires no additional off chip components except for the crystal reference source. During operation, calibration breaks may be made such that the LUT 7516 is continuously updated. In the case of a wireless sensor, the transmitter and receiver functions are separated by epochs of inactivity in which the calibration processing may be done.

ATL1 Q Control

Figure 33:
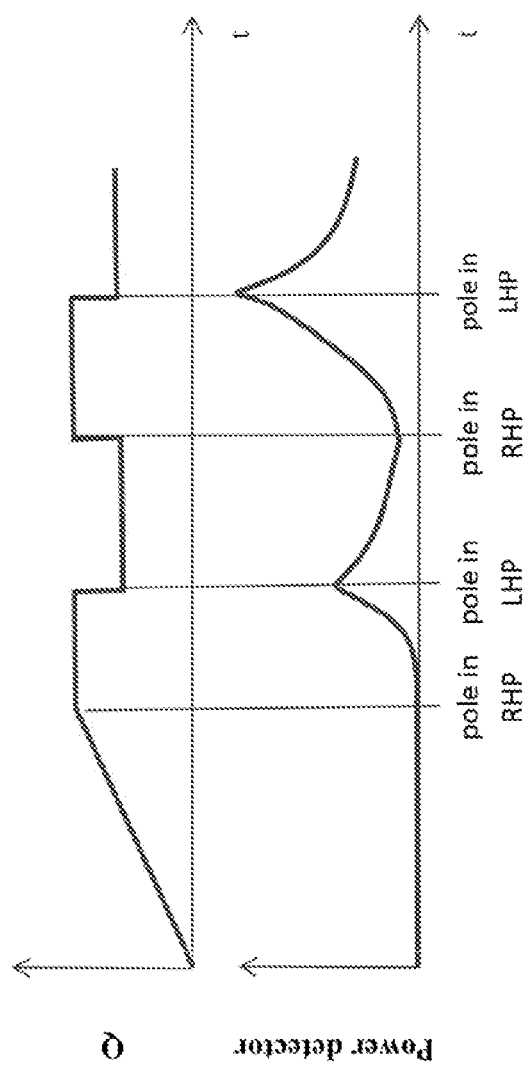
FIG. 33 is a set of graphs showing Q control alternating between higher and lower levels during closed loop calibration.

FIG. 33 shows an example of the Q control of the ATL1 alternated between higher and lower levels that alternately places the closed loop pole of the ATL1 in the right hand and left hand planes. The resulting exponential rise and decay is easily measured by the power detector with numerical analysis done on the microprocessor. Hence the applied Q control voltage may be mapped to a specific pole position. This is stored in the LUT such that when a pole position is required for the filtering operations of the ATL1 then the LUT may be interpolated and the {f,Q} control voltages set.

The real part of the closed pole value is easily measured. Suppose that the pole is in the right hand plane such that it has the form of x=a exp(bt) where a and b are unknown constants. Then if the envelope voltage is measured at two different times of $t_1$ and $t_2$ resulting in $x_1$ and $x_2$ respectively then the desired parameter b may be estimated from $$x_1 = a\exp(bt_1)$$
$$x_2 = a\exp(bt_2)$$
$$b = \frac{\ln\left(\frac{x_2}{x_1}\right)}{t_2 - t_1}$$

Either the times of $t_1$ and $t_2$ may be set and the voltages $x_1$ and $x_2$ measured, or else fixed thresholds may be set at $x_1$ and $x_2$, and the time difference of $t_2-t_1$ may be measured. Either approach is straight forward.

For applications involving an ATLn implementation, the above calibration procedure is repeated for each ATL1 core module within the ATLn.

It will be understood from the forgoing that the ATLn may be designed to relatively easily broaden the bandwidth. As was shown above, a small amount of Level Two feedback gain G around the 3 Rs of an ATL3 is a simple and robust way to change the passband from something representing a single pole passband response to a broader response similar to a third order Chebyshev filter.

ATL3 Control Example

An application of this control concept may be in a wireless sensor, and may provide the following aspects:

First, the ATL3 may be configured on the fly to be a sensor for power spectral density for a cognitive radio;

Then the ATL3 functions as both a transmitter filter and a receiver filter for this passband using transmit receive (T/R) switches to reorient the filter for transmit and receive functions;

In the receive mode, we can tie the ATL3 into an adaptive loop that uses the SNR of the digital sampled output to optimize filter parameters. As the {f,Q} control is orthogonal, this SNR optimization is robustly achieved with a simple dithering algorithm.

Finally in setting up the ATL3 it is necessary to know where the poles are located as a function of the controls. This may be achieved by using an auxiliary ATL1 on chip for calibration purposes. By alternating the pole position in the right and left hand planes (unstable and stable respectively), the envelope of the self-oscillation of the ATL1 may be used as a probe signal to estimate the real part of the pole location. The imaginary component is determined by the frequency of self-oscillation. The self-oscillation may be measured based on comparison with a crystal locked synthesizer frequency. Instead of the ATL1, the three resonators (R) of the ATL3 may also be used directly. However, implementing the ATL1 allows for calibration to be continuous and in parallel with the operation of the ATL3 which is then dedicated for the actual signal processing. The measurements of the ATL1 pole location as a function of the control voltages and perhaps chip temperature is stored in a LUT. The values of the LUT are interpolated when the ATL3 is to be configured.

It should be pointed out that the exponential decay times of this procedure may be quite fast, requiring a high speed DAC. Further, there is an assumption that when crossing from the unstable RHP to the stable LHP, the pole frequency does not change, which is a reasonable assumption. Consequently, this approach for calibrating and stabilizing a single ATL1 core module is adequate for general purposes. For the highest calibration precision, however, a second approach to calibration and stabilization is now presented.

High Precision ATL1 Calibration and Stability Processing Objectives

While the ATL1 calibration is stable over time, varying primarily based on ambient temperature, it may not be sufficient for precision filtering operation for applications that require high Q narrow bandwidth operation where the poles are very close to the jω axis. In addition to the normal aging effects of components, there is some sensitivity in the ATL due to temperature drift of components that may result in bandpass shifts on the order of several MHz. In addition, the ATL passband is affected by the load match at the input and output terminals.

For the highest precision, what is desired is:

The ability to set a 1 MHz bandwidth for an ATL1 core module, and

Resolution of the ATL1 core module center frequency of about 100 kHz, requiring a relative frequency accuracy of 100 ppm.

This relative frequency accuracy is typically provided by a crystal reference that is available in all communications devices. In applications where the highest precision is not needed, or when an external crystal reference is not available, high performance is still achievable.

A factory calibration may not be sufficient for this level of highest precision, such that initialization calibration, and possibly run time calibration, may be necessary. What is more, in narrow bandwidth operations, the Q enhancement factor may be large and therefore the loop gain has to be set very precisely. If the loop gain is changed by as little as 100 ppm in high precision applications where narrow bandwidth linear filtering mode is desired, the ATLn can push the closed loop poles over the jw axis into the right hand plane (RHP) resulting either in a) self oscillation; or b) transitioning into an injection locking. Hence precise calibration of the loop gain is also required. To address these calibration issues, two calibration modes, discussed in detail below, are envisioned.

ATL1 Initialization Self-Calibration Mode

ATL1 self-calibration at any system implementation—be it discrete component level, surface mount level, or as an integrated chip—is based on measurements of the ATL1 passband as a function of the {f,g,p} control voltages. The ATL1 can go into this self-calibration mode every time it is requested to do so by an upper application layer that either a) repopulates the LUTs or b) can do a weighting of the previous and current measurements. These ATL1 measurements will be done with the input and the output loads of the circuit in place such that any deviation due to port impedance mismatch is accounted for. If not available at the system level, a temperature sensor is also provided with the ATL1 circuit such that the sensitivity due to temperature changes may be calculated. Note that this is done over multiple calibration runs and by analysis of the drift during run-time. Note also that this in-situ calibration also accounts for the voltage regulation errors and any offsets in DAC voltages for the {f,g,p} controls.

Initialization is only required when the initial parameters for operating frequency and bandwidth (Q) are established. If multiple operational frequencies are required, as in a frequency hopping application, initialization is required at each operational frequency. Operation of the ATL1, and by extension the ATLn, has proven to be stable over time and hence initialization is not routinely performed. The sole parameter that affects operational calibration is the ambient temperature of operation, which is the subject of run time calibration.

For implementation of an ATLn, each of the ATL1 core modules much be separately initialized and their respective LUTs established.

ATL1 Run Time Calibration Mode

Run time calibration is application specific. In wireless applications of the ATL1, there will be some inherent baseband data demodulation processing by which signals may be extracted as metrics indicative of the quality of the ATL1 filtering. The {f,g,p} control parameters may be set by dithering or other optimization strategies to maximize the quality of the ATL1 filtering. Corrections to the LUTs may be noted as deviations from this optimization process. Hence the LUTs are continuously optimized. Algorithms for long term annealing of the LUT may be customized to the specific applications.

The frequency passband response is measured relative to a crystal-based reference oscillator or other frequency reference source.

ATL1 High Precision Calibration Processing Overview

In this section, a high precision calibration structure is proposed that will facilitate the two calibration modes of the previous section: ATL1 initialization self-calibration and ATL1 run time calibration. This structure is dependent upon the physical implementation of the ATL1 core module, be it at discrete component level, surface mount level, or an integrated chip implementation. While any application could be considered (an ATL3 or the ATLF for example), in order to focus initially on the concepts of self-calibration and stability control only, the ATL1 core module is implemented within an overall wireless sensor transceiver system consisting of a minimal four components, a block diagram of which is shown in FIG. 146, which shows antenna 14610, switch array 14612, ATLa 14614, ATLb 14616, down/up conversion and ADC/DAC sampling 14618, ATL control 14620, baseband processing 14622, LO/ADC clock synthesizer 14624, power conditioning 14626, transceiver chip 14628, clock crystal 14630, and power source 14632. For this example, we show a pair of standard ATL1 core modules labeled as ATL1a and ATL1b. They are chip implementations of the ATL1 and considered to be identical and uncalibrated. But the following calibration process would be the same at discrete component level and surface mount implementations of FIG. 146. Chip level implementation, however, likely provides the highest level of precision.

Referring to the overall wireless sensor transceiver system of this example, shown in FIG. 146, the antenna is connected to an operational mode switch matrix that enables different configurations of the ATL1a and ATL1b for calibration mode, transmit mode, and receive mode. Clearly the switch will have some insertion loss and will contribute to the receiver noise figure (NF). We will consider this issue later. The baseband processing is used to generate observables from which the ATL1a and ATL1b may be controlled. The control is shown as a red line that also affects the switch array.

The overall goal is to develop a practical means of self-calibration of the ATL1a and ATL1b that is done within the transceiver module outlined in FIG. 146 by itself. That is, the transceiver module as shown in FIG. 146 will be fabricated and inserted into the transceiver system initially uncalibrated. Upon application of power, the transceiver module enters a self-calibration mode wherein it generates a look-up table (LUT) for the control voltages of ATL1a and ATL1b necessary to support a given center frequency and Q. The calibration will be ongoing during operation in various modes. In this way the transceiver chip will self-learn as it is operating.

To enable this calibration, the clock crystal sets the reference frequency to be used. However, as inexpensive clock crystals are only accurate to within about 100 ppm, it is possible in various scenarios to use an incoming reference signal to determine the frequency offset of the clock crystal, as mentioned above, and store this also in the LUT.

It is important to recognize that the ATL1 may be operated as a stable oscillator with a tunable frequency, and that this output may be fed onto another ATL1 to determine its frequency characteristics. Following this method, ATL1a becomes a voltage controlled oscillator (VCO) that feeds into ATL1b to determine the bandpass characteristics of ATL1b, and then to use ATL1b as a VCO to feed into ATL1a to in turn determine the bandpass characteristics of ATL1b. As the ATL1a and ATL1b are built on the same chip die, operate at the same temperature and have the same voltage applied to it and age in the same manner, they will be very closely matched in terms of operating characteristics. This helps with the calibration as will be elaborated on later. A key innovation is that the chip is a transceiver and therefore has baseband processing that is clocked based on the frequency corrected clock. The stability of the clock crystal is therefore effectively mapped into the ATL1a and ATL1b. That is, say that ATL1a is used as a VCO set up to operate at a specific frequency based on control settings. Then it is possible based on the down conversion (based on an LO synthesizer derived from the clock crystal) and ADC sampling (clock also based on the clock crystal) to determine the frequency of the ATL1a relative to the corrected clock crystal frequency. When the closed loop resonant pole of the ATL1a is backed away from the jw axis such that it ceases to oscillate then it will behave as a high Q filter. The frequency of oscillation just as the ATL1a comes out of oscillation mode into the filter mode is precisely the center frequency of the ATL1a high Q filter.

For non-chip implementations, the same considerations apply at system level. However, calibration accuracy may be impacted by the quality of the implementation.

As used herein, reference to high and low Q will be understood based on the context in which they are used, as will be understood by those skilled in the art. In some cases, the Q of the primary resonator may be considered high relative to the adjustable resonator, where a high Q resonator may be considered to be a factor of 10 greater, or even a factor of 100 greater, than the adjustable resonator.

Operational Modes

There are different modes that the switch array can implement.

The basic receive mode (Mode 1 shown in FIG. 147), where we have the ATL1a forms the RF filter. FIG. 147 shows antenna 14710, ATLa 14712, and down conversion ADC sampling 14714. In this mode the ATL1a will have relatively high Q and also will have a high gain.

ATL1a and ATL1b are cascaded (Mode 2 shown in FIG. 148) where the ATL1a will have a lower Q, broader bandwidth and ATL1b will be narrower bandwidth and higher Q. FIG. 148 shows antenna 14810, ATLa 14812, ATLb 14814, and down conversion ADC sampling 14816. The idea is that ATL1a will suppress some of the out of band tones and have better intermodulation performance as it is lower Q. The ATL1b will be narrower bandwidth with a higher Q.

A provisional switched-in attenuator is inserted between ATL1a and ATL1b as shown in FIG. 149, as may be necessary for keeping the gain within a reasonable upper limit for stability as discussed later. FIG. 149 shows antenna 14910, ATLa 14912, attenuator 14914, ATLb 14916, and down conversion ADC sampling. If the gain is too high, then it is difficult to ensure that the transceiver chip remains stable. Note that this attenuator is a relatively trivial circuit that may be added in at the output of the ATL1a.

Currently we are restricting to time division duplexing (TDD) protocols for which the transceiver will transmit in one time interval, and then receive during another time interval, however other protocols may also be used. The selection of an appropriate protocol is beyond the present discussion, as long as the mode is able to handle this. Mode 3, as shown in FIG. 150 is the basic transmit mode that works in conjunction with mode 1 for the receive mode. FIG. 150 shows antenna 15010, ATLb 1501, and up conversion DAC sampling 15014. The switch array would facilitate the switching between the mode 1 and mode 3 for the TDD function.

High Precision Calibration Modes

Next, we consider the set of switchable modes for calibration. In Mode 4, as shown in FIG. 151, we operate the ATL1b as a VCO by tuning it such that the closed loop resonance pole is essentially at the jw axis. FIG. 151 shows ALTb 15110, attenuator 15112, ALTa 15114, and down conversion ADC sampling 15116. We attenuate this ATL1b VCO signal to a low level by a simple attenuator associated with the ATL1b output that may be switched in. An attenuated sinusoidal signal then goes into the ATL1a and is down converted and sampled. Subsequent processing measures the level and frequency of the signal output of the ATL1a. In this way, the ATL1a bandwidth and center frequency may be tuned.

Mode 5, shown in FIG. 152, is the reverse of Mode 4 in that the ATL1a is used as the VCO and fed into the ATL1b that operates as a filter. FIG. 152 shows ATLa 15210, attenuator 15212, ATLb 15214, and down conversion ADC sampling 15216.

High Precision ATLn Self-Calibration

We now teach that with the addition of a single ATL1 core module to any ATLn circuit, precision calibration may be achieved. We begin with the circuit of FIG. 146 being operational, but there is no calibration data given at all. When the circuit of FIG. 146 is powered up the first time, it goes into a fundamental calibration mode where the content of the LUT is erased and we start with a blank LUT.

Assume then that the system starts in Mode 5 of FIG. 152. We will assume for simplicity that ATL1a and ATL1b have resonators in their through path, with a scaling block and a phase shifter in the feedback path, as shown in FIG. 153. FIG. 153 shows coupler 15310, resonator 15312, scaling block 15314, and phase shifter 15316. As usual we assume three control voltages {f,g,p}: one for the resonator frequency, one for the scaling block setting and the third for the phase shifter control.

Assume that the ATL1b can be set up with a resonator with an open loop Q of approximately 10 for illustrative purposes. If the scaling block is set to G=0, then there is no feedback and then we only have the open loop Q. Hence the output of the ATL1a that passes through the ATL1b should be observable in the baseband processing to the extent that the frequency may be accurately determined by reference to a clock crystal.

We also assume that the ATL1b fabrication is sufficiently controlled such that the resonator of ATL1b may be set such that it is approximately in the middle of the tunable band. This implies that we are assuming reasonable fabrication control of the varactor diodes used in the resonators. Also, the resonator for ATL1a is initially set in the middle of the tunable band.

Now the gain is increased. Note that the ATL1a resonator oscillation condition is met when the loop phase around the ATL1a is a multiple of 360 degrees, and that the loop gain is slightly less than unity. We next adjust the ATL1a phase voltage control to achieve this resonance condition. The ATL1a phase is then adjusted such that the scaling block is set to the minimum feedback gain to sustain oscillation. The difficultly will be in observing the oscillation as the baseband processing has a restricted bandwidth. Hence an initial search over the resonator voltage and the phase is required for ATL1a.

As shown above, the phase shifter will be modeled as an all-pass filter of the form $$= \frac{+}{+ +}$$

where the pole zero plot is given in FIG. 154.

The frequency response is shown in FIG. 155. Note that the magnitude response is flat as required of an ideal phase shifter, and that the phase is a decreasing slope with frequency representing a near constant delay over an approximate frequency range of ±20%. By changing the all-pass center frequency $\omega_p$, the phase curve can be shifted left or right providing phase control.

Next, we look at frequency plot of the open loop resonator within the ATL1 core module, represented as $$H_r(s) = \frac{2D_r\omega_r s}{s^2 + 2D_r\omega_r s + \omega_r^2}$$

The response for $\omega r=1$ and $Dr=0.05$, which corresponds to an open loop Q of 10, is given in FIG. 156. The pole zero plot of the resonator is given in FIG. 157.

The open loop transfer function is given by $$H_{ol}(s) = GH_r(s)H_{ap}(s)$$

where G is the gain of the scaling block and the subscript "ap" refers to the all-pass. The zero-degree root locus of the resonator is shown in FIG. 158, where we additionally show both the poles and zeros of the phase shifter.

This pole behavior is approximately the same as before with the closed loop poles starting at the open loop pole locations of the resonator (for G=0) and moving towards the jw axis as G increases. The locus reaches the jw axis when G=1.

We now mismatch the phase shifter such that it provides an excess of 50° in the loop which is implemented by choosing $\omega_{ap}=0.9$. The new phase plot of the phase shifter now shows a lag of 50° as seen in FIG. 159.

The changed root locus is given in FIG. 160 for the same range of G as before (0<G<1). Note that the oscillation condition is not reached for G=1. Consequently, the loop gain has to be increased in the case of a phase mismatch in order to reach the unstable state. Also, note that as G is increased beyond G=1, the oscillation frequency is decreased. This makes sense as the resonator needs to be at a lower frequency such that it has a positive phase shift to offset the negative shift of the all-pass phase shifter circuit.

For the case of $\omega_{ap}$=0.9, we need G=1.26 or a 26% higher G in order to reach the oscillation condition. If the phase shifter is mismatched the other way, such that it provides a positive phase shift, then the oscillation frequency is increased resulting in a negative phase shift of the resonator to offset the positive phase shift of the all pass network. FIG. 161 shows a plot of the loop gain required to reach the oscillation condition as a function of the phase shifter mismatch. We map this into the equivalent phase shift shown in FIG. 156.

We see that the ATL1 core module resonance frequency and phase shifter values can be set by increasing G and noting the point where the ATL1 core module begins to oscillate. The following procedure is one possible sequence:

Set up the switch array to give us Mode 4 shown in FIG. 151.

Set up the ATL1a with feedback gain of zero such that it has a broadband response.

Set the desired upper range of the ATL1b resonant frequency by adjusting the resonator frequency control voltage.

Assure that the Local Oscillator (LO) of FIG. 146 is set at approximately the same frequency that results from Step 4.

Increase feedback gain of ATL1b until ATL1b just reaches oscillation threshold.

Dither the phase shifter such that we can back off the feedback gain to find the oscillation threshold minimum gain value.

Finding this point, put the frequency of oscillation, feedback gain control voltage, and phase shifter control voltage into the LUT. This represents the calibration point of the ATL1b that precisely sets the ATL1b pole location at the jw axis for the given oscillation frequency with the phase shifter correctly set.

Once the upper range of the resonator control has been completed in this incremental fashion, we proceed with the lower half. Go back to the starting voltage of the ATL1b resonator and then incrementally lower the resonator voltage following the above steps until the complete resonator range is calibrated and LUT complete. Once this first point is found, then the remainder of the procedure is relatively fast and efficient.

Once the oscillation conditions for ATL1b are completed, then Mode 5 shown in FIG. is switched in, reversing the functions of ATL1a and ATL1b. That is ATL1b is now set up for no feedback and hence broad bandwidth. Note that as ATL1a and ATL1b are essentially identical, varying only in tolerances resulting from fabrication, the LUT entries for the ATL1b may be used as initial points for the ATL1a calibration. In the case where the ATL1a and ATL1b are located on the same chip die, and operated under the same conditions (temperature, supply voltage, etc.), the LUT entries for ATL1a for should be very close.

The ATL1a is then set up as an oscillator and the calibration table filled, following the procedural steps as above, for the ATL1a.

The LUT's are now populated with the conditions for the closed loop resonant poles to reach the jw axis for both the ATL1a and ATL1b. The final step is to interpolate these values into a uniform frequency sampling, which is easily done as the data collected from the initial step is sufficiently dense.

Now we can use Mode 4 (FIG. 151) again, but now with the ATL1b as a VCO that can be tuned fairly accurately. The precise frequency of the ATL1b will ultimately be determined by the LO down conversion and the digital signal processing (DSP) baseband processing. This determined frequency is 'exact' in the context of the clock crystal.

We now turn to determining the characteristics for the closed loop Q of ATL1a as a function of the applied loop gain. Suppose we want the ATL1a to have a passband centered at a frequency $\omega_a$. From the previous calibration, we know the feedback gain and phase shifter settings to just reach oscillation. Now we have to know how much to reduce this feedback gain setting from this oscillation condition that will give us the desired bandwidth Q. This is achieved as shown in FIG. 162, which shows ATL1b 16210, ATL1a 16212, and down conversion ADC processing for amplitude 16214.

ATL1b oscillates as a VCO at $\omega_a$ with the signal passed into ATL1a. The phase shifter control and open loop resonator control voltage of ATL1a are dithered in a synchronous fashion based on the LUT entry. This causes the passband of the ATL1a to be dithered in terms of the center frequency. The down conversion, ADC and subsequent processing determines the amplitude variation of the frequency component at $\omega_a$. The variation is used to determine the bandwidth of the ATL1a with a specific feedback gain. This observation is now an entry into the LUT for ATL1a. Then the feedback gain of ATL1a is incremented and the process repeated.

Once a number of such bandwidth observations are made as a function of the feedback control voltage for ATL1a, then we have a choice of a) either interpolating these values into a piecewise curve fit, or b) just fitting a quadratic or cubic polynomial to the data. The latter, fitting a quadratic or cubic polynomial to the LUT data, is felt to be a more accurate approach.

Once ATL1a is calibrated in this fashion then we can go back to Mode 5 (FIG. 152) and use the ATL1a as the VCO and measure the bandwidth of ATL1b for various feedback gain settings.

It should be pointed out that the addition of the single ATL1 core module solely for calibration purposes serves to enable high precision calibration of any ATLn implementation. The initialization procedure above is repeated for each ATL1 core module comprising the ATLn.

Control of Resonant Circuits

As stated above, it is desirable to be able to adjust the characteristics of presently pre-determined primary resonant structures by coupling these pre-determined primary resonant structures to a secondary variable resonant structure, and in so doing modify the characteristics of the pre-determined primary resonant structure by way of controlling the secondary variable resonant structure. This may permit the net circuit to automatically mitigate ambient temperature changes, component aging and drift of such pre-determined primary resonant structures. So doing would enhance overall system performance.

This coupling of resonant structures so described entails the addition of a variable resonator with a primary resonator. In one example, where the variable resonator is an ATL-based circuit that controls an external resonator (XR), this circuit design may be referred to as an ATLXR. As the discussion below will be in terms of an ATL-based circuit used with an external resonator, the term ATLXR will be used as a shorthand reference to a primary resonator that is modified by an adjustable resonator. However, it will be understood that the principles discussed may be expanded to other circuit designs in which other types of resonators are controlled using the ATL-based circuits described herein, which may not be considered external, as well as other suitable types of adjustable resonators.

The primary resonator may be a fixed resonator or a resonator that is tunable in frequency. However, for practical reasons, the primary resonator is preferably stable over the cycle time of the secondary variable resonator control and response loop such that the external pre-determined primary resonant structure appears "quasi-fixed" for system performance purposes.

This approach may be used to make small adjustments post-production that may increase production yields for high Q and moderate Q filters. The yield improvements may amount to adjusting the Q and/or center frequency of the fixed resonant structure. For example, the frequency response of the primary resonator may be designed to operate within a predetermined error factor, such as may be specified by the manufacturing specifications. The adjustable resonator may then be used to control the primary resonator within this predetermined error factor to cause the closed loop frequency response to approach the ideal frequency response of the primary resonator.

In one example, consider an external resonator, denoted by XR, of moderate to high Q, that has predetermined frequency response properties. The XR resonator is connected in a signal loop with active signal amplification gain block g and an additional second variable resonator, denoted by R, as shown in FIG. 179. The variable R resonator 17910 is controllable in terms of resonant frequency by a control f 17916, and may have a low Q, relative to the external resonator F 17912. The gain block G 17914 is controllable by g 17918.

The ATLXR provides fine tuning of a primary resonator by employing a tunable secondary low Q circuit in a signal loop containing the primary resonator. The pre-determined resonance properties of the primary resonator may be effectively modified by the action of:

A change in the resonance frequency of the low Q resonator R by the control of f;

And/or a change in the closed loop Q of the resonator R by the gain block G through the control g.

Basic Principle of Operation of the ATLXR: Controlling the Poles of a Primary Resonator As noted above, while the term ATLXR is used herein, the primary resonator being controlled may be a resonator other than an "eXternal Resonator", and the adjustable resonator may be a resonator other than an ATL-based circuit. However, as the context of the present example is given in terms of these examples, the following ATLXR Acronym Table is presented for reference:

| ATL | Any member of the set ATL1, ATL3, ATLn in context |
|---|---|
| ATLF | Implementation of the ATLXR where external resonator is an antenna |
| ATLF3 | Implementation of the ATLF incorporating the ATL3 version of the ATLn |
| ATLXR | ATL with a primary (eXternal) Resonator incorporated into a signal loop |
| BAW | Bulk acoustic wave resonator |
| BPF | Band pass filter |
| DC | Directional Coupler |
| f | Frequency control of secondary variable resonator |
| g | Gain control of scaling block in loop |
| G | Gain block or scaling block, acted on by control g |
| LHP | Portion of the s-plane to the left of the jw axis |
| p | Loop phase control of P |
| P | Phase shifter, considered to be discrete (0 degrees or 180 degrees) |
| R(s) | Transfer function of a chip integratable resonator R, controllable by f |
| RHP | Portion of the s-plane to the right of the jw axis |
| SAW | Surface wave resonator or a set of resonators to realize a multipole-filter |
| SOS | second order section or bi-quad section of a filter partition |
| v | Control of variable attenuator |
| V | Variable attenuator between ATLXR stages for multipole filter |
| XR | External resonator |
| XR(s) | Transfer function of a primary resonator, which may be fixed or tunable, and may or may not be external |

For the purposes of illustrating the principle of operation, an example of an embodiment of the ATLXR and its operation may be described using a pole zero diagram of the open loop response of the ATLXR. We will describe the operation based on the primary resonator being a two-port resonator. However, the principle of operation of the one port resonator is essentially the same.

Consider the open loop circuit shown in FIG. 180. In this example we assume that the components of F 18010, R 18012, and P 18014 are linear and time invariant. R is controlled by f 18016, and P is controlled by p 18018. However, the description also extends to mild deviations for nonlinear and time varying components as mentioned above. In a preferred embodiment, the resonator may be modelled as a generally high Q resonance pole, while R may be represented by low Q poles at about Q=10 to 20, based on these considerations:

Requiring a basic resonator R with Q that is higher than about 10 to 20 would result in a chip integration that is more difficult;

Inversely, requiring a basic resonator R with a Q that is too low may result in excessive Q enhancement that may contribute to circuit linearity issues.

In addition, a loop delay needs to be represented which includes module delays of:

Delay of the phase shifter P;

Delay of the connection lines to and from F; and

Additional delay in the buffers used in the tunable secondary resonator R.

As discussed previously, there are various tunable ATLn resonator configurations that may be used that are capable of being adjusted to compensate for phase changes in the circuit, eliminating the need for a separate phase shifter component.

The pole zero plot of the open loop ATLXR response is shown in FIG. 181. The s plane is shown with vertical axis as the jw axis, and the horizontal axis as the real axis. Also shown are the poles of a Pade delay model 18110.

The set of poles 18110 and zeros 18112 shown as the 'Pade model of the open loop delay' of FIG. 181 is a polynomial approximation to the phase exponential term of exp(-sTD), where TD is the overall accumulated delay of the signal loop that does not include the delay of the primary or adjustable resonators. Hence the Pade poles and zeros are equivalent and not physical. They form an all pass filter structure that affects phase only and not amplitude.

Regarding the Pade poles and zeros of FIG. 181, an essential observation is that these equivalent poles are far into the left-hand plane relative to a) the tunable poles of R, and b) the higher Q poles of the primary resonator. Also, for the closed loop the pole migration with increased loop gain of the Pade poles is negligible.

FIG. 182 shows the poles and zeros of the Pade representation for a normalized loop delay of two periods of the ATLXR band center frequency. The effect of increasing the loop delay further is that the poles move closer to the jw axis and therefore influence the phase slope more. However, a higher order Pade model will be needed. Instead of this, the Pade poles and zeros could be expressed more as a bandpass response. However, this is not really necessary as the delays will be small.

However, the Pade delay model accurately represents the effect of the arbitrary delay that occurs within the signal loop. As indicated above, the poles of the ATLXR variable resonator R are shown in the same place but may be slightly offset from each other. While details of these variable resonator R poles are secondary, the main attribute is that they are controllable by f to move up and down in frequency (parallel with the jw axis). This is facilitated by the varactor diode control (f control) of each variable resonator in R. These resonators also have a zero at s=0.

The operation of the ATLXR is then explained based on FIG. 183. For the closed loop, as the ATLXR loop gain g is increased, the dominant high Q pole of the primary resonator closest to the jω axis will follow one of the trajectories as shown by the small arrows. The trajectory followed depends on the location of the pole of R (as controlled by f) and the phase setting of P.

In this way, the variable secondary resonator R is adjusting the s-plane operating point of the primary, or external resonator XR.

For clarity, the trajectory of the other poles of the delay and R are not shown as these will not be overly relevant as the high Q pole only has to move a short distance, requiring only a small closed loop gain as discussed above. Therefore, the poles of the secondary variable resonator R and the delay model do not change much. In this way, the dominant primary, or external resonator XR pole may be placed in a desirable location by adjusting the settings of the variable resonator R and phase control P.

ATLXR Overview

The ideas developed herein are applicable to an embodiment in which the ATLXR places a controllable variable resonator (R) with a variable gain block into a signal loop that includes an external generally high Q resonator (XR), such that the closed loop frequency response of the ATLXR that incorporates the primary, or external resonator XR may be modestly "manipulated". This manipulation of the primary external resonator is actually a manipulation of the closed loop ATLXR circuit that contains the primary resonator, and the tunable resonator. Dynamic modifications of the closed loop ATLXR are sufficient to get the desired passband response and compensate for moderate temperature changes, initial manufacturing tolerances, and device ageing effects of the primary, or external resonator XR. The closed loop resonance effecting the signal path transfer function from the input to output port is a modified version of the dominant resonance pole of the stand-alone primary resonator.

The transfer function from the input to output port of the ATLXR results in a narrow bandpass frequency response that is approximately equivalent to the response of a single dominant high Q pole that can be manipulated with the controls {f,g,p} acting on the secondary variable resonator R.

The pole of the primary resonator, which may not be explicitly controllable, may be implicitly controlled to move the pole a desired location in the s-plane by operation of the coupled signal loop, for such items as, but not limited to:

Enhance the Q of the primary resonator;

Compensate for any initial manufacturing variations of the primary resonator;

Compensate for frequency shift of the primary resonator due to variation in temperature;

Compensate for frequency shift of the primary resonator due to component aging;

Achieve a specific placement of the pole of the primary resonator in the s-plane such that the ATLXR may be cascaded with other ATLXRs to realize a specific multi-pole filter such as a Chebyshev or Butterworth bandpass filter incorporating external resonators XR.

Facilitate bandpass equalization function where the ATLXR may be part of an adaptive filter Follow a frequency hopping sub-band, such as in Bluetooth, where the overall SAW may provide a 20 MHz bandpass, and the ATLXR emphasizes the particular sub-band of 1 MHz bandwidth, and follows the frequency hopping scheme.

It will be understood that the detailed analysis presented above relates to a particular embodiment of a circuit used to control a primary resonator, and is provided to help obtain a deeper understanding of the principles involved with the approach being advocated. However, it will also be understood that the discussion above may not be applicable in its entirety in all circumstances, as once the design principles are understood, other applications and other examples of designs may be used that depart from the analysis presented above. As such, the discussion above should be taken as informative, but not as a requirement of all types of circuits Characteristics of ATLXR Resonators Primary External Resonator XR:

XR(s) is used to represent the transfer function of the external resonator, which may be considered external to the ATLXR chip. Note that the XR resonator may be any electrical, electromagnetic or electro-mechanical resonator, such as the following:

Electrical resonators may be circuits comprised of inductors or capacitors;

Electromagnetic resonators may be distributed microstrip or stripline or waveguide cavity resonators;

Mechanical resonators may be SAW or BAW devices, as well as MEMS resonators;

Resonators based on material properties, such as a ferrite material YIG (Yttrium iron garnet) based resonator with a slow magnetic field based frequency control Secondary Variable Resonators R:

As explained above, the ATLXR variable resonators R are generally low Q resonators, may be integratable onto a chip, and may be controllable in terms of frequency response for both resonance frequency and bandwidth. Examples of suitable resonators R in the ATLXR shown above are broadly described above.

R(s) is the transfer function of the secondary resonator of the ATL signal loop and has a control of f. The control f would typically act on a form of varactor diode, or perhaps a MEMS device, to vary the capacitance of R. P is a discrete switched phase that may have several phase states as selectable by the control of p. The gain block G has a variable gain controllable by g. Finally, there is a coupler at the input and output of the ATLXR circuit.

The variable R resonator would ideally be integrated on chip in the preferred embodiment. R would typically consist of integrated capacitors and spiral inductors of fixed value in addition to a varactor diode of variable value as controllable by f. R may also be implemented based on distributed transmission line components integrated onto the chip die.

Another alternative for the resonator of R is that it is implemented based on an integrated MEMS device which results in a variable inductor or variable capacitor. Examples of suitable resonators R may include those described in detail in Nielsen.

Variations and Options

As will be understood, different alternatives to, and variations of, the ATLXR circuit exist. The following are some possible variations:

The primary resonators may be single port instead of two port devices. As such we can envision an application of, for instance, a multiple pole BAW chip device as illustrated in FIG. 191. Here the resonators are on a common BAW chip with grounding and one port connections from each resonator to the ATLXR chip. Proposed in this embodiment is an external resonator chip consisting of a plurality of BAW resonators each with a one port connection to the matching ATLXR chip that constitutes a multipole filter. The internal adjustable resonator block R closes the signal loop as required.

Other implementations of the ATLXR signal loop may involve negative resistance amplifiers.

The primary resonator may be part of an antenna or radiating system. This may include antennas that have some resonance property as a chip antenna or a printed circuit antenna.

An ATLXR may be arranged as shown in FIG. 192 which has a plurality of general ATLXR blocks and a switch matrix that connects various antennas and various resonators. This will have general ports that may attach to BAW resonators, printed resonators, chip antennas, no resonator at all, etc. On the other side the switch matrix attaches to ATLXR circuits. Or if no enhancement is required then no ATLXR is attached. FIG. 192 shows BAW/SAW resonators 19210, PCB printed resonators 19212, chip antennas 19214, switch matrix 19216, block of ATLXR circuits 19218, and general ATLXR chip 19220.

The switch and plurality of ATLXR circuits may be integrated into a generic transceiver chip and then general external resonators may be attached to the general pins of the ATLXR which may be antennas, printed circuit board resonators, SAW/BAW resonators, and the like.

Preferred Embodiment

A preferred embodiment in the context of an ATL-based circuit is shown in FIG. 188. FIG. 188 shows components F 18810, R 18812 controlled by f 18814, P 18816 controlled by p 18818, couplers 18820, signal out 18822, gain block G 18824 controlled by g 18826, signal in 18828, and chip integrated circuit 18830. The signal loop may have a single variable resonator or a plurality of variable resonators. Further, there may be one or more primary resonator, either in series or in parallel, connected in series within the loop with the one or more variable resonators.

As noted above, XR(s) is used to define transfer function of the primary resonator. While not required, the primary resonator will generally be an external resonator that is external to the ATLXR chip. R(s) is the transfer function of the internal, or adjustable resonator of the ATL signal loop and has a control f. The control f may act on a form of varactor diode, or perhaps a MEMS device, to vary the capacitance of R. P is a discrete switched phase that may have several phase states as selectable by the control of p. The gain block G has a variable gain controllable by g. Finally, there is a coupler at the input and output of the ATLXR circuit.

In one example, the adjustable resonator may be integrated on chip. In some examples, the adjustable resonator may consist of integrated capacitors and spiral inductors of fixed value in addition to a varactor diode of variable value as controllable by f. R may also be implemented based on distributed transmission line components integrated onto the chip die. Another alternative for the resonator of R is that it is implemented based on an integrated MEMS device, which results in a variable inductor or variable capacitor. Other suitable resonators will also be recognized by those skilled in the art.

Summarizing, the ATLXR signal loop has an adjustable resonator R, coupled with a primary, or external resonator, which may be of various types. This permits a combined closed loop resonator response with a single dominant pole that may be manipulated with the controls {f,g,p} within the secondary tunable resonator.

In one example, one may moderately move the pole of an external resonator into a desirable s-plane location using:
A set of low Q resonators that:
Are controllable in frequency,
Preferably utilize a selectable phase shift, and
A variable gain;
Where the low Q resonators and variable gain are deployed in a signal loop to move the pole of an external resonator into a desirable location.

While the fundamental ATLXR of FIG. 209 assumes the primary resonator is not controllable in FIG. 188 the primary resonator F may be controllable or tunable between different operating frequencies, as in the example of FIG. 189, having components F 18810, R 18812 controlled by f 18814, P 18816 controlled by p 18818, couplers 18820, signal out 18822, gain block G 18824 controlled by g 18826, signal in 18828, and chip integrated circuit 18830, and additionally having coarse frequency control of F 18910. For example, the primary resonator may be a ferrite based resonator with an applied magnetic field for slow control. Or it may be a MEMS type resonator that has some coarse frequency control that is relatively slow. These may be incorporated into the ATLXR signal loop as shown providing a fast electronic control of the closed loop pole.

The ATLXR may be directly extendable itself to a multi-pole filter implementation. An example is shown in FIG. 190 of a two-pole ATLXR filter. FIG. 190 shows components F 18810, R 18812 controlled by f 18814, P 18816 controlled by p 18818, couplers 18820, signal out 18822, gain block G 18824 controlled by g 18826, signal in 18828, and chip integrated circuit 18830, and additionally having variable attenuator 19010 controlled by v 19012. The additional control of v for the variable attenuator V, is provided such that the overall throughput gain of the multi-ATLXR circuit does not result in uncontrollable self-oscillation. Clearly the cascade configuration of FIG. is extendable to an arbitrary order bandpass filter wherein each ATLXR circuit will implement one SOS (second order section or bi-quad) of the overall transfer function of the bandpass filter.

that are possible. As with the discussion above, these variatinos are described and depicted in terms, however these variations are also applicable to other circuit designs that are based on other types of resonators This may include an external resonator chip consisting of a plurality of BAW resonators each with a one port connection to the matching ATLXR chip that constitutes a multipole filter. The internal resonator block R forms the additional feedback port required.

Implementation of the ATLXR

Integrated chip complexity is generally considered to be secondary as small signal transistors may be integrated at negligible cost. Inductors and capacitors may be costlier as they occupy a larger die area. Hence a cost-effective integration of the variable R resonators generally only achieves a low Q value of about 10. To achieve a highly selective bandpass filter response, it is necessary that the filter poles have high Q values, e.g. much higher than 10, and therefore significant Q enhancement may be necessary. While arbitrary high Q enhancement is possible with the ATLn, this comes at a cost of reduced linearity. The advantage of the off-chip external resonator is that it may have a fairly high initial Q and hence only a modest further enhancement in Q is necessary.

In some examples, the primary resonator will have a Q that is about 10 times or more greater than the Q of the adjustable resonator, and may be as much as 100 times or more greater than the Q of the adjustable resonator. In the context of the present discussion, referring to the values of 10 or 100 is not intended to be a definite limit, but shall be considered a general range that will inherently include factors that are close to, but may be slightly outside, these ranges.

In some examples, the primary resonator may be an external resonator. As this is anticipated to be the most likely scenario in which the teachings may be used, the term "external" is commonly used herein to refer to the primary resonator. However it will be understood that the teachings may also be applied to non-external resonators. A resonator may be considered external if it is made from a different material, or a different technology, relative to the adjustable resonant circuit. It may also be considered external if it is on a substrate that is separate and distinct from the substrate of the adjustable resonant circuit, where the substrates may then be bonded or otherwise attached together in the various manners known in the art, which will in turn depend on the eventual form of the primary resonator and the adjustable resonator. For example, the primary resonator may be a first component, made form a first material, and the adjustable resonator may be a second component made from a second material that is different than the first material. Examples of this are shown, for example, in FIG. 188, where the resonator is "off-chip" relative to the adjustable resonator, and in FIG. 191, which shows a BAW filter on a separate substrate. Other designs will be apparent to those skilled in the art and will not be discussed further.

Variants of printed resonators generally do not achieve the high Q of a SAW or BAW but have much higher Q than chip resonator implementations. A useful printed resonator may include a waveguide-like cavity built on the PC board with a number of via connections to contain the field. This is shown in FIG. 193, which is a top down view of the resonators showing the feed structure and the via hole connections that stitch the outer periphery of the waveguide cavity. Via connections in the PCB are shown at 19310, and the feed is shown at 19312. Metallization at the top and bottom planes of the printed circuit board are not shown for sake of clarity. A single port resonator is shown but this could be a two port by adding another feed probe.

A resonator of this type has the advantage of providing higher Q as the losses are essentially dielectric and not conductive. Multiple resonators 19412 may be implemented as shown in FIG. 194, each of which are connected to an ATLXR chip 19410.

Multi-level boards offer a possibility of stacking printed resonators as illustrated in the diagram in FIG. 195 having ATLXR chip 19510 and chip antenna 19512. Generally, in smart phones at least layers are used and hence a number of stripline resonators 19514 may get stacked as illustrated in order to occupy less space. If the ATLXR chip uses ball grid connectors, then the resonators may be stacked under the chip for compactness. This makes for a very cost-effective implementation of external resonators XR that would have an initial Q on the order of 100 for microwave frequency applications. At higher frequencies, the printed resonators become more attractive as they are smaller but may require low loss dielectric substrates in order to maintain the Q of an external resonator XR at around 100 or so.

ATLXR Coupling Configurations

Two characteristics of the ATLXR are discussed below.

The first characteristic is a set of resonators which are to be coupled, including:

A primary resonator(s), such as an external resonator XR, and usually of higher Q; and Adjustable resonators, typically of lower Q, that are tunable in terms of resonance frequency and bandwidth The second characteristic is an active signal loop that incorporates the set of resonators. This generally includes the coupling architecture that couples the signal in and out of the resonators in order to achieve the desired effect. Coupling mechanisms may consist of circulators, directional couplers, multiport devices, etc. There may be one resonator or multiple resonators in the loop. Further, the 'resonator' implies the system of resonators unless we are specific about referring to a single resonator.

Of interest is to consider the primary resonant structure in combination with the ATL adaptive filter resonant structure discussed above. There are various architectures that may be used, of which four are indicated below, which are generally distinguished by the coupling configuration. Other implementations may also be possible, as will be recognized by those skilled in the art.

ATLXR Implementation Category 1: Unidirectional Signal Flow

Category 1 is the first ATLXR implementation category, and has two main characteristics. The first is that all of the signals are unidirectional. The second is that the input signal is isolated from the feedback signal via the directional sum block. This however assumes that the sum block is nonreciprocal.

Figure 80:
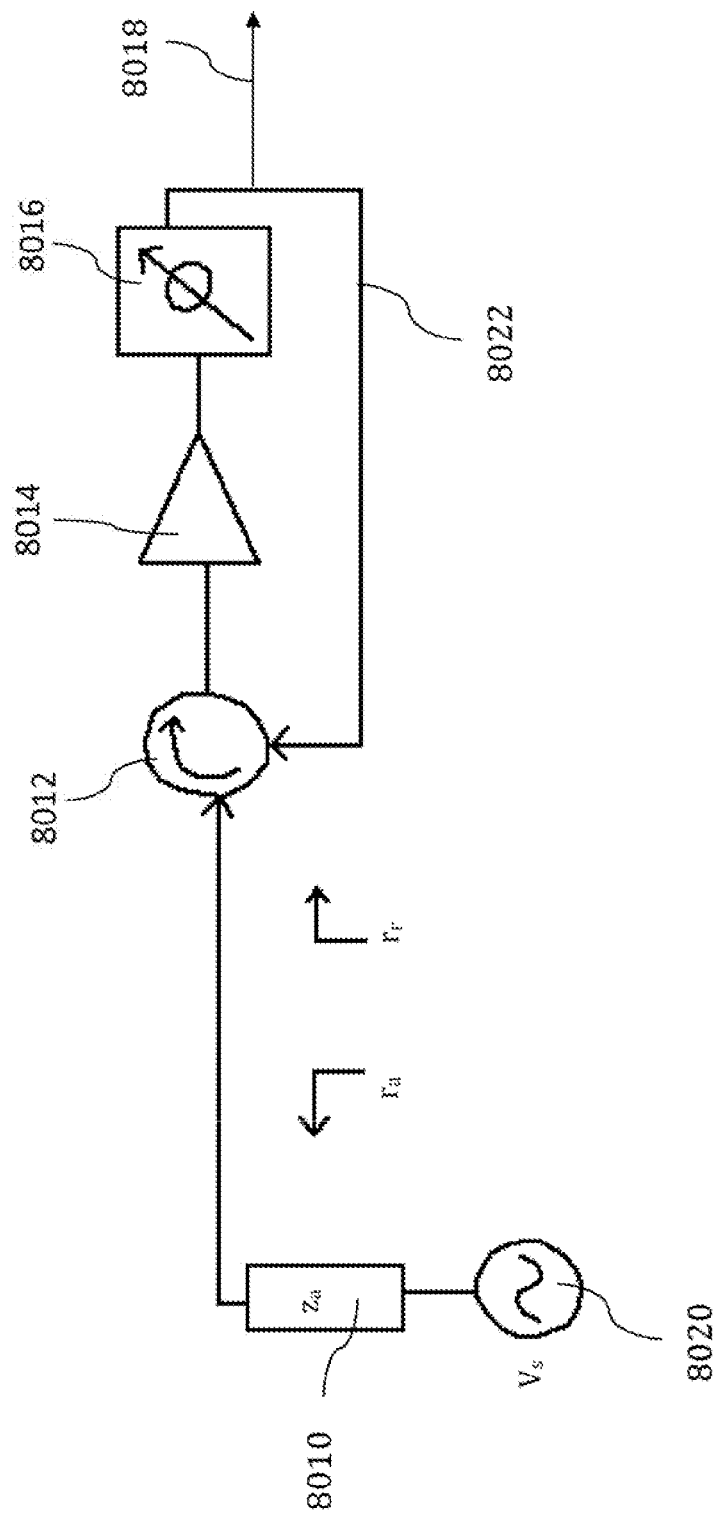
FIG. 80 is a block diagram showing ATLF Category 1 implementation consisting of a circulator, a scaling block, and a phase shifter.

There are two ways of implementing such a sum block. The first way is to use a circulator as shown in FIG. 80. The circulator is a non-reciprocal device that is bulky, expensive and therefore not integratable on chip. It creates unidirectional flow, and the output may be tapped off from a buffer output in the feedback processing as shown. FIG. 80 shows source 8020, input 8010, circulator 8012, gain scaling block 8014, phase shifter 8016, loop 8022, and output 8018.

A better way to implement ATLXR Category 1 is to use an active differential amplifier 20502 as a non-reciprocal sum block that forces the unidirectional signal flow in the loop, as shown at the top of FIG. 205, where the circuit on the top has a resonator 20504, a phase shifter 20506 and a gain block 20508, and the circuit on bottom has ATL circuits 1301 and an external resonator 20510. The output may be taken anywhere, and the order of the components in the loop is arbitrary. While the resonators are labeled 1301 in the various drawings depicting ATL circuits, it will be understood that these may be higher or lower order ATL circuits, or may be a basic resonator, such as resonator 1401 discussed previously.

This active feedback summer is perhaps ideal in that the differential amplifier circuit is trivial to implement on chip and does not require any inductors or other components that are difficult to implement at chip level.

Implementation of the ATLXR Category 1 using an ATL3 implementation in shown at the bottom of FIG. 205. As described above, the ATL3 implementation enables loop phase shift control within the low Q secondary resonators, and a phase shifter may be as simple as switching between two phase polarizations.

Figure 110:
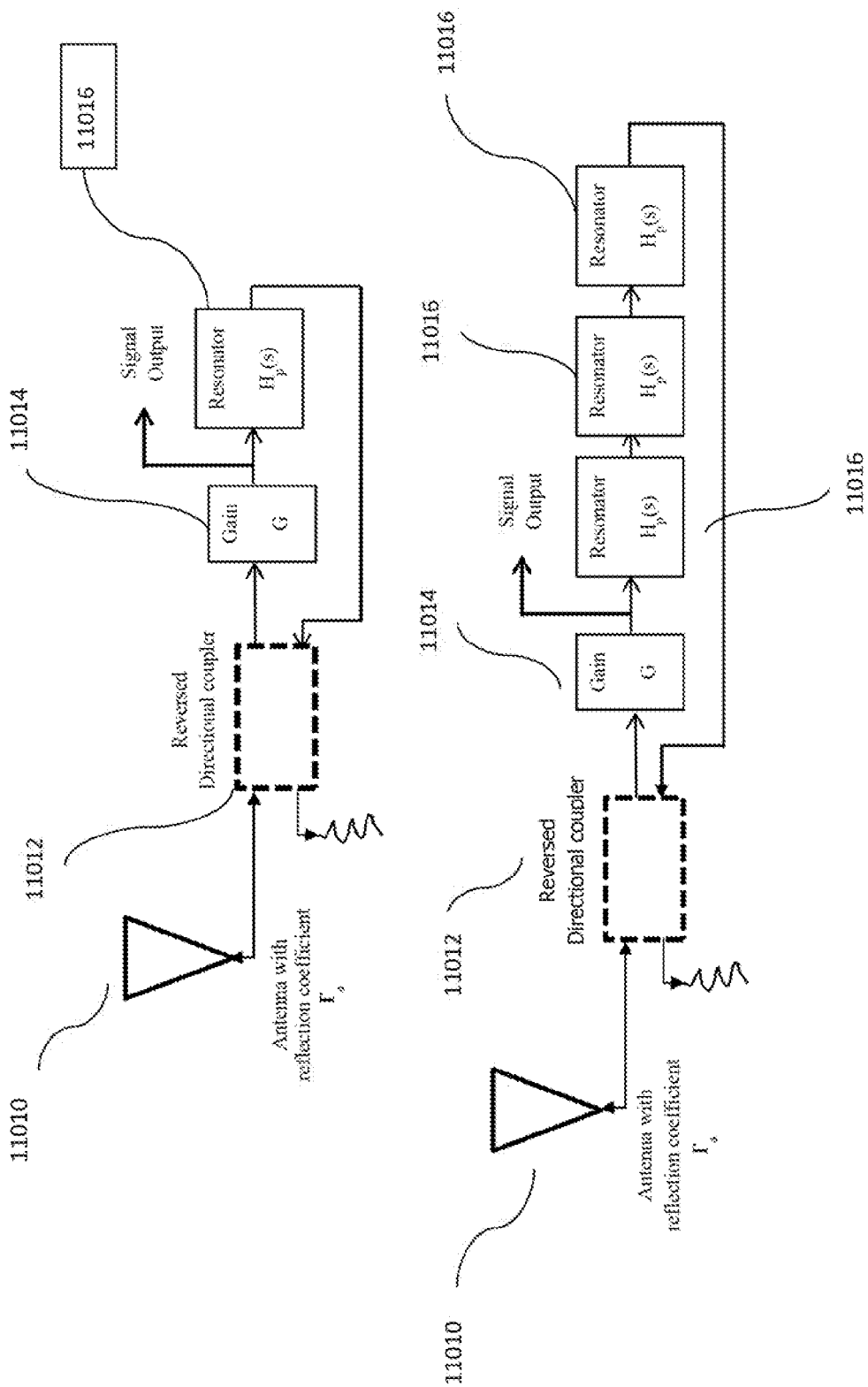
FIG. 110 is a block diagram showing the circuit of an ATLXR Filtenna Category 2 implementation based on ATL1 (top) and ATL3 (bottom).

ATLXR Implementation Category 2: Bidirectional Signal Exchange with the External Resonator Category 2 implementation of the ATLXR uses either a directional coupler or a circulator as the combining element between the primary resonator (XR) and the adjustable resonator circuitry, as shown at FIG. 110 and FIG. 206 respectively, where an implementation using either the ATL1 or ATL3 is shown as the adjustable resonator circuitry. Other ATL implementations are also possible.

In this category, we turn the circulator or directional coupler backwards so as to deliberately reflect the feedback signal off the external resonator as an input component that now becomes part of the loop. The role of the circulator or directional coupler is to separate a bidirectional flow in the external resonator to a segregated flow in the loop. As described below, in the case of an ATLF, if we use a reversed directional coupler 20704 of say 10 dB, this provides a signal to bounce off of the antenna 20702, shown at the top of FIG. 207, or to the input of an external resonator such as a BAW or printed circuit antenna as the external one port resonator that is recirculated, as shown at the bottom of FIG. 207, where the circuit also includes a resonator 20706 and a gain/phase block 20708.

For the condition where the external resonator is an antenna, which is discussed as the ATLF in detail below, we recognize that the antenna will be poorly matched. Consequently, we build in the reflection off of the antenna for active impedance matching as we deliberately include the antenna in the feedback loop.

ATLXR Implementation Category 3: The ATL as a Negative Resistance Amplifier

Figure 113:
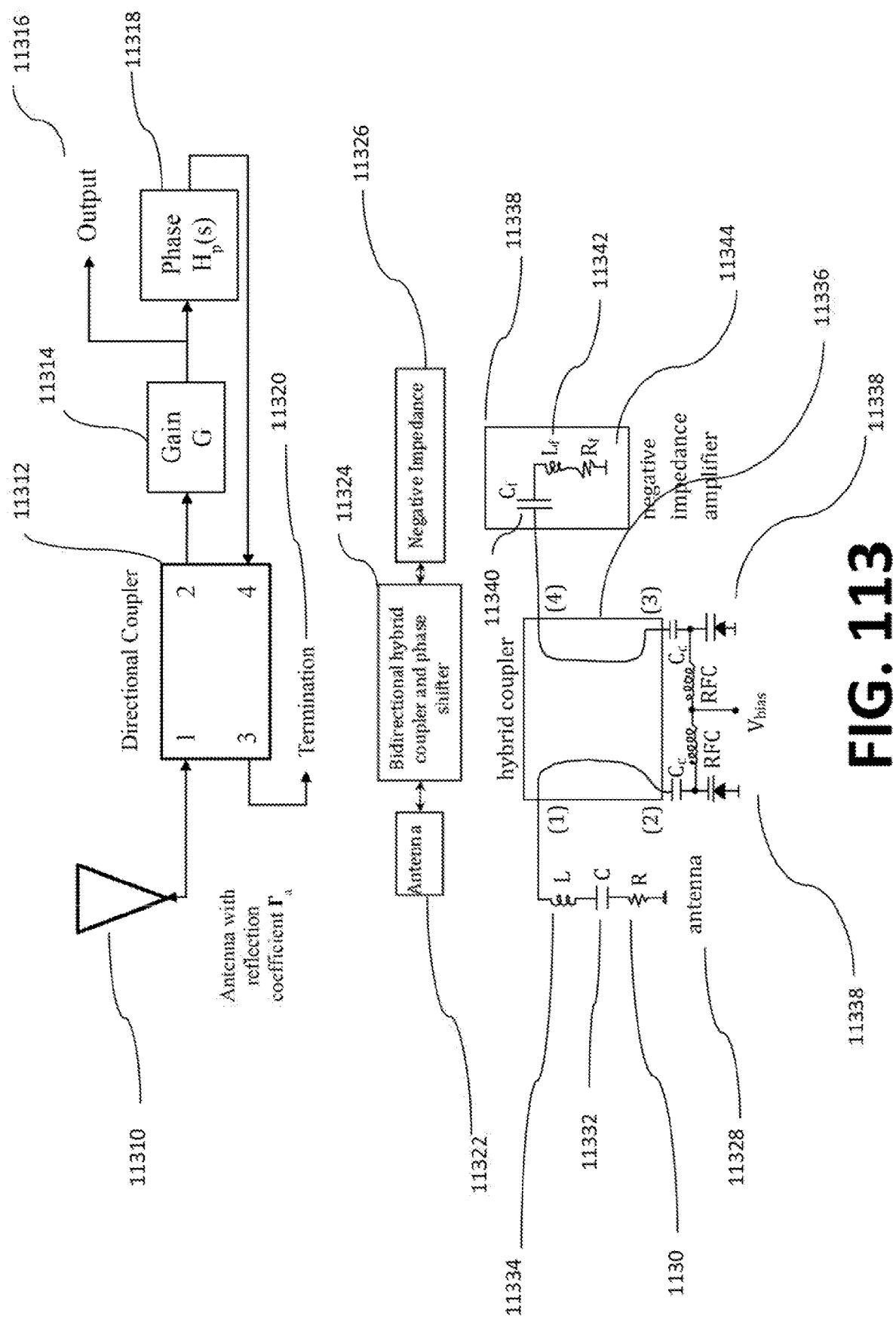
FIG. 113 is block diagrams showing ATLF Categories 2 and 3 implementation, where the top shows ATLF Category 2 implementation consisting of a directional coupler, a phase shifter, and a scaling block, and the bottom shows ATLF Category 3 implementation consisting of a bi-directional phase shifter implemented with a directional hybrid coupler and varactor diodes attached to ports 2 and 3.

Category 3 implementation of the ATLXR uses a hybrid coupler, as shown at the bottom of FIG. 113 where the ATL is implemented as a negative resistance amplifier. In this implementation category, there is no requirement for a directional coupler.

The hybrid coupler is part of the in-line bidirectional phase shifter. It is an example of an implementation of a phase shifter and does not really have anything to do with the ATLF feedback loop. That is, a phase shifter may be developed in another way without the hybrid coupler.

As can be seen, ATLXR Category 3 is similar to Category 2, except that the entire circuit consists of bidirectional signal flow, instead of just the path between the external resonator and the secondary resonator loop. This results in a negative resistance gain block, as opposed to a normally used two port gain block. Referring to FIG. 208, a Category 3 ATLXR implementation is shown.

ATLXR Implementation Category 4: Using External Two-Port Resonators

ATLXR Category 4 consists of the external resonator as a two port resonator. This two port resonator could be a printed antenna, a printed resonator, or a two port BAW/SAW. Category 4 is shown in FIG. 209, with an antenna 20902, resonator 20904, and a gain/phase block 20906. As such we can envision an application of, for instance, a multiple pole BAW chip device as illustrated in FIG. 191. FIG. 191 shows components F 18810, R 18812 controlled by f 18814, P 18816 controlled by p 18818, couplers 18820, signal out 18822, gain block G 18824 controlled by g 18826, signal in 18828, ATLXR chip 19110, BAW chip 19112, and attenuator 19114 controlled by a 19116. Here the resonators are on a common BAW chip with grounding and one port connections from each resonator to the ATLXR chip. Proposed in this embodiment is an external resonator chip consisting of a plurality of BAW resonators each with a one port connection to the matching ATLXR chip that constitutes a multipole filter. The internal resonator block R forms the additional feedback port required.

ATLXR Implementation Using a Switch Matrix

An ATLXR may be arranged as shown in FIG. 192 which has a plurality of general ATLXR blocks and a switch matrix that connects various antennas and various resonators. This will have general ports that may attach to BAW resonators, printed resonators, chip antennas, no resonator at all, etc. On the other side the switch matrix attaches to ATLXR circuits. Or if no enhancement is required then no ATLXR is attached.

The switch and plurality of ATLXR circuits may be integrated into a generic transceiver chip and then general external resonators may be attached to the general pins of the ATLXR which may be antennas, printed circuit board resonators, SAW/BAW resonators, and the like.

Having examined the concept of the ATLXR for enhancing the performance of primary resonators, we will examine two specific communication system cases where:

The primary resonator is an arbitrary electrically small antenna (ESA) subsystem; and The primary resonator is an external BAW or SAW RF resonator filter(s).

Optimizing the System Performance of an Arbitrary Electrically Small Antenna Using Coupled Resonators Wireless transceivers have been highly integrated and optimized over the past decades to a point where a sophisticated WiFi transceiver, operating at 2.45 GHz or 5 GHz, consists of a small number of components enabled by the high level of integration in the central transceiver chip, and fits onto a circuit board of several square centimeters. This has fueled the IoT and applications such as the wireless smart bandage sensor. However, the availability of inexpensive wireless transceivers is now creating a push for even further cost reductions, performance enhancements, and antenna size reductions.

Impedance Matching Considerations for Electrically Small Antennas

Electrically small antennas (ESA) are structures with dimensions that are significantly smaller than the operating wavelength and are therefore generally difficult to impedance match over a band of frequencies using existing methods. Suffice it to say that proper impedance matching between the antenna and the receiver is crucial to efficient energy transfer. To proceed, we need to consider some brief background material on antennas to give us insight into: a) what constitutes an antenna; and b) how the ATLn resonator can couple with it in the context of the ATLXR discussed above.

The essence of an antenna is easiest to understand if we start in the transmit mode. It is simply an apparatus that arranges current flow of charge that is alternately accelerating and decelerating such that radiated electromagnetic (EM) fields have an amplitude that depends inversely on the range from this radiating apparatus in the far field that is typically 10 wavelengths from the radiating source.

When the antenna is used in the receive mode, the Lorentz reaction integral predicts that the performance of the receive antenna is reciprocal to the performance of the transmit mode antenna: the current distribution within an antenna and the antenna impedance is the same for both transmit and receive functions. Hence we can analyze the antenna in transmit mode and use the impedance properties calculated to determine the behavior of the antenna in the receive mode.

Figure 53:
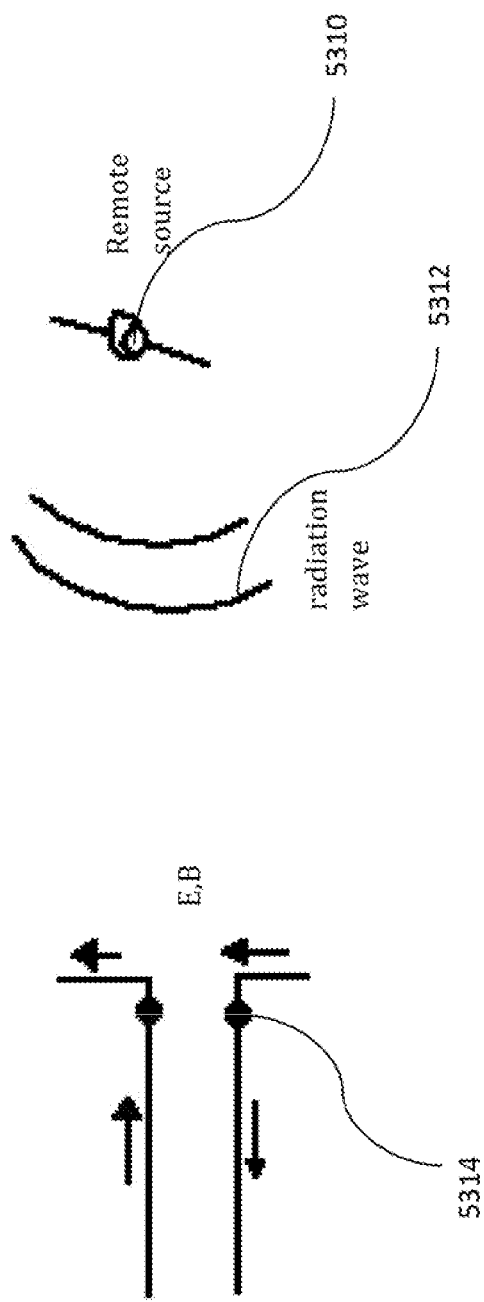
FIG. 53 is a diagram illustrating the coupling of a dipole antenna with an external EM radiation source.

The Lorentz reaction integral is the core of this central property of antenna reciprocity. Consider another EM generator at a distance from the antenna that generates E and B fields in the vicinity of the wire dipole as shown in FIG. 53. We introduce J as the electric current and M as the equivalent magnetic current that, while fictitious, works well in antenna analysis. FIG. 53 shows a remote source 5310, a radiation wave 5312, and wire dipole 5314.

Lorentz Reaction Integral

The Lorentz reaction integral, which is the measure of how the antenna structure couples to the incoming external field, is $$\int_v (E \cdot J - H \cdot M) dv$$

The current distribution within an electrically small wire antenna may be determined from the same Lorentz reaction integral by determining the current distribution that has:

Certain aperture voltage; and

Zero tangential electric field on the wire structure.

The input impedance is then easily extracted once the antenna current distribution is known.

The Lorentz reaction integral provides a way to calculate the general coupling between the two antenna structures. The Lorentz reaction integral shows that the coupling is reciprocal: coupling is independent of which antenna is radiating and which antenna is receiving. A significant result from this is that the antenna impedance is the same for both transmitting and receiving. This principle of reciprocity allows us to analyze the antenna as a transmission structure, which is usually simpler, and then directly use the outcome of this to reciprocally tell us how the antenna receives a signal. In the transmit mode, accelerating electrons moving along a wire conductor generate EM fields that have a $1/r$ component, r being the distance from an observation point to the antenna center.

Dipole and Loop Antenna Characteristics

Dipole Antennas:

Specifically for the wire dipole antenna, which has no magnetic field coupling, the Lorentz reaction integral becomes $$\int_v E \cdot J \, dv$$

Figure 54:
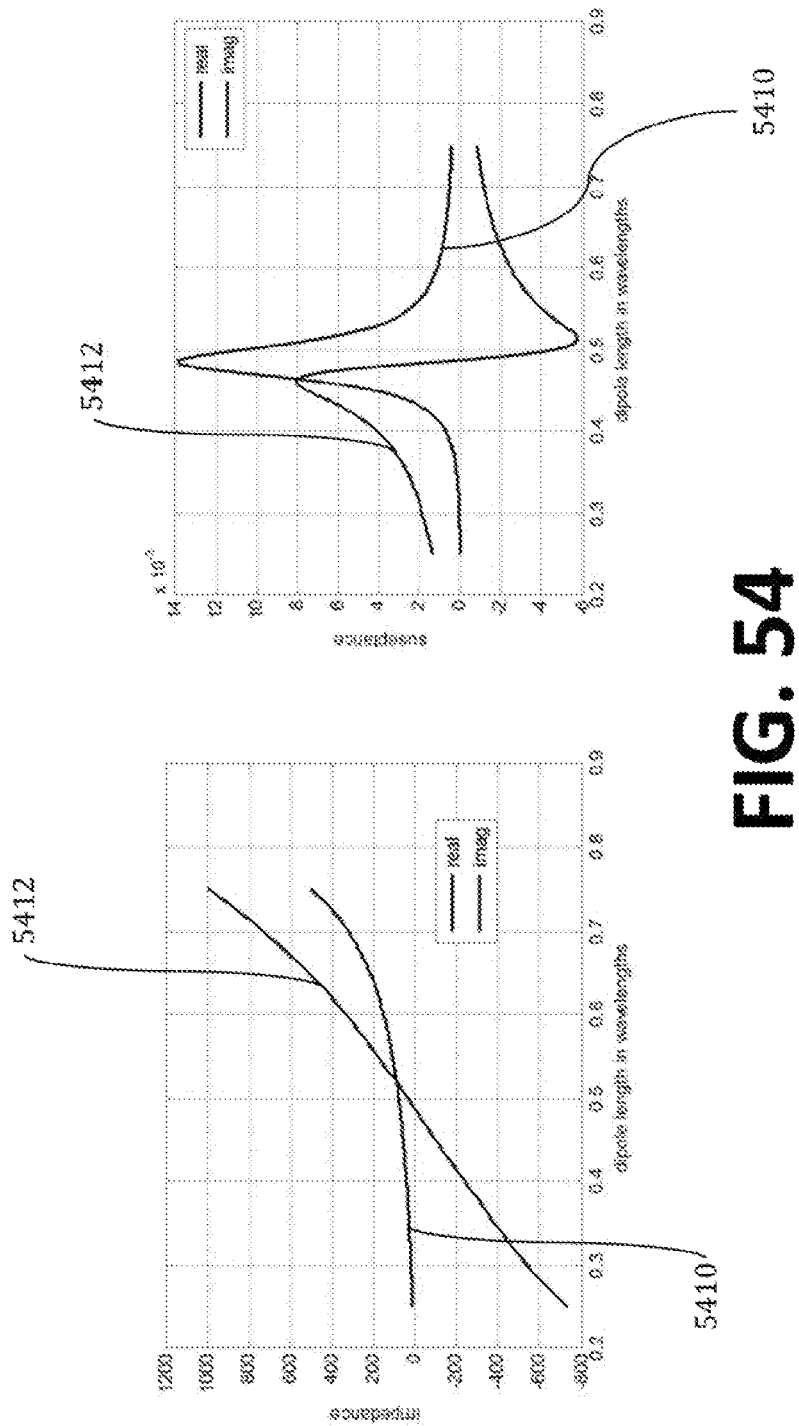
FIG. 54 is a graph showing input impedance (left) and conductance (right) of the dipole wire antenna.

The input impedance and conductance of a dipole antenna of variable electrical length are presented in FIG. 54, where electrical length is the total physical dipole antenna length in terms of wavelengths. The real component is shown at 5410, while the imaginary component is shown at 5412. For lengths shorter than resonance, the antenna behaves as a capacitor and for longer than resonance behaves as an inductor. Note that at resonance, the series LRC dipole impedance model is a reasonable approximation, as the slope of the real component is not overly steep.

The dipole antenna impedance leads to a series LRC model of $$Z(\omega) = R(\omega) + jX(\omega) = R + j\left(\omega L - \frac{1}{\omega C}\right)$$

This model is a reasonable fit over a larger frequency range, but at resonance the radiation resistance R is a function of $\omega$. The other possibility is an admittance model of parallel GLC $$Y(\omega) = G + j\left(\omega C - \frac{1}{\omega L}\right)$$

which is accurate over the narrow frequency range around the resonance. That is, looking at the right side plot in FIG. 54, the conductance goes through a stationary point at resonance and to a first order may be considered as constant. The susceptance varies approximately linearly, as does the quantity $(\omega C - 1/\omega L)$. Away from resonance, the admittance and susceptance both increase monotonically with frequency, showing that neither series nor parallel models are accurate.

Of interest is that in neither the series nor parallel LRC model is the real part constant, since the radiation resistance is a function of electrical length, and hence frequency. Thus, the LRC model of a dipole antenna may only be accurate over a relatively narrow bandwidth for higher Q dipole antennas.

All of which creates a challenge in the modeling of impedance matching for the dipole antenna.

Figure 55:
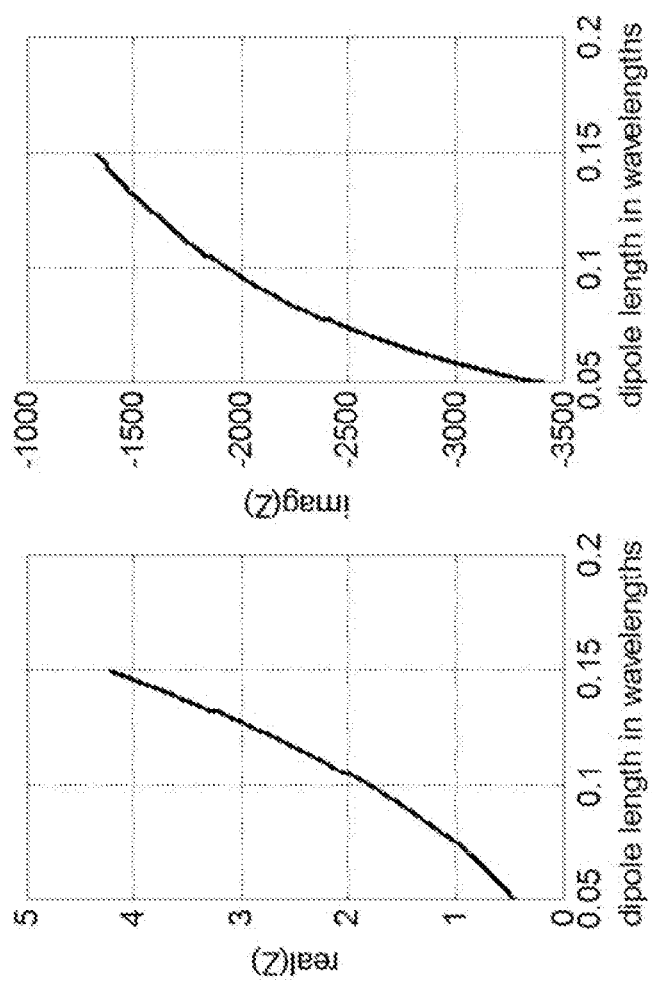
FIG. 55 is a graph showing input impedance of an electrically small dipole wire antenna with a dimension of nominally 0.1 wavelengths.

To complicate matters, at the 2.4 GHz and 5 GHz operational bands, the half wavelength dipoles, or even quarter wavelength monopoles, are physically too large for small wireless sensor applications and a more compact antenna is required. In FIG. 55, we consider the input impedance of a small antenna with a dimension of nominally 0.1 wavelengths. The series LRC model of such a short dipole shows that the radiation resistance is 2 ohms while the series capacitive reactance is 2000 ohms. It thus requires a resonance circuit of very large Q and component precision to efficiently compensate for this large capacitive reactance. It is a non-trivial impedance matching circuit to transform the 2 ohms to 50 ohms.

Figure 56:
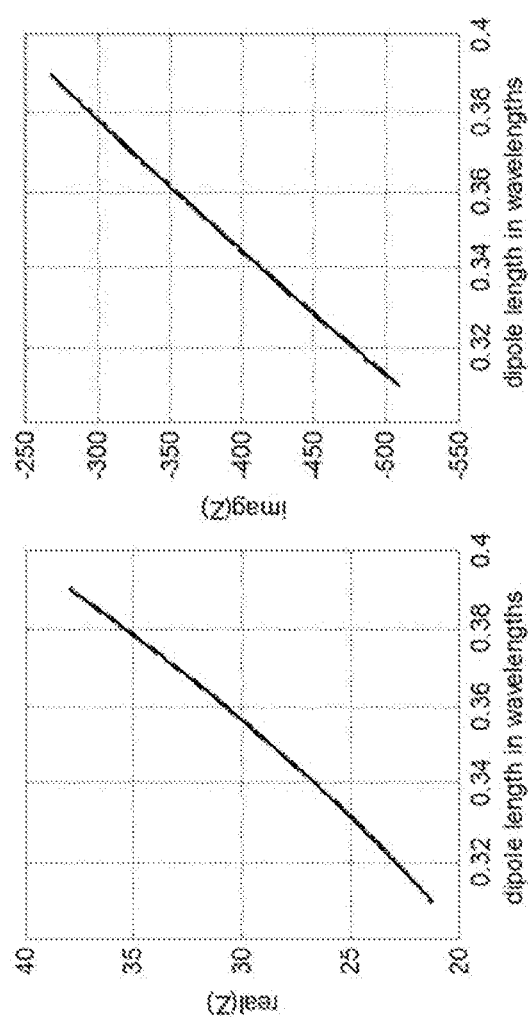
FIG. 56 is a graph showing input impedance of an electrically small dipole wire antenna with an antenna Q on the order of 10 to 20 over a 20% relative bandwidth.

Note that the Q of this dipole antenna itself is over 1000, which implies that reducing the antenna Q could perhaps be useful to achieve a broader bandwidth. But this comes at a cost of imposing a loss, which adds directly to the noise figure (NF) of the receiver. If we make the dipole antenna just a little longer than the resonant frequency length, then we can achieve a reasonable antenna Q and more easily couple this to the ATL1. FIG. 56 shows the impedance of an electrically small dipole wire antenna with an antenna Q on the order of 10 to 20 over a 20% relative bandwidth.

Loop Antennas:

This antenna structure generates primarily a magnetic field perpendicular to the loop plane, which is equivalent to a (fictitious) magnetic current dipole also perpendicular to the loop plane. An equivalent representation of this antenna is a magnetic current M flowing perpendicular to the plane of the loop. Note that M is fictitious, unlike J which is real. The Lorentz coupling integral of the loop antenna becomes $$\int_v H \cdot M \, dv$$

showing that the loop antenna is now sensitive to the magnetic component of the far field external source instead of the electric component The electrically small current loop antenna has an input impedance that is represented by a series resistor inductor model as $$Z(\omega) = R(\omega) + jX(\omega)$$

Impedance matching is in principle accomplished by a series capacitor of $-jX(\omega)$ that resonates with the antenna inductance, providing an $R(\omega)$ which is generally on the order of several ohms: a resistance that is too small for compatibility with low power integrated electronics.

Figure 57:
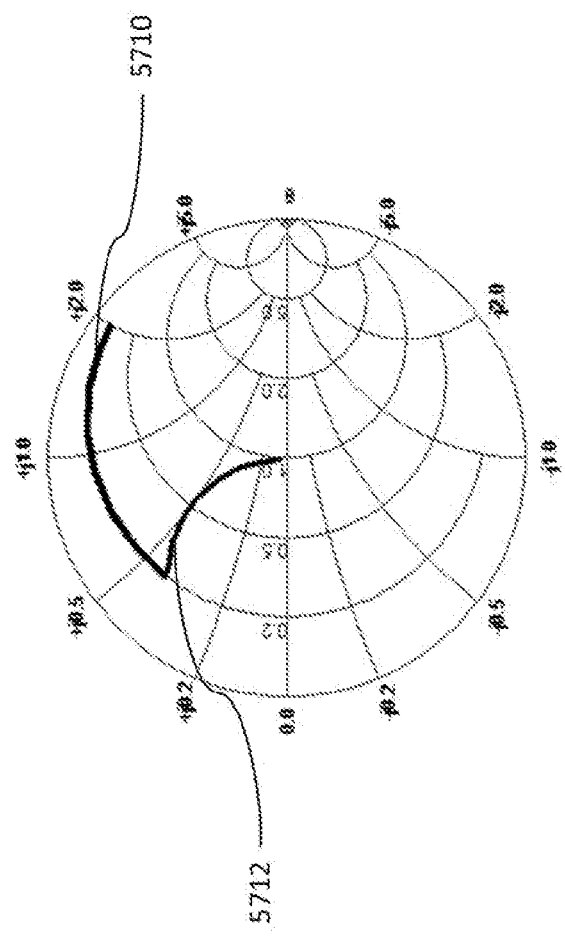
FIG. 57 is a graph showing the series and shunt capacitance Smith Chart for loop antenna impedance matching.

Consequently we do a match with a series or shunt capacitor. Segment 5710 of the Smith Chart curve (normalized to 50 ohms) shown in FIG. 57 is the series capacitor and 5712 is the shunt capacitance. Note that this only matches the antenna for one frequency. If it is desired to be well matched over a larger range of frequencies then, a more complex impedance matching circuit would be required.

Ground Plane Effects:

The dipole and loop antennas are balanced in the way that they are symmetrical with regard to the terminal. However, in the construction of small wireless circuits a ground plane is convenient as it forms a potential reference point that is distributed throughout the circuit. Unfortunately, as the frequency increases, a ground plane:

Is no longer that equal potential surface that is desired
Is rather difficult to model
Is the source of many EMI (electromagnetic interference) problems.

With regard to the antenna, we must regard the ground plane as part of the antenna. This significantly complicates the analysis and modeling for the antenna impedance matching.

Figure 58:
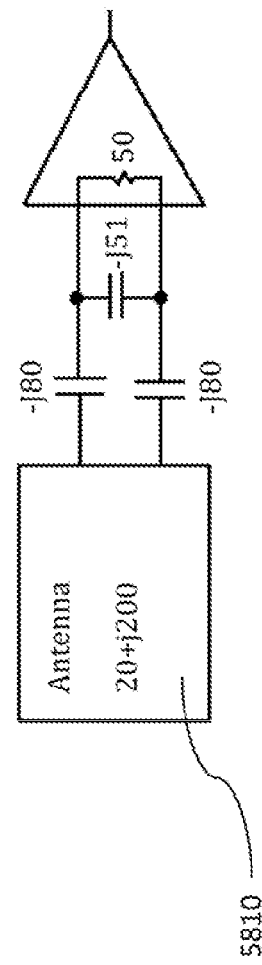
FIG. 58 is a diagram of the structure of a resonant dielectric antenna.

The physical limit as to how small one can make a loop or dipole antenna and still radiate is theoretically zero-size, but practically it is limited as the radiation resistance drops quickly to zero as the dimensions shrink. With impedance matching, we can put a large current through the radiation resistance—which by the principle of reciprocity also works in receive mode. Consider a series model of 2+j200 that could represent a small loop antenna 5810 as shown in FIG. 58. One can still match it to 50 ohms, but the components are getting more difficult in that one needs a series capacitance of impedance of $-j1$ and a shunt capacitance of $-j7$ ohms. The series capacitance of $-j1$ is impractical and would be omitted, resulting in a slight impedance mismatch loss.

Printed Antennas:

For many wireless applications, the printed antenna, such as the inverted F antenna (PIFA) is inexpensive and efficient. The PIFA antenna is an example of an unbalanced antenna with a ground plane. This is commonly used as a printed antenna for small wireless transceivers. FIG. 211 shows the current flow and the resultant field generation, represented by arrows 21102, complicated by the current flow in the ground plane. However, for many applications, the size of about quarter wavelength may still prove to be prohibitive.

Aperture Antennas:

The wire dipole and the wire loop are the two fundamental types of radiating structures: all wire antennas are combinations of these two antenna types. While aperture antennas that couple into waveguide structures are different, these are not of significance in this discussion except to say that in order to couple from a field mode to a conducted mode, a wire antenna of some sort is still needed.

It is important to note that all of the above electrically small antennas are resonant structures. This brings us to the chip antenna.

Characteristics of a Resonant Dielectric Antenna: The Chip Antenna

An electrically small wire antenna may be further reduced in size by wrapping the wire paths of the antennas around a small block of dielectric with a high relative permittivity (generally between 5 to 55) resulting in the dielectric resonator antenna, which has come to be known as the "chip antenna". With dimensions in millimeters, these chip antennas are substantially smaller than the typical wavelengths of an intended use as a 2.45 GHz antenna where free space wavelengths are in the range of 10 cm. Various possibilities of folded line and coil structures may be constructed with ceramic grown around the conductors. These small versions of dielectric resonator antennas are also referred to as chip antennas.

Chip antennas are generally installed such that the ground plane is a significant circuit element, with the ground plane essentially forming the other half of the antenna.

Figure 59:
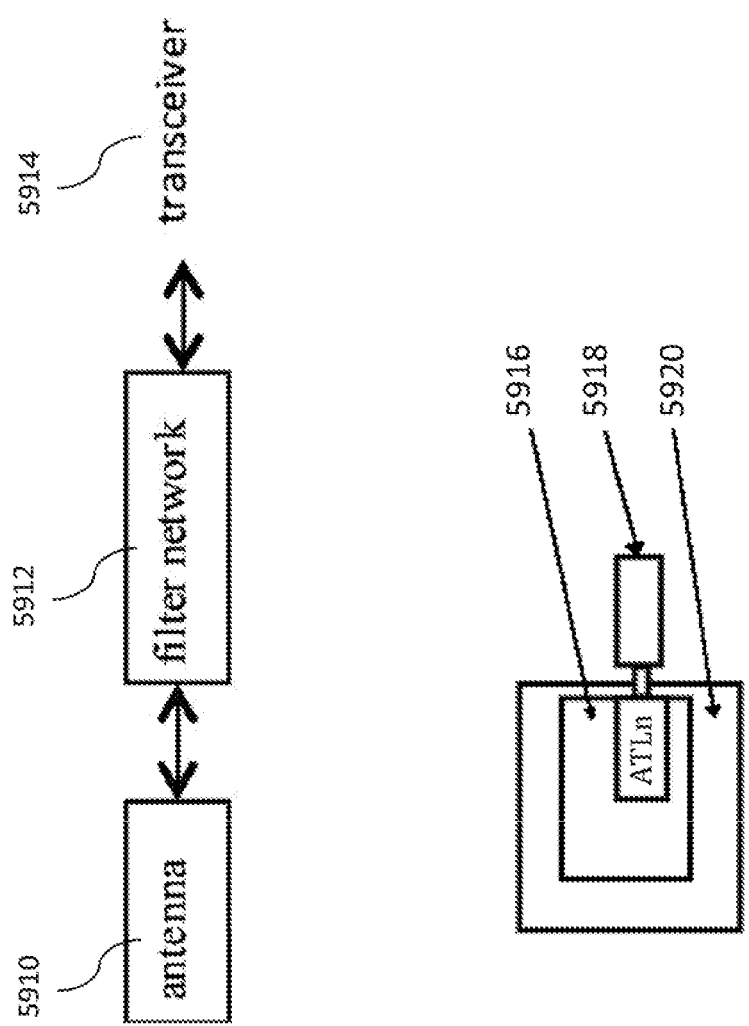
FIG. 59 is a block diagram showing a notional implementation of the ATLF.

A typical implementation of a chip antenna with conventional matching components, as shown at the top of FIG. 59 is not only complex, it is generally only approximate such that the antenna is typically not precisely matched to the transceiver. FIG. 59 shows an antenna 5910, filter network 5912, and transceiver 5914. The circuit ground plane essentially forms the other half of the antenna adding more impedance matching complexity. Additionally, the transceiver has to (generally) provide matching typically to 50 ohms, which implies internal buffering with an impact on overall efficiency. Furthermore, the matching components not only add cost, but also require board space; additional fabrication steps; and are lossy. Referring to the bottom of FIG. 59, a transceiver chip with ATLn 5916, a chip antenna 5918, and a ground plate 5920 are shown.

If the Q of the chip antenna 5918 is too high, then it will not achieve a broad tuning range. To assist with this a varactor diode may be placed as a shunt component from the chip antenna terminal to ground. Similar to the resonator of the ATL1, this allows for a smooth tuning across a broad frequency range.

Furthermore, when integrating a chip antenna, the input impedance changes significantly with layout, and a model would have to be fit with a network analyzer (NWA) measurement. Again, impedance matching modeling is non-trivial.

In one example, when integrating the ATLn with an electrically small antenna, the ATLn directional coupler is realized based on using spiral transformers and inductors. For a desired tuning bandwidth of over 10%, it is difficult to achieve good directivity such that the coupling ratio $|c|<0.1$. Consequently, we are typically faced with the issue of having $|S_{11}(\pm j\omega_0)| \gg 1$. Therefore, the ATL1 becomes sensitive to an impedance mismatch at the input port. This would seem to prohibit attaching an antenna directly to the ATL1 as the VSWR is typically too large, causing the overall system to self-oscillate at an uncontrolled frequency. A solution might be to include a low noise amplifier (LNA) between the antenna and ATL1. However, this will require additional components to match the antenna with the LNA, or else a significant portion of the available power will be reflected back to the antenna and re-radiated.

In contrast, the adjustment of a circuit referred to as the ATLF (an ATL-based filtenna circuit), discussed below, may be accomplished by allowing for an automatic conjugate impedance match between the antenna and the receiver, as discussed elsewhere. In this manner, the ATLF may be used to achieve a high degree of energy transfer between the antenna and the transmitter/receiver, and does so at the specific band of interest within the larger frequency envelope of the modulated signal carrier.

A closer look at the ESA antenna is required to understand the resonance modeling and impedance compensation. FIG. 54 shows the plot of the input impedance and conductance of a dipole antenna of variable electrical length, where electrical length is the physical length in terms of wavelengths. For lengths shorter than resonance, the antenna behaves as a capacitor and for longer than resonance behaves as an inductor. Of interest is that in neither the series LRC antenna model nor parallel LRC antenna model is the real part constant since the antenna radiation resistance is a function of electrical length.

What makes the resonant dipole so practical is that in the parallel LRC model the conductance peaks at the same electrical length that the susceptance simultaneously goes to zero. Such antennas are, therefore, impedance matched to a fixed value of about 72 ohms.

Looking specifically, for example, at the common 2.4 GHz and 5 GHz type frequency bands, the half wavelength dipoles or even quarter wavelength monopoles are physically too large for many applications and a more compact antenna is needed.

Such small ESAs have a high reactive component and a low radiation resistance. In FIG. 55 we consider the input impedance of a much shorter antenna of nominally 0.1 wavelengths. The series RC model of such a short dipole shows that the radiation resistance is scarcely 2 ohms, while the series capacitive reactance is 2,000 ohms. It requires a resonance circuit of enormous Q and component precision to efficiently compensate for this large capacitive reactance. The matching circuit to transform the 2 ohms to 50 ohms is not trivial and using actual lumped matching components represents a significant loss.

If we make the dipole antenna just a little longer then we can achieve a reasonable antenna Q.

FIG. 56 shows the impedance of a dipole that is nominally 0.35 wavelengths long. The radiation resistance has increased to 30 ohms, while the series capacitive reactance is a more manageable 375 ohms.

Matching an ESA over a broad frequency tuning range without significant mismatch loss typically requires a complex matching circuit with high quality components. Hence the requirement for ESA antenna design, for such applications as wireless sensors and cell phones, becomes the objective of achieving a compact design in terms of physical size while achieving an input port impedance that is not too difficult to match with reasonable components.

This fixed impedance antenna is subsequently attached to a matching fixed impedance transceiver subsystem. This approach, while simplifying radio design, has two major shortfalls that result in:

Signal loss in the coupled antenna/transceiver system: the antenna impedance matching of the antenna, over the operating range of the transceiver, is a fixed and relatively constant average impedance over the operating band of the transceiver. The result is a loss of some 2-3 dB in signal strength for both transmit and receiver. This loss in signal strength reduces the range of the transceiver.

In addition to signal loss, there is also battery power lost within the lumped impedance matching elements of the antenna and the transceiver.

As disclosed in Nielsen, a conjugate matching antenna circuit may be used that allows for a maximum or at least increased amount of energy transfer between an ESA antenna to the transceiver over the entire bandwidth of the transmission. This circuit is called the Anlotek ATL Filtenna, or simply the ATLF. The ATLF is applicable to both transmit and receive functions.

Of particular importance is that the ATLF conjugate matching antenna circuit is functional in conditions where the antenna impedance is not static. To achieve a conjugate coupling with the antenna, control of a circuit for complex conjugate matching of an antenna in a situation or application where the local environment of the subject antenna causes the reflection coefficient of the subject antenna is not static. The change of the reflection coefficient may be caused by 1) local environmental factors, or 2) the coupling of the subject antenna with nearby objects, or 3) application specific changes to the antenna impedance. Antenna optimization techniques for communication systems and other applications in such a dynamic environment may lose track of the true reflection coefficient of the subject antenna and thus fail to optimize the antenna or even cause the antenna to be effectively decoupled from the transceiver system.

Consideration of Impedance Matching Methods for Antennas that are not Electrically Small Antennas Impedance matching for high power transmission antennas have been widely deployed based on the metric known as Voltage Standing Wave Ratio (VSWR). While such antennas are not electrically small, for completeness this method is reviewed.

While these methods are used to automatically match impedances between transmitter and antenna, these are generally based at minimizing the Voltage Standing Wave Ratio (VSWR) in the transmission line, typically between the antenna and the transmitter, although the same could be done on the transmission line between the antenna and the receiver.

This method looks at the VSWR present in the signal transmission line to the antenna as a measure of impedance mismatch between the transmitter and antenna and adjusts variable inductor and capacitor circuit elements to minimize the VSWR. Variable line length elements are another way of minimizing the VSWR. Measuring the VSWR requires special equipment at the antenna tower.

As this method is looking at the center frequency of the transmission, the VSWR is adjusted to minimize the impedance mismatch at the antenna across the full bandwidth of the transmission. This is in marked contrast to the approach discussed below that optimizes the matching between the antenna and the receiver/transmitter.

Antenna Impedance Matching Using Resonant Structure Coupling

Rather than working to improve an impedance matching circuitry within the antenna, we will show that by coupling the unmatched impedance antenna resonator—be it a chip, dipole, or loop antenna—with an external resonant structure having suitable characteristics, such as the ATL described above, we can optimize the performance of the antenna itself. We call this resonator-linked antenna subsystem the ATL Filtenna (ATLF). However, other resonant structures that are able to do certain things by having certain characteristics similar to the ATL may also be used to modify the performance of the antenna toward a desired result.

Figure 60:
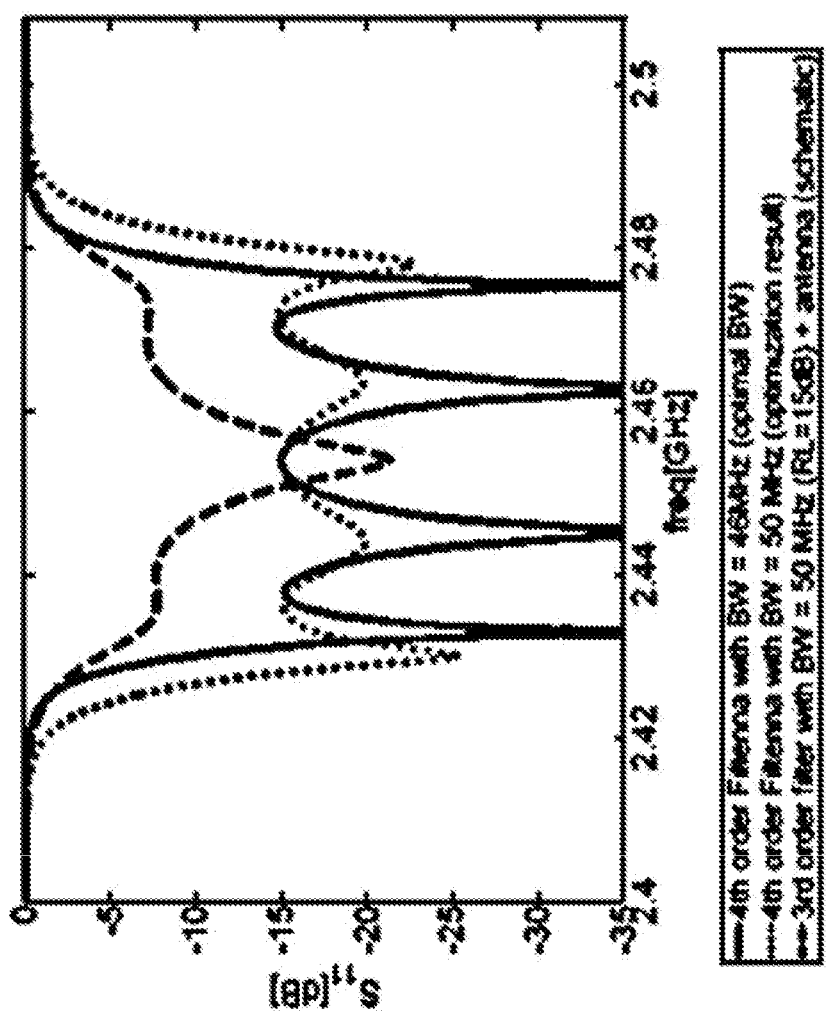
FIG. 60 is a graph showing prior art complex high order bandpass filtenna matching circuit performance.

The term "filtenna" is sometimes used to refer to a circuit having an antenna, typically a one port antenna element, and a two port filter network. An example is shown at the top of FIG. 59. Typically, the filter in the filtenna is a bandpass structure that is essentially a matching circuit. The filtenna may be regarded simply as a grouping of the antenna and a matching network that typically has bandpass characteristics. A filtenna bandpass matching circuit may be high order and complex, as in the prior art example of FIG. 60, which produces a higher order Chebyshev-like band-pass response from an otherwise narrowband antenna.

Figure 61:
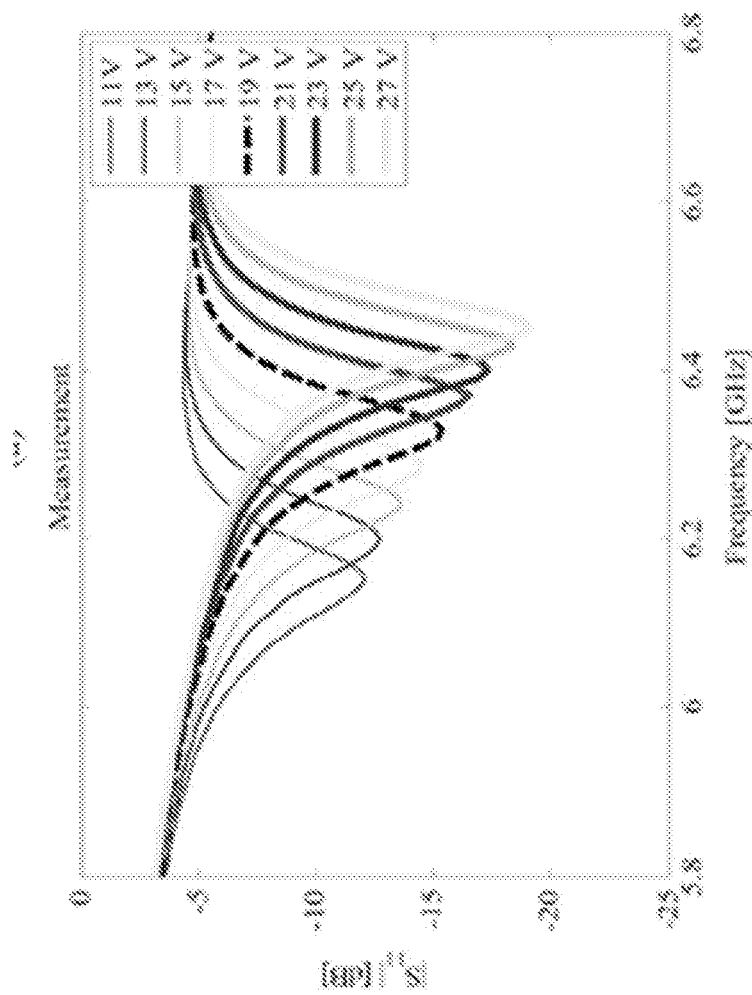
FIG. 61 is a graph showing a prior art example of a reconfigurable filtenna.

The term "reconfigurable antenna" may be used to refer some sort of control applied to the antenna to change its frequency response or radiation pattern. This may be achieved by a varactor diode control or PIN switches to couple in different parts of the antenna. One prior art example regarding a varactor based tunable antenna, which thereby falls into the definition of a reconfigurable filtenna, has a response as shown in FIG. 61. Many other examples of the reconfigurable filtenna exist in the literature, one category using active secondary radiators for achieving the reconfigurable filtenna properties.

What we will show is a circuit topology and method for providing dynamic antenna matching without the use of an antenna impedance matching circuit. The discussion herein will be given in terms of an ATL-based circuit, and therefore referred to using the term ATLF. However, it will be understood that similar strategies and design principles may be used with other circuit elements as will be understood.

The ATLF coupled resonant structure antenna subsystem reduces or removes the need for impedance matching when connected to a circuit as the antenna feed. This form of antenna impedance matching by the ATLF is valid for both transmit and receive mode. Additionally, the ATLF resonator-linked antenna subsystem also allows for an improved transfer of received antenna energy to the attached transceiver.

Broadly speaking, the ATLF accomplishes impedance matching by synthesizing the unknown reflection coefficient of the antenna, by which the ATLF creates an equivalent conjugate impedance match with the receiver, which is the condition for maximum energy transfer from the antenna to the receiver. The actual reflection coefficient of the antenna is dynamic and unique to the antenna structure at the precise operating frequency but is not known a priori by the ATLF.

This synthesizing of the unknown reflection coefficient of the antenna is achieved by analyzing the SNR feedback from the receiver demodulation, available from the receiver system, and dithering both magnitude and phase within the ATLF to provide the conjugate impedance match sought. Once this is achieved, the ATLF may further increase the magnitude of the effective reflection coefficient thereby effectively narrowing the signal bandwidth and increasing the Q of the received signal. Bandwidth narrowing is limited by the self-calibration and stability control of the ATLF, discussed below, that assures stability by preventing the feedback loop from driving the ATLF into instability by crossing the $j\omega$ axis and crossing into the RHP.

In the transmit mode, lookup table parameters may be used for optimization, rather than the demodulated SNR feedback from the receiver. Indirectly though, transmitter matching is based on feedback from the receiver, as the SNR estimation sets appropriate values stored in a LUT that may be used for the transmit mode, based on the principle of reciprocity.

Figure 62:
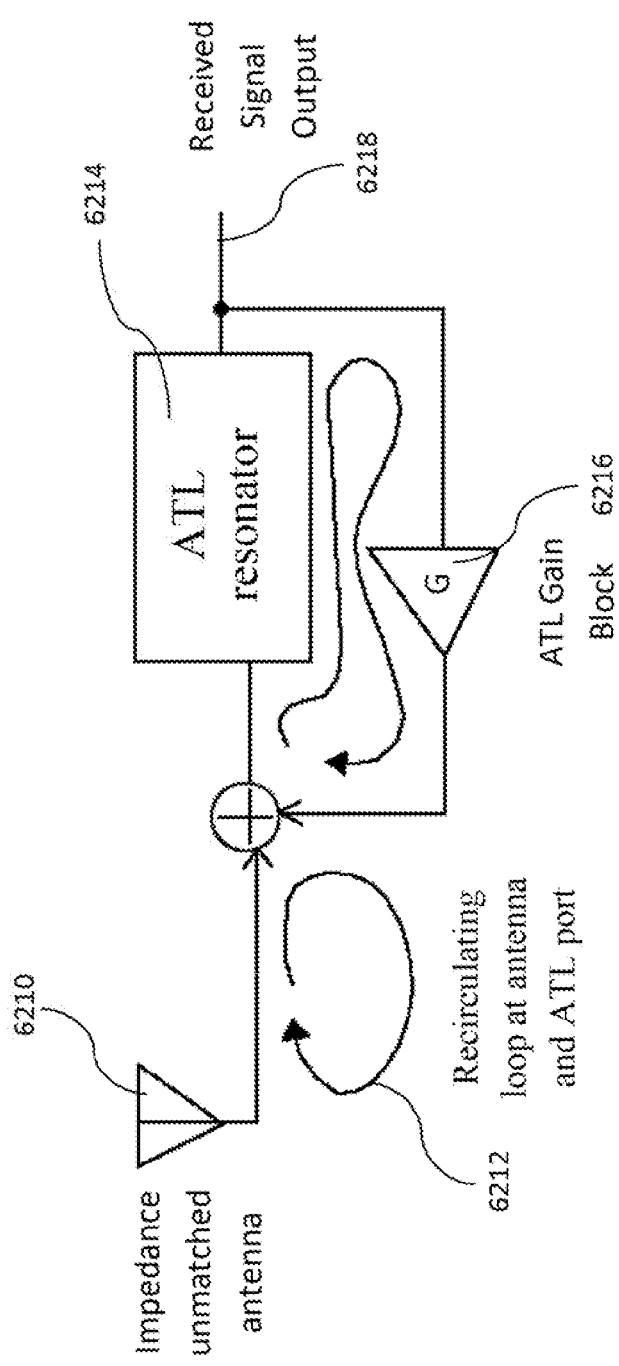
FIG. 62 is a block diagram illustrating the ATLF resonator linked antenna subsystem.

The ATLF resonator linked antenna subsystem, shown as two coupled resonators in FIG. 62 in the receive mode, thus dispenses with the typical antenna matching components and allows connecting the transceiver device directly to the ATLF resonator linked antenna subsystem. FIG. 62 shows an impedance unmatched antenna 6210, a recirculating loop at antenna and ATL port 6212, an ATL resonator 6214, an ATL gain block 6216, and received signal output 6218. This is possible because any electrically small low loss antenna is a resonator circuit element in itself that would be absorbed into the ATLn as a resonator sub-circuit such that they resonate together.

The ATLF may be used as:

A filtenna as it comprises an antenna that is filtered and impedance matched to a transceiver; and/or A reconfigurable antenna as we optionally apply frequency control to the antenna, typically in the form of a varactor diode.

Traditional antenna impedance matching, however, is eliminated in the ATLF as the antenna is directly coupled to the ATLn as an embedded resonator. This is achieved with the self-calibration of the ATLn, described below, that optimizes the operation regardless of the antenna that is attached. Not only does this reduce the parts count as matching components are not required, but also critically eliminates losses associated with lumped element impedance matching, improving antenna subsystem performance.

The increment in the chip die size to accommodate the ATLF is an insignificant cost driver. The inductor is more of a size issue and Q's of more than 15 are not likely cost effective. Hence the ATLn resonator Q of about 10 is a reasonable starting point. A successful ATLn enhancement factor (ratio of closed loop Q to open loop Q) would thus be on the order of 100, equivalent to that of the surface acoustic wave (SAW) filter for the same filtering performance.

The Electrically Small Antenna as a Resonator

As an example to work with, we assume a shortened dipole with a Q on the order of 10. This antenna is still too long for practical sensor implementation but there are ways of realizing a more compact antenna with similar impedance. This will be considered later. Impedance of such a device is given in FIG. 56.

Consider the series LRC model for the target antenna that is accurate over a relatively narrow bandwidth. For notational simplicity, we will assume normalization to 1 ohm such that the antenna port impedance, denoted as $z_A$, is given as:

$$z_A = Ls + \frac{1}{sC} + R$$

The reflection coefficient (looking into the antenna port) is then given as:

$$\Gamma_A = \frac{z_A - 1}{z_A + 1}$$

This can be expressed as:

$$\Gamma_A = \frac{Ls + \frac{1}{sC} + R - 1}{Ls + \frac{1}{sC} + R + 1} = \frac{s^2 + \frac{R-1}{L}s + \frac{1}{LC}}{s^2 + \frac{R+1}{L}s + \frac{1}{LC}}$$

Figure 65:
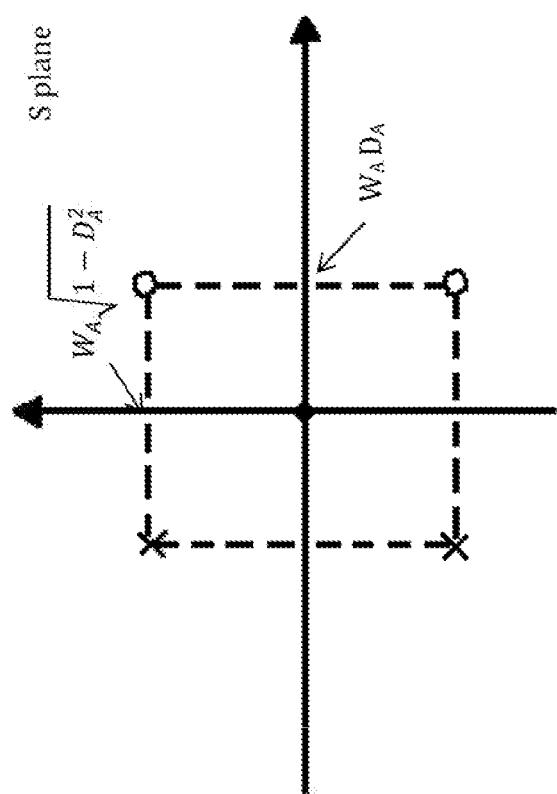
FIG. 65 is a pole-zero diagram of an antenna with small radiation resistance.

Consider the case where the normalized radiation resistance is negligibly small such that R≈0. It can be shown that the pole-zero plot for this case is as shown in FIG. 65.

Figure 66:
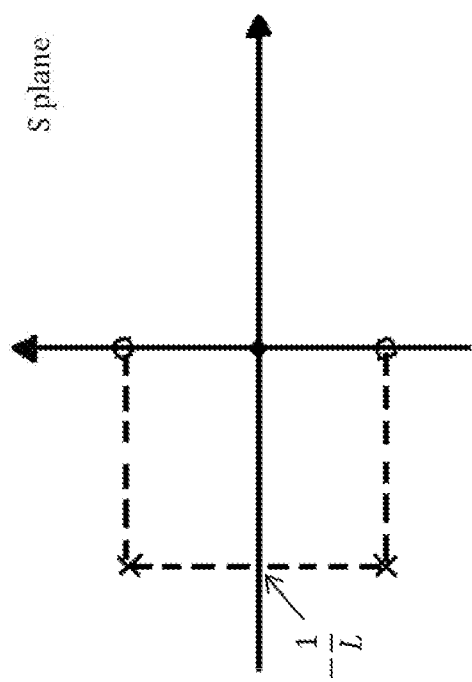
FIG. 66 is a pole-zero diagram for a perfectly matched antenna.

Next consider a perfectly matched antenna at the resonance frequency of the antenna such that R=1. It can be shown that the pole-zero plot for this case is as shown in FIG. 66. Other possibilities of a resonant, but mismatched, antenna could also be considered, but the range of R=0 to R=1 bounds the issue.

Figure 67:
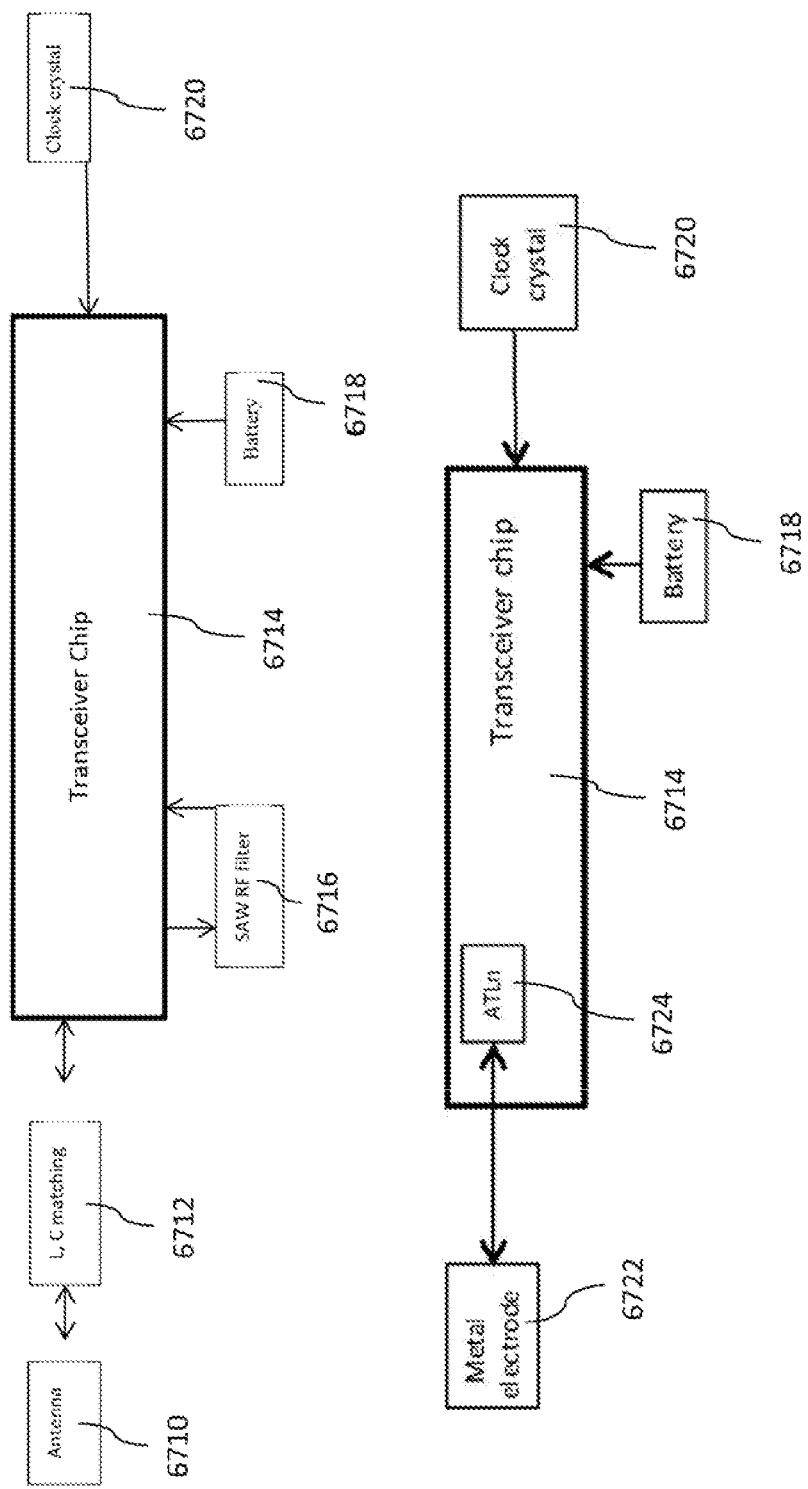
FIG. 67 is a set of block diagrams of transceivers with no matching network functions.

In contrast, the ATLF block diagram shown in the lower part of FIG. 67 dispenses with the matching components and connects the transceiver device to the chip antenna directly. We shall show that the ATLF may be operated such that the circuit requires no impedance matching, as the chip antenna effectively becomes part of a resonator in the ATLn. The ATLn self-calibrates and optimizes this antenna subsystem performance regardless of the antenna that is attached, as is discussed below. FIG. 67 shows two block diagrams of transceivers with no matching network function. The top diagram shows antenna 6710, L,C matching 6712, transceiver chip 6714, SAW RF filter 6716, battery 6718, and clock crystal 6720. The bottom diagram shows metal electrode 6722, transceiver chip 6714, ATLn 6724, battery 6718, and clock crystal 6720.

The ATL1 Resonant Variable Analog Filter in the Context of the ATLF Application

As mentioned above, the ATLF is described below in terms of an ATL-based circuit. It will be apparent, however, that circuits that provide similar benefits, to a greater or lesser extent, may be provided using other components that perform similar functions as those performed by the ATL-based circuit. In its basic form, the circuit connected to the antenna includes a signal conditioning block that includes an adjustable phase shift element and an adjustable scaling block connected in a signal loop with the antenna, where the adjustable phase shift element and the adjustable scaling block are controlled to condition the signal to modify the signal received by the antenna toward a desired signal. Preferably, the signal conditioning block also includes an adjustable resonator. It will also be understood that the signal conditioning block may be divided into separate components and distributed throughout the signal loop to provide the desired signal conditioning.

The analysis below will be given in the context of a particular example of an ATL-based circuit and is included for the purpose of improving the understanding of the principles involved. It will be understood, however, that the analysis may not be applicable to all implementations, and that variations in the design may be provided while still achieving beneficial results.

In the context of an ATL-based circuit, a brief review the ATL1, presented in some detail above, is in order to understand the linking of the two resonant structures of the ATLF: the unmatched target antenna and the variable analog ATLn filter. We begin with the simplest idealized model of the ATL1 as shown in FIG. 40 consisting of a resonator and scaling block in a feedback configuration, as discussed in detail above. Two implementations are possible, as shown, each with both advantages and disadvantages: the topology selection depends on the chip implementation of the variable ATLn filter. Initially, it is the loop that matters: the actual physical location of the input and output ports of ATL adaptive filter are secondary.

As detailed elsewhere, the ATL1 resonator transfer function is given by the standard second order model as $$H_r(s) = \frac{2D_r \omega_r s}{s^2 + 2D_r \omega_r s + \omega_r^2}$$

Figure 63:
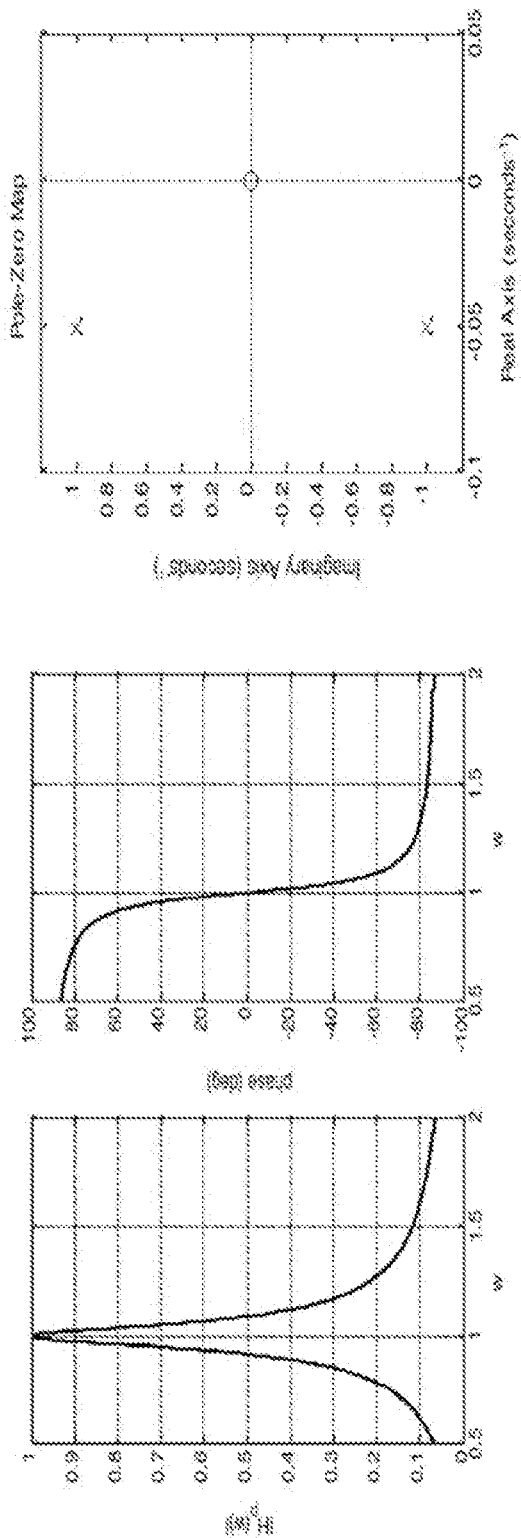
FIG. 63 is a series of graphs showing characteristic plots of ATL1 resonators at given values.

The characteristics plots for the resonator at normalized frequency are shown in FIG. 63 for $\omega_r=1$ and $D_r=0.05=0.05$, resulting in an open loop Q of 10, or relative bandwidth of 10%.

Note that in this second order model, the through gain of the resonator at resonance of $s=j\omega_r$ is $H_r(j\omega_r)=1$. As discussed elsewhere:

The ATL1 resonance frequency $\omega_r$ is adjustable with a varactor diode control voltage; and The ATL1 scaling block provides a gain of G that is controlled by a control voltage g.

The closed loop ATL1 transfer function at resonance is $$H(s) = \frac{H_r(s)}{1 - GH_r(s)} = \frac{2D\omega_r s}{s^2 + 2D_r\omega_r s + \omega^2 - G2D_r\omega_r s} = \frac{2D_r\omega_r s}{s^2 + (1-G)2D_r\omega_r s + \omega_r^2}$$

At resonance, the closed loop through gain is $$H(j\omega) = \frac{1}{1-G}$$

The bandwidth in radians per second is $B=2(1-G)D_r\omega_r$ and the Q is defined as $$Q = \frac{\omega_r}{B} = \frac{1}{2(1-G)D_r}$$

Finally, the Q enhancement factor of any resonator, the change of the Q from the open loop resonator to the closed loop, is denoted by $R_Q$ and is given as $$R_Q = \frac{\frac{1}{2(1-G)D_r}}{\frac{1}{2D_r}} = \frac{2D_r}{2(1-G)D_r} = \frac{1}{1-G}$$

which emphasizes that Q enhancement is simply the change of the Q from the open loop resonator to the closed loop resonator and is not dependent on the initial properties of the resonator.

Note that from this expression, two ratios of open loop to closed loop Q obtain:

$R_Q>1$ for values of $0<G<1$ corresponding to Q-enhancement $R_Q<1$ for values of $G<0$ corresponding to Q-spoiling Note that $R_Q$ becomes indeterminate for values of $G=1$. This corresponds to a pole crossing into the RHP of the S plane which is an unstable condition.

For chip implementations, $D_r$ is fixed based on what can be easily integrated into a chip. $D_r=0.05$ is reasonable for an integrated LC chip resonator resulting in a resonator Q of 10, which is easily designed. A key point here is that such a low Q means that the resonator components may be physically small when integrated.

Expanding on the component size issue, the resonance frequency is given as $$\omega_r = \frac{1}{\sqrt{LC}}$$

where L and C are the integrated inductor and capacitor components of the resonator. To minimize chip space, L and C should have a small value, as the physical area of each component grows roughly proportional to the component value. For a given resonance frequency of $\omega_r$, making L smaller implies C should be larger and vice versa. The energy storage in L is $0.5 \, Li^2$, and the energy storage in C is $0.5 \, Cv^2$, where i and v are the current and voltage of the resonator signal. In the chip it is desired to keep both i and v small. As the energy is the same such that $Li^2 = Cv^2$. Hence if L is decreased, then the current is increased. C is implemented with a varactor diode such that we need to keep the signal voltages small, so that they do not interfere with the varactor biasing and cause intermodulation distortion. Note that increasing C results in a lower voltage required for the same energy storage at the expense of increasing currents. While is a chip integration trade-off, the overall ATL1 resonator design for the ATLF is simplified by only requiring modest values for Q.

Figure 64:
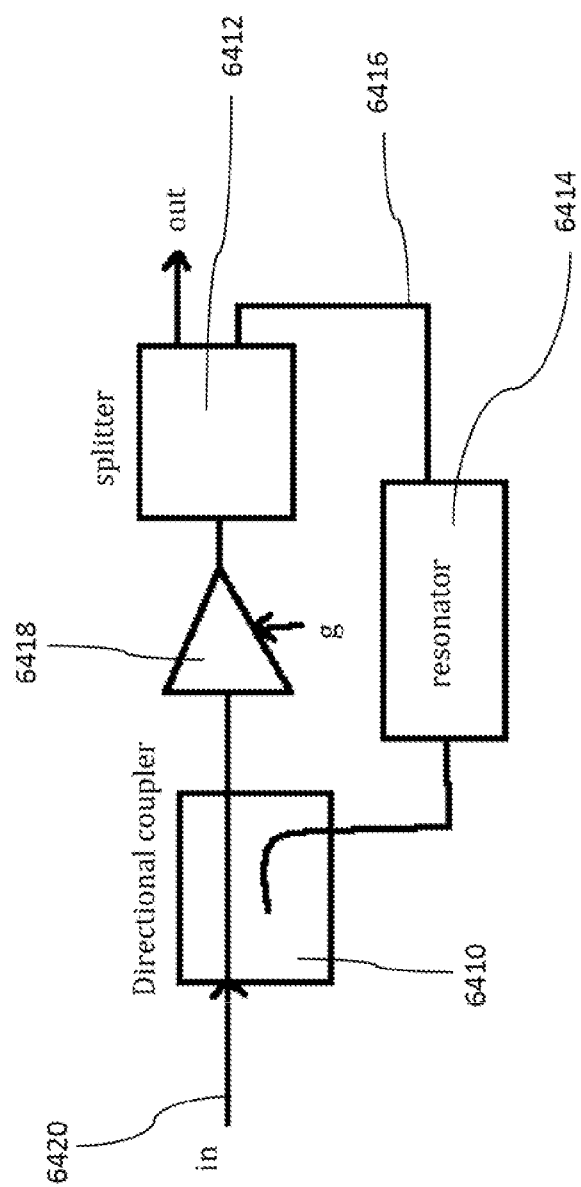
FIG. 64 is a block diagram showing an ATL1 with directional coupler and output splitter.

We now include the directional coupler 6410 and the output splitter 6412 in the ATL1 as shown in FIG. 64. Here we have the resonator 6414 in the feedback loop 6416, such that the scaling block 6418 is a buffer before the output splitter 6412. The directional coupler 6410 adds the resonator output back into the loop and minimizes the connection to the input port 6420. The directional coupler 6410 is of value in this context as the recirculating signal is of much larger amplitude than the incoming signal by a ratio (at resonance) of 1/(1−G), where G denotes the overall open loop gain at resonance, as controlled by the control voltage g. This signal ratio results in a large return gain on the input port 6420 of the ATL. For the ATL1, a modest amount of return gain is necessary, but if it is too large then it might overwhelm the target antenna resonance and may be difficult to calibrate. A moderate amount of directivity of the directional coupler is therefore desirable. The splitter in FIG. 64 may be trivially implemented with a simple lossy resistive circuit.

Adding the Phase Shifter to the ATLF

Figure 68:
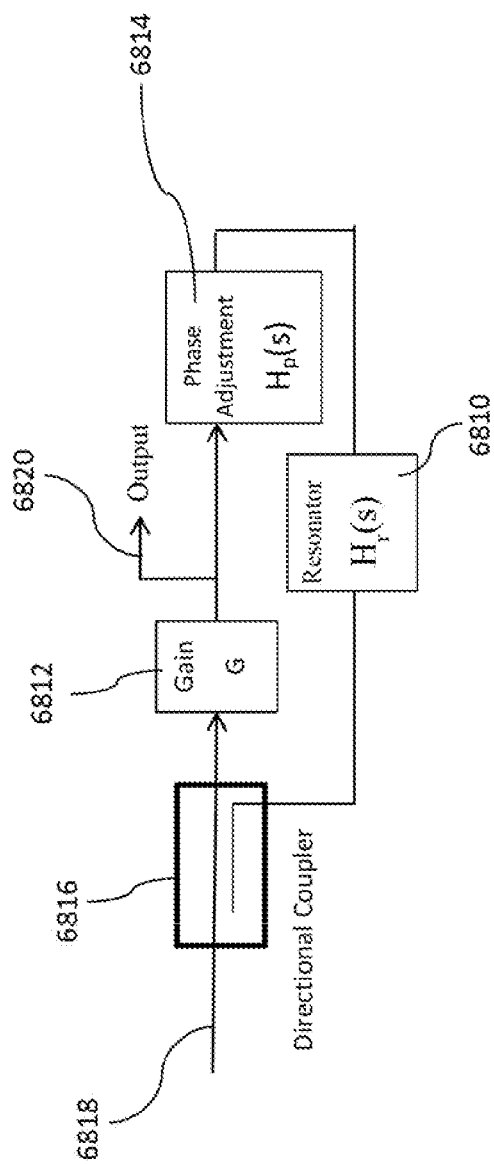
FIG. 68 is a block diagram showing a feedback loop with a reversed direction coupler, gain stage, phase shifter and resonator.

An implementation of a phase shifter for the ATL1 is discussed above. Now consider the combining of the phase shifter into the feedback loop of the ATLF, shown in FIG. 68, consisting of resonator 6810, a gain element 6812, a phase shifter 6814, a directional coupler 6816, input 6818, and output 6820. As indicated herein, there are various implementations of circuits available to provide the directional coupler function.

The overall transfer function can be expressed as $$H(s) = \frac{1}{1 - GH_r(s)H_p(s)}$$

The numerator of this transfer function may vary depending on where the output and input are given. For now, we assume the input is current impressed into the antenna and the output is taken from the output of the gain block. Now we can consider the combined poles and zeros and plot out the closed loop poles as a function of G as shown in FIG. 69.

Note that the resonator poles move towards the jw axis as G is increased, eventually crossing the line with the maximum ingress into the right hand plane being the open loop zeros of the phase shifter all-pass network. The open loop poles of the all-pass filter go conveniently deeper into the left hand plane and become the secondary closed loop poles.

Figure 69:
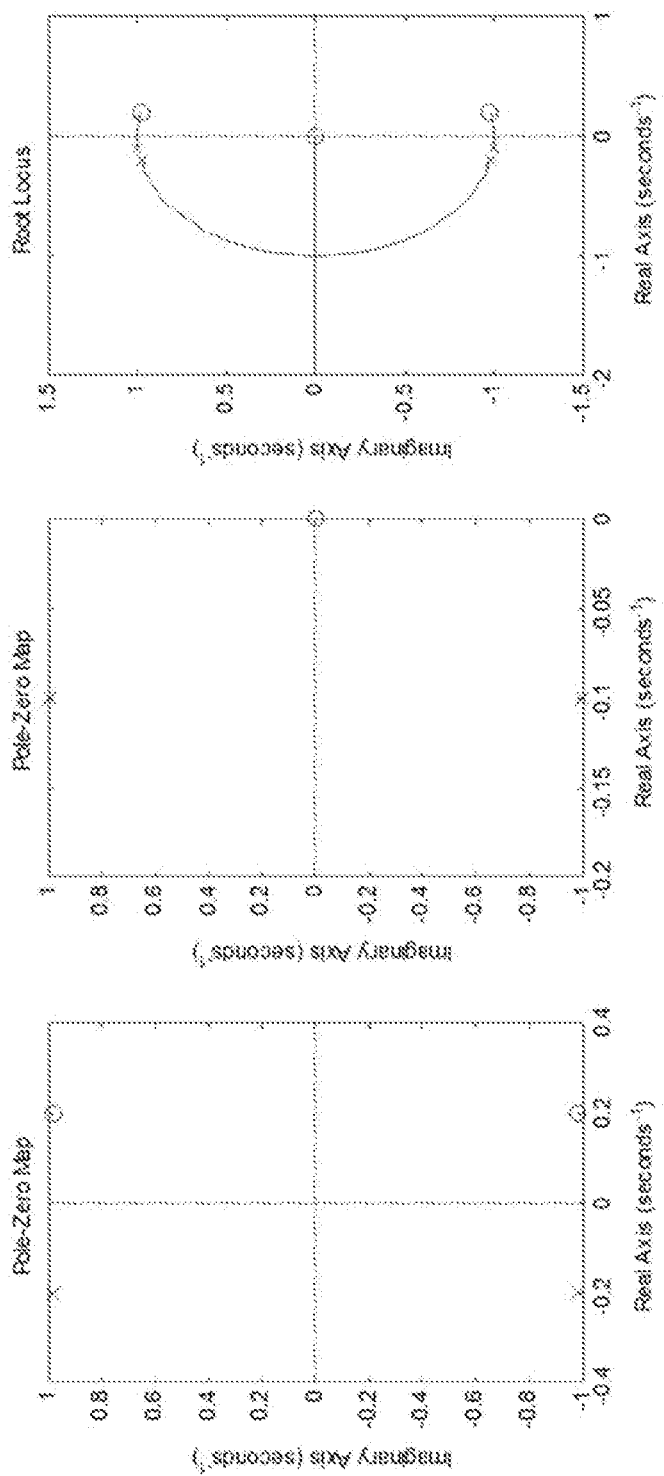
FIG. 69 is a set of plots showing the closed loop poles and zeroes of the ATLF.
Figure 70:
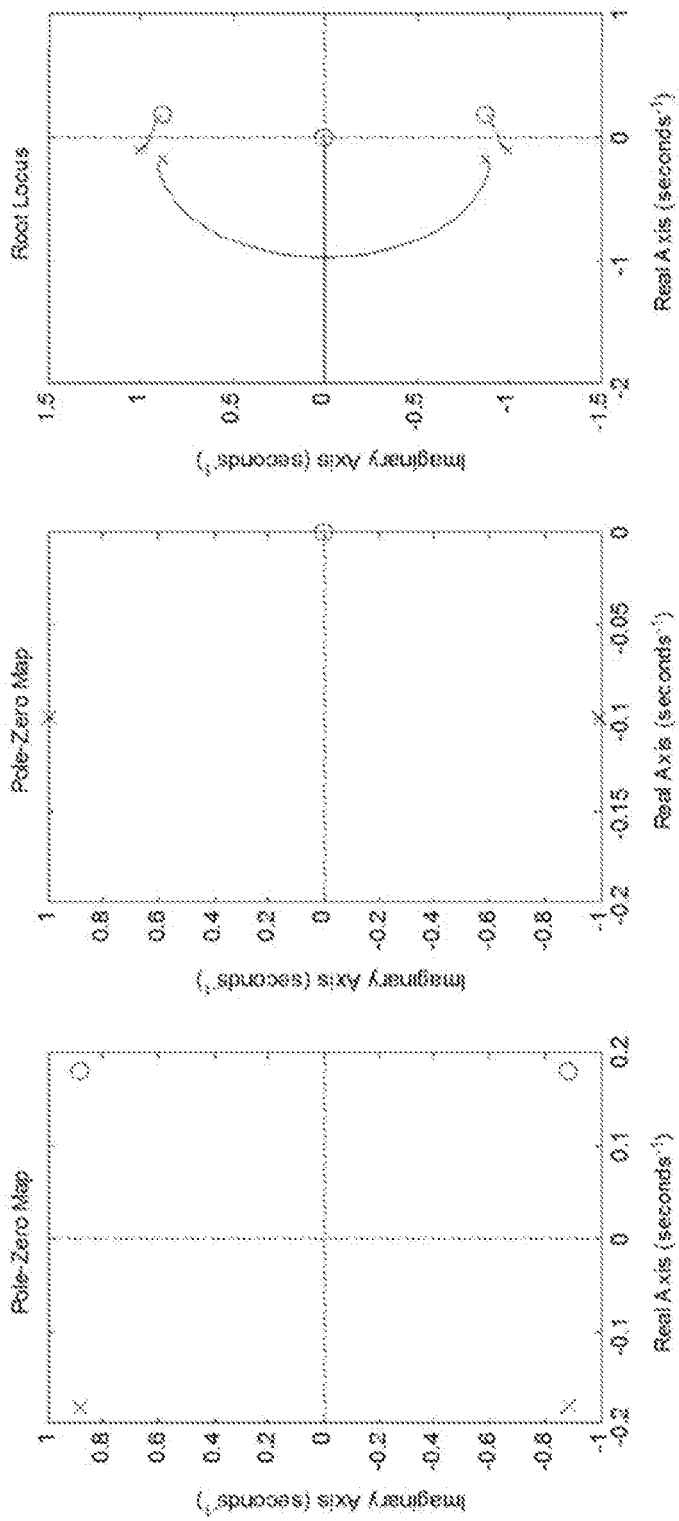
FIG. 70 is a set of plots showing distorted root trajectories resulting from a misaligned phase shifter.

In FIG. 69, we show the case for the aligned phase shifter and resonator. If the phase shifter is misaligned, then a distorted root trajectory results as shown in FIG. 70. Note that the resonator $\omega_r$ would have to be adjusted to compensate for the phase error of the phase shifter to get the same ATL1 center frequency.

Figure 72:
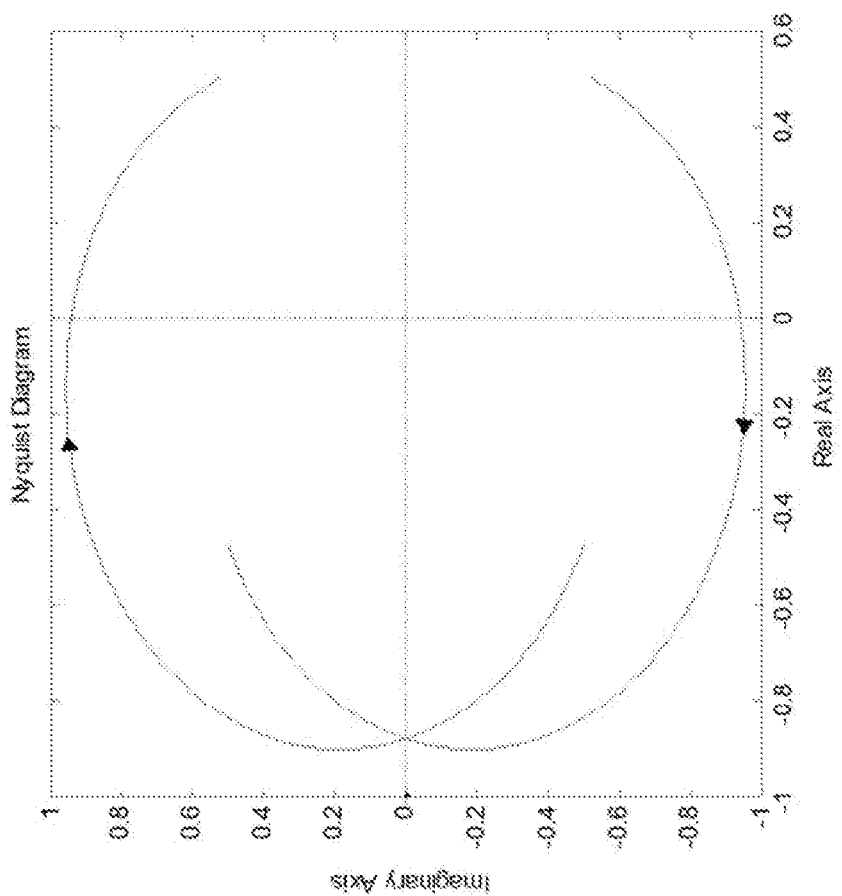
FIG. 72 is a Nyquist plot for the case of a misaligned phase shifter.

It is useful to look at the Nyquist plot for this misaligned phase shifter case shown in FIG. 72.

If −1/G is coming in from the left side as G increases, it is seen that there are two soft resonant peaks in the frequency response that merge into a single peak as G becomes larger and the −1/G point moves very close to the outer contour of $F(j\omega)$ in the Nyquist plot.

Figure 71:
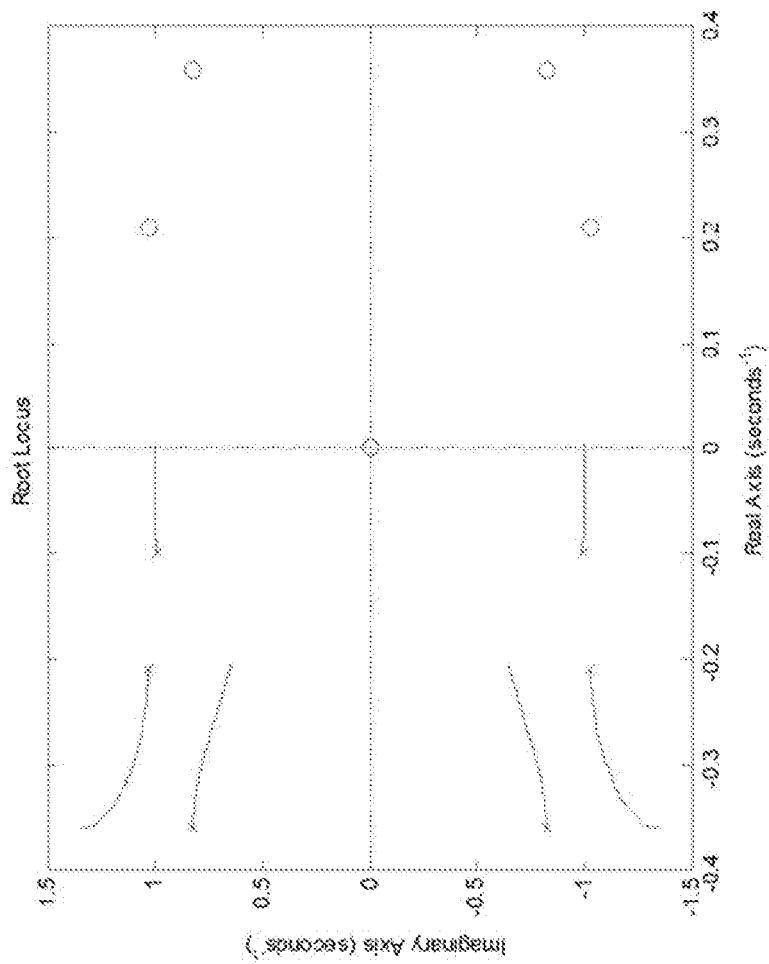
FIG. 71 is a plot of the root locus after phase compensation is applied.

For completeness, we show the case when another all pass network is added to represent some phase error due to propagation delay around the loop, and a phase shifter all pass network is added to compensate. The parasitic poles and zeros of the unwanted excess delay causes some complications to the root locus, but also shows that the phase compensation works. An example root locus is given in FIG. 71.

As will be described in the self-calibration section, the rule for optimizing the three control voltages {f,p,g} still holds and may be generalized as:

Given the constraint of a given output {signal level, Q enhancement, bandwidth} then {f,p,g} is set such that
g is minimized, where
f=center frequency control voltage
g=ATL1 loop gain voltage control
p=ATL1 phase adjustment voltage control This optimization seems to be convex in a moderate neighborhood of the optimum value of {f,p,g} provided that the resonator open loop poles have a higher Q than the Q of the resonator used in the all-pass phase shifting network. Additional complexities arising from internal loop reflections that may frustrate this optimization and create local optimization minimums.

Figure 73:
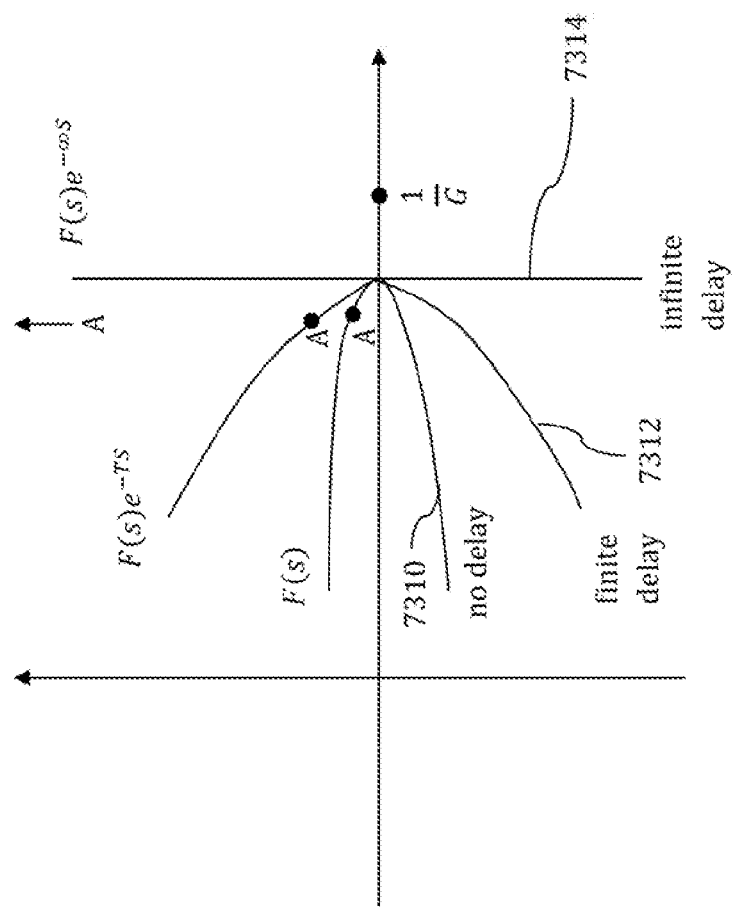
FIG. 73 is a Nyquist plot of an ATL1 loop with no delay, with finite delay, and with infinite delay.

The Nyquist plot can be used to show the effect of adding additional delay to the loop, such that there are multiple 360 degree increments associated with the round trip delay. When excess delay increases in the ATL1 loop, there is a narrowing of the passband as the off-resonance points are significantly moved due to the phase shift of the delay. This is shown in FIG. 73, which shows a Nyquist plot of XR(s) as the delay increases from no delay (line 7310) to finite delay (line 7312) and then infinite delay (line 7314).

Antenna Coupling and Impedance in the ATLF

Figure 74:
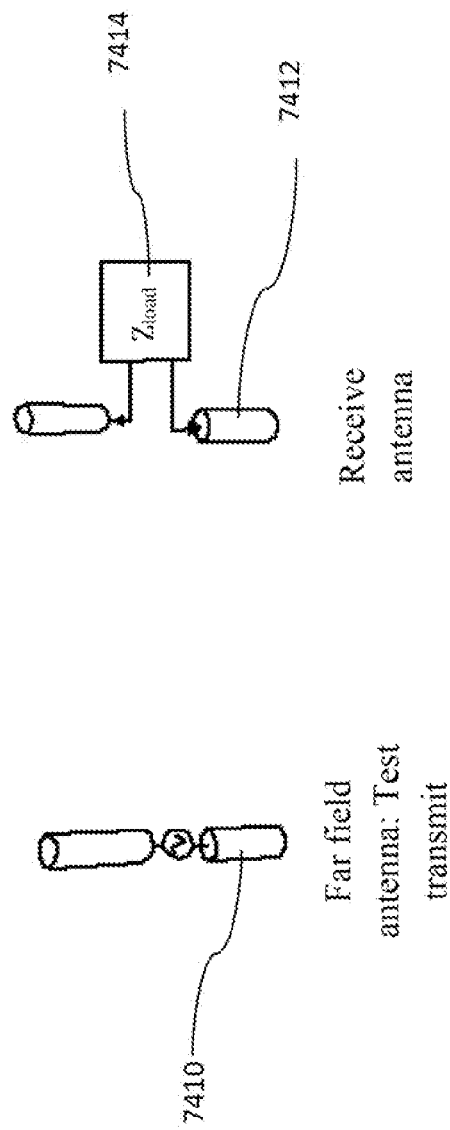
FIG. 74 is a diagram showing an antenna test setup.

Next, one may consider the issue of antenna coupling and impedance such that one may calculate these for the resonant coupling into ATLF. Consider FIG. 74, where we have a test transmit antenna 7410 in the far field of the receive antenna 7412 which is terminated in $Z_{load}$ 7414.

Figure 75:
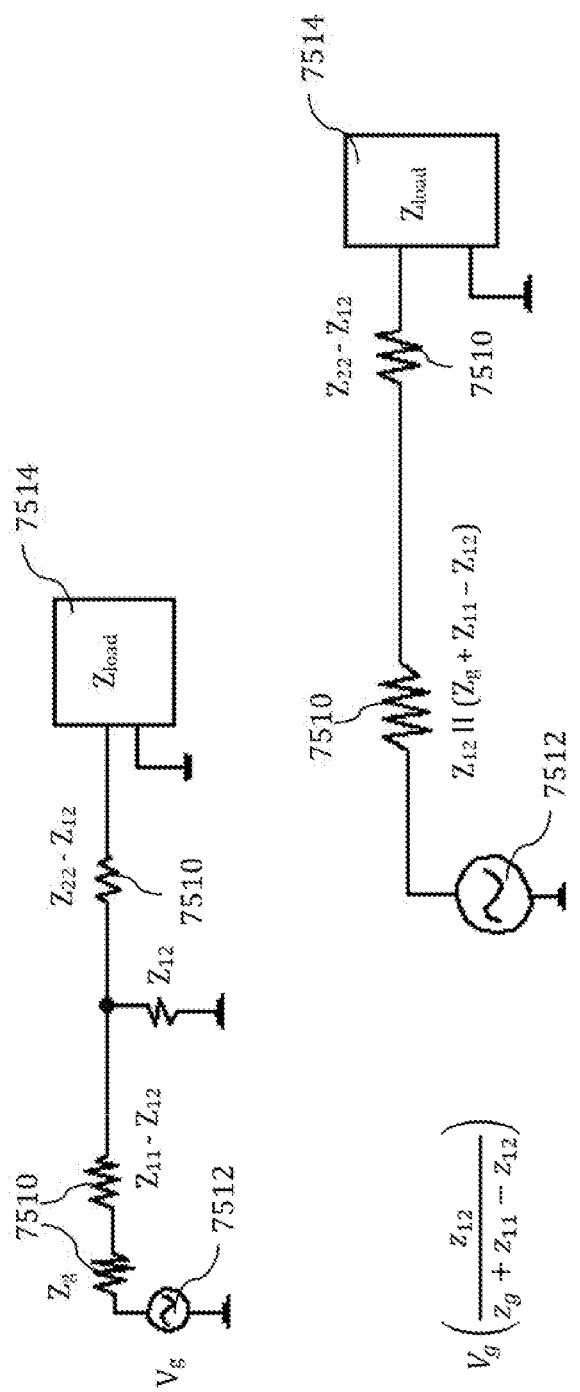
FIG. 75 is a diagram showing the equivalent circuit of coupled test antennas and the Thevinan equivalent circuit.

Based on the Lorentz reaction integral, one can determine the self-impedance of the test antenna (Z11); and the mutual coupling impedance (Z12) and self-impedance of the receive antenna (Z22). With these impedances, one can derive the equivalent coupling circuit as shown on the top in FIG. 75, as well as the Thevinan equivalent circuit as shown on the bottom in FIG. 75. Here $V_g$ is the generator voltage of the test antenna with a source impedance of $Z_g$. FIG. 75 shows resistors 7510, source 7512, and terminates in $Z_{load}$ 7514.

Given that the antennas are far apart, such that current flow in the receive antenna does not influence the transmit antenna, then it is reasonable to assume that $$|Z_{12}| << |Z_{11}|$$

$$|Z_{12}| << |Z_{22}|$$

Figure 76:
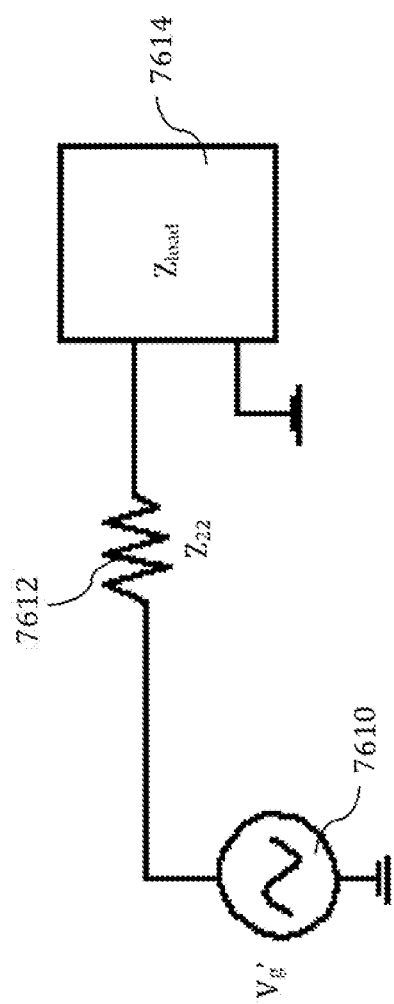
FIG. 76 is a diagram showing the approximate circuit of coupled test antennas.

Based on this, the circuit of FIG. 75 may be approximated as the circuit shown in FIG. 76, having source 7610, resistor 7612, and terminating in $Z_{load}$ 7614. The importance of this circuit is that the equivalent source impedance of the generator is now $Z_{22}$ such that the best power transfer is achieved with a conjugate load impedance matching of $Z_{load} = Z_{22}^*$.

For the ATLF analysis, we will work with both the impedance and the reflection coefficient of the antenna. The benefit of the reflection coefficient is that we can directly relate this to a transfer function and then couple in the ATL1 transfer function. Incorporating the antenna as a resonator into the ATL1 as a resonator, it is more direct to deal with impedances.

Antenna Inductance Matching in the ATLF

Figure 77:
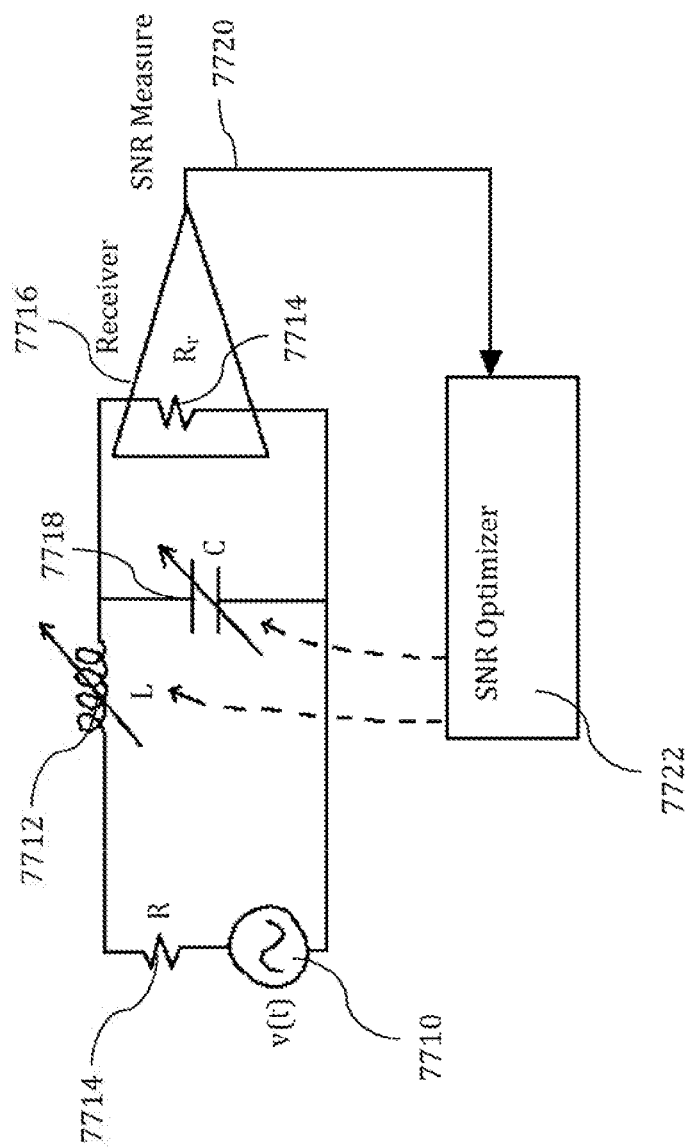
FIG. 77 is a block diagram showing impedance matching of an antenna to the receiver load with an L-match circuit.

To put some substance to the discussion of impedance matching, consider first the example of typical narrow band matching with the ATLF. Note that the tuning band over which the ATLF operates may be broad but the instantaneous band is considered small enough that the L-match is sufficient. As an initial example consider the radiation resistance of R=20 ohms to be matched to a receiver of $R_r$=50 ohms. This will be done at a resonance frequency of 1 GHz. The L-match is shown in FIG. 77, having source 7710, inductor 7712, resistors 7714, receiver 7716, capacitor 7718, SNR measure 7720, and SNR optimizer 7722 connected to inductor 7712 and capacitor 7718.

With the proper values for physical L and C, the impedance looking into the matching network and receiver from the antenna is exactly 20 ohms. Also, as only lossless inductors and capacitors are used in the match, the full available power from the antenna is dissipated in the receiver resistance $R_r$.

Next we consider the reflection coefficient relative to the antenna resistance of R such that $$\Gamma_r = \frac{R_r - R}{R_r + R}$$

Figure 78:
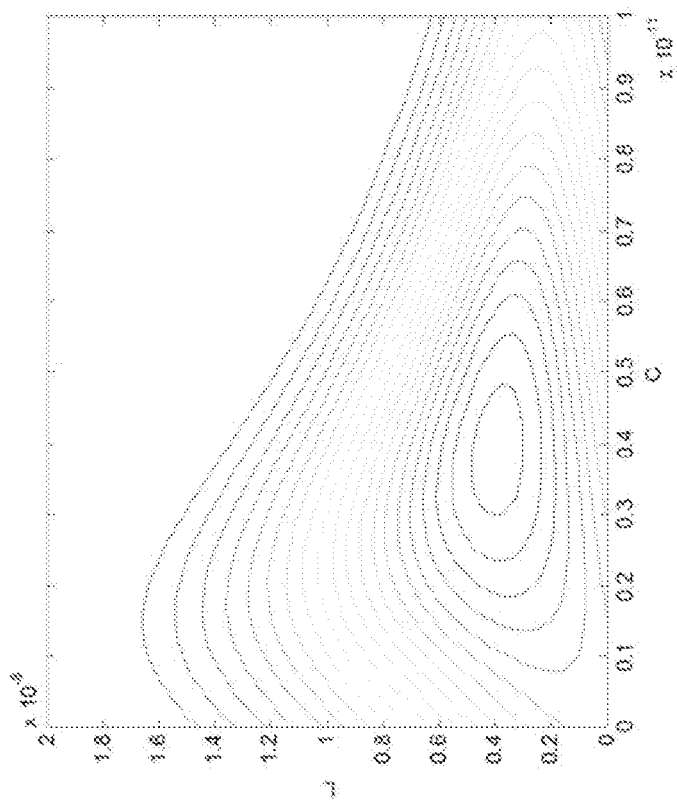
FIG. 78 is a plot of the complex antenna error surface.

We plot out $|\Gamma_r|^2$ as a function of L and C and get the contour plot of FIG. 78. This is a favorable convex error surface that L and C can easily be optimized with respect to using a simple gradient search optimizer. That is, if we can measure the SNR which is a monotonic function of the Noise Figure (NF) and the NF in turn is a monotonic function of $|\Gamma_r|^2$ then maximizing SNR minimizes $|\Gamma_r|$. In this example $|\Gamma_r|$ is a simple approximately convex function of matching parameters. Putting all of this together, a simple gradient search of the SNR will find the global minimum of $|\Gamma_r(L,C)|$. The only caveat is that ISI and narrowband interference spectral peaks are not considered here.

The L match is simple and works well for narrow bandwidths. The eventual bandwidth depends on how different R is from $R_r$. If R=$R_r$ then L=C=0 and the bandwidth is infinite. However, if R=$R_r$, then the bandwidth of the matching is quite small. If the resulting bandwidth is too small to accommodate the desired antenna signals, then a more complex physical matching network will be required with more physical L's and C's.

A problem with a chip integration of the L-match is that the range of L and C required to accommodate a range of antennas may be significant. A tunable inductor could be implemented with a MEMS device. However, MEMS do not integrate well with standard RFICs or MMICs due to mechanical structures required and high control voltage so when circuit cost is an issue, MEMS solutions are usually not viable. Of course, it is possible to integrate a varactor for C, but a variable physical L will require some active GIC type circuitry which is difficult at microwave frequencies with added noise. MEMS or GIC circuitry is difficult, expensive and also limited in component value range.

A point of the ATLF antenna matching is that it for a majority of cases, only two parameters are varied. However, for tough matching problems (such as a large antenna reactance, or R=$R_r$) we may find that the bandwidth becomes too narrow before the matching is complete. In this case, the SNR optimization limits the matching by effectively imposing the soft constraint of tolerable ISI noise.

Figure 94:
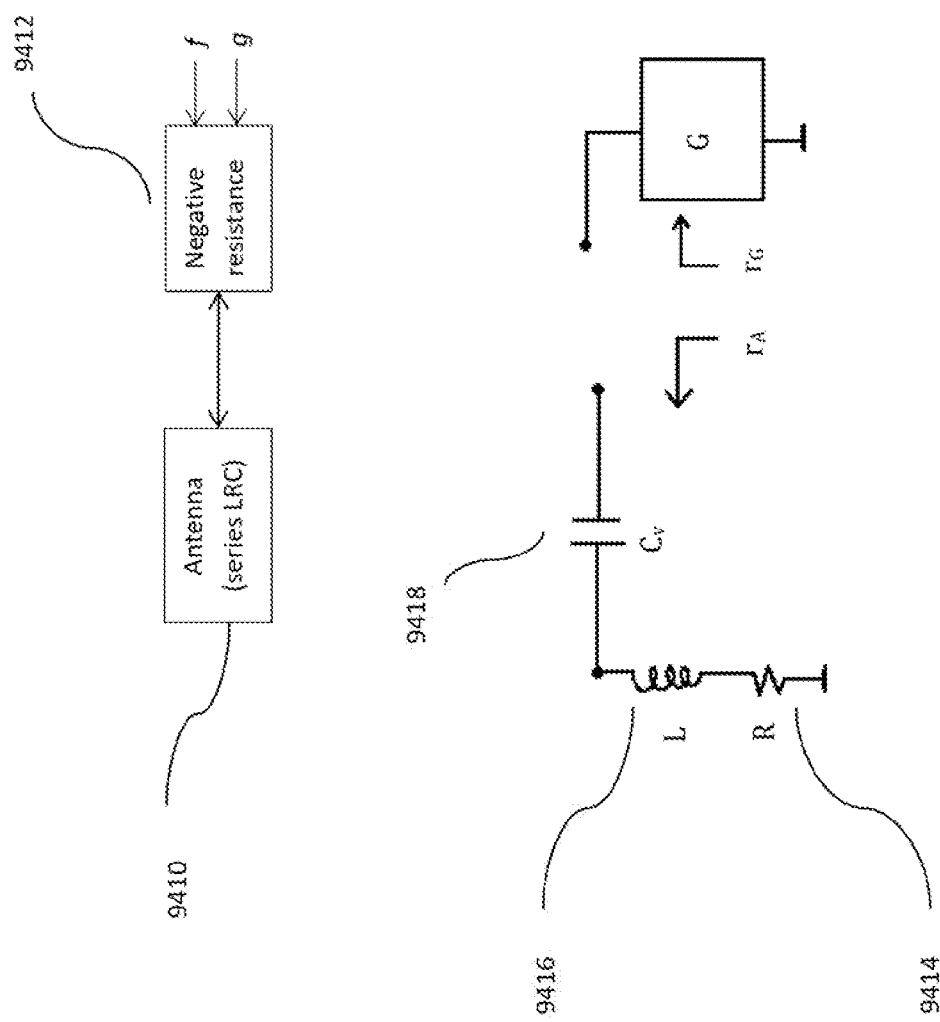
FIG. 94 is diagrams showing an ATLF consisting of an antenna and a negative resistance.

Reactive Antenna Component Matching of the ATLF Using an Adaptive Negative Resistance ATL Implementation The ATLF implementation of a negative resistance device, illustrated with a block diagram as shown at the top of FIG. 94, works only at the resonant frequency of the antenna itself. This resonant frequency occurs when the reactance of the antenna is zero. In a practical implementation, a negative resistance device will have some reactance associated with it that will push the resonance. We will first consider the ATLF circuit with a fixed frequency negative resistance device, and then extend that treatment to a variable negative resistance implementation, providing tunability.

Attaching a negative resistance device to the antenna may be approximated by the circuit shown at the top of FIG. 112. The circuit in FIG. 112 shows antenna model 11210 with resistor 11212, capacitor 11214, and inductor 11216, along with coupling cap 11218, and negative resistance provided at resistor 11220 and inductor 11222. The root locus and Nyquist plot of this circuit are shown at the bottom of FIG. 112. Application of a larger magnitude of negative resistance pushes the magnitude of the ATLF reflection coefficient over one and results in Q enhancement. Note how the poles circle around and cross the jw axis at a much different frequency than the resonance of the antenna. Also, there are two resonances with the second occurring at a much lower frequency. This is evident in the Nyquist plot also.

It is apparent that the antenna may have a soft resonance, but as gain is increased the Q enhancement may change the band center completely and seemingly unpredictably. This is where the ATLF provides much more predictable control of the Q enhanced passband.

Next we consider a phase shifter consisting of a directional coupler and varactor diodes. The S parameters of the four-port coupler are $$S = \frac{1}{\sqrt{2}} \begin{bmatrix} 0 & 1 & j & 0 \\ 1 & 0 & 0 & j \\ j & 0 & 0 & 1 \\ 0 & j & 1 & 0 \end{bmatrix}$$

where $j=\sqrt{-1}$. Putting this four port directional coupler into the scheme of FIG. 113 results in a phase shift equal to the phase shift of the reflection of ports 2 and 3, facilitated by a change in the varactor diode voltage. The top portion of FIG. 113 shows antenna 11310, directional coupler 11312, gain block 11314, output 11316, phase shifter 11318, and termination 11320. The middle portion shows antenna 11322, bidirectional hybrid coupler and phase shifter 11324, and negative impedance 11326. The bottom portion shows antenna 11328 connected to resistor 11330, capacitor 11332, and inductor 11334, with hybrid coupler 11336 and negative impedance amplifier 11338 having capacitor 11340, inductor 11342, and resistor 11344. Hybrid coupler 11336 is also connected to two varactor diodes 11338.

Operationally, the signal loop is as follows:

The signal from the antenna enters port 1 and exits port 2 and port 3;

The signal out of port 3 is lost in the matched gain block;

The signal from port 2 goes through the phase shifter and gain block;

The signal is split after the gain block where part is directed as output and the balance is routed into port 3 which couples it back into the antenna port;

The antenna reflects this and the signal loops back into port 1, forming the resonant loop structure.

The directional coupler may provide a 3 dB or a higher coupling ratio. Also, it may be implemented as a 90 degree or a 180 degree coupler.

Figure 114:
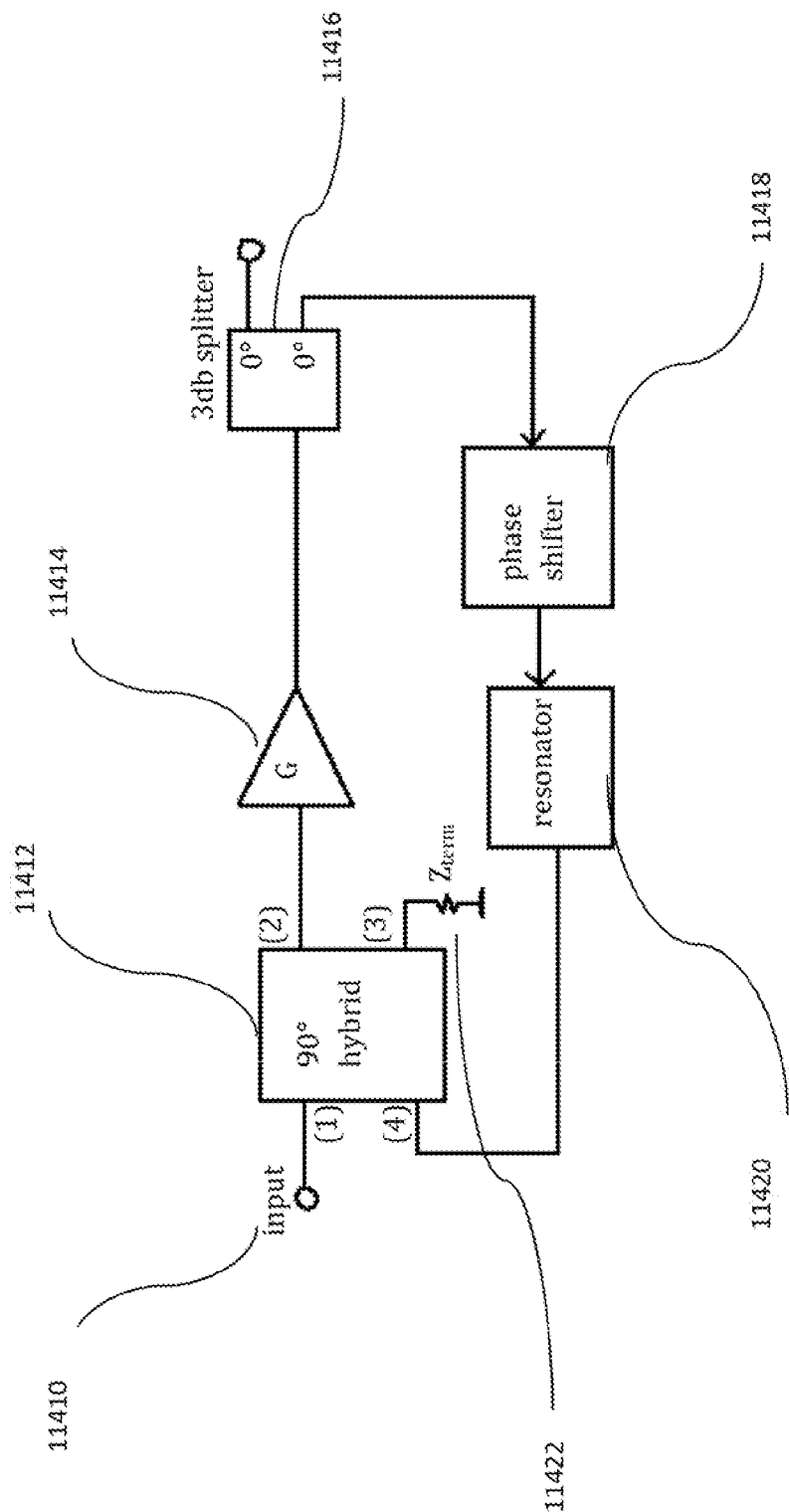
FIG. 114 is a block diagram showing ATL1 implementation with a splitter and directional coupler.

One possible implementation is as shown in FIG. 114 which comprises a 3 dB hybrid 90 degree coupler with the 0 degree output port 2 into the gain block followed by a 3 dB splitter as the ATL1 output coupler. The return signal from the output coupler is the feedback signal that goes through a phase shifter and resonator, which is then coupled back to the 90 degree hybrid coupler port 4. FIG. 114 shows input 11410, 90° hybrid coupler 11412, gain block 11414, 3 db splitter 11416, phase shifter 11418, and resonator 11420, with $Z_{term}$ at 11422.

When the phase is set correctly in this implementation, the 90 degree coupler is lossless with no signal sent to port 3 such that there is no dissipation in the termination resistor. Hence at resonance the full signal is sent through port 4 into the feedback loop. Furthermore, with ideal components at resonance with the phase shifter set correctly, there is no loss in the circuit, and all the power generated is available to the input port of the 3 dB output power splitter. The result is that when the phasing is done correctly, such that there is ideally no loss in the loop, then the noise figure (NF) of the ATL1 is minimized. Hence this arrangement provides the best NF and the highest frequency selectivity.

Examples of the negative resistance amplifier include, but are not limited to, a tunnel diode, a Gunn diode, or an Impatt diode. One may of course also use a properly biased FET of any type to provide a negative resistance. Such implementations are considered known to those skilled in the art. It is important to note that the phase shifter is traversed in both directions.

Figure 115:
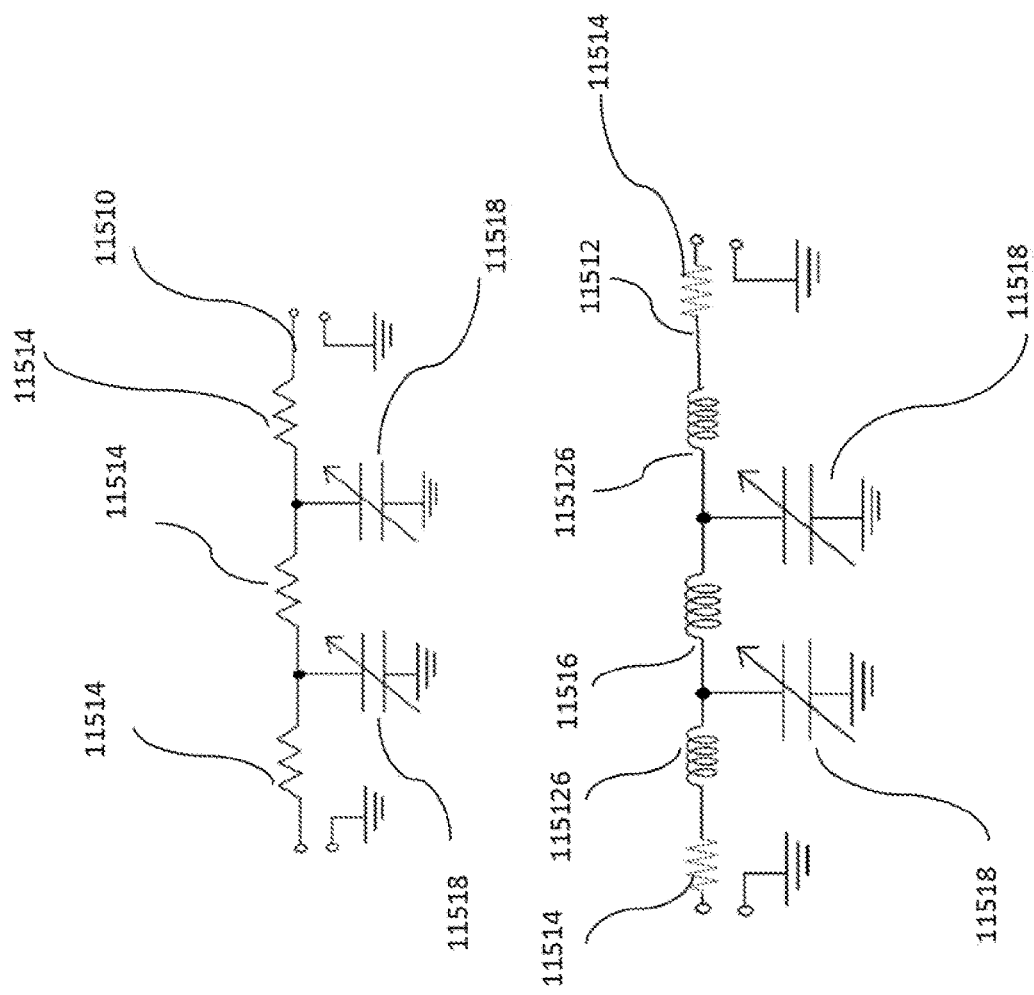
FIG. 115 is diagrams of bi-directional phase shifter alternatives.

One must recognize that the phase shifter imposes some loss. Further, the coupler is not integratable at chip level. There are many ways of implementing a varactor controlled bi-directional phase shifter. Two of these are shown in FIG. 115. The scheme 11510 at the top of FIG. 115 uses a variable RC time constant. The bottom scheme 11512 uses several stages of inductors and capacitors. Both schemes 11510 and 11512 show resistors 11514, inductors 11516, and capacitors 11518.

When designing an ATLF, the needed phase delay correction may be minimized by integration. In addition, the phase shift through the components may be reasonably accurately known. Hence fixed phase compensation may be included, and then the phase shifter need only adjust for the phase error or the phase shift not correctable by fixed networks, such as a variable phase shift of a delay over a broad frequency range. Now if the phase adjustment needed is small then a simple variable phase shifter may be used that combines the ATL negative resistance implementation and the phase shifter discussed above.

Active Antenna Reflection Coefficient Synthesis in the ATLF

The objective of the ATLF is to synthesize the physical capacitor of the inductance matching example. This is achieved through matching of reflection coefficients: if the reflection coefficient of the ATLF looks like that of a capacitor, then the circuit will react as if a physical capacitor was actually creating the reflection coefficient. In this case, the antenna reactive inductance is cancelled out.

Figure 79:
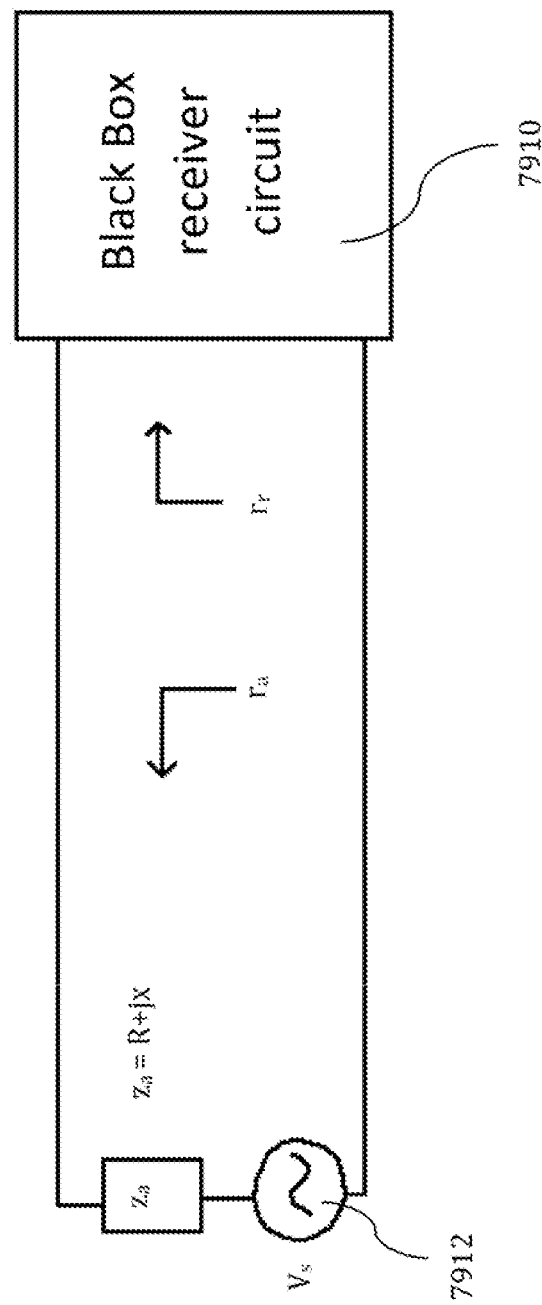
FIG. 79 is a block diagram illustrating ATLF impedance matching based on reflection coefficients.

Consider this fundamental concept of matching based on the reflection coefficient as shown in FIG. 79. Here we have an arbitrary antenna impedance of $$Z_a = R + jX$$

The reflection coefficient relative to some arbitrary characteristic impedance is $\Gamma_a$ for the antenna and $\Gamma_r$ for the receiver. If we have the condition of $\Gamma_r = \Gamma_a^*$ then the antenna is matched to the receiver and the available power of the antenna signal is fully utilized. This condition also maximizes the $SNR_{out}$ with caveats as mentioned above. Notwithstanding, maximizing the $SNR_{out}$ is the overarching best thing we can do to recover the antenna signal.

Now consider how we can realize the blackbox receiver shown in FIG. 79, having black box receiver circuit 7910 and source 7912. A possible realization is the Category 1 ATLF implementation using a circulator. Here the signal is input to the circulator, which couples it into a gain stage and phase shifter, and then back to the circulator and back out to the antenna. Unfortunately, a circulator is not integratable due to the ferrite and magnetic field source required but is implementable in a non-chip configuration. Based on this active scheme, we may certainly generate any reflection coefficient, even $|\Gamma_r| > 1$ if desired. Hence, we can satisfy the conjugate matching condition of $\Gamma_r = \Gamma_a^*$ which implies that we have made full use of the available signal power from the antenna.

In terms of NF, it would seem that the noise associated with the gain stage may be added in series at the input of the circulator, and then assume the generator $\Gamma_a$ to be otherwise noise free. In other words, the conjugate matching may be done, but the penalty may be an added noise term due to the gain block and the insertion loss of the circulator.

Figure 81:
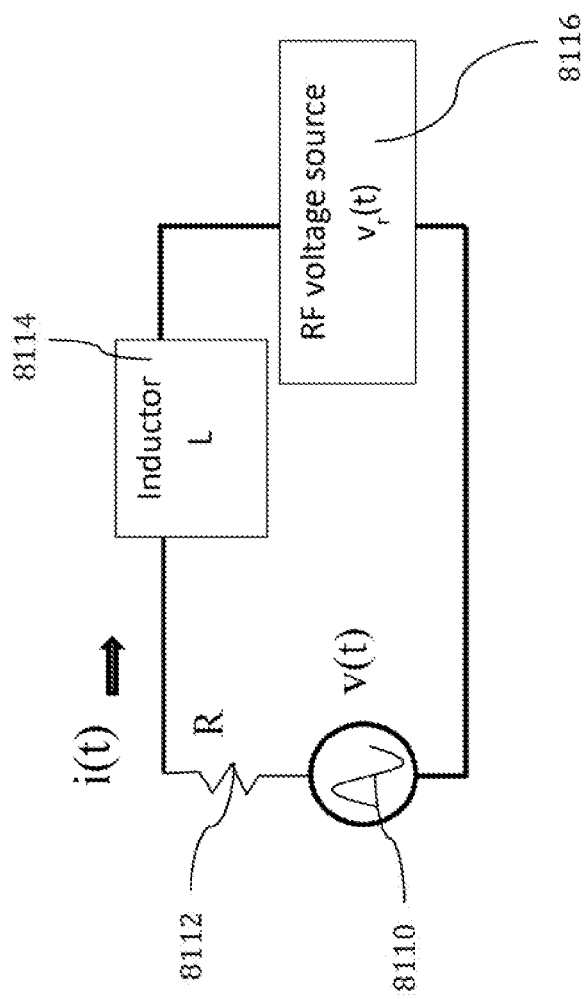
FIG. 81 is a block diagram showing an antenna with inductive reactance attached to an RF voltage source.

This theory of matching based on reflection coefficient indicates that we may inject a signal towards the antenna that in effect helps transport the available power to the receiver. This apparent oddity is explained by considering the antenna with a reactance of inductance L that is connected to a controlled RF voltage source denoted as $v_r(t)v_r(t)$ as shown in FIG. 81. FIG. 81 shows a source 8110, resistor 8112, inductor 8114, and RF voltage source 8116. The current that flows out of the antenna is i(t) which is reduced due to the inductive impedance. If the inductance was not present, then the current of $$i = \frac{v}{2R}$$

would correspond to the case of the inductor coupling into a matched resistor load of R with no inductor to impede the flow. This current will flow in the antenna if the voltage across the inductor is $$\frac{L}{2R}\frac{dv}{dt} = \frac{j\omega vL}{2R}$$

Consequently, the synthesized RF voltage applied to the antenna port (inductor end) is $$v_r = \frac{v}{2} - \frac{L}{2R}\frac{dv}{dt} = \frac{v}{2}\left(1 - \frac{j\omega L}{R}\right)$$

Figure 82:
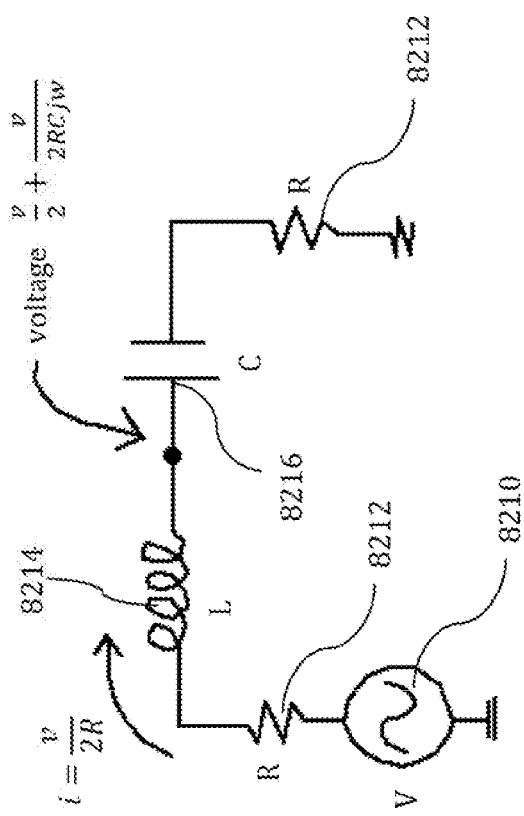
FIG. 82 is a diagram illustrating inductance cancellation by a capacitor.

Now consider that the synthesized RF voltage comes from a capacitor in series with a resistor R as shown in FIG. 82. FIG. 82 shows source 8210, resistors 8212, inductor 8214, and capacitor 8416. Then the voltage across the capacitor is given as $$\frac{1}{2R}\frac{v}{Cj\omega}$$

Consequently, we must have $$\frac{v}{2}\left(1 - \frac{j\omega L}{R}\right) = \frac{v}{2}\left(1 + \frac{1}{RCj\omega}\right) - \frac{j\omega L}{R} = \frac{1}{RCj\omega}$$

$$\omega^2 = \frac{1}{LC}$$

This is as expected since a series L and C resonate at a frequency of $\omega = 1/\sqrt{LC}$, precisely cancelling the antenna inductive reactance at that frequency.

Next consider the active reflection coefficient generator of FIG. 80 and determine the equivalent impedance generated by the reflection coefficient. We control the gain G and the phase $\phi$. The voltage signal into the circulator port 1 from the antenna is denoted as $v_{in}$. As such the return signal to the antenna, denoted as $v_f$ is given as $$v_f = v_{in} G e^{j\phi}$$

and enters port 3 of the circulator. This results in an equivalent reflection coefficient of $$\Gamma = \frac{v_f}{v_{in}} = Ge^{j\phi}$$

We assume here that the input impedance of the circulator port and subsequent gain block has an impedance of R. Later we will make this general by adding a small component to . Γ. Based on the impedance of the antenna R we can write this reflection coefficient in terms of the equivalent impedance again referenced to R, denoted as $Z_r$ and given as $$Z_r = R\frac{1+\Gamma}{1-\Gamma}$$

Now we can plot the real part of $Z_r$, as shown in FIG. 83. Note that for gains of G greater than one that $\text{Re}(Z_r)<0$, implying negative resistance, implying that there is a reflection gain.

Figure 84:
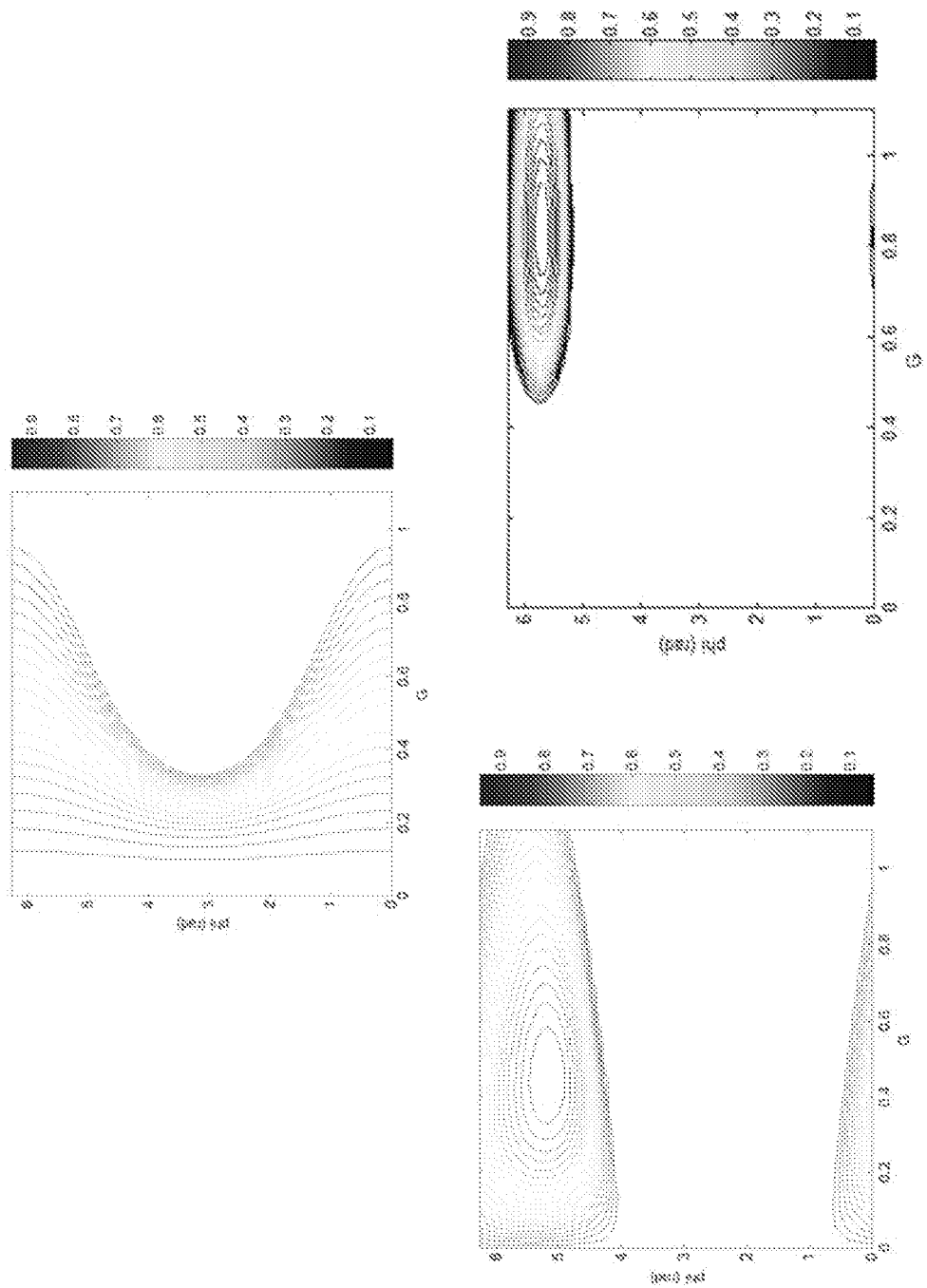
FIG. 84 is plots showing the power coupling factor from the antenna to the receiver for three values of the equivalent antenna impedance.

Next, it is revealing to plot the power loss factor of the antenna source. To do this, add the inductive component of the antenna impedance to $Z_r$, and then recalculate the reflection coefficient which we will call $\Gamma_a$. Then calculate the factor of $P_f = 1 - |\Gamma_a|^2$ as representing the portion of the antenna available power that makes it into the circulator port 1. A plot of $P_f$ is given in FIG. 84 for the three values: $Z_r=1$; $Z_r=1+j1$; and $Z_r=1+j3$.

Note that as the antenna reactance increases, the region over which the antenna coupling is reasonable diminishes and higher gains are required. This is expected since the active feedback has to match a larger magnitude reflection coefficient of the antenna. As the reflection coefficients become larger, the resonance becomes stronger and the region shrinks.

Also, note that G for the optimum point where $P_f$ is about G=1: if G is increased further then $P_f$ begins to decrease. This is due to the equivalent resistance of the receiver feedback becoming less than R and then eventually becoming negative as G increases beyond 1.

Next it is interesting to plot the current flowing from the antenna. To calculate this, first define a as the power wave into the receiver (circulator) and b as the reflection from the circulator. The reflection coefficient can be expressed as $$\Gamma = \frac{b}{a} = Ge^{j\phi}$$

Next the voltage at the port 1 of the circulator is given as $$V_r = a+b = a(1+\Gamma)$$

The current flowing out of the antenna into the circulator port is given as $$I = \frac{a-b}{R} = \frac{a}{R}(1-\Gamma) = \frac{V_r}{(1+\Gamma)}\frac{1}{R}(1-\Gamma)$$

We also have $$V - V_r = IZ = V_r\frac{Z}{R}\frac{1-\Gamma}{1+\Gamma}$$

This gives an expression for the circulator port voltage in terms of known values as $$V = V_r\left(1 + \frac{Z}{R}\frac{1-\Gamma}{1+\Gamma}\right)$$

or $$V_r = \frac{V}{1 + \frac{Z}{R}\frac{1-\Gamma}{1+\Gamma}}$$

Once we have $V_r$ we can determine $$I = \frac{V_r(1-\Gamma)}{R(1+\Gamma)}$$

or simpler $$I = \frac{V - V_r}{Z}$$

Figure 85:
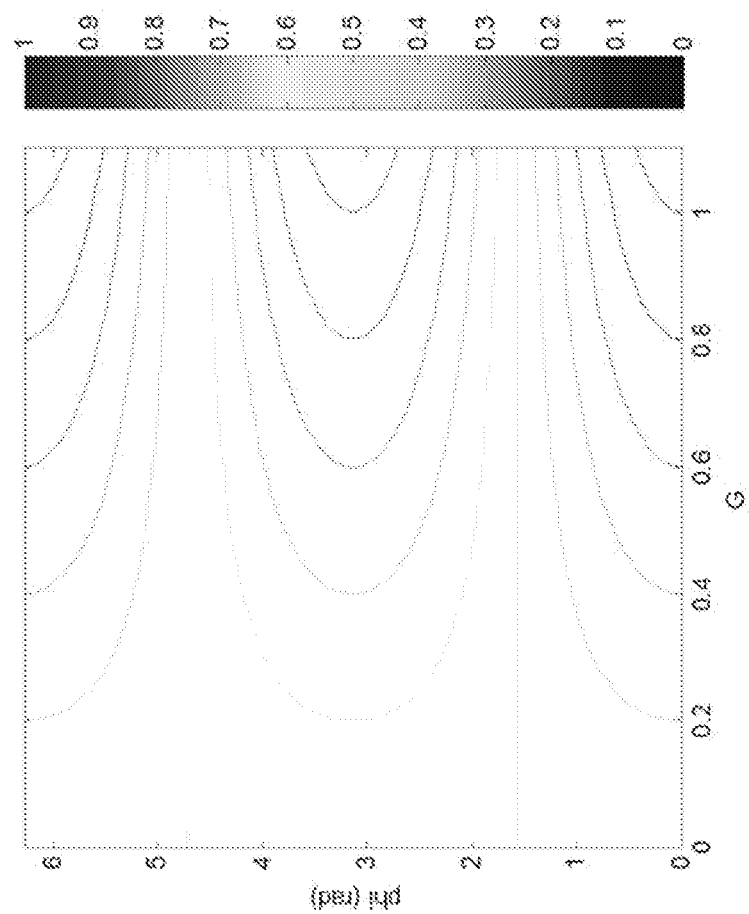
FIG. 85 is a plot showing the current out of an antenna for Z=R.

Our first example is for Z=R such that the optimum solution is for G=0 as shown in FIG. 85. Note that the current is 0.5 since R=1 and V=1 such that I=V/2R=0.5. But note that for Φ=π, the current increases for increasing G. Also, note that at G=1 and Φ=π the current increases to 1 as the equivalent impedance of the receiver is then zero: we are drawing more current out of the antenna, but the power coupling factor is zero, so that none of the available power is being used by the receiver.

However, the interesting point here is that the forward power wave of a emanating from the antenna makes it into the active load of the circulator, and is then reflected back to the antenna by synthesizing b. Hence the information of a is utilized in the receiver. Consequently, we should really look at a instead of the voltage at port 1 of the circulator.

Figure 86:
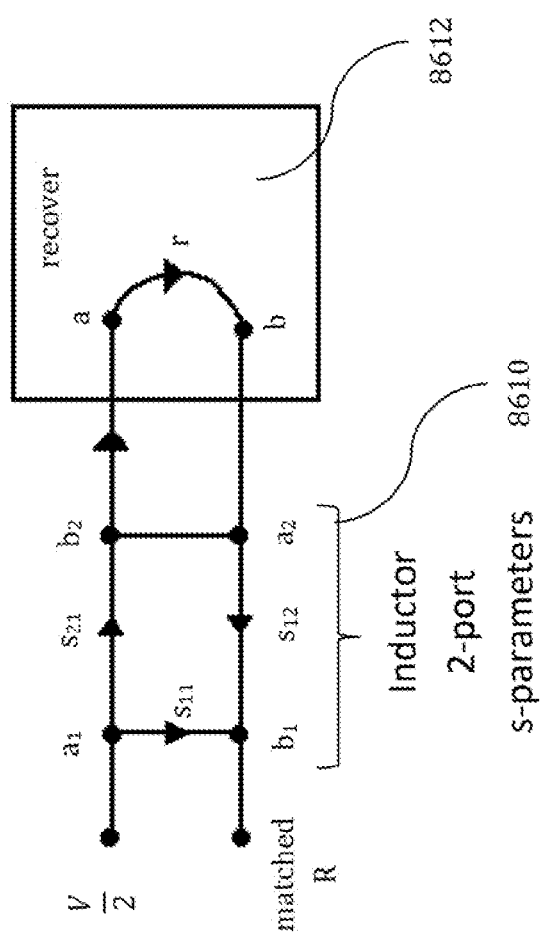
FIG. 86 is a block diagram illustrating the equivalent reflection caused by the inductor of the antenna.

But a=0.5 independent of the reflection coefficient generated from the receiver. It would therefor seem that the whole active feedback scheme is not achieving much—but that is because the antenna is matched to begin with. Once the inductor is added to the antenna, then the antenna signal is partially reflected back at the input to the inductor and it is the 'b' signal out of the inductor that then becomes the 'a' into the antenna. This is illustrated in FIG. 86 having inductor 2 port s-parameters 8610 and recover 8612.

Figure 87:
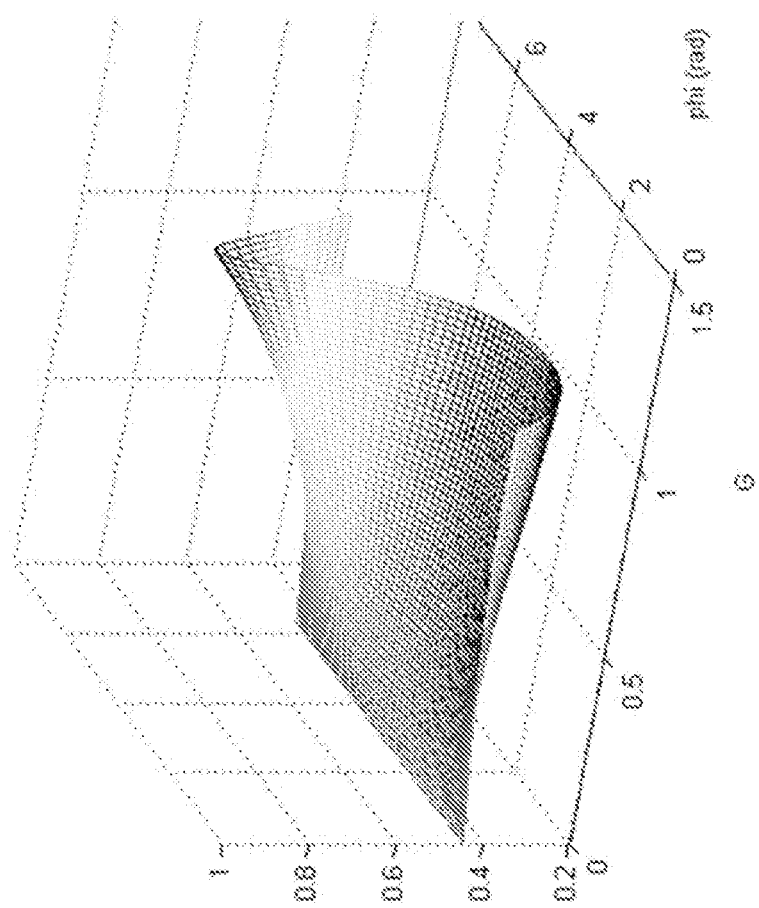
FIG. 87 is a plot of the receiver 'a node' showing that the power wave signal increases steadily with G.

Now consider the plot of the receiver a node which is shown in FIG. 87 for all of the receiver G and Φ conditions. Note that as G increases the amplitude of the input power wave just keeps increasing. Note that this is the signal that is input to the gain block of the receiver. It would seem that we have created a 'super antenna' but alas this is not the case. The issue is that the a signal has contributions from the active receiver via the path $b \rightarrow a_2 \rightarrow S_{22} \rightarrow b_2 \rightarrow a$ and therefore what we are seeing is the combination of the power wave from the antenna and the recirculating signal from the receiver to the inductor port (antenna port) and back which is coherent with the antenna power wave, but with receiver noise added in. This makes it complex to analyze.

With the feedback, we have gain such that the apparent power wave from the antenna can grow, but as it has passed through the receiver, there is noise added that deteriorates the overall NF. We cannot have a NF of less than 1 and therefore the apparent signal enhancement of FIG. 87 is an illusion.

As a summary note, it is clear that sampling the signal output of the receiver as it goes through resonance is not a clear indication of the optimum operating point. The true measure is once again the SNR.

The signal graph of FIG. 87 gives another way of interpreting what is going on. The power wave emanating from the antenna hits the inductor two port and is reflected and partially transmitted. With no active feedback and termination in R at the output of the inductor, the power wave would be reduced because $|S_{21}|$ of the inductor is less than 1. However, the inductor does not add noise and so this reduction does not necessarily degrade the SNR. Now we have the feedback signal of $b \rightarrow a_2 \rightarrow S_{22} \rightarrow b_2 \rightarrow a$ that gets added to the antenna power wave restoring its amplitude if the active receiver reflection coefficient emulates a resonating capacitor with R in series. However, the process of doing this adds noise from the active gain block of the receiver.

The higher the inductance, the larger the magnitude of reflection coefficient that needs to be generated by the receiver to compensate for the loss of $|S_{21}|$ (which increases with inductance as $|S_{21}|=R/(R+jwL)$). The bigger the contribution from the receiver, the more receiver noise is added into the mix. Also, evident from FIG. 87 is that G may be increased beyond the level necessary for compensation of $|S_{21}|$, providing additional gain to the antenna power wave. However, the SNR does not improve further and in fact the SNR starts to go down.

SNR as a Measure of ATLF Antenna Impedance Matching Quality

Indirect measures of the matching condition in the receive mode may be facilitated by measuring the SNR of the demodulated output with the simple objective of adjusting the matching components such that the SNR is maximized. There are some points to make in this regard:

If the only sources of noise are the thermal noise of the antenna based on the effective temperature of the environment it is exposed to and the intrinsic noise of the receiver RF amplifier, then maximizing the SNR of the demodulated received signal output is equivalent to minimizing the NF or the FOM as described earlier. The NF has the penalty term of $1/(1-|\Gamma_r|^2)$ which is thereby minimized, which in turn implies that $|\Gamma_r|$ is minimized, implying the optimum antenna impedance match.

There are other sources of noise such as non-thermal interference that the antenna picks up from channels adjacent to the desired signal. The antenna match will be made such that the bandwidth is narrowed around the frequency channel of the desired signal. This comes about as the SNR measurement cannot distinguish between thermal and interference noise.

If the receiver noise is negligible in comparison with the thermal and interference noise from the antenna, then the matching would become irrelevant as the in-band noise and signal are processed similarly. Hence there is no advantage to maximizing the antenna power that reaches the receiver.

Additionally, ISI noise (inter-symbol interference discussed elsewhere) will be generated in the receiver if the signal filtering does not have the correct shape that matches the signal modulation. Generally, for the antenna matching, ISI noise increases as the bandwidth of antenna match becomes too narrow. This is an element of consideration when the bandwidth of the ATLF received signal is too narrow to begin with, as discussed below.

Note that with matching based on SNR maximization there are two processes going on. The first is that the antenna is matched to transfer the maximum signal power to the receiver. The second is that the bandwidth is limited by the matching process, due to the resonance of the matching network as discussed below. Hence noise and interference from outside of the resonance peak is being suppressed relative to the desired antenna signal.

Figure 89:
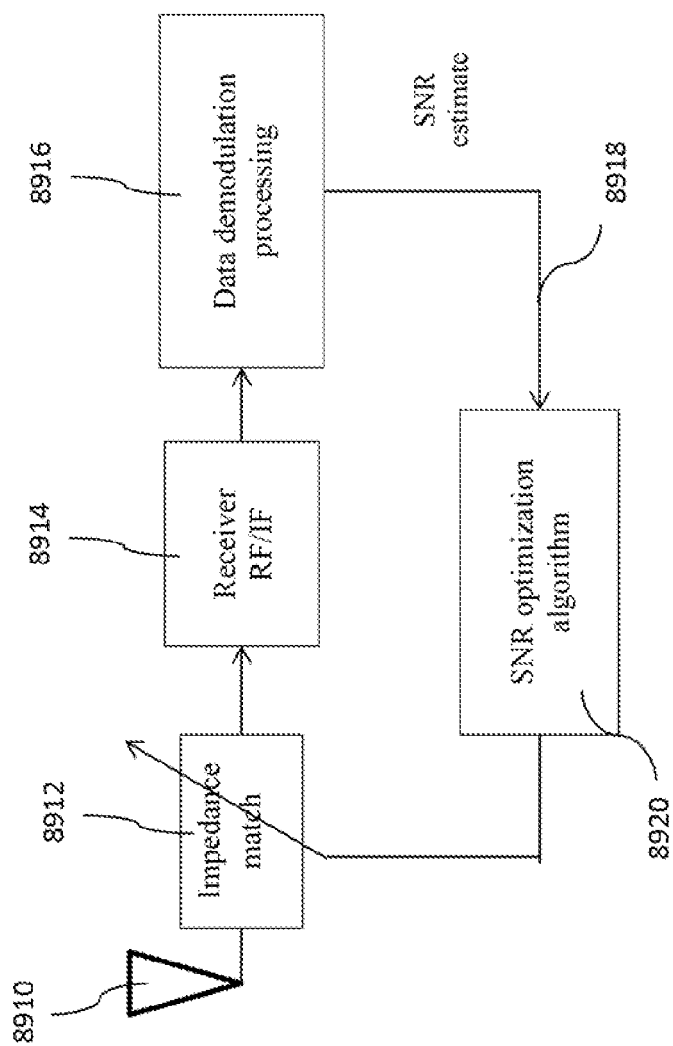
FIG. 89 is a block diagram of objective signal to noise (SNR) optimization.

FIG. 89 is then a block diagram of the processing that we are attempting to do, showing the antenna 8910 picking up the signal and being matched to the receiver, whereupon the signal is demodulated extracting the data symbol values used to optimize the information content contained in both the SNR and ISI metrics. FIG. 89 shows antenna 8910, impedance match 8912, receiver RF/IF 8914, data demodulation processing 8916, SNR estimate 8918, and SNR optimization algorithm 8920. An outcome of this process is also the estimate of the SNR of the samples of the demodulated data symbols. These are used in the SNR optimization that contains an optimization algorithm for setting the parameters for the antenna matching.

Measurement of the ATLF SNR

As described above, the ATLF may be pre-calibrated with a factory measurement and calibration, with values stored in a LUT. However, the real benefit of the ATLF is to adapt to changes in the antenna characteristics. Also, for Q enhancement within the ATL it is necessary to precisely determine and implement the feedback. And ultimately, it is the noise in the demodulated signal that matters, not directly the amplitude or bandwidth of the demodulated signal. The ATLF should respond to features of the filtering that is done in the demodulation process such as from an equalizer used to minimize ISI and in-band interference. It is necessary that the ATLF adapt dynamically to work in concert with these other systems and not compromise their function. Hence attention to overall processing feedback loops is important.

As discussed above, we use the LUT values as an initial setting. We also update the LUT dynamically for such instances as frequency hopping protocols, which are necessary for fast adaptation of the ATLF. Then we rely on current SNR measurements as a guide to further tuning of the ATLF.

Figure 90:
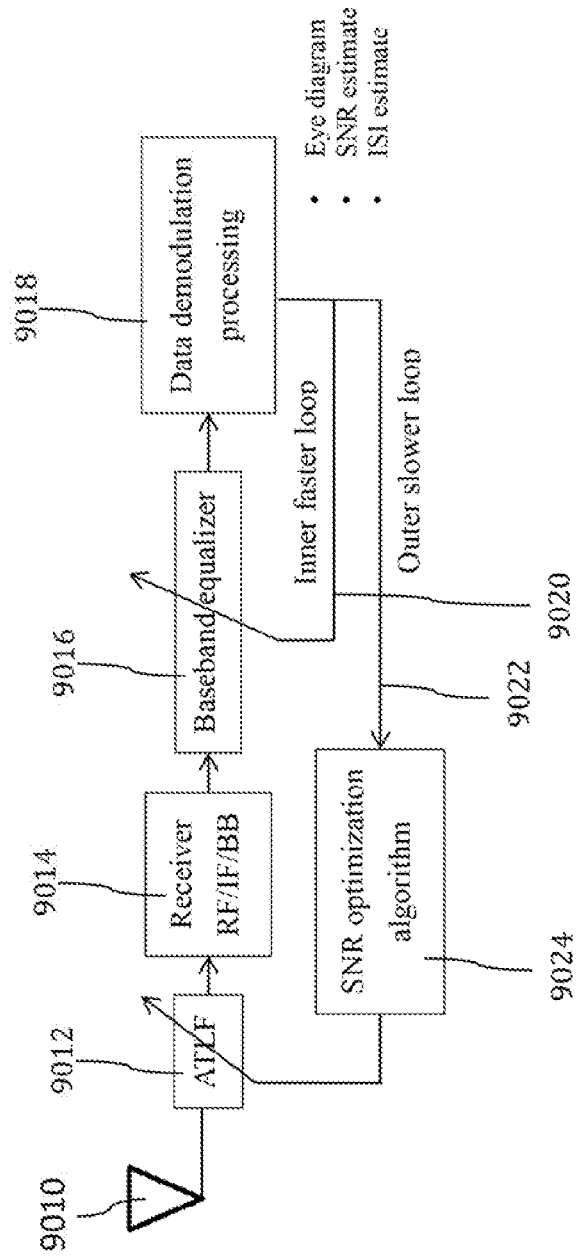
FIG. 90 is a high level block diagram of a wireless data receiver using the ATLF for antenna impedance matching and system interface.

FIG. 90 shows a high-level block diagram of a wireless data receiver that could use an ATLF for antenna matching and interface. FIG. 90 shows antenna 9010, ALTF 9012, receiver RF/IF/BB 9014, baseband equalizer 9016, data demodulation processing 9018, inner faster loop 9020, outer slower loop 9022, and SNR optimization algorithm 9024. It is worthwhile to walk through FIG. 90 to highlight how timing issues drive the architecture:

The antenna output is coupled to the ATLF which matches the antenna to the receiver that has some combination of RF, IF and baseband (BB) down conversion and further filtering;

The BB output (which could also be near IF) is digitized and goes into a baseband equalizer that shapes the baseband filter to minimize ISI (inter-symbol interference) noise as well as in-band noise. The equalizer operates with a relatively fast feedback loop as shown because it has to keep up with channel variations due to multipath effects. A variant of the equalizer is the rake receiver and OFDM receiver as used in spread spectrum receivers, in which the channel state is continuously tracked and estimated. Regardless of the details, the purpose is to mitigate effects of channel frequency selectivity as effected by changing multipath.

The data is extracted from the demodulated baseband signal. Additionally, we get some measures of the SNR from the demodulation process that then drives the ATLF optimization.

The ATLF is not affected by multipath and does not have to accommodate changes to the wireless channel. However, it needs to accommodate changes to the antenna impedance that occur if there are electromagnetic scattering or absorption objects placed in the near field of the antenna that affect its impedance. Changes to the antenna near field are expected to be much slower and less frequent than changes to the multipath communications channel. Consequently, it is desirable to have the ATLF as an outer slower loop.

An example of a case where the antenna impedance changes are of significance would be the smart bandage where the patient may change position effecting the antenna near field and hence its impedance which the ATLF has to accommodate. However, this change occurs slowly and relatively infrequently in comparison to changes in the room multipath channel.

Figure 91:
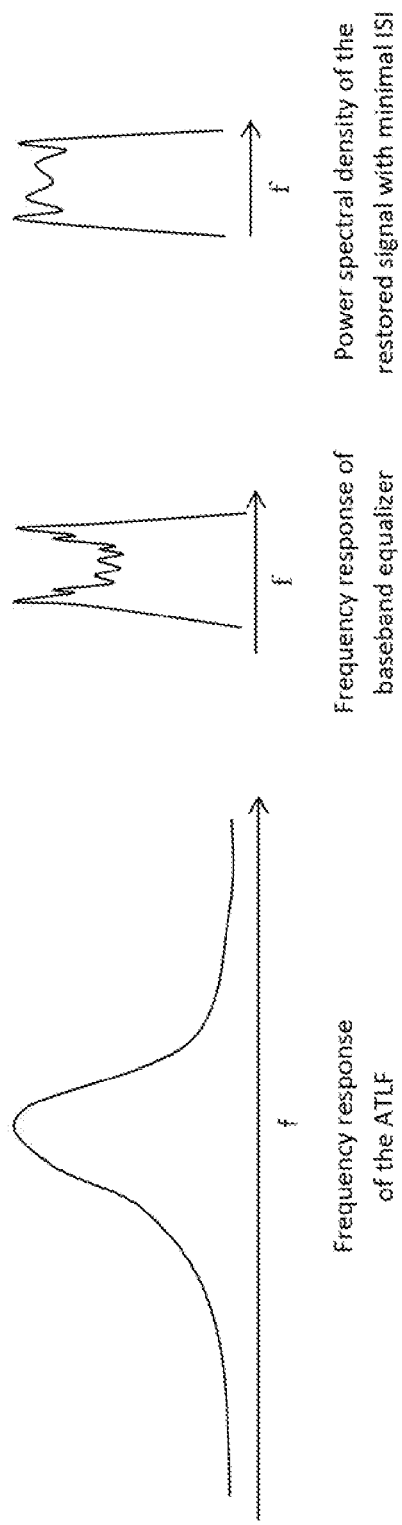
FIG. 91 is a series of plots that notionally illustrate the equalizer mitigating filter shaping distortion.

The equalizer may undo some of the filter shaping distortion imposed by the ATLF. Hence the ATLF focuses on matching and generates some soft-shouldered filter response. This may be restored by the equalizer to some extent as notionally illustrated in FIG. 91. Hence it is not so necessary to have a complex ATLF with multiple poles. However, there will be a modestly enhanced NF as the outer frequency components of the RF signal band will not be matched well.

Implementation of the ATL Filtenna (ATLF)

A complication with this discussion is that there are a variety of antenna circuit models that approximate the impedance behavior of the antenna over a relatively narrow bandwidth as shown above. Hence instead of attempting a unified approach we will step through a series of examples that cover the range of simplistic idealized circuits to more practical embodiments. Other examples may also be possible.

Radiation Resistance Component of Antenna Impedance

Figure 93:
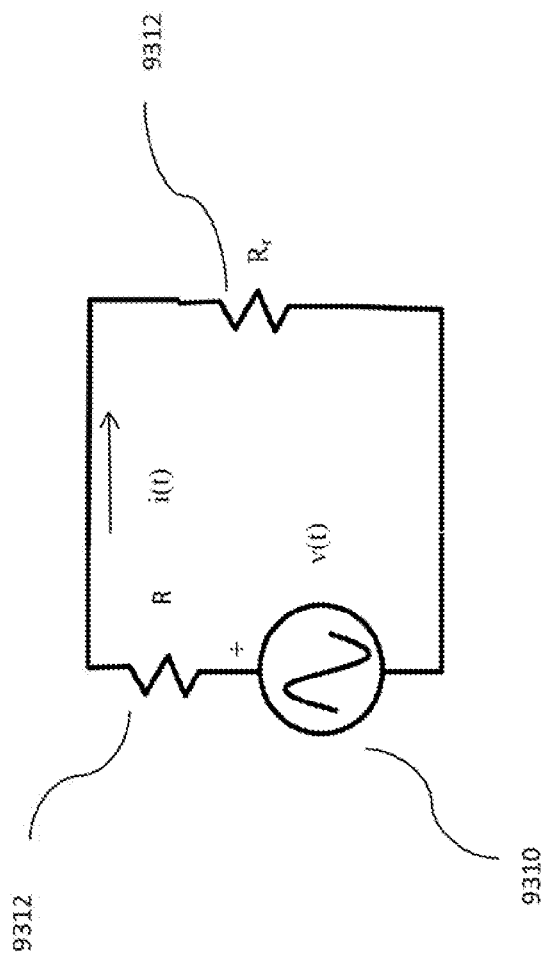
FIG. 93 is a diagram of an ideal antenna with radiation resistance of R connected to receiver with impedance Rr.

Let us start with a fictitious antenna whose impedance consists of just its radiation resistance. A real antenna always has a reactive component that we will add in shortly. FIG. 93 shows the equivalent circuit of this idealized antenna connected to a receiver of resistance $R_r$, AC voltage source 9310 and resistors 9312. Assume that the impressed voltage source from some distant radiation source is sinusoidal with an RMS (root mean square) amplitude of v. The available power from this antenna is therefore $$P_{av} = \frac{1}{2}\frac{v^2}{2R} = \frac{v^2}{4R}$$

The receiver the antenna is connected to a receiver of resistance $R_R$. The power transferred from the antenna to the receiver is $$P_r = \left(\frac{v}{R+R_r}\right)^2 R_r = \frac{v^2}{4R}\frac{4RR_r}{(R+R_r)^2} = P_{av}\frac{4RR_r}{(R+R_r)^2}$$

Define the reflection coefficient of the antenna as $$\Gamma_A = \frac{R-R_r}{R+R_r}$$

where we have arbitrarily taken R as the characteristic antenna impedance. Then $$1-|\Gamma_A|^2 = \frac{(R+R_r)^2 - (R-R_r)^2}{(R+R_r)^2} = \frac{4R_r R}{(R+R_r)^2}$$

and thus $$P_r = P_{av}(1-|\Gamma_A|^2)$$

which is the desired form that shows the loss in power due to the impedance mismatch.

Next suppose that the $R_r$ load represents the receiver impedance, and that the receiver has a noise figure (NF) of $NF_r$. Then the overall noise figure of the antenna and receiver can then be expressed as $$NF = 1 + \frac{NF_r - 1}{1 - |\Gamma_r|^2}$$

which is based on the assumption that the equivalent noise temperature of the antenna is 293° K. This clearly shows the inflation of the antenna-receiver NF due to the mismatch between the antenna and the receiver. The figure of merit (FOM) of the antenna-receiver may be defined to be this NF. This makes sense as the gain of the antenna-receiver is arbitrary and the FOM should only focus on the receiver's ability to utilize the available power sourced by the antenna. Note that if the NF of the receiver is $NF_r=1$ such that it generates no intrinsic noise, then there is no consequence of mismatch. That is, mismatch just reduces the overall signal gain of the receiver but does not contribute to NF. This also makes sense in that the in-band noise and signal from the antenna source are processed exactly the same and therefore mismatching affects both equally. Antenna matching is only necessary as the receiver generates additional noise. Equivalently we can state that if the interference noise of the antenna input is much larger than the intrinsic noise of the receiver then there is little consequence to mismatching the antenna.

Some observations are appropriate at this point.

If the antenna does not have a substantial reactive component relative to the radiation resistance, such as the simple resistive model considered presently, then the losses due to mismatching and inflation of the NF are typically modest. Consider the example of R=20 and $R_r$=50. Then $$|\Gamma_r| = \left|\frac{R_r - R_r}{R_r + R}\right| = 0.4$$

$$10\log\left(\frac{1}{1 - |\Gamma_r|^2}\right) = 0.76 \text{ dB}$$

The losses due to antenna mismatch become more critical when the reactance of the antenna is considered. For this situation, we have to adjust the tuning parameters of the matching circuit or else the NF inflation will become very high. Antennas with dimensions that are small relative to wavelength typically have a high reactive component.

If the SNR of the received signal at the output of the antenna is very high then we are less concerned about antenna mismatch. However, if the same antenna is used for transmit then the mismatch is reciprocal, under the assumption that the carrier frequencies are close, such that the mismatch is the same for the transmit and receive channels. A mismatch loss in the transmit mode implies that the transmitter operation is inefficient, which may have a major impact on battery usage and/or range.

In the receiver mode, the desired signal output of the antenna is generally buried in thermal background noise and interference. Additionally, due to multipath, the exact received signal strength is high variable. Therefore, it is not practical to estimate the condition of the antenna matching from observations of the RF signal. The desired signal has to be down converted, filtered and processed before structural features of the signal may be reliably measured from which we may assess the state of the antenna matching.

In the transmit mode, the reflection coefficient of the antenna may be measured directly based on the VSWR (voltage standing wave ratio) measurement which is typically straightforward to implement. Suppose we have an antenna that is used for both transmit and receive at approximately the same carrier frequency. Then in principle we can match the antenna based on VSWR or some other measure in the transmit mode, and then assume the same matching applies for the receive mode by reciprocity. If the antenna is sufficiently broadband and the frequency separation between the transmit and receive channels is small compared to the antenna bandwidth, then this method is adequate. This is not, however, an assumption that we are making here, our objective is to tune the matching of the antenna based only on the generally weak received signal in order to transfer the optimal energy transfer from the antenna to the receiver.

Coupling the Reactive Antenna Impedance Component to the Resonant ATL Using a Reversed Directional Coupler To recap, the ATLF consists of an antenna resonator coupled to a resonant ATL self-configured as a negative resistance, shown at the top of FIG. 94. The antenna resonator is represented by the series LRC model, where R represents the radiation resistance. The negative resistance ATL is represented by a reflection coefficient given as $\Gamma_G=G(g)$ denoting the direct dependence on G as set by the control g. We show a series RLC representing the antenna, and the varactor diode with capacitance $C_V$. This has an equivalent reflection coefficient denoted as $\Gamma_A$. FIG. 94 shows antenna (series LRC) 9410, negative resistance 9412, resistor 9414, inductor 9416, and capacitor 9418.

Figure 95:
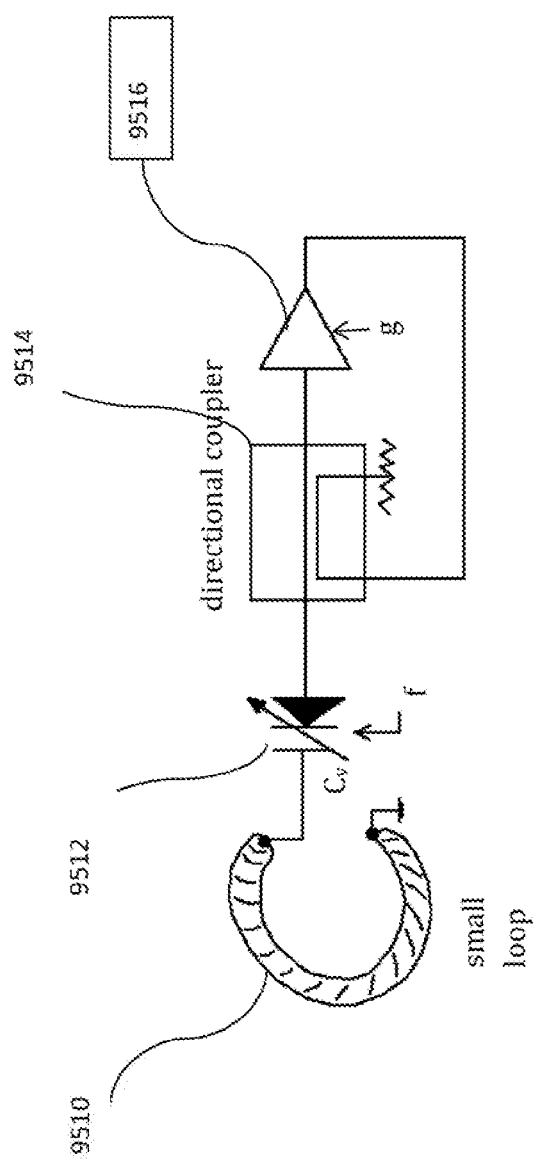
FIG. 95 is a diagram showing a loop antenna with a reversed gain stage.

Unlike other implementations of the ATLn that involve a directional coupler, a key for the ATLF is that the directional coupler is reversed as shown in the small loop antenna example of FIG. 95. FIG. 95 shows small loop antenna 9510, capacitor 9512, directional coupler 9514, and gain block 9516. This enables the coupling of the antenna resonator to the ATLn resonator that is central to proper performance of the ATLF. Were not the coupler reversed, the negative resistance reflection from the ATL would feed back into the ATL itself, and not toward the antenna.

We start with the small loop antenna as an initial configuration as shown in FIG. 95. Here we have a series varactor diode that sets the capacitance to cancel the inductive reactance of the loop antenna. The gain is arranged as a scaling block and a reversed directional coupler. The operation is that the signal enters as a voltage source in the loop antenna. This is amplified by the gain section which behaves as a one port reflection that is reflected back by the mismatched antenna. The reversed directional coupler serves to block any reflection from the gain stage controlled by g.

Coupling this to the idealized loop we have the overall transfer function given as $$H = \frac{G}{1 - G\Gamma_A}$$

Consider the series LRC model for the antenna where the antenna port impedance is denoted as $z_A$ and given as $$z_A = Ls + \frac{1}{sC} + R$$

The reflection coefficient (looking into the antenna port) is then given as $$\Gamma_A = \frac{z_A - 1}{z_A + 1}$$

Here we are using impedance normalization such that the characteristic impedance is 1. This reflection coefficient $\Gamma_A$ can be expressed as $$\Gamma_A = \frac{Ls + \frac{1}{sC} + R - 1}{Ls + \frac{1}{sC} + R + 1}$$

$$= \frac{s^2 + \frac{R-1}{L}s + \frac{1}{LC}}{s^2 + \frac{R+1}{L}s + \frac{1}{LC}}$$

Figure 96:
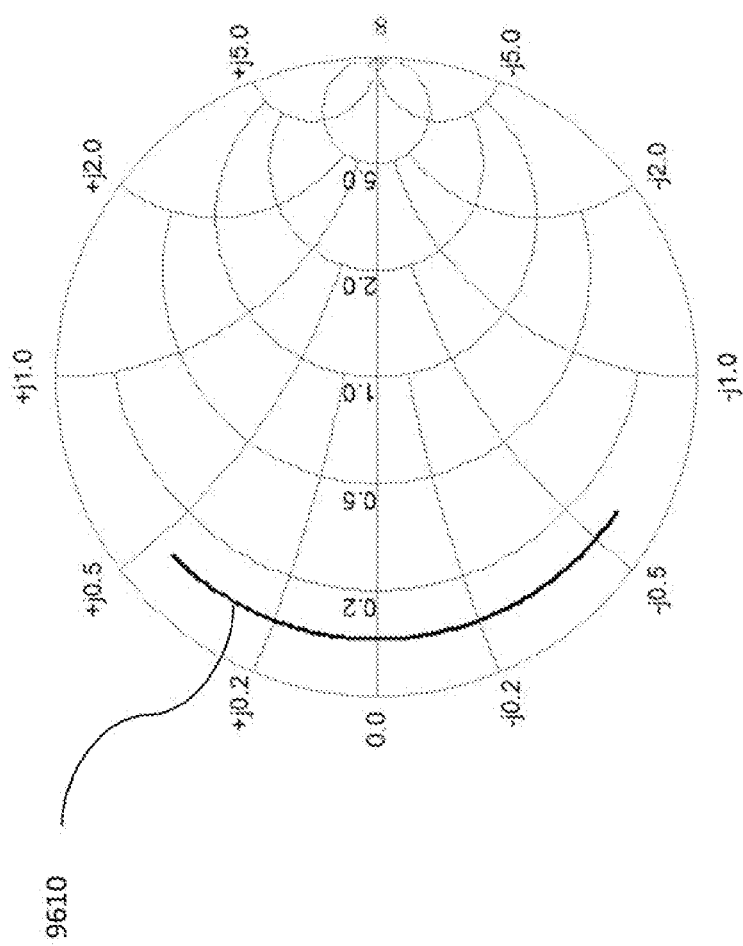
FIG. 96 is a plot showing the antenna reflection coefficient for the frequency range 0.75<w<1.25.

This reflection coefficient is plotted in FIG. 96 as line 9610 for the normalized frequency range 0.75<w<1.25. As expected, the $C_V$ capacitance cancels the antenna reactance and the reflection coefficient at resonance is a negative real value.

Figure 97:
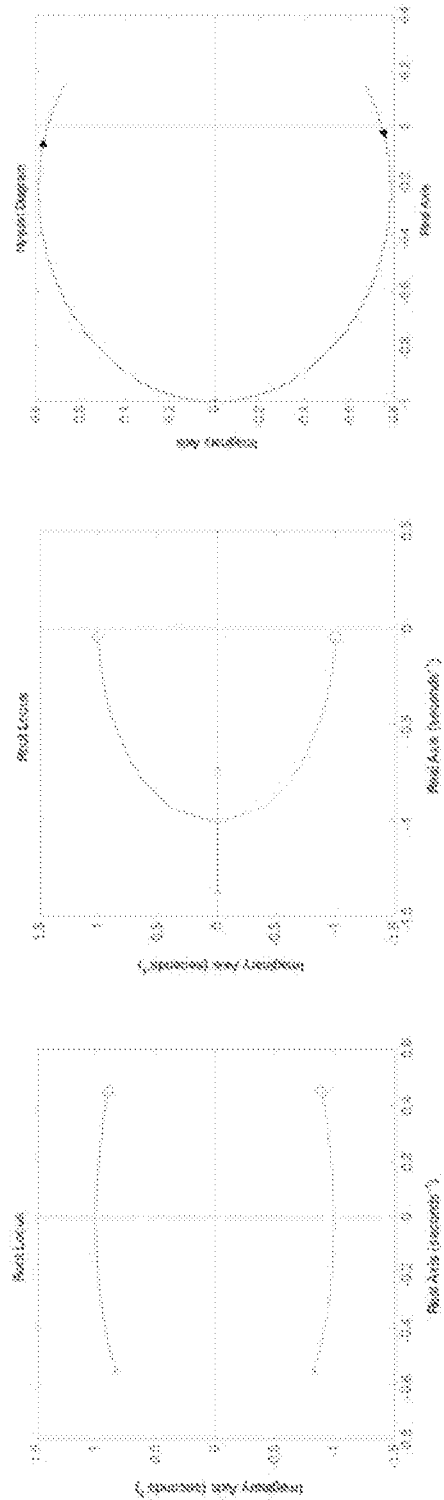
FIG. 97 is graphs showing the root locus of an ideal ATLF.

It is interesting to consider that any antenna in which the radiation resistance or conductor losses are not a function of frequency, that $\Gamma_A$ is a constant amplitude function with a similar pole zero pattern as the all pass filter. The root locus for this case as shown in FIG. 97.

The root locus shows the typical Q enhancement for R=0.1. For R>1 it is necessary to use a negative G. Note that:

Negative G and |G|>1 occurs for negative resistances in the range of −1<$R_g$<0

Positive G and |G|>1 occurs for negative resistances in the range of −∞<$R_g$<−1

Note that all impedances are normalized to the characteristic impedance.

Here we are assuming that the output is taken from the scaling block output. Also, the input interaction with the antenna may be represented by a series voltage source. Plugging in some normalized values of C=1, L=1 and R=0.1, we get the root locus shown on the left side of FIG. 97 for G<0. That G has to be negative is clear from $\Gamma_A$<0 at the resonance condition.

This root locus shows that the typical ATLn behavior of pole movement exists and may be controlled with closed loop poles crossing the jw axis provided that R<1. That is, the radiation impedance is less than the characteristic impedance. If R>1, then there is a limit to the possible Q enhancement of this circuit as shown in the right side root locus plot of FIG. 97. Note that when R>1, the open loop poles are actually on the negative real axis and there is no resonance. Providing feedback, however, does generate Q enhancement from zero to some finite value that is limited by R.

Next consider the transfer function for a value of G such that $Ga = 1/\min(\text{real}(T)) + 0.01$ which gives a closed loop Q of about 100. The frequency response is plotted at the top of FIG. 98 at line 9810.

Figure 98:
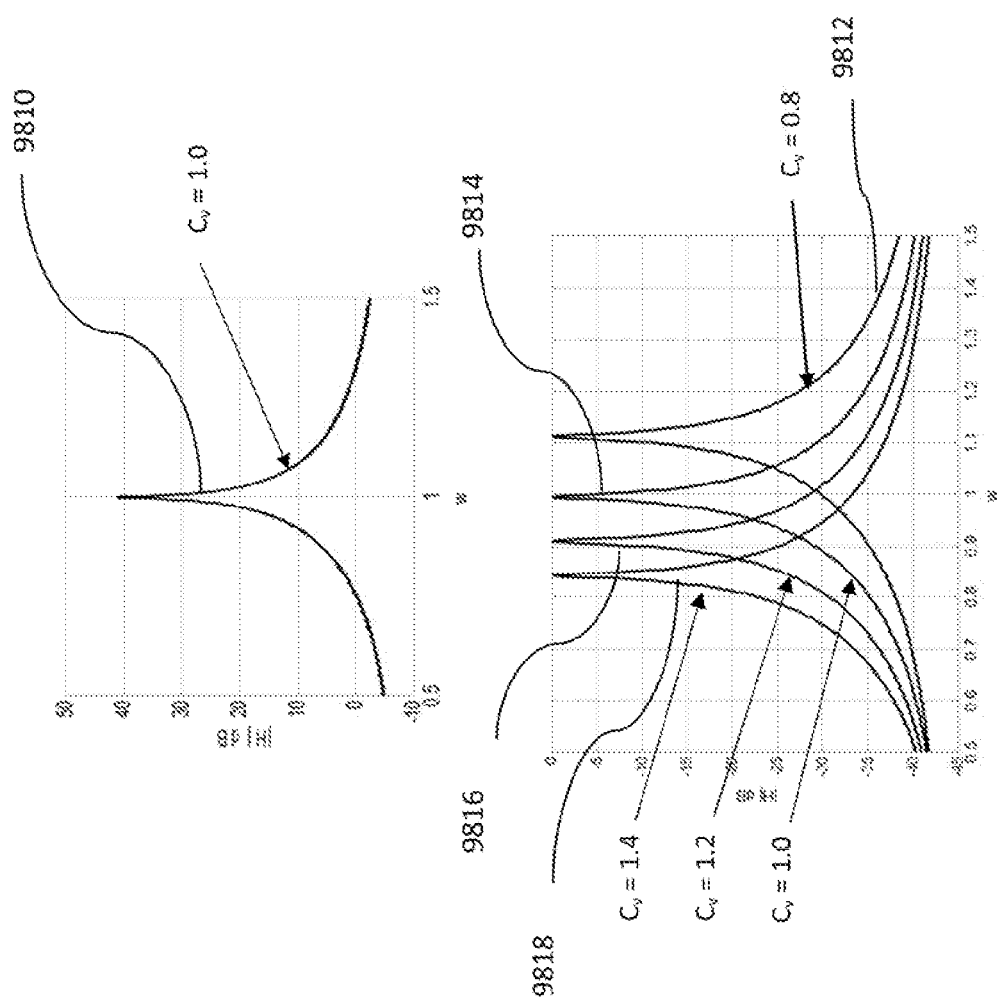
FIG. 98 is graphs showing the magnitude of the transfer function of the ATLF for various values of the normalized varactor diode capacitance for Cv=1.

By changing the varactor capacitance $C_V$ we can tune over a broad frequency range as with the ATL1. Normalized curves are shown at the bottom of FIG. 98, where line 9812 shows $C_V$=0.8, line 9814 shows $C_v$=1.0, line 9816 shows $C_v$=1.2, and line 9818 shows $C_v$=1.4.

Figure 99:
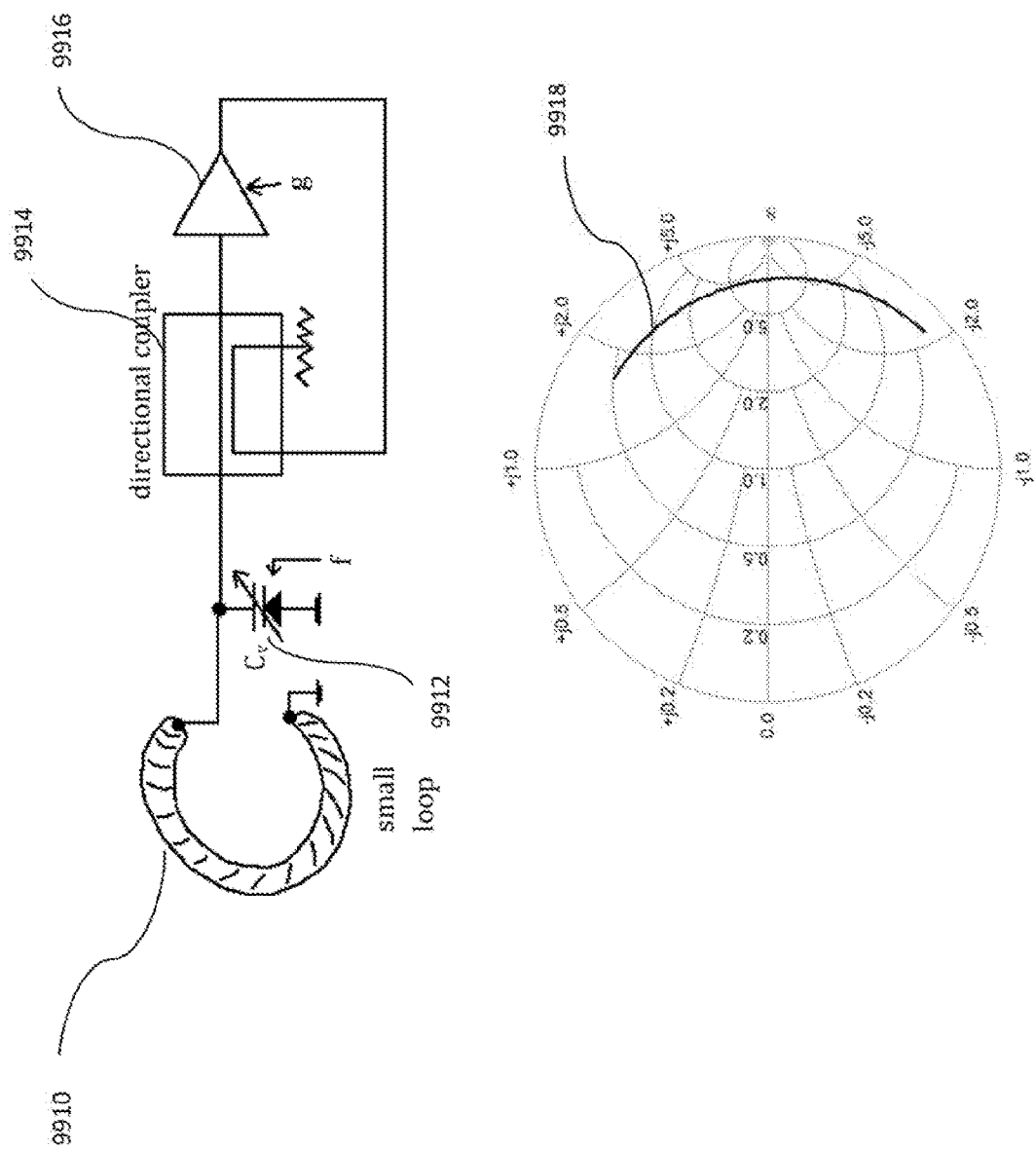
FIG. 99 is a diagram of a loop antenna with parallel varactor capacitor instead of series (top) and a plot of the deflection coefficient of the antenna for the frequency range 0.75<w<1.25.

Suppose we place the varactor diode in parallel with the loop antenna instead of series as in the circuit at the top of FIG. 99, which has small loop antenna 9910, capacitor 9912, directional coupler 9914, and gain block 9916. The only change is that now $\Gamma_A$ is the negative of the previous case which results in the Smith chart plot on bottom of FIG. 99 with line 9918.

Figure 100:
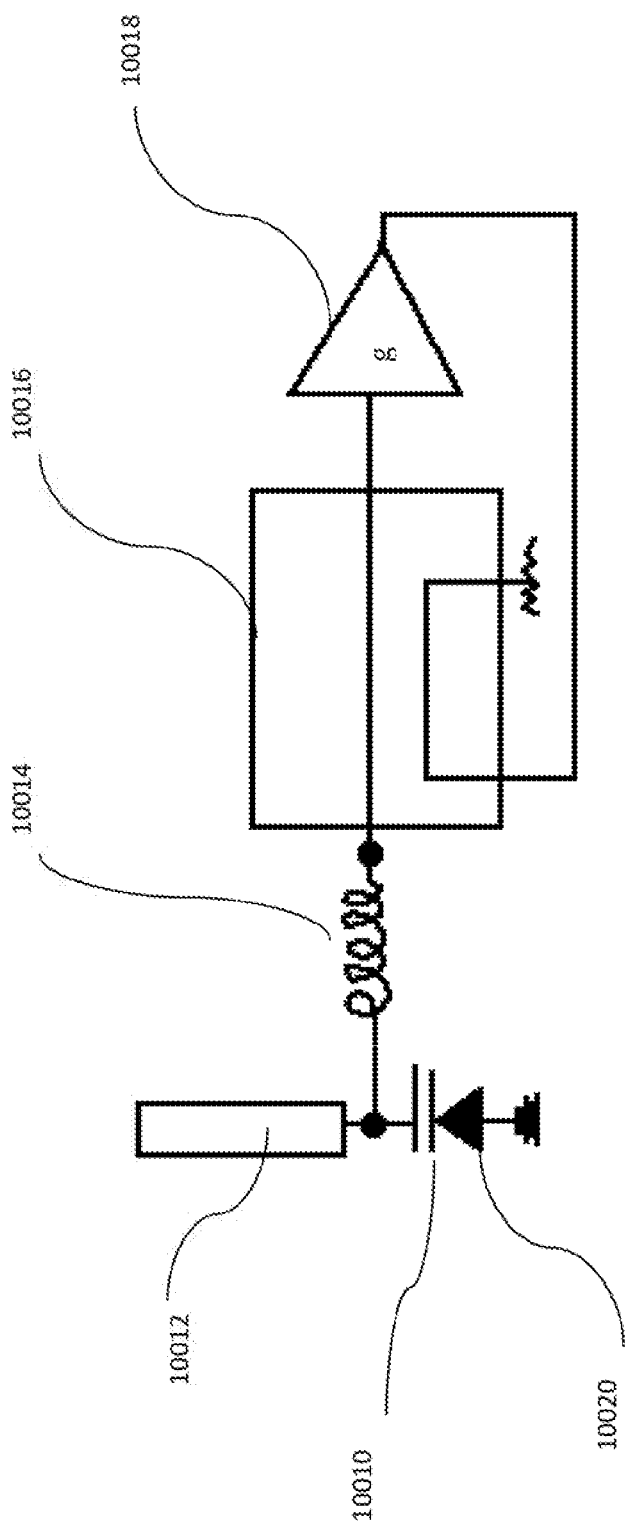
FIG. 100 is a diagram of varactor based tuning of a short dipole antenna.

Clearly all of the considerations of the bandpass response and Q enhancement remain the same as before. The only change is that G is positive instead of negative. We can also consider short dipole antennas that are tuned as in FIG. 100. Here the dipole is best modeled as a series capacitor and a shunt conductance, accounting for the conductive loses as well as the radiation resistance. We place a varactor 10020 in parallel with this to provide some tuning range for the inductor. FIG. 100 shows capacitor 10010, antenna 10012, inductor 10014, directional coupler 10016, and gain block 10018.

In this configuration the input impedance into the antenna as seen from the reversed directional coupler is $$Z = sL + \frac{1}{G + s(C_v + C)}$$

The bottom of FIG. 98 shows the transfer functions of the ATLF for various values of the normalized varactor diode capacitance. This is calculated by first determining the reflection coefficient of the antenna with matching L and $C_V$. Then the ideal ATL1 is assigned a reflection coefficient of the smallest real part of the antenna reflection over the frequency range of interest and adding 0.01. This gives a Q in the range of about 100.

Figure 101:
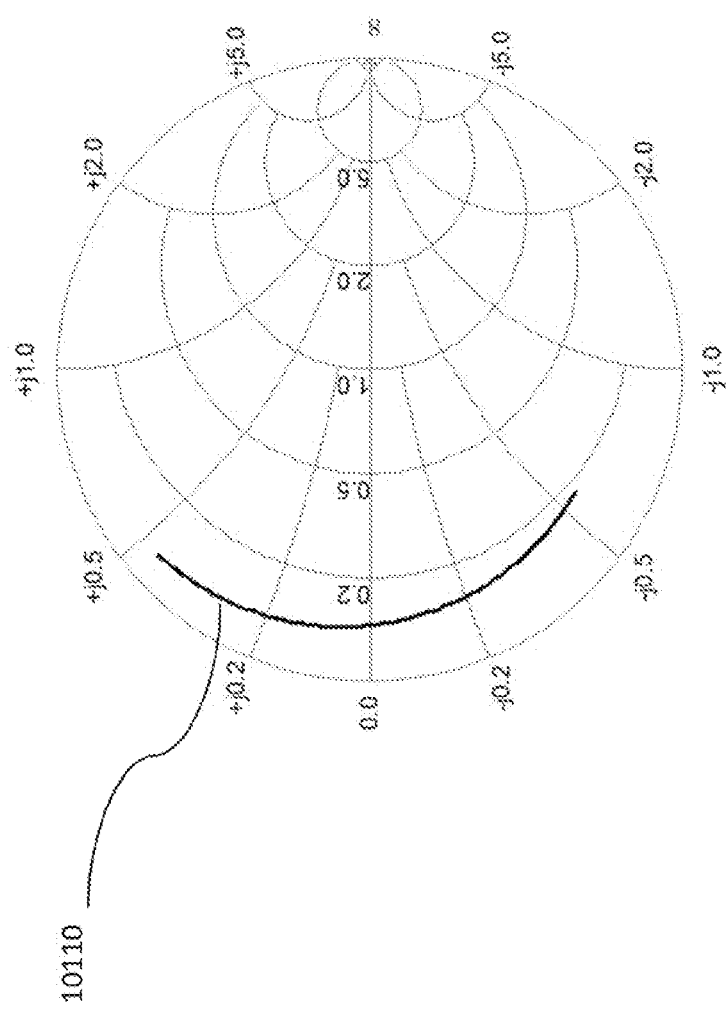
FIG. 101 is a plot of the reflection coefficient of a short dipole antenna.

The reflection coefficient is plotted as shown in FIG. 101 at 10110 showing similar behavior as before but the magnitude of $\Gamma_A$ is slightly larger and not as symmetric about the real axis.

Figure 102:
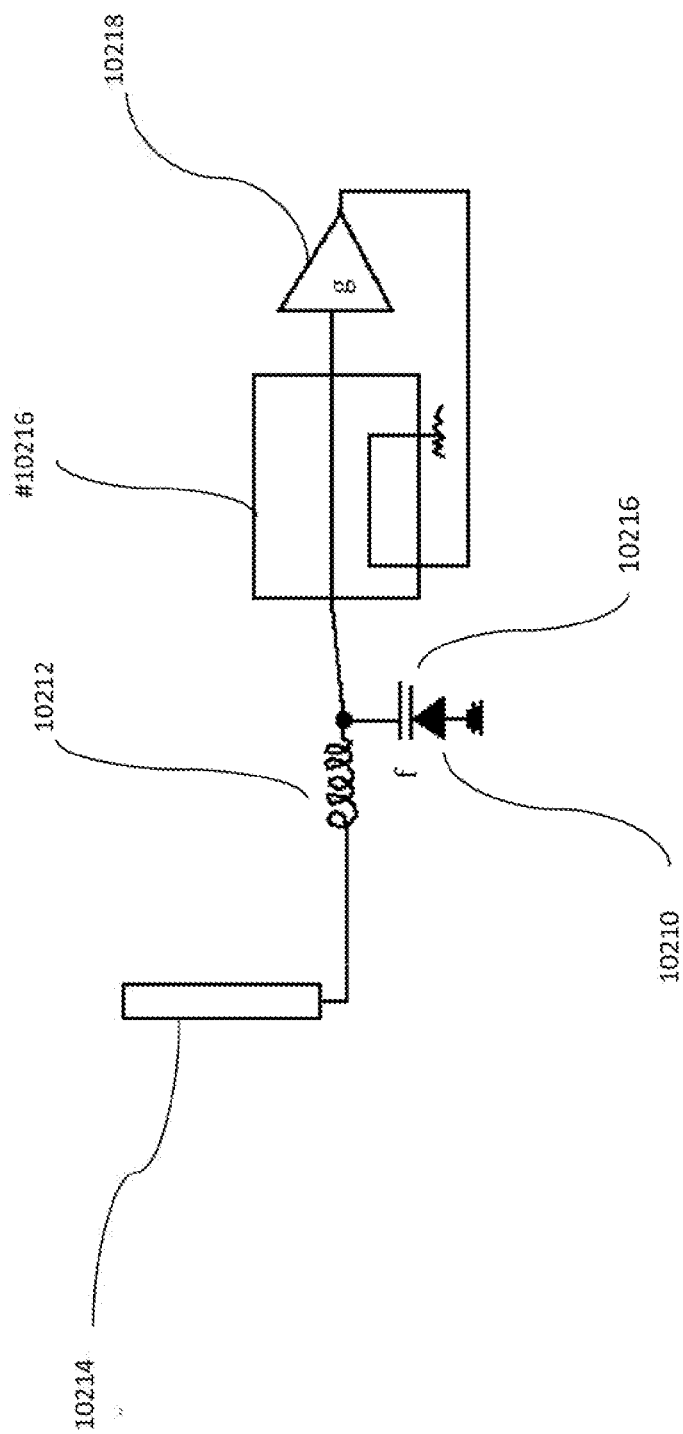
FIG. 102 is a block diagram of a circuit implementation with inductor tuning of dipole antenna and varactor diode to provide tuning range.

Of interest is that the circuit shown in FIG. 102, where the varactor diode 10210 is placed more logically after the inductor 10212, unfortunately only has a very small tuning range. If the varactor is in series with the inductor then the tuning range is restored. FIG. 102 shows antenna 10214, capacitor 10216, directional coupler 10216, and gain block 10218.

Figure 103:
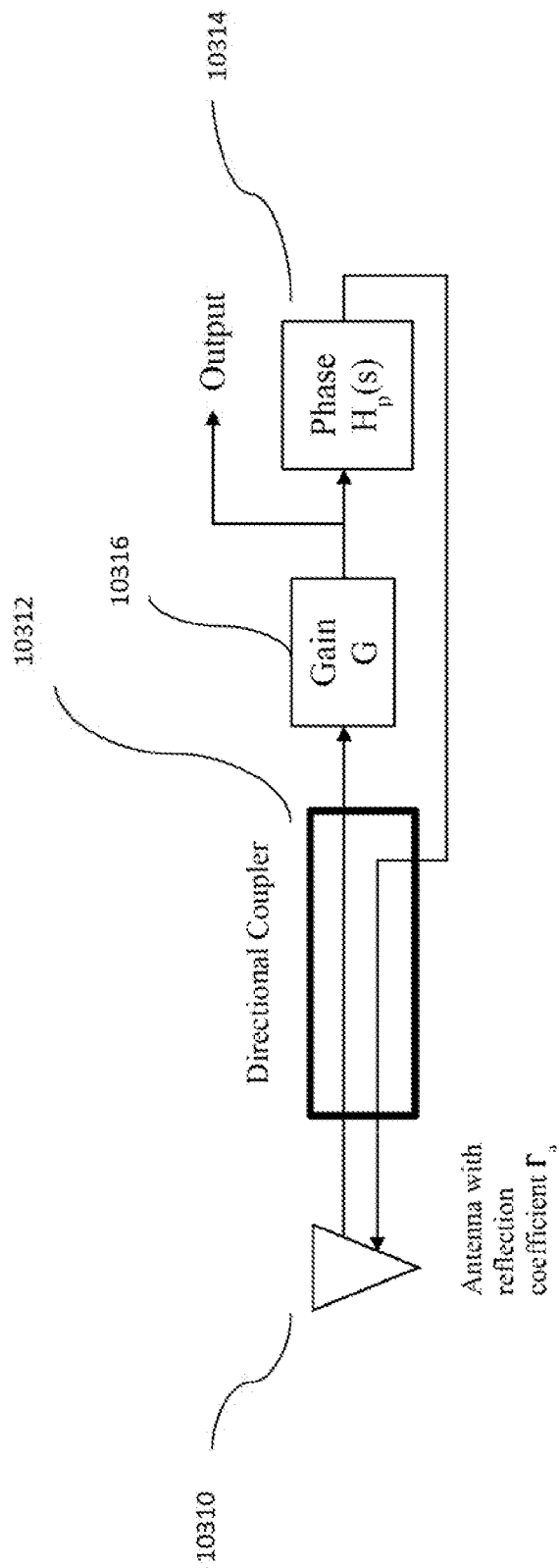
FIG. 103 is a block diagram of a feedback loop with a direction coupler, gain stage, phase shifter and antenna reflection.

Now consider the combining of the phase shifter in the feedback loop, as shown in FIG. 103. FIG. 103 shows antenna reflection 10310, directional coupler 10312, phase shifter 10314, and gain stage 10316. The overall transfer function can be expressed as $$H_F(s) = \frac{1}{1 - G\Gamma_a(s)H_p(s)}$$

Figure 104:
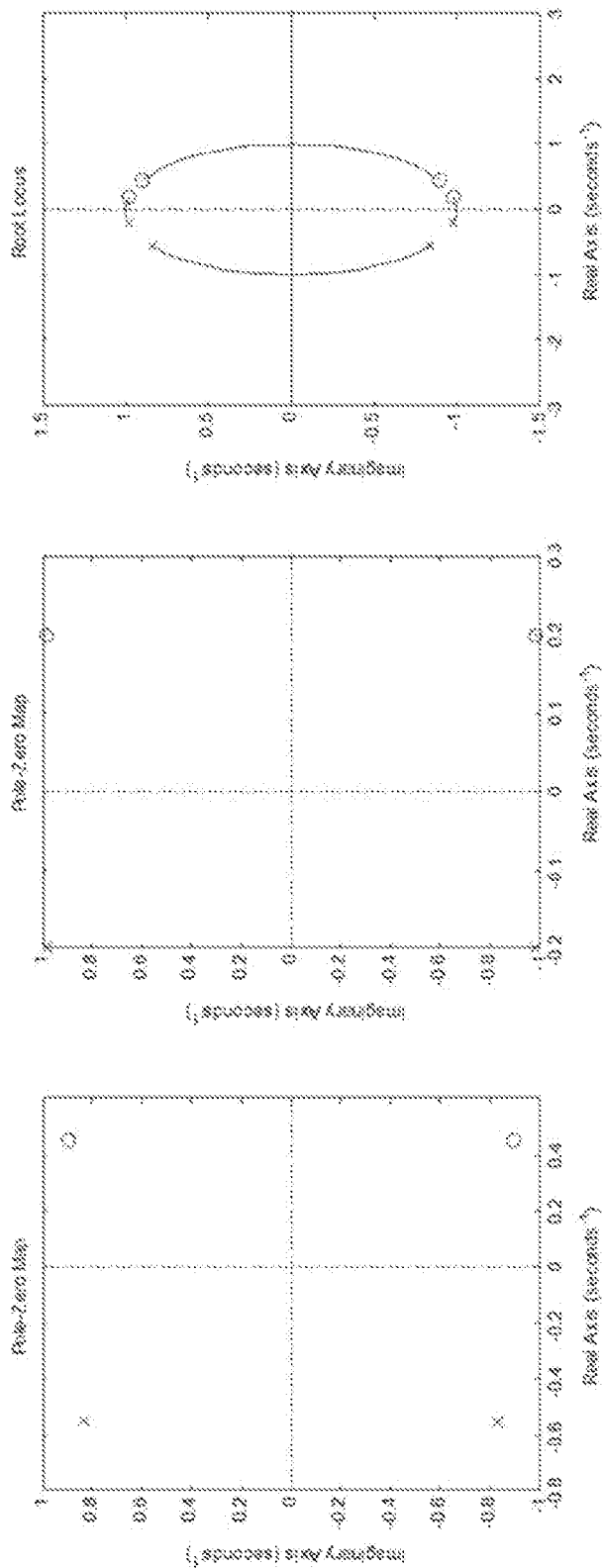
FIG. 104 is a series of plots showing poles and roots of the antenna reflection and phase shifter plotted on left and center, with the full root locus plotted on the right

The numerator of this transfer function can vary depending on where the output and input are placed. For now we assume the input is current impressed into the antenna and the output is taken from the output of the gain block. Now we can consider the combined poles and zeros and plot out the closed loop poles as a function of G as shown in FIG. 104.

Figure 105:
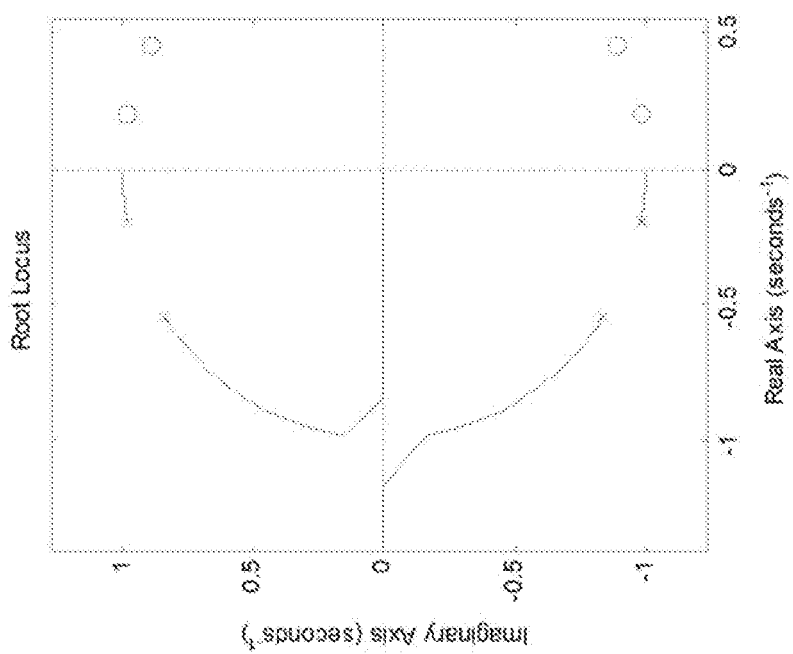
FIG. 105 is a plot showing that an unstable closed loop pole on real axis limits the Q enhancement that is achievable (plot generated for 0<G<1).

This reveals some of the complexity we now have in terms of the coupled resonances of the antenna reflection and the phase shifter. Note the key result that the dominant closed loop poles are determined by the phase shifter and not the antenna reflection. The poles of $\Gamma_a(s)$ unfortunately go to the real axis, and then one of the poles proceeds into the right hand plane along the real axis eventually making the process unstable. For this example, the unstable real axis pole emerges before Q enhancement is complete as shown in FIG. 105.

Figure 106:
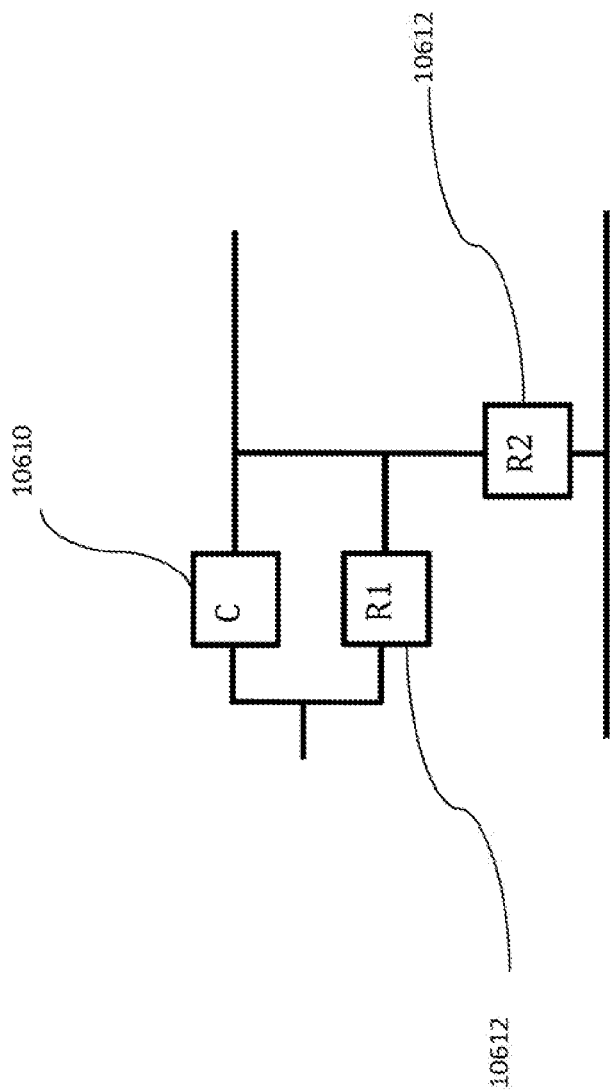
FIG. 106 is a block diagram showing a lead circuit for adding stability to a loop.
Figure 107:
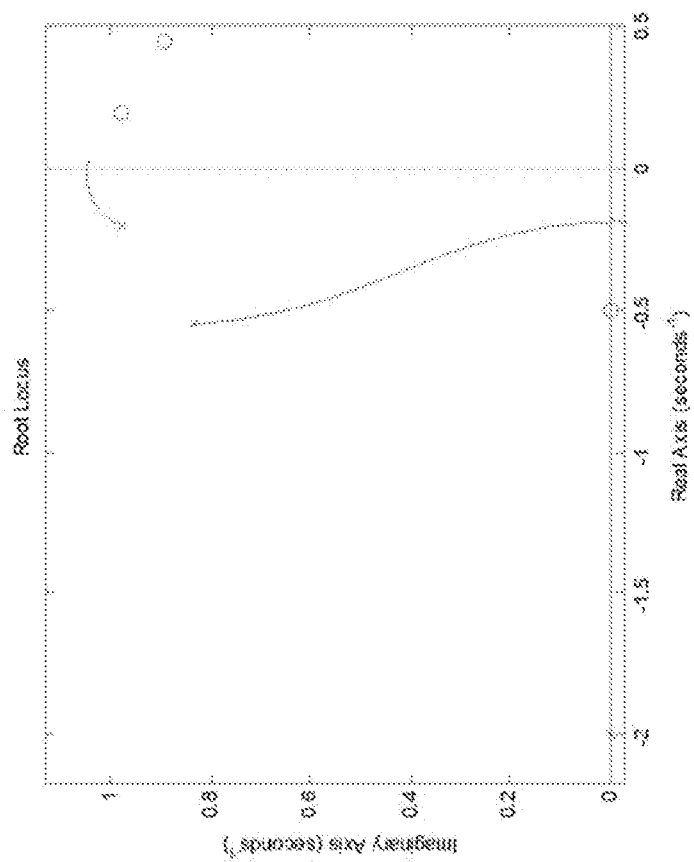
FIG. 107 is a plot of a root locus showing stable enhancement of the dominant pole.

Fortunately, this circuit may be stabilized with a simple lead circuit that slows down the pole movement: all we have to do is to add an RC lead circuit as shown in FIG. 106. FIG. 106 shows capacitor 10610 and resistors 10612. This restoring circuit may be placed anywhere in the loop of FIG. 103 and provides stable enhancement. With this circuit added, the root locus changes to that of FIG. 107 showing stable enhancement of the dominant pole.

Figure 108:
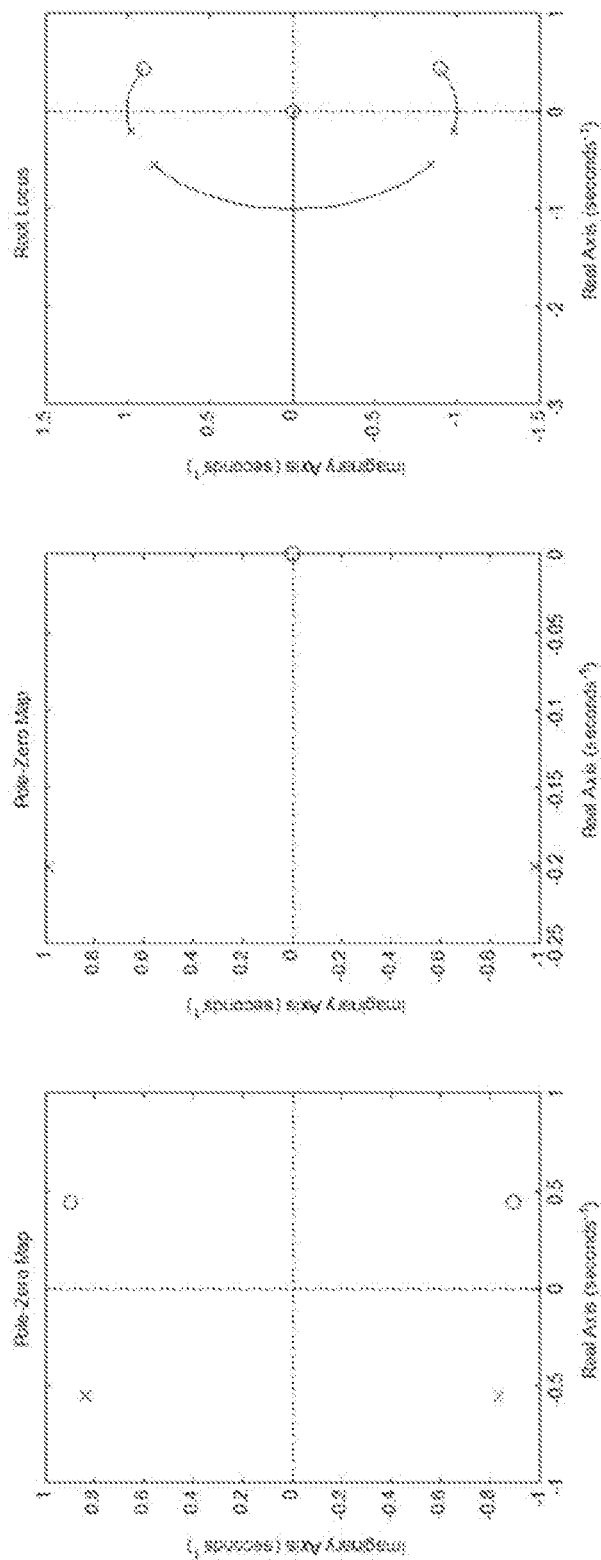
FIG. 108 is a series of plots of poles and roots of the antenna reflection and ATL1 resonator plotted in left and center plots and the full root locus plotted on the right.
Figure 109:
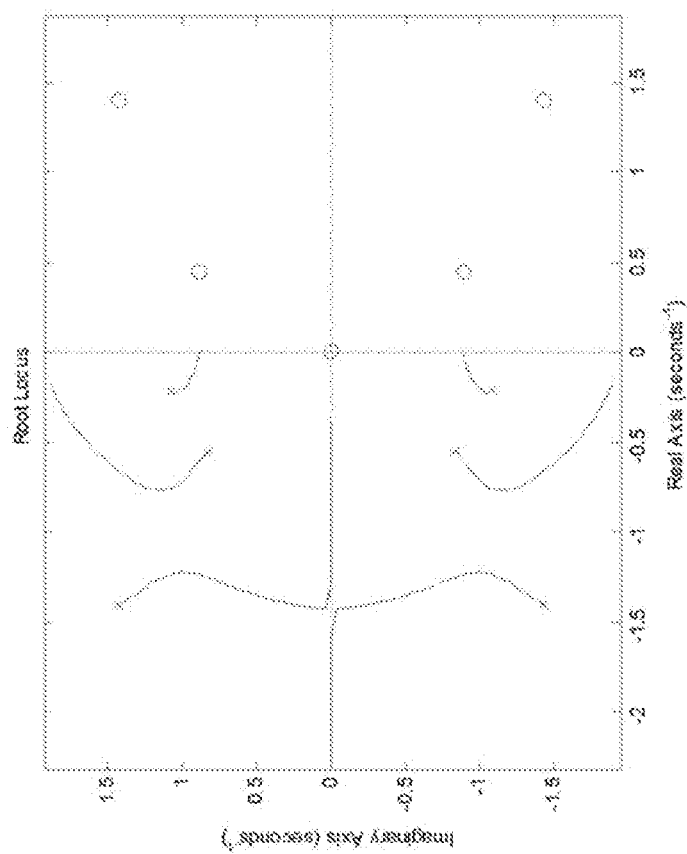
FIG. 109 is a plot of the root locus of ATL filtenna with delay, resonator to act as phase compensator and the antenna reflection as before.

Now replace the phase shifter with the resonator and we get the root locus plots shown in FIG. 108 and FIG. 109. Note that with the resonator, we have a simpler response in that only the dominant poles ever cross the jω axis. The secondary antenna poles result in left going root trajectories. A major advantage of this replacement is that the loop is stable without requiring additional compensation.

Note that we now have what is essentially the ATL1 with some undesired loop delay that may be compensated by detuning the resonator as indicated above. This circuit is shown at the top of FIG. 110. The only deviation in the ATL1 is that the directional coupler is configured differently and reversed in order to send the feedback signal to be reflected off the antenna, instead of back into the ATL1 loop. FIG. 110 shows antenna refection 11010, reversed directional coupler 11012, gain stage 11014, and resonator 11016.

Figure 111:
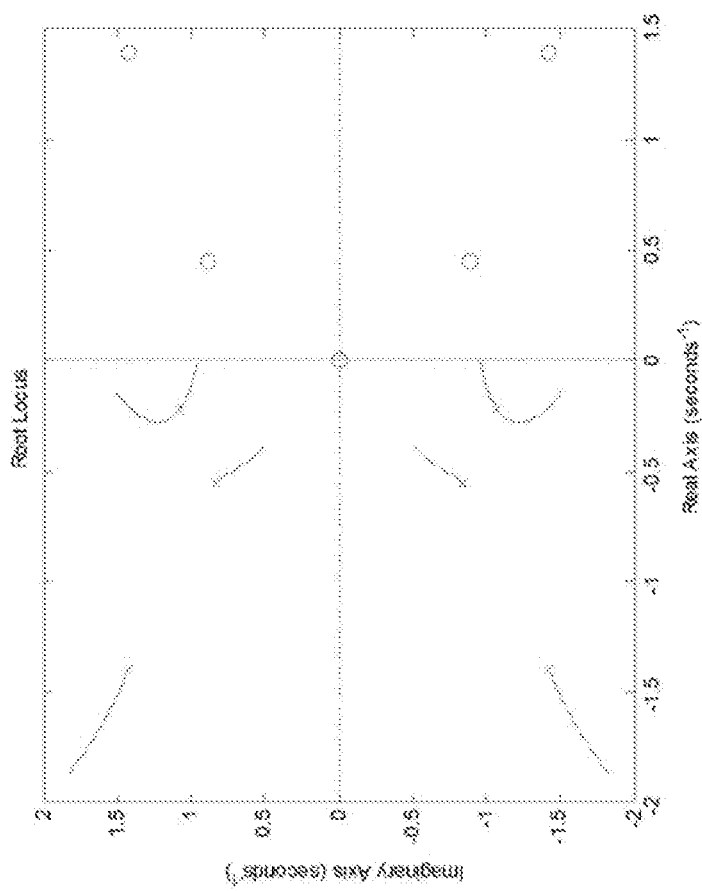
FIG. 111 is a plot showing the root locus of the ATLF using the ATL2.

We can extend this to the ATL2 circuit as also shown at the bottom of FIG. 110. The root locus for the ATLF based on the ATL2 is shown in FIG. 111. Note the two resonator poles lead to a well-behaved dominant pole that moves toward the jw axis, but also a spurious pole at higher frequency. However, for high Q enhancement this is of little consequence. The poles left of the resonator are the antenna poles and finally to the far left are the poles of the all pass circuit simulating the loop delay.

Finally, for completeness the root locus of the ATLF based on the ATL3 is given in FIG. 212. Again, there is no issue, with the dominant pole moving in a well-behaved fashion toward the jw axis. However, there is the potential for the annoying spurious passband mode again at the higher frequency. Again, if the Q enhancement is high then this should not create a problem.

For calibration purposes, given a desired frequency, we can vary the capacitance of the varactors of the antenna and the individual resonators of the ATL3. When properly tuned, the root locus appears as shown in FIG. 213. It is important to note the rather surprising and non-obvious result is that when everything is set right, then the dominant pole for the ATL3 Filtenna moves directly toward the jw axis with no spurious passbands. This is the minimum G solution that may be used for calibration as indicated above. Hence the earlier calibration rule remains intact such that the four varactors are set $\{f1, f2, f3, f_{ant}\}$ such that G is minimized for a constrained Q enhancement or bandwidth.

ATLn as a Negative Resistance Element

As indicated above, a key element of the ALTF is that the directional coupler is reversed from the normal ATLn configuration so that the antenna is coupled into the resonant structure of the ATLn with a controllable bandwidth. When the normal directional coupler is reversed, this makes the ATLn behave as a negative resistance, providing return gain at the input power. When the ATLF is implemented in this way, then the requirement for a directional coupler goes away. This may be highly desirable as it is difficult to realize a suitable directional coupler on a chip with L's and C's that are physically small. Hence in this section we will take a different approach to the ATLF, dispensing with the directional coupler and then implementing a reflective phase shifter with gain over a limited bandwidth. This may be construed as a coupling of resonators, the antenna and the phase shifter. The objective here is not a detailed design but rather a discussion of circuit topology such that it may be related back to the ATLF with the ATL1.

Consider the feedback gain circuit on the right side of the ATLF circuit in FIG. 95. The reflection coefficient looking into the directional coupler is G. The equivalent impedance is therefore given by $$G = \frac{z_g - z_o}{z_g + z_o}$$

where $z_0$ is the reference or characteristic impedance and $z_g$ is the equivalent input impedance. This gives $$z_g = z_o \frac{1+G}{1-G}$$

Figure 116:
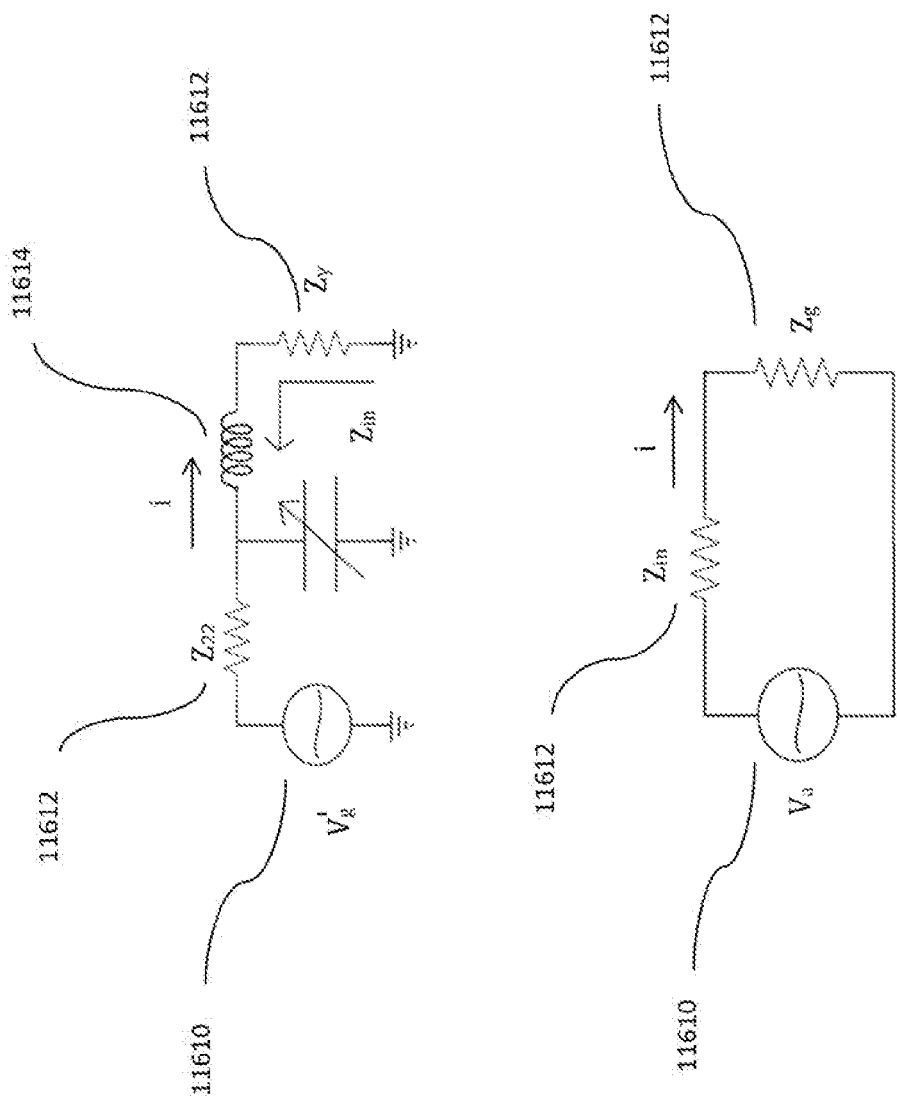
FIG. 116 is diagrams of equivalent ATLF as a negative resistance circuit (top) and its Thevenin equivalent circuit (bottom).

In this idealized example G is real and positive. Hence when G>1 we see that $z_g$<0, which is the negative resistance. Now consider the equivalent antenna circuit shown in FIG. 116 with AC voltage source 11610, resistor 11612, and inductor 11614, which is augmented in FIG. 116 with the varactor, inductor and the negative resistance $z_g$. The diagram at the bottom of FIG. 116 is a Thevenin equivalent circuit of the top diagram where $v_a$ is a voltage source that is derivable from the input EM signal based on the reaction integral. In terms of generating the bandpass response of the ATLF what is important is only the interaction of $z_{in}$ with $z_g$ as a function of frequency. A constraint of the current i is given as $$z_{in}(\omega)i + z_g i = v_a$$

Figure 117:
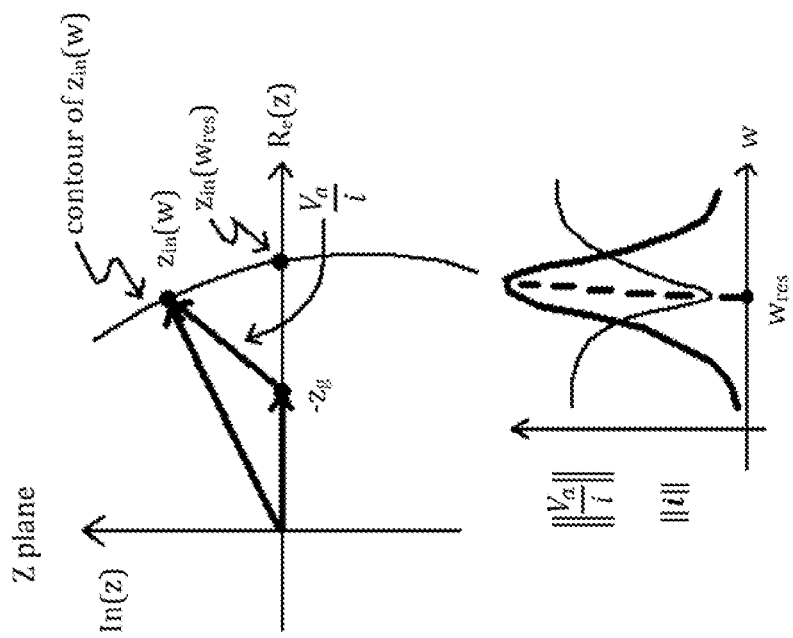
FIG. 117 is plots showing operation of the ATLF in the Z plane (top) impedance phasor diagram (bottom) resonance of ATLF current.

Now consider the phasor diagram of $z_{in}(\omega)+z_g=v_a/i$ drawn in the Z-plane as shown in FIG. 117. The objective is to determine the ATLF response as a function of ω. Now $v_a$, the equivalent voltage of the antenna, is considered to be constant as a function of frequency. Taking $v_a$=const, then it follows from the phasor diagram of FIG. 117 that as ω changes through the resonance point, $v_a/i$ must go through a corresponding minimum, and hence the current i must go through a maximum magnitude. We can also see that the phase of i must go through a large change as the frequency goes through the resonance point. The smaller the distance of $|z_{in}(\omega_{res})+z_g|$, the sharper the resonance and the larger $|i(\omega_{res})|$ is for a given $v_a$. As the output of the ATLF is proportional to i(ω), it follows that the ATLF response will have a sharply enhanced resonance as illustrated at the bottom of FIG. 117.

Run-Time Tuning of the ATLF

As with the ATLn, we can set the {g,p,f} controls for the ATLF based on look-up table (LUT) entries for a given input of {desired Q, desired center passband frequency}. The LUT may be populated based on a standardized measurement in an anechoic chamber. However, this initial factory calibration is only of use if the antenna is constant. If the antenna is changed for another or if the impedance of the antenna changes due to near-field interaction then the LUT entries will be in error. To be useful, the ATLF must have to have a run-time calibration method.

Maximizing the SNR of the demodulated signal from the receiver is one approach: {g,p,f} are dithered such that the SNR of the processed output is maximized. Consider a data modulated signal of constant power that is coupled into the ATLF antenna. Assume the ATLF antenna stays fixed in position and orientation. The output of the ATLF is demodulated and the SNR of the data samples is computed continuously in time. We assume that the processing receiver demodulator has its own clock and carrier synchronization schemes that are done as an inner process of the data demodulation. For nominal SNR this demodulation function with carrier and clock optimization is relatively independent of the ATLF optimization. Now dither the {g,p,f} controls with a time constant that is slower than the clock and carrier tracking loops of the receiver. Consequently an optimum point may be found and the LUT updated. Those skilled in the art will select the appropriate numerical optimization algorithm to use. In this way the LUT for the operating point of the data signal (carrier frequency and bandwidth) can be optimized, which optimizes the SNR. Note that the inputs to the LUT are the parameters of the data signal, and not the desired center frequency and bandwidth that we use herein for Self Calibration of the ATLn.

The bandwidth is set appropriately, considering that too wide a bandwidth will result in too much adjacent channel noise to enter the receiver; and too narrow a bandwidth will result in ISI (inter symbol interference).

Next suppose that the ATLF is still stationary with a static antenna and no changes in the near field but the data signal is frequency hopping. However, we know the hopping sequence and therefore set up the ATLF with the LUT entry for the upcoming data burst. However, the {f,g,p} are dithered slightly to a new value and we note if the resulting SNR after the burst has been demodulated has increased or decreased. We can then use a gradient algorithm to optimize for those particular parameters associated with the data burst. That is if the SNR as measured based on the current dithered {f,g,p} is better than previous then we nudge the LUT entry a bit toward the current ATLF parameter set. In this way we may slowly optimize the LUT entries for the current data modulation. Optimizing to a given data modulation is generally sufficient as the ATLF chip will be used in a specific wireless application and is not expected to deal with multiple modulation types. If the intended use, however, is for multiple modulation type, then a LUT may be generated and used for each signal type. As the SNR measurement is random, the {f,g,p} optimization based on dithering is essentially a stochastic gradient search algorithm.

Next allow the antenna to move implying that the multipath environment will change. However, this does not imply that the antenna impedance will change. Only if the antenna changes does there need to be a change in the ATLF LUT parameters as the SNR will still remain at maximum. As the multipath will result in fading dynamics, then the SNR will change from one burst to the next at the same hopping frequency of the modulated data signal. Hence the change in SNR will be more due to the change in multipath as opposed to the change in {f,g,p}. Fortunately, we can still use the stochastic search to find the optimum {f,g,p}. Only to avoid instability, it is necessary that any adjustment of the ATLF parameters is done with very small increments.

Another complication is that of the change of near field environment of the antenna. An example is the smart bandage where the patient may change positions or roll over periodically that influences the near field of the antenna. In such a case, the impedance of the antenna changes and a modified entry for the LUT is required. Hence this becomes a compromise between tracking the changes with a reasonable response time and determining the optimum {f,g,p}. This type of problem has a solution and is covered with extensive publications in the public domain. A classic application is the cable modem equalizer.

The dithering algorithm is the simplest run-time calibration and is generally robust. However, there are pathological cases where the dithering algorithm fails. The emerging machine learning algorithms may be applicable. The algorithms will vary significantly with specific applications.

Bandwidth of the ATLF

The signal bandwidth of the ATLF may be visualized by looking at the reflection coefficient into the antenna. We consider the antenna to be resonant with a series LRC model as done before. The reflection coefficient looking into the antenna, denoted as $\Gamma_A$, is given as $$\Gamma_A = \frac{s^2 + \frac{1}{LC}}{s^2 + \frac{2R}{L}s + \frac{1}{LC}}$$

based on the characteristic impedance being R Hence the pole-zero pattern has two zeros on the jw axis and poles in the LHP. The smaller the ratio of R/L the closer the poles will be to the jw axis. Now the ATLF transfer function will have the form of $$H(s) = Re\left\{\frac{\text{some polynomial of } s}{1 - Ge^{j\phi}\Gamma_A(s)}\right\}$$

which ignored a lot of details but shows that the increase in G will move the poles towards the jw axis narrowing the bandwidth for commensurate phase values.

Regardless of the details of the root trajectories, as R/L decreases, the starting point of the trajectories is closer to the jw axis and the smaller the bandwidth will be. Note that this is case for effective Q spoiling, as a larger bandwidth may be required: with the ATLF active feedback gain we can push the poles away from the jw axis, further into the LHP, and reduce the bandwidth.

Figure 88:
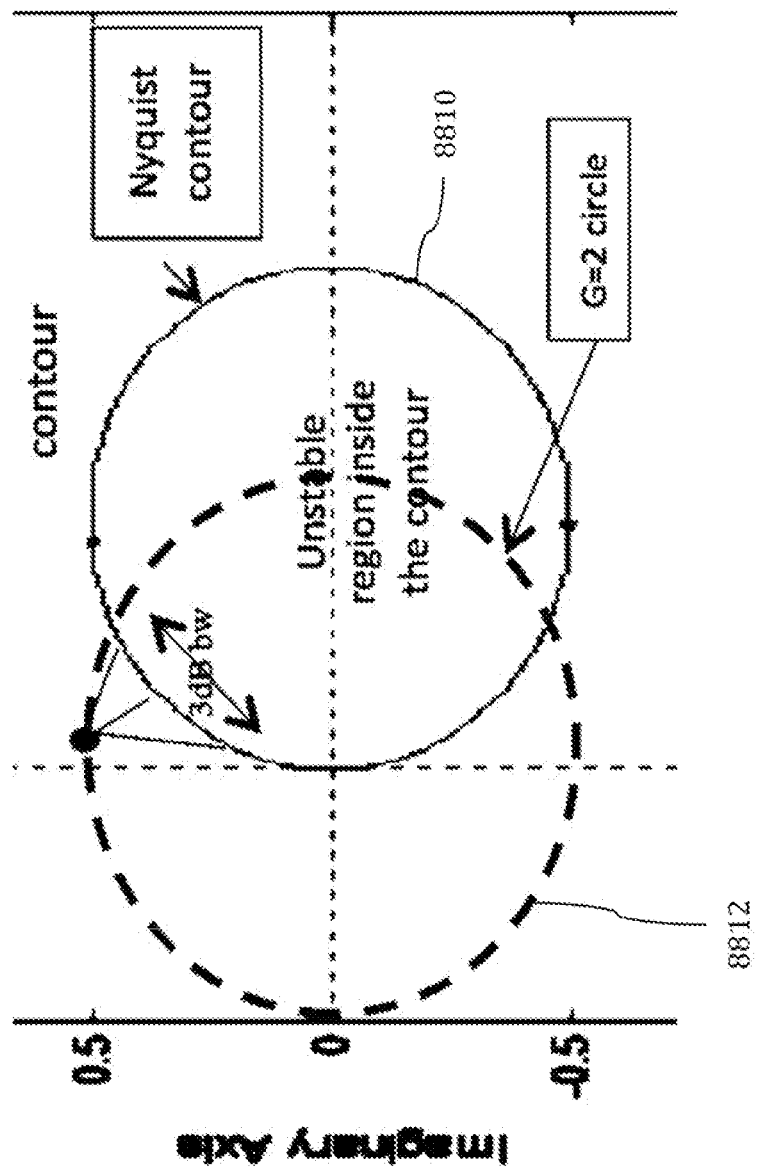
FIG. 88 is a Nyquist plot for ATLF stability regions.

FIG. 88 shows the Nyquist plot and the possibility of determining the bandwidth and stability regions showing the Nyquist contour 8810 and G=2 circle 8812. Note that the 3 dB bandwidth also depends on the numerator of the transfer function which is not considered as part of the Nyquist. As G increases, the circle of $e^{-j\phi}/G$ gets smaller, showing an increase in the region of instability and narrower bandwidths. Hence for 0<G<1 the circle radius is larger than 1 and therefore there is no instability.

Figure of Merit for ATLF

The signal quality factor of the ATLF, which may also be referred to as the figure of merit (FOM), addresses how well the overall antenna responds to an incoming electromagnetic (EM) signal in receive mode. This FOM may be flexible in that a variety of antennas may be accommodated by the ATLF, and therefore what is considered acceptable or preferred may change depending on a particular design scenario. The FOM therefore has to separate the performance of the antenna element itself and the performance of the ATLF or in other words, the ability of the ATLF to accommodate the specific antenna.

The antenna intercepts the signal contained in the incoming EM field and converts it into conducted electrical power. The efficacy of the antenna to perform this task is quantified by the radiation resistance that is denoted herein as $R_A$. The available power from the antenna of course depends on the signal amplitude as either a voltage or current. The complexities of determining the signal amplitude may be ignored in this FOM calculation, as this is simply a property of the antenna and not the ATLF. Hence we may assume that at the antenna terminal output there is a an available power, denoted by $P_{av}$, given as $$P_{av} = \tfrac{1}{2} I_A^2 R_A$$

where $I_A$ is the RMS level of the conducted current out of the antenna terminal. Otherwise we can consider $V_A$ as the RMS voltage at the antenna terminal such that the available power is $$P_{av} = \tfrac{1}{2} V_A^2 / R_A$$

Figure 118:
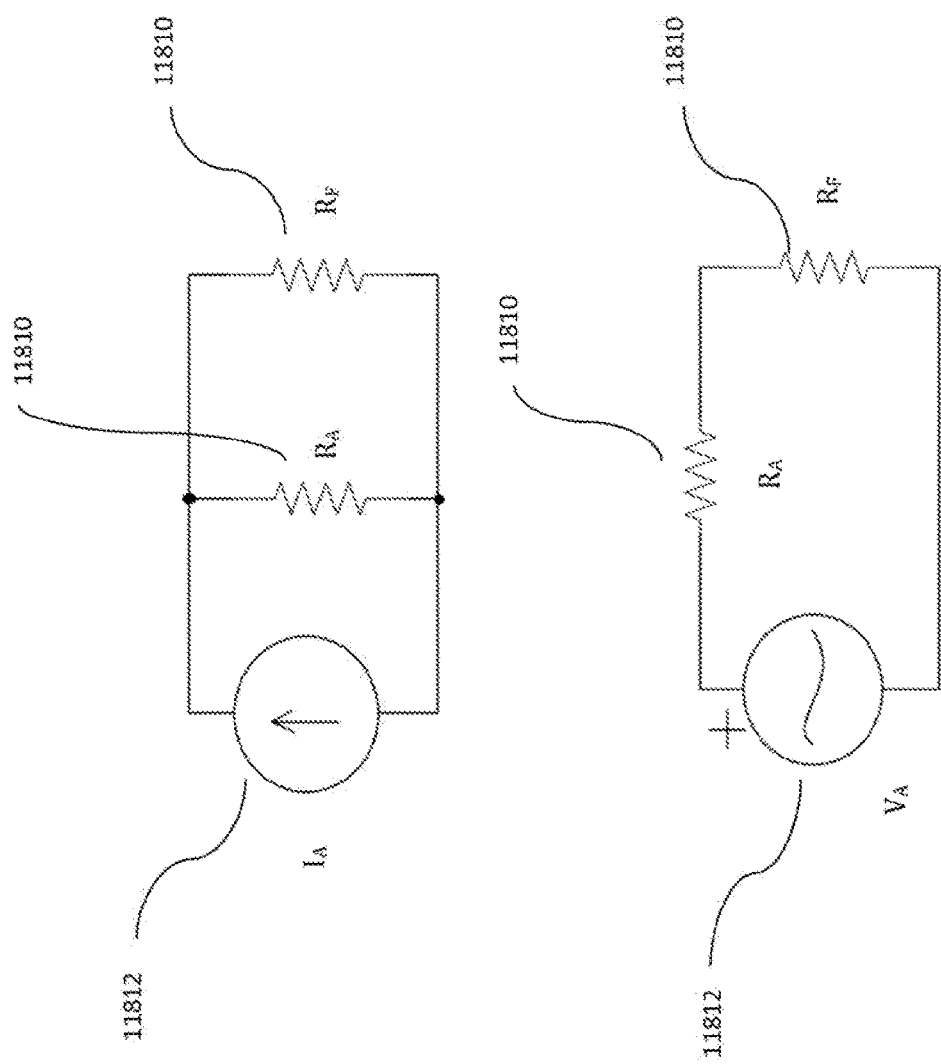
FIG. 118 is diagrams showing Norton and Thevenin equivalent circuits of ATLF.

The actual power delivered to the receiver depends on the input impedance of the ATLF and the signal gain associated with the ATLF. However, this ATLF gain should not be part of the FOM. Instead what is important is the ATLF's utilization of the available power and how much noise is contributed by the ATLF. Let $R_F$ denote the input resonance impedance of the ATLF. We may then produce the Norton and Thevenin equivalent circuits for the ATLF as shown in FIG. 118, which show resistors 11810 and sources 11812.

The ATLF objective is to make full use of the available power, achieved when $R_F = R_A$. If this condition is not met, some of the power will be reflected from the ATLF based on the reflection coefficient given as $$\Gamma_F = \frac{R_F - R_A}{R_F + R_A}$$

For $R_F \neq R_A$ a portion of the antenna power is reflected back into the antenna and re-radiated and is therefore lost. The signal power absorbed by the ATLF is then equal to $$P_f = P_{av}(1 - |\Gamma_F|^2)$$

which is the desired form that shows the loss in power due to the impedance mismatch.

Next suppose that the receiver load resistance $R_r$ represents the receiver impedance and that the receiver has a noise figure (NF) of $NF_r$. Then the overall noise figure of the antenna and receiver may then be expressed as $$NF = 1 + \frac{NF_r - 1}{1 - |\Gamma_r|^2}$$

which is based on the assumption that the equivalent noise temperature of the antenna is 293° K. This relationship shows the inflation of the NF due to the mismatch between the antenna and the receiver. The figure of merit (FOM) of the antenna-receiver may be defined as this NF. This makes sense as the gain of the antenna-receiver is arbitrary and the FOM should only focus on the receiver's ability to utilize the available power sourced by the antenna. Note that if the $NF_r$ of the receiver is such that it generates no intrinsic noise, then there is no consequence of an antenna mismatch. That is, mismatch just reduces the overall signal gain of the receiver but does not contribute to the NF. This also makes sense in that the in-band noise and signal from the antenna source are processed exactly the same, and therefore mismatching affects both equally. Antenna matching is only necessary as the receiver generates additional noise. Equivalently, we can state that if the interference noise of the antenna input is much larger than the intrinsic noise of the receiver, then there is little consequence to mismatching the antenna.

The ATLF as a negative resistance, as discussed above, generates additional independent thermal noise which may be represented by an equivalent noise source at the input to the ATLF negative resistance block that is characterized by the noise figure (NF) of the ATLF denoted as $NF_{ATLF}$. The NF of the overall ATLF is defined as $$NF_{ATLF} \triangleq \frac{SNR_{in}}{SNR_{out}}$$

where $SNR_{in}$ is the SNR associated with the available power output of the antenna, and $SNR_{out}$ is the SNR at the output of the ATLF assuming that we are evaluating this at the resonance frequency.

Assume that the antenna is subjected to blackbody thermal radiation at room temperature and the conducted noise spectral density at the antenna terminal is represented by $\eta_A$. Likewise the ATLF negative resistance has an equivalent input noise density of $\eta_F$. Then we have $$F = \frac{\frac{1}{\eta_A}}{\frac{(1 - |\Gamma_F|^2)}{\eta_A + \eta_F}}$$

$$= \frac{\eta_A + \eta_F}{\eta_A} \cdot \frac{1}{1 - |\Gamma_F|^2}$$

$$= F_F \left( \frac{1}{1 - |\Gamma_F|^2} \right)$$

where we have written the NF of the ATLF negative resistance as $$F_F = 1 + \frac{\eta_F}{\eta_A}$$

In summary, the overall NF of the ATLF, denoted by F, is a product of the NF of the negative resistance used in the ATLF ($F_F$) and the penalty term of $(1 - |\Gamma_F|^2)^{-1}$ which captures how well the ATLF absorbs the available antenna output signal power.

The use of NF as a FOM is reasonable as it captures how well the ATLF absorbs the antenna signal and transfers it to the gain stage. This may be compared to conventional arrangements in which the matching circuitry represents component losses and mismatch over the desired frequency range. NF also shows the equivalent noise inflation due to the mismatch of the ATLF, specifically between the antenna radiation resistance and the active electronic device used as the negative resistance. Determining this impedance is a subtle point, as it would seem that $|\Gamma_F| > 1$ due to the negative resistance.

Figure 119:
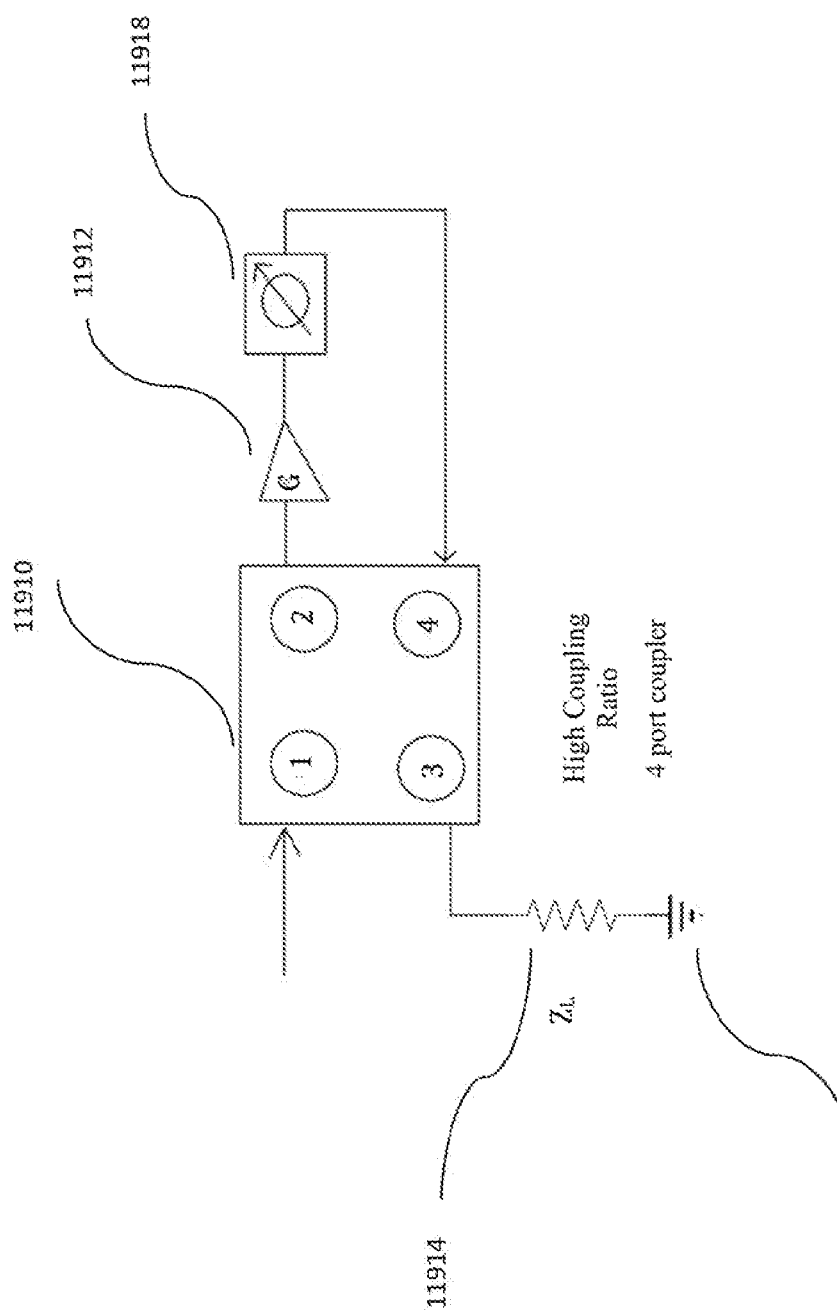
FIG. 119 is a diagram showing equivalent impedance of a negative resistance port.

Consider the equivalent circuit of the negative resistance device as shown in FIG. 119 where the input signal from the antenna is coupled into a 4 port directional coupler. FIG. 119 shows 4 port directional coupler 11910, gain 11912, resistor 11914, grounding 1196, and phase shifter 11918. The output of this coupler is amplified and phase shifted and sent back into the coupler. Assume a high ratio coupler such that the pair of ports {1,2} and the pair {3,4} are strongly coupled. Assume that the gain G is sufficiently high such that path from port 1 to the gain G and back through port 3 to port 1 has gain. Then at port 1 we have an equivalent of negative resistance assuming the phase shifter is set correctly to offset the 90 degree shift of the hybrid coupler. Notwithstanding any frequency dependence, it is clear that at the resonance frequency that the signal reflection at port 1 due to the mismatch of $R_A$ with the characteristic impedance of the circuit in FIG. 119 will lead to the signal loss related to the factor of $$(1-|\Gamma_F|^2)^{-1}.$$

In the negative resistance transistor device we can consider a similar equivalent circuit operating over a narrow band. Hence the term of $(1-|\Gamma_F|^2)^{-1}$ represents the proportional loss of signal that would otherwise be available to influence signal flow inside the transistor.

The excess loss factor of $(1-|\Gamma_F|^2)^{-1}$ is important but represents a modest loss relative to other loss mechanisms and sources of noise. As an example, consider a poorly matched antenna where $R_A=10$ ohms and $R_F=50$ ohms for which $10 \log_{10} (1-|\Gamma_F|^2)=-0.9$ dB representing a modest increment of about 1 dB in terms of the NF. The NF due to mismatch resulting from reactive components may be much larger.

ATLF Configurations

Figure 120:
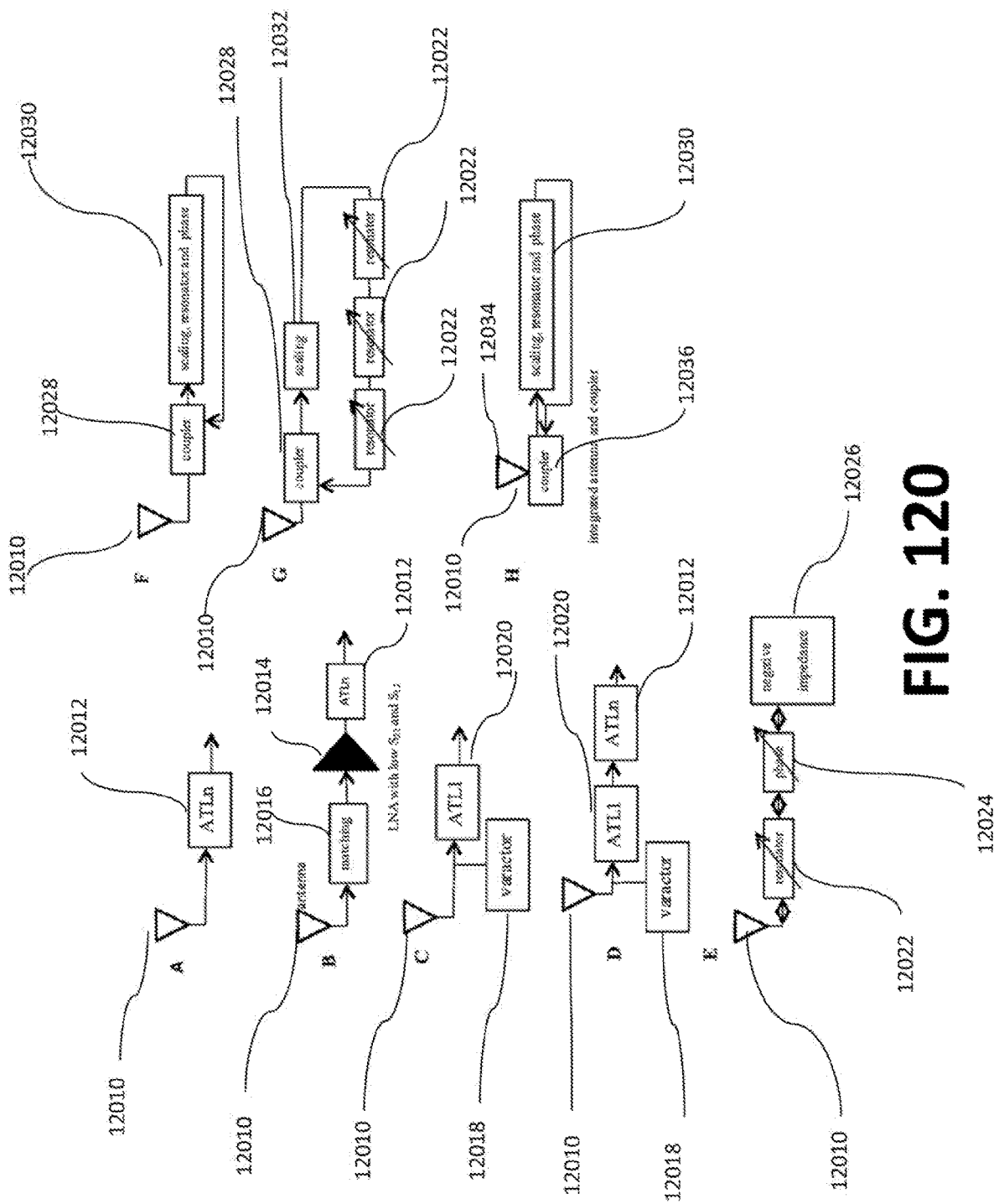
FIG. 120 is diagrams of various approaches to implementing an ATL filtenna circuit.

The main implementation issue of the ATLF is therefore that of resonator coupling. For this there may be various circuit configurations that may be developed, some of which have been arranged into categories, and shown in the block diagrams of FIG. 120:

A shows the direct connection from the antenna 12010 to the ATLn 12012, with the ATLn providing frequency tunability and Q adjustment, but without providing coupling to the antenna 12010.

B shows an LNA 12014 that serves as an active isolator that decouples the antenna sub-circuit from the ATLn filter. If the antenna 12010 is not matched to the characteristic impedance over the band of interest, then it will not couple effectively into the ATL1 12012. Hence B includes a matching network 12016 and an LNA 12014.

C shows the small antenna 12010, which may be modeled as an LRC circuit, where the varactor 12018 modifies the effective antenna capacitance. This changes the antenna resonance, partially matching the antenna over the operating band to the ATL1 resonator 12020.

D is the same as C, but with a cascade of an ATL1 12020 and an ATLn 12012. The first ATL1 interacts with the antenna 12010 and is a lower Q circuit with a varactor 12018. The reason for this circuit is to do partial enhancement of the Q creating a dominant pole pair that is further enhanced by the second ATLn. This approach makes it simpler to accommodate a wider variety of antennas.

E shows the controllable negative resistance solution provided by a configured ATLn, discussed later, to the ATLF implementation. E shows antenna 12010, resonator 12022, phase shifter 12024, and negative impedance 12026.

F shows an ATLF implementation based on an off chip directional coupler. F shows antenna 12010, coupler 12028, and scaling, resonator, and phase block 12030.

G is similar to F but shows that the phase shifter may be removed and replaced by three resonators 12022 that if slightly detuned will provide a suitable range of phase correction, as discussed above. G shows antenna 12010, coupler 12028, and scaling block 12032.

H shows the ATLF comprised of a specialized antenna 12010 that consists of a radiating element 12034 and an integrated directional coupler 12036, providing a two port antenna that may connect to the versions of F and G. Hence, the scaling, phase and resonator as shown in one block 12030.

Other implementations may also be possible, where the implementation of choice may be driven by system level parameters and performance objectives.

ATLF Calibration

As will be described a way in which control voltages that adapt the performance of the ATLn for the target application may be set, based on the following principles: In this example Thus, for the ATL1, there may be 3 such LUTs, while for the ATL3, there may be 9 LUTs.

Below is a discussion of various considerations that may or may not be relevant to any particular implementation.

We will now address an example of the calibration and stabilization of a single ATL1 core module. FIG. 32 presents a circuit that has processing built in for the purpose of calibrating and stabilizing the response of an ATL1 block 7502.

The microprocessor 7504, generally a system asset, adjusts the control for the frequency and Q of the ATL1 7502 through a DAC implemented as a pulse width modulation (PWM) circuit 7506, and based on readings from a temperature sensor 7508. The microprocessor drives the ATL1 to the start to self-oscillation. The frequency of this self-oscillation is down converted in block by a frequency synthesizer signal generated by a crystal reference 7505 and a frequency synthesizer 7507 that is set also by the microprocessor 7504. A frequency counter 7509 or other measurement means determines the frequency of the down-converted signal. In this way the resonant frequency of the ATL1 core module may be determined. Also, there is a power detector and ADC block 7514 that can estimate the rate of increase of the self-oscillation signal at the output of the ATL1 7502. The microprocessor 7504 estimates this exponential rise of power and from this determines where the closed loop pole of the ATL1 7502 is. Presently it will be just to the right of the jw axis. If the Q-enhancement is decreased slightly then the self-oscillation will continue at the same frequency to a high accuracy but will begin to decay exponentially. Now the pole is on the left hand side of the While the ATL1 calibration is stable over time, varying primarily based on ambient temperature, it may not be As we will seeseen, calibration of the ATLF will rely on purposeful transitions into an oscillation condition of the ATLF. We have relied on the fact that crossing the outer encirclement of the Nyquist locus results in instability. Complex variable theory provides two perspectives on stability that relevant in the present context.

Stability of Open Loop Transfer Function from Complex Variable Theory

The first result from complex variable theory is that the open loop transfer function is in itself stable and has no poles inside the right hand plane. This is true as long as the components are unconditionally stable. In the architecture we have, the resonators and the gain block are assumed to be stable which is certainly true for the resonators, as these are passive sub-circuits with no active gain. The gain block may be assumed to be unconditionally stable and hence also qualifies. A situation could arise though if the gain block is based on a transistor configuration that is not unconditionally stable and as the impedance of the other loop components change slightly, could see a pole creep up in the right hand plane that changes the Nyquist stability criteria. This is a design issue that may be avoided or minimized. However, the negative resistance implementation of the ATLF is a bit more challenging in that the gain block is certainly not unconditionally stable. Situations may easily arise in which the reflection off of the resonator or phase shifter and the negative resistance pushes a pole into the right hand plane that is outside of the normal operating band. This could be a frequency well below or above the resonator bandwidth wherein the reflection coefficient approaches unity. This needs to be avoided by careful design insuring that 1) there are no open loop poles in the right hand plane, and 2) potential poles are designed out.

Analytic Continuity from Complex Variable Theory

The other result from complex variable theory that is relied upon is that of analytic continuity. This states that any point inside of the outer encirclement is unstable. This is why determining the points of (f,g) that result in marginal stability (boundary point of stability) gives us the portion of the Nyquist locus. Hence, we may overshoot the boundary by an arbitrary amount in terms of g control and still be in the region of instability. The flip side is that outside of this boundary we have strictly stable behavior.

Figure 92:
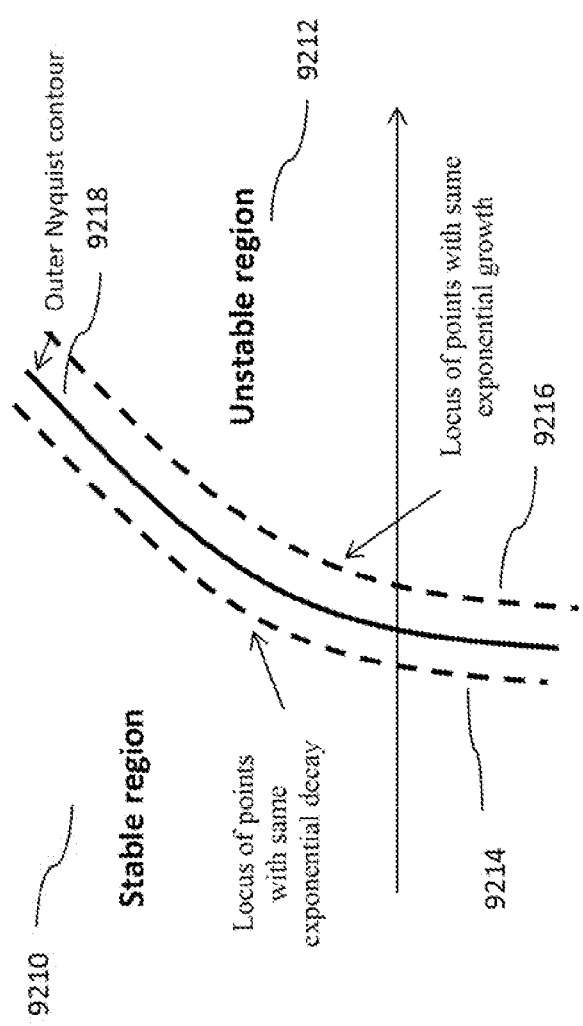
FIG. 92 is a plot showing that points on either side of the Nyquist curve behave the same as a class.

What this further tells us is that the operating points a short distance from the Nyquist locus have predictable natural modes that are exponentially decaying in the stable region and exponential growing in the unstable region. The useful part is that the coefficient of this growth or decay is proportional to the skew distance to the Nyquist contour. It is as though we have taken the s plane and warped it such that the jw axis is conformal to the outer Nyquist contour. This allows us to accurately predict how changes in g and f will affect the Q. This is illustrated in FIG. 92. It is this continuity property that makes the calibration and tracking smooth and possible. FIG. 92 shows stable region 9210, unstable region 9212, locus of points with same exponential decay 9214, locus of points with same exponential growth 9216, and outer Nyquist contour 9218.

Figure 128:
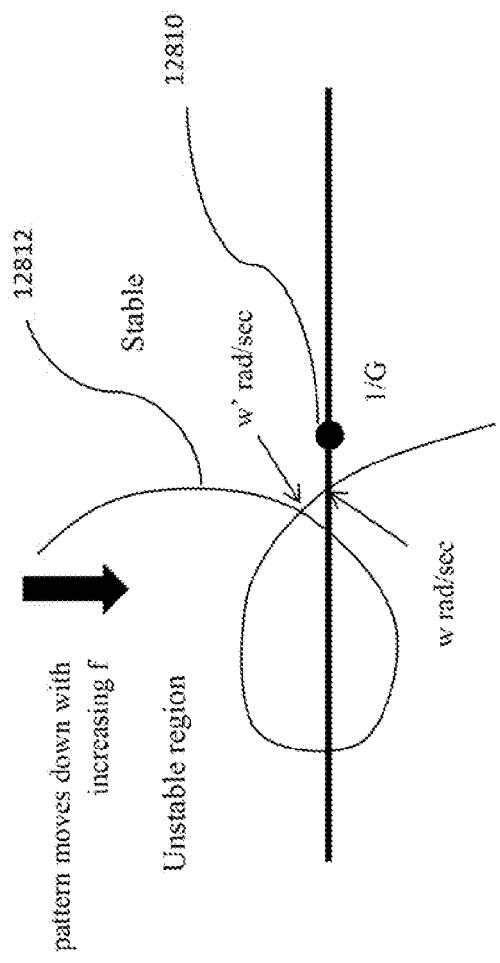
Figure 129:
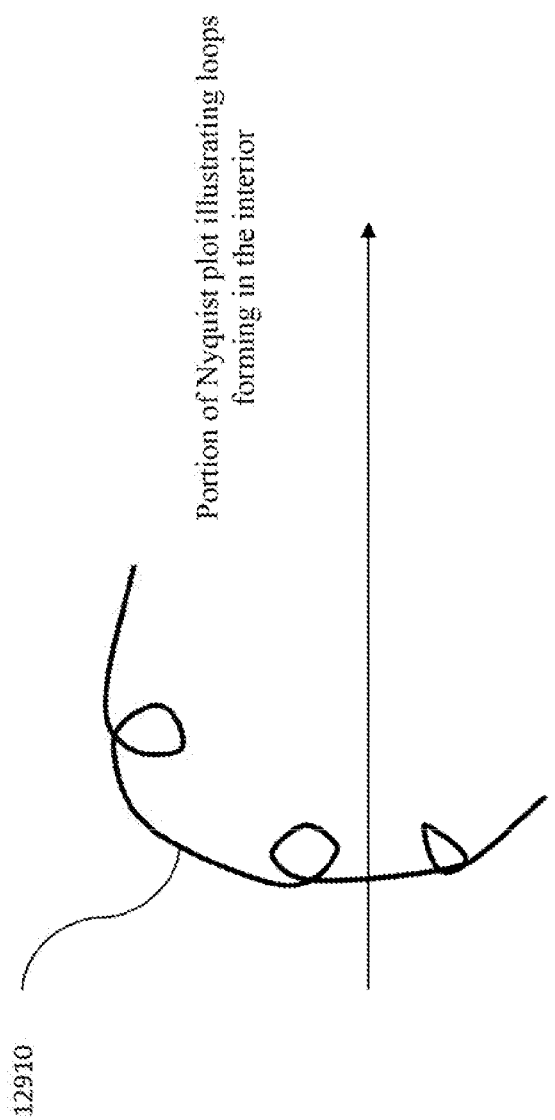

An interesting property is that the Nyquist locus may have small loops that appear, due to antenna reflections in the antenna near field. These loops are always into the interior of the unstable region as illustrated in FIG. 128. The reason for this is that the phasor of the Nyquist locus (for a realizable stable open loop response) is always in the clockwise direction as frequency is increased. Also, the reflection off the scattering points is a much faster rotating phasor that also rotates in the clockwise direction. Sketching this out it is seen that only inwardly oriented loops are possible. This implies that the near field scattering will result in gaps in tunable frequencies. However, as the loops cannot grow on the outside, it helps the stability as the loop will not suddenly make the ATLF unstable. This is illustrated in FIG. 129.

Calibration of the ATLF

Single Frequency ATLF Calibration Procedure

An example of a procedure for the ATLF calibration under single frequency operation, assuming that there is no prior calibration done, is given below. Other procedures may also be possible.

Set f=1 as this will place the resonator roughly in the middle of the tuning band Increase g until the RF detector indicates oscillation mode and go a bit beyond this point Vary f until the baseband detector also lights up. Now we are at the correct frequency.

Decrease g until the baseband detector is extinguished. If the RF detector extinguishes at the same point, then the ATLF is correctly tuned for the frequency. If the RF detector is still on showing an oscillatory mode, then the frequency has shifted due to the gain block coming out of saturation. To fix this, shift f such that the baseband detector lights up again. Correct tuning is when the RF and baseband detectors light up and extinguish at the same time.

It is assumed that the shape of G(g) is accurately known, but G(g) is not absolutely known. However, G(g)=1 is determined at the point where both RF and baseband detectors go from active to extinguished states simultaneously. From the shape of G(g) we know $$\frac{\partial G(g)}{\partial g}$$

and then we can basically set g according to the Q needed. Provided that the Nyquist locus is roughly perpendicular to the real axis, Q is approximately $$Q \approx \frac{1}{1 - G(g)}$$

Expressing Q in terms of the change in g required and knowing $$\frac{\partial G(g)}{\partial g}$$

we get $$Q \approx \frac{1}{\Delta g \frac{\partial G(g)}{\partial g}}$$

such that we can solve for the required change in g as $$\Delta g = \frac{1}{Q \frac{\partial G(g)}{\partial g}}$$

Once the setting has been made and the receiver functions properly, then the LUT may be populated with the boundary value of the Nyquist locus for the given desired frequency as well as the g giving the desired Q.

During operation, we may use the SNR to track any changes of the g and f values. For both a static antenna and the fixed multipath case, this is straightforward as we only need the gradients along the g and f variable directions. We determine the gradients numerically by dithering g and f by small amounts.

In the case of variable multipath and/or variable antenna impedance, this is more difficult as the SNR fluctuates randomly. If the multipath and antenna impedance is slowly changing, then we may assume it to be quasi-static, in which case we can complete an iteration of the SNR steepest ascent routine before the characteristics change. In this way we are always tracking the value of g(t) and f(t) necessary for the optimum point. If the fluctuations are slow relative to the time necessary to measure the SNR, then several iterations of steepest descent are possible and we can converge or tightly track.

Multiple Frequency ATLF Calibration Procedure

If a frequency hopping scheme is being used by the communication channel, then each of the set of frequencies is preferably calibrated by the ATLF. Doing so may give us a vector of settings for f and g as a function of the hopping frequency. One calibration procedure may calibrate for each of the hopping frequencies as though they were a single frequency. However, another, more efficient procedure may also be used.

The obvious improvement is to calibrate the frequencies in sequence and realize that the change in f and g from say a lower hopping frequency to the next higher hopping frequency is very small. Therefore, the outcome of the previous frequency calibration is the initial guess for the next higher frequency.

Then it should be clear that the parametric curves of g(frequency) and f(frequency) will be fairly smooth. Spline interpolation may be used to combine the calibration data. This may be used more in tracking. In tracking the SNR is again used. A problem is that the SNR available to the ATLF transceiver may be highly frequency dependent in regions of multipath. Therefore, dithering only makes sense when comparing the specific frequencies. This means that the dithering calculation of the numerical gradient has to wait until the specific frequency shows up. If the multipath varies in time faster than the convergence time of the SNR optimization, then it will be necessary to open up the bandwidth of the ATLF such that there is more SNR data. This is a compromise as the ATLF will only give the best matching over a segment of the tuning range instead of individual frequencies. An innovation to follow here is the selection of this matching over what size frequency segments and how many segments to actively track.

If the multipath changes quickly in frequency, then this grouping will not work well. As a concluding statement, grouping hopping frequencies over the coherence bandwidth of the multipath channel is preferably done in terms of sharing SNR data samples and the steepest descent algorithm preferably converges within the coherence time of the channel. This may seem rather restrictive, however, it is the optimization algorithm only has to keep up with changes in the antenna impedance and some slow changes in the ATLF based on temperature, supply voltage and aging. Hence, the changes to the eventual LUT may be made quite slowly. That said, there will be instances for which the ATLF cannot calibrate and tune properly such as in cases where the sensor antenna is continuously subjected to fast changing and significant near field scattering.

Initial ATLF Calibration, Acquisition and Tracking Phases

In one embodiment of the ATLF, it may be convenient to consider three states as:

Initial Calibration Phase:

The ATLF is first powered up after being installed with the antenna attached and in the housing with all antenna covers and so forth in place. The LUT is populated only with configuration data such as Is this a single frequency or frequency hopping application When to wake up When to begin calibration When to acquisition and so forth.

If it is a single frequency application, then the calibration will only be developed for that single frequency. It will use the self-oscillation mode to determine the Nyquist boundary point. It may do this several times recording temperature at the same time to start the estimation of temperature related parameters. It then goes to sleep and wakes up when it is time to begin the acquisition phase.

For the multi-frequency sensor, the calibration is done in the same way but for each of the hopping frequencies as described earlier. Assume that the commissioning provides it with a procedure such that it handles the calibration in an efficient manner such as using a spline fit as opposed to doing each frequency independently.

Acquisition Phase:

The sensor wakes up and begins an acquisition mode. The time information may not be exact so that it waits for the packet to arrive at a specific frequency based on the LUT. Optionally it may do a self-calibration step to fine tune the position of the antenna center frequency and bandwidth. Since the ATLF may not have accurate time information, it will open the receiver and wait for a data packet at the specific frequency. When the packet arrives then there is information for setting the clock accurately for the next packet and the next carrier frequency of the hopping sequence expected. Between the time that the first packet ends and the next packet starts it may optionally self-calibrate if necessary. Optionally it may self-calibrate multiple times until the LUT is accurate. The acquisition phase may consume a disproportional amount of energy if not configured optimally. Regardless, it is finished with the acquisition mode once the LUT entries are accurate and that the receive performance is optimal.

Tracking Phase:

At the completion of acquisition the self-calibration based on self-oscillation is no longer required and the track mode may be entered. This implies that only the SNR during receive is use for fine tuning the ATLF. The SNR tuning is very low power but requires a sequence of data packets as stochastic gradient methods are used. Such stochastic gradient determination requires dithering that does result in a slight degradation in the ATLF tuning. As discussed, if the coherence bandwidth or coherence time is too short then SNR gradient estimation becomes too unreliable and noisy and the track mode is no longer workable. In this case it is necessary to revert back to the acquisition mode and rely on self-oscillation to control the ATLF and ready it for the next packet. The penalty is that acquisition consumes more power than track mode.

Sub-Optimal Track Mode

If the track mode fails due to the coherence bandwidth or coherence time being too short and acquisition takes too much energy, then an option is to control the bandwidth such that it gives an acceptable averaged result over segments of the hopping frequency band. That is, instead of retuning the ATLF for each specific frequency hopping packet, we can group the frequency hopping band into two or three segments. The ATLF would use a broader bandwidth. Now there is much more data available as the packets of a group of hopping frequencies occurs more often than the individual frequencies. Hence a compromised version of the track mode will work again.

As part of the overall commissioning of the sensor, rules and thresholds for transitioning between these four modes will be imputed into the LUT configuration.

The phases and modes described above are given as examples, and they may be modified, replaced or combined with other phases and modes by those skilled in the art once the design principles discussed herein are properly understood.

Run Time Calibration of the ATLn and ATLF

Next we consider the run time calibration. There may be various ways of achieving this. In the wireless sensor application of the above example, the telemetry link is used intermittently and therefore there is a significant proportion of time in which the ATLn and ATLF may self-calibrate. This self-calibration may be tailored to the specifics of the application.

As an example, consider the smart bandage application where the transceiver chip wakes up every second or so, sends a data packet at a certain frequency and goes back to sleep. If the ATL1b is used in Mode 3 (FIG. 150) for transmission, then Mode 4 (FIG. 151) may be run a few milliseconds before transmission, setting up the control voltages for ATL1b precisely based on using ATL1a as a VCO set to the transmit frequency. Then just prior to transmission taking place, the ATLF is reconfigured for Mode 3 (FIG. 150) with the ATL1b precisely tuned in frequency. Generally a receive mode will also be required such that the bandage sensor may be controlled as to a) what to transmit, and b) when to transmit, and c) on which frequency channel. Usually to save power, the receiver wakes up at a predetermined time based on the wireless telemetry protocol used. Prior to the receive mode epoch Mode 4 (FIG. 151) is configured and the ATL1b is the VCO set up at the expected receive frequency. The control of ATL1a is dithered to ensure that the passband is centered correctly and has the correct frequency. Frequency errors in ATL1b may be corrected at the same time.

This intermittent run time calibration does not have to be done continuously, but only on a periodic basis. At issue is that the calibration will take additional battery energy, which is also to be minimized. For every calibration measurement done, the LUT may be annealed with the new information. As such, the ATLn and ATLF stays self-calibrated and up to date.

Another mode of calibration is that the ATL1a and/or ATL1b are continuously adapted for optimized receiver performance, which is only done in the receiver mod. Depending on the baseband processing, there will generally be some utility for measurement of signal qualities. This could perhaps be the outcome of some clocking phase tracking loop for optimum demodulation of communications signals. The control voltages may be dithered to optimize this demodulation process.

Summary of the Self-Calibration of the ATLF

As described, the self-calibration of the ATLF may occur when it is first powered up after circuit construction. This may be part of a factory calibration or the eventual user may do this as an initialization procedure. During run time, the calibration of the ATLn may be continued as required, either:

Replacing calibration coefficients in the look up table (LUT), or

Dynamically modifying the coefficients as the antenna environment changes, the circuit temperature changes, or other effects such as aging.

Therefore, the ATLF will adapt to the embedded environment. This is important in cases such as the wireless sensor bandage as the patient moves, changing the near field of the antenna, or the skin impedance of the patient changes.

This resonance matching that is the output of the ATLF self-calibration process achieves several objectives simultaneously:

Eliminates matching components as discussed above. Not only does this reduce the parts count as matching components are not required, this also eliminates losses associated with more common impedance matching. Simply put, the resonance of the antenna structure is absorbed into the ATLn which undergoes a self-calibration process thereby optimizing the antenna subsystem performance.

Minimizes the loss between:
The radiated power of the antenna and the transmit power supplied to the antenna, or
The available power of the incoming electromagnetic (EM) signal and the conducted receive signal into the receiver processing.

Achieves optimization over a prescribed bandwidth and center frequency that may change dynamically. That is, the resonance matching of the ATLn with the ATLF is optimized across the whole tuning bandwidth of the ATLn.

This ATLF optimization is not a compromise of any best fit matching that may be achieved with a small number of discrete matching components. This becomes important as the tuning bandwidth increases and the instantaneous channel bandwidth decreases. For instance, if the tuning is over a 10% bandwidth, but the wireless communications channel is over a 0.1% bandwidth, then instead of the compromised tuning over the 10% bandwidth, the ATLF is automatically optimized for best matching for each 0.1% bandwidth increment over the entire 10% tuning range.

Control of the ATLF

A description of the control of the ATLF is described below in the context of an ATL-based circuit. This discussion may translate to other embodiments, depending on their final configuration.

To understand the aspects of control of the ATLF, an overview of the technology of the ATLF is in order. This overview includes:

A variable analog bandpass filter that is simultaneously and independently tunable in frequency and adjustable in bandwidth (the ATL);

A circuit (ATLF) for conjugate antenna impedance matching, based on a vertical integration of the ATL;

Control and optimization of the ATLF circuit to assure transfer of maximum available antenna energy to the transceiver, for applications where the antenna impedance is reasonably static over periods of minutes, and slowly varying from an initial impedance value to a new impedance value.

From this understanding, we will describe the circuit and method for control of the ATLF circuit for applications where the antenna impedance is changing rapidly.

The control of the ATLn has been discussed above. The main difference between the ATLF and the ATLn in terms of control is that the input port impedance of the ATLn is assumed to be a designed real value such that the control did not have to contend with an unknown time varying impedance. The ATLF, on the other hand, has unknown port impedance in terms of the antenna. Furthermore, the antenna impedance may fluctuate significantly with time as scattering objects in the near field change.

For the ATLn it is possible to consider a calibration look up table (LUT) for coarse control and using the SNR measurement for fine control as described above. The LUT is fundamentally dimensioned in terms of the control voltages with the potential of compensation for variations in temperature, supply voltage measurements, component aging, etc.

The unmodelled parameters such as allowance of slow component drift over time may be handled by the SNR optimization. Essentially, the more information that can be stored in the LUT the less fine-tuning that the run-time control has to do. The LUT may be built up as an initial calibration procedure or developed a priori during run time. Regardless of the procedure, as the calibration matures, the emphasis on run-time control will become less critical as the LUT becomes more accurate. The calibration may be thought of as a form of supervised learning where the labeled data that is used for training is the output of the communication processing. During runtime, after a coarse setting by the LUT, the objective of maximizing the SNR drives the control. Feedback from this process as to the fine adjustments made to the LUT control is used to make annealing adjustments to the LUT over time.

The ATLF follows a similar ATLn strategy in which the LUT is used for coarse tuning and SNR optimization is used for run-time fine adjustments. The difference is, however, that the ATLF has to contend with an unknown and time fluctuating antenna port impedance. Near field scattering objects affect the antenna impedance, giving rise to three very different cases for control of the ATLF. These static, quasi-static and dynamic antenna impedance cases are now described.

Static Antenna Impedance:

Consider a sensor mounted on some equipment in a climate controlled environment where there is no chance of scattering objects that enter the near field of the antenna. In this case the antenna environment is static and the antenna impedance is static. This is then the same scenario from a control perspective of the ATLn control with static input and output port impedances. For this case the ATLF LUT may be pre-calibrated or built up over time. Ultimately only the unmodelled components of the LUT have to be tracked based on the SNR optimization procedure. For instance, if the LUT does not have provision for temperature fluctuations, then the ATLF control tracks over slow variations. Note that the frequency selectivity of the multipath, that may occur between the static sensor and the reader, does not affect the antenna impedance as the influence of the moving reader in terms of a moving scattering object is insignificant.

Quasi-Static Antenna Impedance:

Consider the sensor mounted on some equipment that is outdoors subject to larger temperature and humidity changes that affect the impedance of the antenna. One method of control is to build up a higher dimensional LUT that takes these environmental effects into account. Assuming a sufficiently elaborate LUT then there is no difference in comparison with the static case. However if it is impractical to calibrate the higher dimensional LUT then some run-time control tracking is necessary. Regardless, the LUT must still be built up and refined over time.

Dynamic Antenna Impedance:

In this scenario, the antenna impedance may change significantly (10% or more) over a short time interval (fraction of a second) which implies that the control system will have to keep up to that rate. The LUT may be used for some initial coarse setting, but tracking the antenna impedance is key to achieving any appreciable Q enhancement (bandwidth narrowing). An example would be the smart bandage where the patient is moving resulting in potentially significant changes to the antenna impedance. If little is known of the signal to be demodulated, then only the SNR is available for optimization. If the signal structure is known, then more powerful optimization processing may be implemented to do the optimization faster and more robustly. However, this more elaborate processing requires energy. Hence there is a point where the energy saved by the more optimal tuning of the ATLF is more than offset by the additional increment in energy required for the processing.

For the ATLF to be successful in any of these cases, it is necessary to have a mechanisms for:
  Building up the LUT initially to allow the ATLF to function;
  Do runtime adjustments to the LUT over time: and
  Rapid runtime tuning of the ATLF.

A major feature of the ATLF in the static antenna impedance case is that it may be completely self-calibrating once it is installed with the antenna and, for example, a sensor. For instance, a pipeline sensor installation may be made as simple as a sensor out of the package is placed on the pipe and powered up whereupon it begins a self-calibration algorithm to build up the LUT. After the LUT is satisfactory it is then available for service. Mechanisms for detecting the need for recalibration (if the runtime SNR optimization is not sufficient for tracking or the optimization has lost track) are part of the control algorithm is such that the sensor can always go back to the initial self-calibration mode if necessary.

Clearly it is not possible here to describe every conceivable sensor installation, commissioning, and usage with the necessary algorithms. Instead we will focus on calibration tools that need to be built in. This is similar to a cell-phone transceiver chip. It consists primarily of hardware processing blocks that do different functions with associated software drivers. The smart phone designer then has to produce the 'main program' that calls all of the subroutines that invoke the hardware processing block with the eventual application target as the goal. This integration is not a trivial task and is where the power consumption minimization occurs. There are application specific questions that need to be addressed by the system designer, some of which include:
  Setting parameters for how long the initial ATLF calibration should last
  Specify the accuracy required of the LUT before releasing to run-time
  How much does he allow the run-time calibration feedback data influence the LUT values
  Should this change over time
  Should the ATLF periodically go into a re-calibration to be more robust Hence the objective is to develop and describe fundamental building blocks.

Effects of Variable Antenna Impedance

The Nyquist locus is central to visualizing the mechanism of the ATLF. As discussed above, we have $H_{OL}(s)$, where $s=j\omega$ is the complex frequency, as the open loop response of the resonators, the antenna reflection coefficient $\Gamma_a$, and any loop parasitics such as the transport delay and the phase shift of the gain block. Abstracted out of the open loop is the pure real valued gain G that is a nonlinear but monotonic function of the gain control parameter denoted by g and the polarity control denoted by p. Also, G is frequency independent. Hence, we assuming the factoring of $H_{OL}(s)$ as $$H_{OL}(s|g,p,f)=G(g,p)H(s|g,p,f)$$

Additionally, we have the frequency control f, which affects the varactor diodes of the resonators in the loop. In general, the resonance frequency will be a nonlinear but a monotonically increasing function of f. $H(s|g,p,f)$, where the function $H(s)$ is conditioned on the parameters g, p and f, is what remains of the open loop response once the pure real value gain of $G(g,p)$ has been factored out. Note that the notation of $G(g,p)$ explicitly states that this real gain is not a function of frequency s nor of the frequency control f. Furthermore, we assume the polarity control to take on one of two Boolean values 0 and 1 such that $G(g,p=0)<0$ $G(g,p=1)>0$ $G(g,p=0)=-G(g,p=1)$ Of course this factorization is incomplete but note that we can abstract out G(g,p) as a frequency independent real gain provided that H(s|g,p,f) includes the dependence on g and p. To proceed, we need the approximation of $H_{OL}(s|g,p,f) \approx G(g,p)H(s|f)$ In this approximate factorization we can accommodate the frequency variability of the gain block but not how the frequency variation changes with p or g. While the approximation is reasonable to a first order, we will have to understand the implications.

The motivation of the factorization is that it results in clear Nyquist plots in which we can extract basic behavior. Consider as an initial introduction FIG. 130 where the left contour represents the Nyquist locus when the system is calibrated, and the black dots indicating the frequency points on the Nyquist locus of the desired center frequency of the ATLF passband. FIG. shows Nyquist locus at calibration 13010, operating point 13012, desired center frequency 13014, operating center frequency after antenna impedance change 13016, and Nyquist locus at actual operation 13018. The green dot represents the operating point which is essentially 1/G and is based on the setting of g and p. As described above, the operating point is based on the criteria. It has to reside outside of the outer encirclement of the Nyquist locus for stability. The closer it is to the Nyquist plot the higher the Q enhancement. On the negative real axis segment, as g increases, the operating point moves to the right closer to the origin. Likewise for the operating point on the positive real axis segment, as g increases, the operating point moves to the left, getting closer to the origin. Eventually g will be large enough that the operating point will cross the Nyquist locus which is the point of infinite Q enhancement and also the point of instability.

Figure 130:
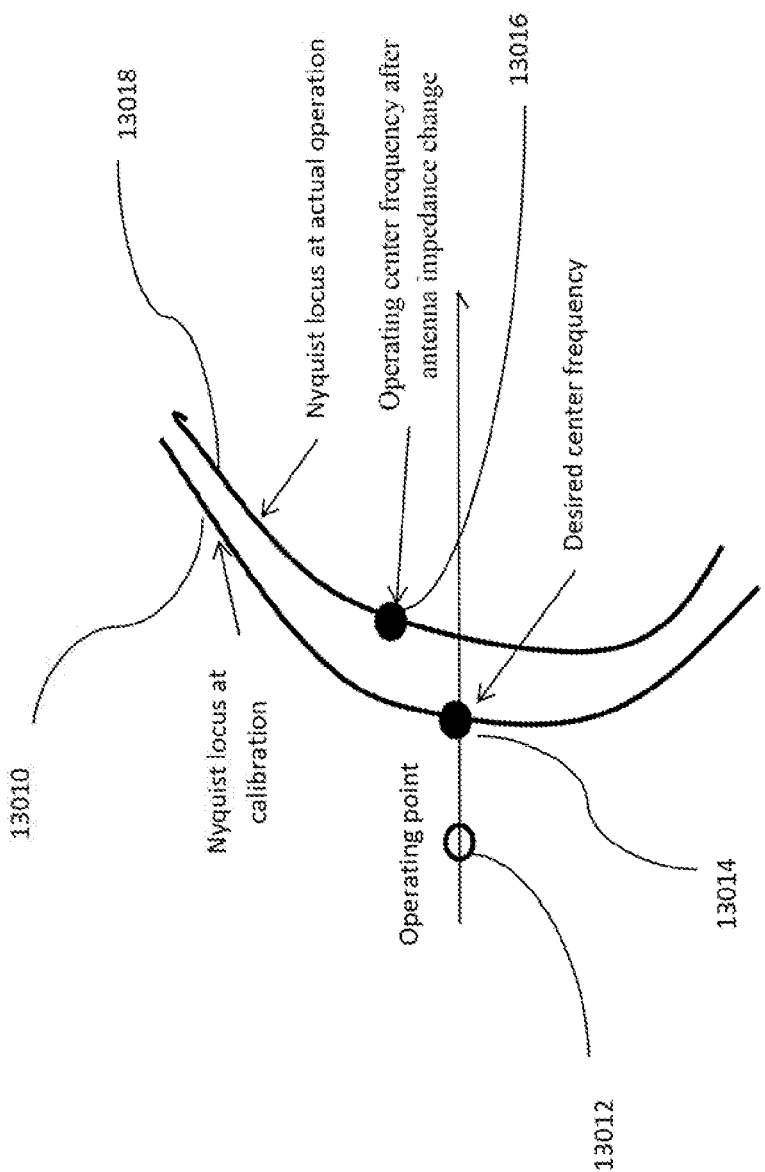
Figure 131:
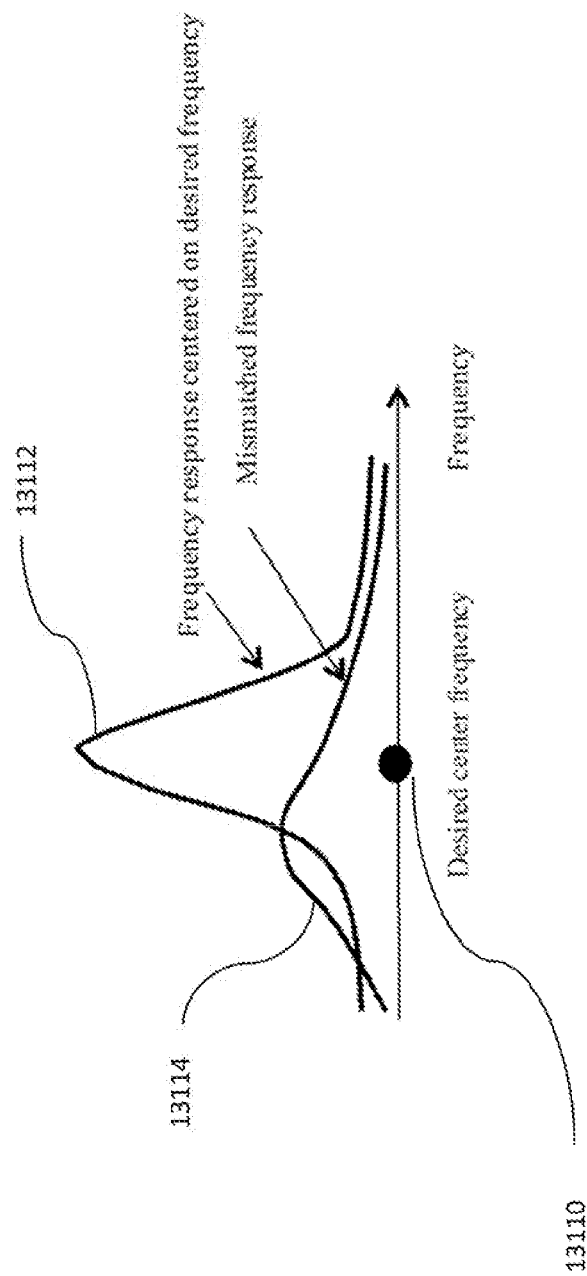

Now consider a small change in the antenna impedance (or other effect) that results in a modest shift in the Nyquist locus to the right contour of FIG. 130. Also, there is a shift in the desired operating frequency. This shift in the Nyquist locus results in a change in the passband characteristics that can be sketched as shown in FIG. 131, where the Q enhancement has dropped significantly, and the passband is misaligned. FIG. 131 shows desired center frequency 13110, frequency response centered on desired frequency 13112, and mismatched frequency response 13114.

Figure 132:
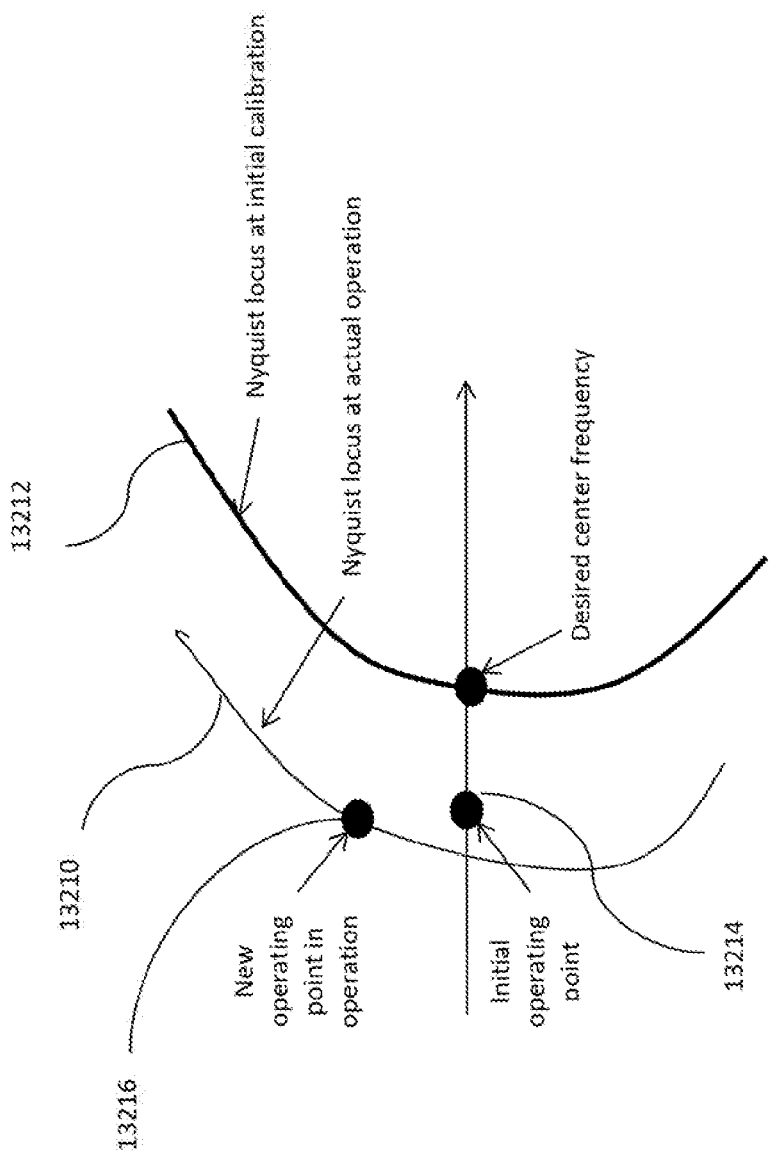

A worse scenario is that the ATLF becomes unstable with the change in antenna impedance as illustrated in FIG. 132. FIG. 132 shows Nyquist locus at actual operation 13210, Nyquist locus at initial calibration 13212, initial operating point 13214, initial operating point 13214, and new operating point in operation 13216. As illustrated, the left contour of FIG. 132 shifts to the left such that the Nyquist contour encircles the operating point. Now the ATLF becomes unstable and hence begins to oscillate at a frequency generally independent of that of the desired signal. With enough Q enhancement, the operating point is relatively close to the Nyquist locus such that there is always a chance of oscillation with a slight perturbation of the antenna impedance. From this Nyquist plot visualization, we can clearly state the objective of the ATLF control algorithms.

ATLF Control Algorithms Objective:

Maintain the operating point a fixed distance from the Nyquist contour and maintain the desired frequency point of the Nyquist locus such that it coincides with the intercept point on the real axis.

Idealized ATLF Consisting of a Non-Reactive Antenna and Loop with Controllable Delay We first assume antenna is real with no reactance: ATLF is pure delay that is controllable to provide the appropriate phase shift. Then we have $H_{OL}(s|g,f) = G(g)H(s) = G(g)re^{-j\omega T(f)}$ where the delay T is monotonically decreasing as f increases. The Nyquist locus is a circle where G(g)r is the radius. Hence we have a redundant specification when it comes to the radius. We know that oscillation will occur when $G(g)r \geq 1$ at some frequency. In reality, G(g)r cannot exceed unity as the oscillation amplitude will increase and the gain block will start to saturate. For the sake of control, we will assume that we know exactly the level of g that causes G(g)r=1. We also know the shape of the function G(g) sufficiently accurately, but not the scaling offset. The shape may be known from the chip design to within a few percent, which is sufficiently accurate. However, we have to know the scaling very accurately as there is but a small difference between a highly Q enhanced stable state and unstable oscillation. Hence this scaling is only known through calibration. To simplify the control we arbitrarily assume that r is exactly unity and that any difference is absorbed in G. We can now meaningfully scale G via calibration such that G(g)=1 exactly for the value of g that just starts the oscillation condition. Then as the shape of G(g) is known, then we have a sufficient characterization of the loop gain.

Next we need to characterize T(f). As with G(g) it is reasonable to assume that the shape of T(f) is known to within a few percent, but the scaling is not sufficiently accurate. However, we know that when oscillation occurs that the frequency can in principle be accurately measured relative to the clock crystal time. Hence the frequency of oscillation will be given by the ambiguous possibilities of $\omega T(f) = 2n\pi \quad n=0,\pm 1,\pm 2,\ldots$ In this idealistic ATLF consisting only of a pure delay, all of the infinite set of frequencies are possible. However, the practical ATLF will reasonably only have a sufficient open loop response over the desired tuning range. Hence, we will assume that only one frequency component is active. If the baseband processing following the ATLF was sufficient then we could envision a wide bandwidth type Fourier based analysis possible where the oscillation frequency could be observed directly after down conversion. However, this is not in line with the very low power processing that is considered inherent in ATLF based network sensor applications. A suitable circuit may be the diode power detection circuit as shown in FIG. 133.

Here we have an RF diode power detector immediately following the ATLF that is sufficiently wideband to detect any oscillation within the tuning range of the ATLF. The ADC may be a simple one-bit threshold comparator. This detector is wideband but does not have to respond quickly and hence the detector circuit with ADC will consume very little power. The ATLF output would typically be down-converted for further processing of the baseband signal in order to demodulate and decode the signal. This could be zero IF, near IF, or complete with a full IF stage before converting to baseband. It only matters that there is a low pass filter (LPF) preceding the baseband signal power detector. Again, this detector of FIG. 133 is a simple diode detector with an ADC sampling the output that may be relatively slow and as simple as a single bit comparator. Note that this too is a very low power and low complexity detector. FIG. 133 shows ATLF 13310, down conversion 13312, LPF 13314, baseband signal power detector 13316, ADC 13318, RF power detector 13320, ADC 13322, reference crystal 13324, and LO synthesizer 13326.

The RF detector allows us to determine the onset of oscillation and gives us an accurate assessment of g that satisfies G(g)=1. The control f may be varied until the baseband detector lights up. At that point we have the f that satisfies the condition of the oscillation frequency at the near zero frequency of the baseband. Note that f does not have to be extremely precise. If the ATLF bandpass is centered within say 20% of the baseband bandwidth that is sufficient. Hence the low pass filter preceding the baseband detector could be 20% bandwidth relative to the overall baseband bandwidth.

In a wireless sensor networks where only one frequency is used, it makes sense that the synthesizer is fixed and only one frequency of the ATLF needs to be accurately calibrated. The sensor would know when the next packet is coming from the access node (AN) or its time slot to transmit. It can estimate this from the clock crystal time. A procedure could be to set up to do a quick tuning burst just prior to the active transceiver time slot (TTS). The TTS is defined here, in the context of the ATLF operation, as the time slot where communication is established between the AN and the sensor. Typically this would entail two-way communication, wherein the ATLF tunes to the expected carrier frequency of the upcoming packet and selects an appropriate bandwidth for this. Then there is a retransmission portion of this packet where the ATLF applies coded phase modulation to the retransmitted signal. Variants of this could be that the sensor is in receive mode only for that particular packet and shuts off in the retransmission portion. Another option is that the ATLF is driven into an oscillation mode at the correct frequency and transmits autonomously and not based on receiving a packet from the AN. Note that this is autonomous mode is possible but requires careful calibration first to set the transmission carrier frequency correctly. More detail will be included of the modes of the TTS in the protocol document.

In any case, when the ATLF is receiving a data packet from the AN, confirmation of correct tuning may be established by some form of SNR metric with is an ancillary output of the digital demodulation and hence is not an additional ATLF imposed complexity requirement.

In a more typical frequency hopping scheme, calibration is performed over the predetermined set of frequencies. We may choose different schemes for calibration. Note that the g required to satisfy G(g)=1 for oscillation is an approximation, and that typically there would be a dependence on f also. For the ATLF based on pure delay as in the initial example here, there is no frequency dependence. However in more practical implementations as will be described there will be such that we have G(g,f)=1 needed to be satisfied at each frequency of the hopping sequence.

If the hopping bandwidth is relatively small, then it is likely sufficient to calibrate only the two extreme edges of the band and then assume that a linear interpolation is sufficiently accurate. If this is not sufficient, then a quadratic parabolic curve fit over f and g is possible with three calibration frequencies. Many options are possible. We may have a set of N>3 calibration frequencies and then do a least-squares fit over the parabolic polynomial coefficients. We may do a spline curve fit based on overdetermined least squares fit and so forth. The objective would be to have a tracking scheme that periodically does a calibration at a particular frequency. This update is then added to the overall least squares solution of the curve fitting. These coefficients are stored in a LUT that is used for interpolation of g and f for each new upcoming transceiver slot.

The overall ATLF based transceiver may be implemented as shown in FIG. 134. FIG. shows antenna 13410, LO synthesizer 13412, reference crystal 13414, LPF 13416, ADC 13418, microcontroller 13420, LUT 13422, baseband signal power detector 13424, LPF 13426, down conversion 13428, control (DAC) 13430, RF power detector 13432, and ATLF 13434. The antenna is part of the ATLF which initially filters the signal that is subsequently down converted and processed in the baseband. An ADC samples the signal and the two detector outputs and the digitized information passed onto the controller. The controller would typically be a highly specialized ASIC and not a general purpose controller as indicated. However as the focus here is on the ATLF control and not on the implementation of the signal demodulation and decoding we just leave it as a generic controller processing block. Feedback to the ATLF is the three controls of {g,f,p} as shown. In terms of power consumption, it may appear that there is significant overhead in terms of processing to keep the ATLF tuned which undermines the drive for low power consumption of the overall circuit as facilitated by using the ATLF. However, the ATLF control is intermittent. Initially there is the calibration and populating of the LUT that consumes energy. However, maintaining this depends on the scenario. Only in active dynamic scenarios is it necessary to continuously track the ATLF and update the LUT. In more static cases there may be long intervals between calibration updates. FIG. 135 shows the time sequence for the active ATLF calibration referenced to a data packet receive epoch.

Incorporating a Reactive Impedance Antenna

For the present case we have simplified orthogonal control in that g controls the movement along the real axis and f the rotation of the Nyquist circle locus. In reality, the situation will be more complex. For example:

The loop gain may be a function off as the pure controllable delay and purely resistive antenna is exchanged for a more implementable resonator and more realistic antenna model.

Also, the gain block may have some gain magnitude frequency dependence and phase shift that is that is weakly dependent on gain.

The factoring of $H_{OL}(s|g,f)=G(g)re^{-j\omega T(f)}$ is not quite this clean.

Assume that the antenna can be represented by a series LRC model that resonates at normalized $\omega=1$. The ATLF loop now consists of the reflection coefficient of the antenna and the pure variable delay of the feedback loop, both of which are frequency dependent.

As shown above, one choice of an antenna model is a series resonance circuit with an impedance of $$z_a = R + sL + \frac{1}{sC}$$
$$= \frac{L}{s}\left(s^2 + s\frac{R}{L} + \frac{1}{LC}\right)$$

The reflection coefficient assuming that R, L and C are normalized by the characteristic impedance is $$\Gamma_a = \frac{z_a - 1}{z_a + 1}$$

which is expanded as $$\Gamma_a = \frac{\frac{L}{s}\left(s^2 + s\frac{R}{L} + \frac{1}{LC}\right) - 1}{\frac{L}{s}\left(s^2 + s\frac{R}{L} + \frac{1}{LC}\right) + 1}$$

$$= \frac{s^2 + s\frac{R-1}{L} + \frac{1}{LC}}{s^2 + s\frac{R+1}{L} + \frac{1}{LC}}$$

First notice that with a lossless antenna where R=0, then $\Gamma_a$ forms an all-pass circuit that is completely lossless with unity magnitude gain and a phase that changes quickly at resonance. We specify the antenna with R L and C such that $\omega_a = 1/\sqrt{LC}$. Note that $$\frac{R+1}{L} = (R+1)\frac{1}{\sqrt{LC}}\sqrt{\frac{C}{L}}$$

Let $$\sqrt{\frac{L}{C}} = 1$$

which is essentially an impedance normalization such that $$\frac{R+1}{L} = (R+1)\omega_a = 2D_{a,den}\omega_a$$

The reflection coefficient denominator damping becomes $D_{a,den} = \frac{1}{2}(R+1)$ and the numerator damping becomes $D_{a,num} = \frac{1}{2}(R-1)$ Hence we can specify the antenna by R and $\omega_a$. With this choice of antenna model and selecting a delay of $T(f) = \pi$ we get the Nyquist plot as shown in FIG. 136. Note that it is impossible to tune to the desired frequency of $\omega=1$ as this point is inside the outer encirclement of the Nyquist plot. The plot is correct in that the antenna is matched at $\omega=1$, and this is also the point where we get the minimum $|\Gamma_a|$. Note that on either side of $\omega=1$, $|\Gamma_a|$ increases as the reactance of the antenna increases. Hence the ATLF may not be realized with a pure transport delay or an all pass filter for that matter. We need the antenna resonator in the feedback loop to bring out the desired operating point on the Nyquist locus so that it is in the outer encirclement.

Consequently, to mitigate a real-world reactive antenna, we need to go to the ATLXR implementation that incorporates the ATL3 version of the ATL, hereinafter referred to as the ATLF3. With this we have the desired Nyquist locus as shown in FIG. 137 where the desired operating point (circled on the real axis) is on the outer encirclement.

Antenna Impedance in the Presence of Near Field Scatterers

Until now we have considered the antenna as having a specific lumped component equivalent model consisting of a radiation resistance and a reactance. For an electrically small antenna in isolation this may be a lumped series inductor or a capacitor that is a sufficient model over a relatively small bandwidth of 10 percent or less. For larger tuning bandwidths it may be necessary to add a series capacitor also to the model. With this, we get the antenna reflection coefficient that consists of two poles and two zeros as described before. What is not included in this model is how the antenna interacts with its immediate surrounding environment. Suppose that there is a reflection that occurs with a relatively long delay caused by a secondary scattering source a few wavelengths from the antenna. Hence at 5 GHz with a 6 cm wavelength this could be a metal reflector of sorts that is some 20 cm from the antenna. This is illustrated in FIG. 138, showing objects 13810, antenna 13812, antenna ground plate 13814, and antenna port 13816.

We can simulate what the effect of the second path of scattering off of the near field objects by assigning a transfer function that is pure scaling plus a delay and adding this to the main antenna reflection coefficient. FIG. 139 shows the complex Nyquist plot of this. The left plot is with no near field scatterers such that the antenna reflection is determined simply by the isolated impedance of the antenna, as would be measured in an anechoic chamber. The center plot adds a scatterer modeled as an amplitude scaled delay. The right plot shows the detail around the center plot point where the real axis is crossed, which is where we assume the 1/G point is located.

Until now we have considered real valued gains such that the phase of G is either 0 or degrees. However, we can consider 1/G to be general and complex so can be located anywhere in the Nyquist plot. In determining the frequency response, it is assumed then that 1/G operates on the positive frequencies and the conjugate of 1/G* works on the negative frequencies. However, as the stimulus and output are both real and that the antenna is a real component that we only need to determine the frequency response from 1/G and the positive frequency locus of the Nyquist plot and then finally take the real part of the output.

Now we can see what happens when 1/G is moved along the real axis and the positive frequency Nyquist locus has loops as shown in FIG. 140. In position A the frequency response will be a relatively low Q peak corresponding to the frequency of the skew line shown. As G is increased the operating point moves to the left and at point B we suddenly see a shift in the passband frequency peak. It is not possible to tune to a frequency on the far side of the loop. Hence higher Q frequency tuning in the presence of scatterers will not work but will appear jumpy.

To further complicate matters, the effect of phase shifter control is illustrated in FIG. 141. Phase shift control moves the whole pattern approximately up and down. Suppose our 1/G operating point is as shown. Then as the phase shifter moves the pattern down and initially causes the frequency of the passband to tune smoothly as desired. Then the Nyquist loop is encountered, causing the peak at a lower frequency to pop up and become dominant. The tuning is not smooth but is jumpy. The frequency jump may easily be many times the bandwidth of the ATLF such that the signal tracking will appear to be lost.

Note that even with coordinated phase and gain manipulations, there is no way to implement smooth tracking over a Nyquist loop as shown. Let us next determine how this affects the tunability of the ATLF.

A series of experiments were performed to measure the impact on the antenna on near field scattering using an unmatched monopole antenna. This test antenna was connected to a calibrated network analyzer and swept between 5 to 6 GHz. The test antenna was held above a workbench with a laminated top and significant metal components in the area. It was held in roughly a horizontal orientation above the desk surface at a height of about 45 cm and moved slowly down in height to 20 cm above the table surface.

In FIG. 142, we show the Nyquist locus of a representative data set, and show a set of complex values for 1/G. We may adjust the gain and the phase of the control where gain affects 1/G on the real axis and phase moves the locus loop up and down. Alternatively, we may leave the locus where it is and assume a complex 1/G with the understanding that we only work on the positive frequencies and that the phase shifter control does change the shape of the loop a little but for the deviations considered here this is a good approximation.

Consider the signal loop consisting of the antenna, a phase shifter and an attenuator. The objective is that we want to smoothly tune the frequency over a modest relative range but we can only place the 1/G point outside of the encirclement. Hence let us see what range of tuning we can get with a set of 1/G points as indicated in FIG. 142 by the dots. The frequency response is approximated as $$H(f) = \frac{1}{\left|\frac{1}{G} - H_a(j2\pi)\right|}$$

The frequency responses corresponding to each of the 1/G operating points are shown in FIG. 143. First of all, these responses are multi-modal such that there will be spurious noise frequency bands that get into the receiver. These spurious responses may potentially be cleared up with bandpass filtering applied downstream from the ATLF, but the bigger problem is that it is difficult to smoothly tune over a reasonable bandwidth. Also, this bandwidth of tunability depends entirely on the response of the antenna. Hence if we see loops like this then it is difficult to achieve any tuning and the control may be frustrated.

A far better solution, as discussed below, is to implement bandpass filtering in the loop with the antenna using the circuit shown in FIG. 144 that is based on the variable analog ATL3. FIG. 144 shows antenna 14410, 4 port coupler 14412, resonator blocks 14414, and variable gain block 14416. With this implementation, the frequency response of this experiment with scattering off of the near field objects is shown in FIG. 145 that shows that a closed loop passband may be generated that is Q enhanced at the desired frequency. This may be done for all of the frequencies over the range of 5-6 GHz. Hence with the complication of adding the ATL3 like resonators we have solved the tunability problem created by the presence of near field scatterers.

Frequency Tuning the ATLF

As described in the ATLF control section above, there is an issue with tunability when:

The antenna is significantly mismatched; and

Has a delayed component of the reflection coefficient that is due to the antenna interacting with scattering components that are in close proximity to the antenna.

With the standard ATLF loop, it is not always possible to achieve sufficient Q enhancement across the band that is to be tuned. Hence the tuning will appear choppy and may on occasion result in instabilities that force the Q enhancement to back off. An option for reducing the effects of this problem may be to put resonators tuned to the desired frequency within the loop.

A method of visualizing the potential instabilities and issues with tuning is to consider a Nyquist locus of the open loop response. The open loop transfer function value at the desired frequency must appear outside the loop of the Nyquist locus. That is, there can be no encirclements of the segment of the open loop transfer function corresponding to the desired tuning range. Any point in this segment that is encircled—within the Nyquist loop—may not be Q-enhanced appropriately.

To achieve smooth tunability, it is therefore necessary to emphasize the portion of the Nyquist locus corresponding to the tuning range. If resonators can be tuned to enhance the currently desired frequency of ATLF operation, then the corresponding region of the Nyquist locus can be relatively emphasized by pushing that specific region of the Nyquist locus further out while shrinking the other components towards the origin of the complex plane.

While we may be able to achieve this with a single resonator of moderate Q, a better solution that is likely easier to implement is a triple resonator as a third order bandpass filter or a sequence of three lower Q resonators that are tunable. Furthermore, if we detune the resonators slightly then a separate phase shifter is not required in the loop. This then looks like a combination of the ATL3 (without phase shifter) and the ATLF that is referred to as the ATLF3.

FIG. 144 shows a block diagram of the ATLF3 using three cascaded resonator blocks and a variable gain block. Note that no phase shifter is included as detuning the three resonator blocks may provide adequate phase control as shown above. However, as discussed above, it is convenient to include a gain polarity control as part of the variable G. This reduces the amount of detuning necessary for the resonators and thereby results in a better-shaped passband. Having three resonators seems to be the correct number as a) two resonators is insufficient as too much resonator detuning will be required for some antenna impedances for satisfactory frequency tuning control, and b) four resonators is excessive complication.

Figure 121:
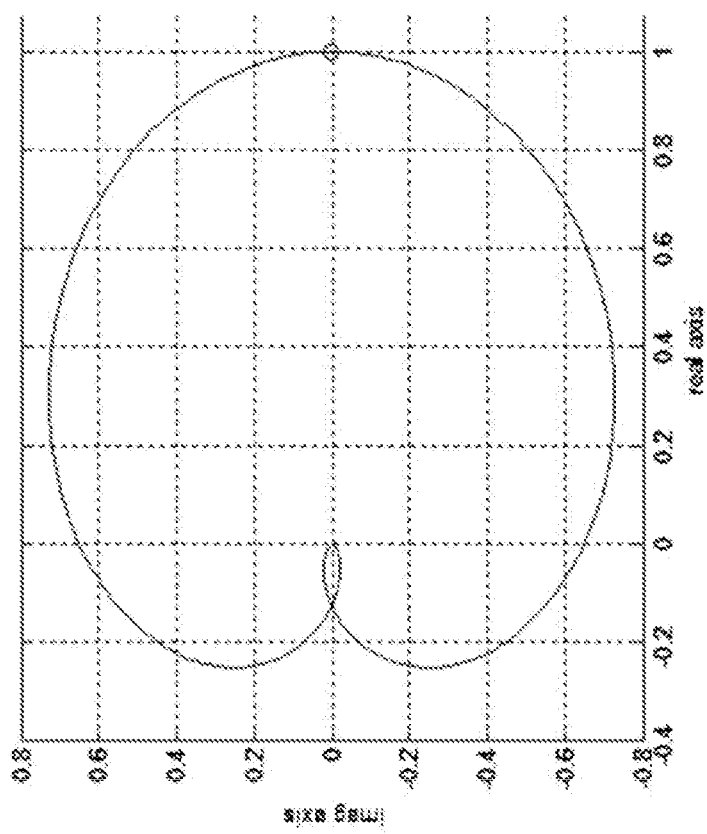

To develop the tuning of the ATLF in frequency, initially consider the simplified case of a non-reactive antenna and no parasitic delay in the ATLF loop. We begin with the open loop response of the cascaded three resonators as shown with the Nyquist locus as shown in FIG. 121 with the circle indicating the resonance frequency is normalized at ω=1 rad/sec point. Here the damping is 0.1, which is a rather low Q resonator with a Q of 5.

As the antenna is real (non-reactive) in this example, so therefore is the antenna reflection coefficient real. If the real antenna impedance is less than that of the characteristic impedance, then the reflection coefficient will be negative and a negative G would then be selected by polarization switching described above to approach the Nyquist locus from the right hand side. Note that the only element dependent on frequency is the resonators themselves that may be tuned to an arbitrary frequency. Consequently, the desired frequency of the Nyquist locus may be set to coincide with the real axis intercept point and smooth tunability is assured.

Next consider that we add transport delay such we have a parasitic phase shift that increases with frequency. With a transport delay of $T=1\omega=1$ the Nyquist locus of FIG. 122 results. Note that due to the transport delay that there will be a shift in the passband of the ATLF as indicated by the point at $\omega=1$ that is shifted.

We can retune the ATLF3 by detuning the three resonators for which we have two options.

Figure 123:
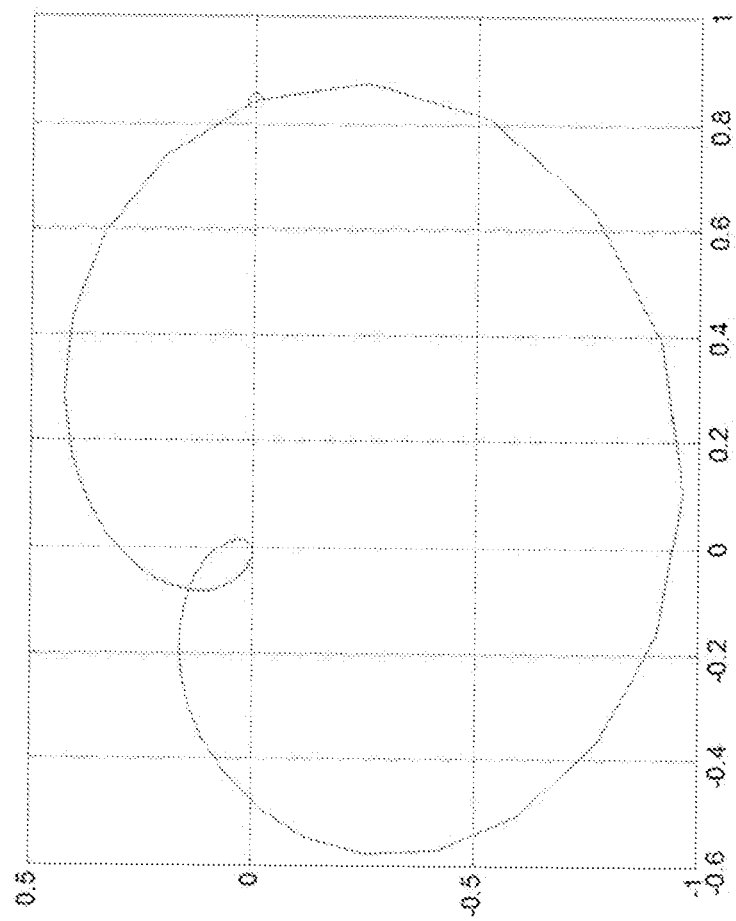

The first option is to increase the resonance frequency of the resonators by about 4% to $\omega_r=1.037$ resulting in the open loop response of FIG. 123. Note that the resonance is on the real axis such that and increase in |G| will give arbitrary Q enhancement. The locus and the real axis are reasonably perpendicular to each other such that the AM/PM (amplitude modulation and pulse modulation) noise will not be an issue. The polarity of G depends on the resistance of the antenna. So if the real part of the antenna impedance is greater than the characteristic resistance of the interconnecting transmission line then the reflection coefficient is real and positive such that G>0.

Figure 122:
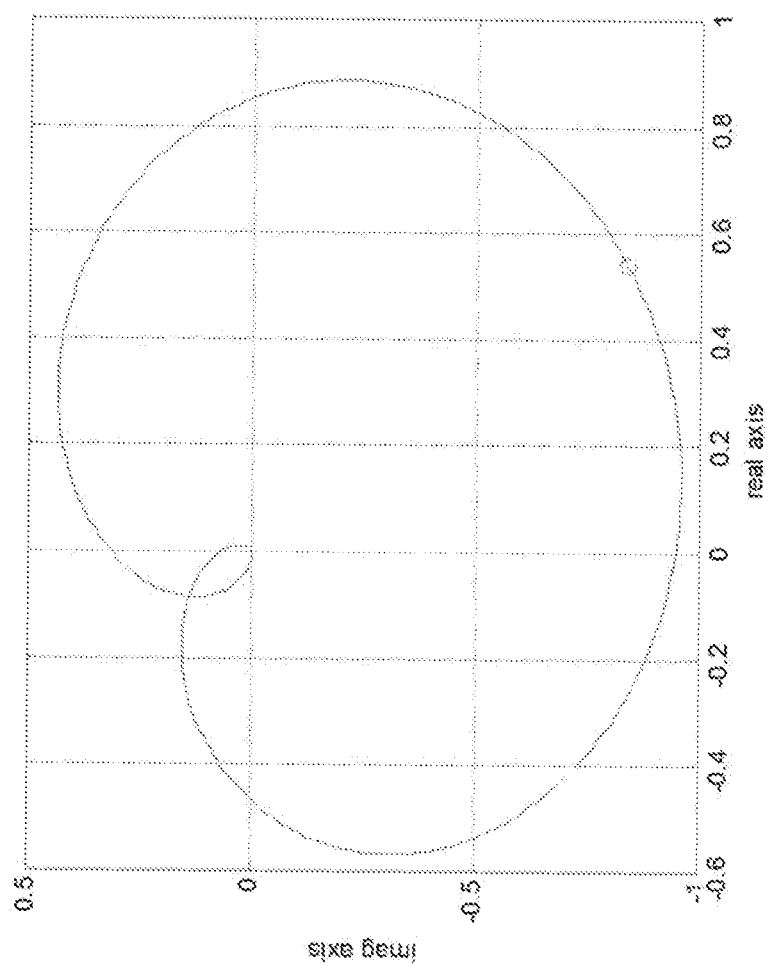
Figure 124:
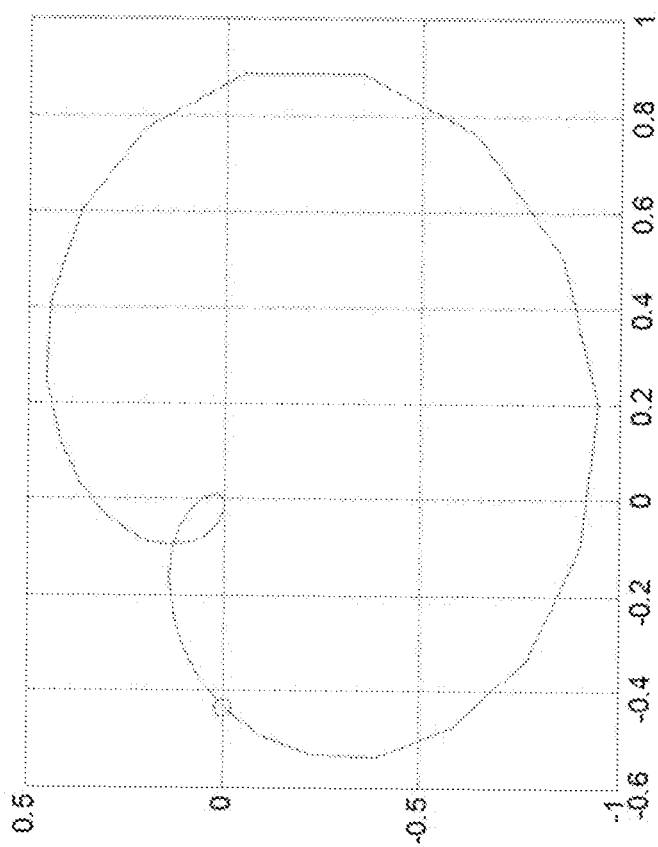

The other choice is to use the intercept of the negative real axis in FIG. 122 for which we have to use G<0 if the antenna resistive impedance is larger than the characteristic impedance. (G>0 if the antenna resistance is less than the characteristic impedance). Now we decrease the resonator $\omega_r$ by about 8 percent such that $\omega_r=0.919$. The result is shown in FIG. 124. The difference in these two solutions is in the angle that the locus makes with the real axis: the more perpendicular the slope is to the real axis, the more symmetric the passband will be around the desired frequency. If the angle between the locus and the real axis is small (such that the locus and real axis are becoming collinear) then the AM to PM noise will become excessive.

Figure 125:
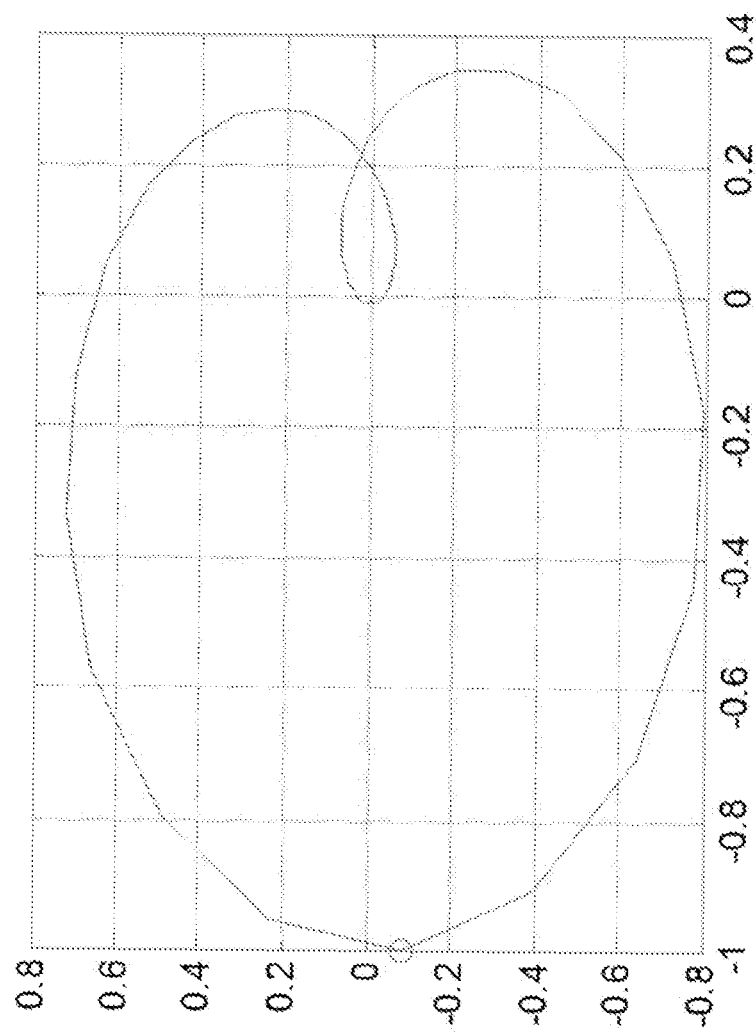

FIG. 125 shows the Nyquist locus for a large parasitic delay of 3 radians. As we have $\omega=1$ in the current example then we have a parasitic phase shift of 3 radians which is almost 180 degrees as is seen in FIG. 125. As the desired frequency point is already very close to the negative real axis intercept point, it does not make sense to try to use the positive real axis interception point. We only need a small amount of detuning of less than 1% to get the operating point aligned with the negative real axis.

In the above examples we have antenna and the resonators are all tuned to a normalized $\omega=1$ as the desired operating frequency, which is not what we will experience in a practical implementation. If we changed the resonant frequency of the antenna, then we have to detune the three resonators and select the polarity switch accordingly. In the following example the antenna resonance is at $\omega_a=2$ which is realistic for an electrically small antenna. The resonators are set at $\omega_r=1.042$ and p is set to 1.

Figure 126:
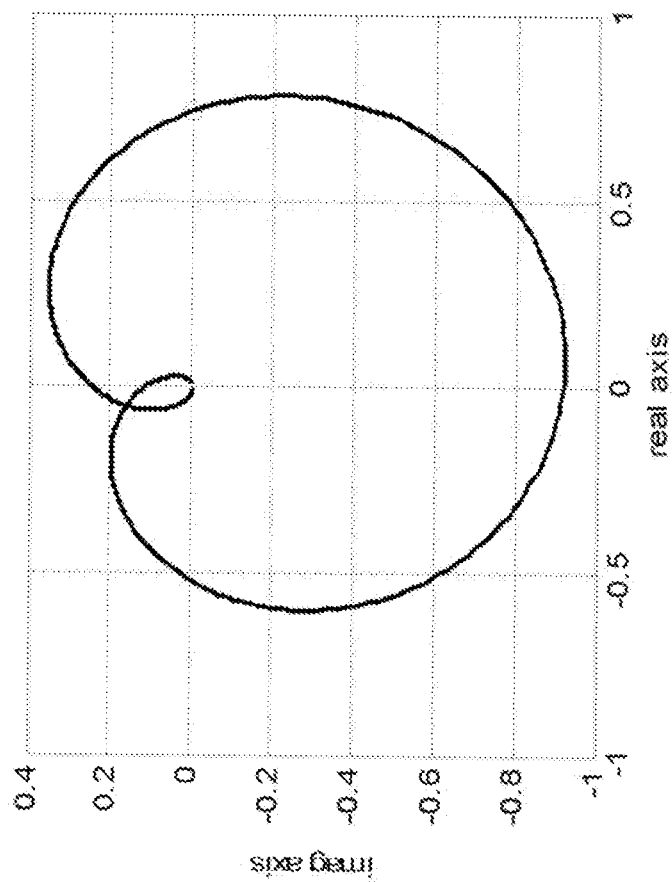

FIG. 126 gives the Nyquist locus of the ATLF3 with the detuned resonators. Note that the consequence of the detuning is that the Nyquist locus is no longer perpendicular with respect to the real axis. This couples the g and f control. In contrast, the Nyquist contour in FIG. 121 is nicely perpendicular.

While it is simple to draw Nyquist plots, the question is how the automatic tuning is done. As discussed above, there are two choices of tuning corresponding to the two Nyquist points on the real axis. Note that a change in f will change the shape of the Nyquist contour as the antenna is not affected by f but is dependent on frequency.

Figure 127:
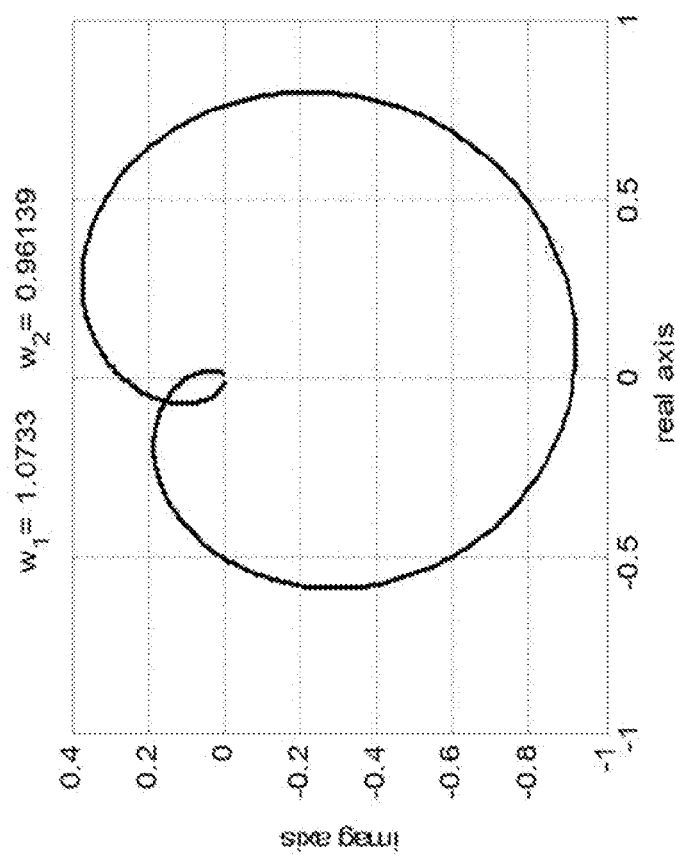

Let us trace through a tuning procedure for this case. Start with $\omega_a=2$ and $\omega=1$ with the objective being a passband centered at $\omega=1$. $\omega_r=1$ in this example is just the nominal starting point for the f control. Say f=0 sets the resonators up so that they are roughly in the middle of the tuning band. The initial Nyquist plot is shown in FIG. 127 with the two possible resonance frequencies as $\omega_1=1.07$ for p=0 (negative real axis) and $\omega_2=0.096$ (positive real axis). These may be determined by setting a p of 0 and increasing g until oscillation is determined and then setting the synthesizer to be responsive to these two frequencies in sequence. This determines $\omega_1$. Then set p to 1 and repeat to find $\omega_2$.

Of course, the synthesizer may not be so general as to allow a frequency sweep as required to find $\omega_1$ and $\omega_2$. Assume the case where the synthesizer is set to the channel frequency of $\omega=1$. In this case the control off is varied first in one direction and then in the other for p=0 and p=1. Then choose the operating frequency with the minimum relative change in f. The point is to minimize the detuning of the resonators based on the choice of p. There are cases where the antenna is subject to near field scattering effects there the Nyquist locus will have parasitic loops such that may cause issues if they occur close to the operating point. In such cases the choice with the large detuning may actually be the better choice. However, without more visibility of the Nyquist locus this decision may only be made blindly.

An illustration of potential problems is shown in FIG. 128, having operation point 12810 and loop 12812. Here we have the operating point close to a loop in the Nyquist locus. Because of the loop as f is changed slightly, the center frequency will appear jump discontinuously. This will create problems for the tracking which if done in a reasonable way will give a compromise tuning with two passbands in this case. The three resonators of the ATLF3 significantly reduce the possibility of these loops from occurring near the operating point. However, the possibility of this type of situation is difficult to eliminate and therefore the tracking algorithm is preferably sufficiently robust in such cases providing at least a compromise solution as opposed to one that loses track.

It will be understood that the analysis provided above is for the purpose of providing a better understanding of the principles and theory involved in the operation of an improved filtenna. Depending on various considerations, such as the actual circuit elements used, the intended use, the preferences of the user, manufacturing steps, etc., practical implementations may be possible that only use some of these considerations, while still falling within the circuit design described herein.

Calibration of the ATLF

Single Frequency ATLF Calibration Procedure

An example of a procedure for the ATLF calibration under single frequency operation, assuming that there is no prior calibration done, is given below. Other procedures may also be possible. is preferably calibrated by the ATLF. Doing so gives us a vector of settings for f and g as a function of the hopping frequency. One calibration procedure may calibrate for each of the hopping frequencies as though they were a single frequency. However, another more efficient procedure may also be used.

The obvious improvement is to calibrate the frequencies in sequence and realize that the change in f and g from, say, a lower hopping frequency to the next higher hopping frequency is very small. In one general embodiment of the ATLF, it may be convenient to consider three states as:

Transferring Information by ATLF Modulation of a Received Signal to be Re-Radiated from the Coupled Antenna As the ATLF antenna and ATLn resonators are in the same loop, the ATLF has the unique feature of being able to inject data encoding modulation into the signal loop containing the coupled resonators. This results in the overlaying of information onto the antenna reflection signal, as shown at high level in FIG. 163. FIG. 163 shows source transmitter/access node 16310 in communication via transmitter signal 16312 with ATLF 16314. Source transmitter/access node 16310 has data output 16316, receiver (echo demod) 16318, transmitter 16320, antenna 16322, and circular coupler 16324. ATLF 16314 has antenna 16326, ATLn 16328, data input for modulation 16330, and output to receiver 16332.

Based on the rather unique property of the ATLF—that there is strong re-radiation from the antenna—we may implement what is essentially an antenna re-radiation enhancer. Strong re-radiation is not usually considered to be an advantage. For a low cost, low power two-way sensor network, however, this may be a significant system enhancement enabled by the ATLF in some circumstances.

When operating in this mode, the general ATLF functionality is augmented in that:

The ATLF, via the coupled antenna, is continuously in a two-way full duplex mode, where it is both:

Receiving a sensor interrogation request from a sender; and

Simultaneously transferring sensor data back to the sender.

The ATLF operates not as a transfer device between the antenna and a transceiver, but in a mode where an interrogator signal is detected and a specific sensor information string is modulated onto the antenna reflection in response to the interrogator, thus transferring information to the interrogator without requiring a transmitter.

An ATLF that enhances the re-radiation behaves as a type of wireless RFID wherein some rather arbitrary combination of the ATLF {g,f,p} control may be dithered in time to modulate the re-radiation of an incoming message signal, where the response from the ATLF could be comprised of digital communication symbols representing a sequence of bits to be returned to the requester as a small, though detectable, modulation of the VSWR.

Background and Overview of Sensor Networks and the ATLF

Sensor network deployment is typically tedious and expensive, as all of the network elements have to be configured for mutual connectivity. A significant development in the recent past has been that of the ad-hoc network where the readers (R) and sensor elements (S) self-discover the connections. In this fashion, all network nodes, such as the routers and terminals of the Internet, essentially self-configure.

In this filing, we specifically consider a network of multiple R's 16410 and multiple S's 16412 as shown in FIG. 164, where the R elements may be complex, and where power consumption may not be an issue. The S elements, in contrast, have to be very low power such that they may operate with solar power and energy scavenging. The S elements also have to be very inexpensive such that they may be expendable. Ideally, they should also be self-configuring within the context of the network they are placed, and self-calibrating.

The wireless RFID was developed for such an application, except that typical deployments may only have one R and one S at a time because the physical distance between R and S has to be small in order to facilitate energy harvesting of the R emission to power the transponder circuitry of S. The small range of existing RFID technology is a significant limitation that this filing will overcome.

Applications for low power, low cost sensor network modules are wide-ranging, with some examples including, but not limited to:

A lane marker (LM) application that enables precise absolute position of a moving vehicle relative to the absolute location of a driving lane. If the vehicle location history is stored within the vehicle, this history may be read by overhead transponders, as in toll road readers, with specific vehicle location history transferred as desired, for example, to both Traffic Engineers and Policing Agencies;

A train application where sensors are placed along the track or distributed amongst the train cars that are read by the train itself, or by trackside infrastructure;

A robotic vehicle application where precise relative positioning of such robotic vehicles to infrastructure waypoints is required for warehousing operations;

A health care setting application where a number of readers (nurses station, individual iPad readers, and the like) and a number of patient health monitors, including Smart Bandages, may be implemented for either hospital or home environment;

Infrastructure sensors may be distributed on bridges to report mechanical stresses and vibrations as well as provide information about height clearance information for vehicles equipped to read such information;

Agricultural stand-alone sensors could provide soil pH and moisture content over large area, read by overhead drones;

In regions where avalanche and mudslides are a threat, sensors may be distributed across a threatening slope;

Distributed pipeline sensors, powered by a modest solar cell, where pipeline status information may be readily transferred to a passing drone or vehicle without using any RF transmitters.

In this disclosure, we will focus on the specific lane marker application of the subject RF network module as an element in the Autonomous Vehicle (AV) solution. The methodology presented will apply to all applications of this technology.

Autonomous Vehicle (AV) Overview

Vehicle-to-vehicle (V2V) and Vehicle-to-Infrastructure (V2I) is a rapidly emerging information field. This will be a significant factor in ushering in the era of the Intelligent Transportation Systems (ITS) where the driverless vehicle is an obvious benefit. The concept of the autonomous driverless vehicle dates back to the 1960's where specialized test tracks were lined with wireless beacons, while electronics embedded in the Autonomous Vehicle (AV) tracked these beacons.

Armed with current technology, AVs have proven to be feasible, even without roadside infrastructure. Computer vision sensors and processing combined with extensive street maps of high detail have proven sufficient to a limited extent. Such initiatives have ushered in the beginnings of the AV era. However, the present car-based AV system is not scalable. For instance, if every AV in high-density freeway traffic sported a rooftop LIDAR, then there would be so much interference that the system would fail. Also, in common and important situations where visibility is impaired such as in fog, snowstorm or heavy rain, camera and LIDAR based systems become useless. Hence wireless RF signaling is virtually a necessity, as RF signals are not significantly impacted by poor visibility.

In terms of wireless signals, GPS is an obvious choice. While this may assist the driver in getting to a destination, it is not of sufficient precision to maintain the position of the vehicle within a driving lane on a freeway—a positioning requirement that needs to be within 10 cm. GPS satellite sources are too far away to provide such accuracy without a heroic amount of processing and cooperative signaling applied which is completely impractical from a cost perspective, to say nothing of GPS latency issues that would render any GPS based system ineffective in a moving car. Again, the obvious solution is to have wireless roadway/roadside infrastructure such as smart RF positioning markers and signposts.

Now that Intelligent Transportation Systems (ITS) development has started, so has the inexorable drive towards facilitating the AV. This means highways will be supplied with wireless infrastructure to keep the AV accurately positioned within its lane. This infrastructure development will be expensive and will require years to fully implement.

As a first application, inexpensive but precise, vehicle positioning system augmentation, enabled by the technology of this disclosure, may be injected into this vehicle information space on a stand-alone basis and may be of use not only in ushering in this future, but for providing immediate value for vehicle operations and safety.

Consider the communications protocol where the system only transmits when requested to do so. An access node (AN) may send out a request signal on a coordinated frequency for which the ATLF is tuned. The ATLF naturally re-radiates this signal due to the high coupling between the antenna and the ATLn. This coupling may be effectively encoded onto the modulated antenna reflection by modulating the varactor diode in the ATL1 with the data. An AN with a built-in coupler of some type, detects the signal from the ATLF and readily demodulates the data. In this way we have full duplex data communication to a wireless sensor in a bandage, for example, without actually using a transmitter, saving the power that would normally be required from a transmitter. At the system level, this affords significant cost savings, reduction in size, and performance enhancement. This architecture is illustrated in FIG. 163.

The ATLF and the Smart Highway

A second application for the modulated antenna reflection enhancer could be its use as a roadway lane and/or roadway edge marker. Here the vehicle sends out a signal that the ATLF sitting in the lane marker picks up and re-transmits back to the vehicle with gain, as the vehicle transceiver picks up the modulated antenna reflection and decodes the information content of the modulated antenna reflection. The ATLF is operating in this mode at very low power and provides safety assisting data transfer with an enhanced range driven by the ATLF gain.

For road signs needed for autonomous vehicle signaling and information transfer, the ATLF modulated antenna reflection data content is much higher than for the roadway lane marker application and the data modulation onto the antenna reflection is readily accommodative.

Overview of the RF Lane Marker System

An example of an implementation as a lane marker system will now be described. Modifications and other implementations will be apparent to those skilled in the art.

Referring to FIG. 165, which shows AV 16510, RF positioning interrogator 16512, and RF positioning lane marker 16514, the AV is moving down the lane of a road that has been implemented with RFLM modules. The AV RF positioning interrogator (AVPI) emanates a narrow bandwidth code modulated signal that propagates forward of the vehicle. This is picked up by the ATLF/antenna loop in the RFLM, which then modulates the received signal with an added code that contains the identity of the RF lane marker. This modulated signal is fed back to the antenna as part of the loop structure, whereupon the antenna reradiates the encoded signal as part of the basic antenna reflection. The information-modulated signal makes its way back to the AVPI where it is coherently demodulated, decoding both 1) the lane marker identity; and 2) the amplitude and Doppler shift of the carrier signal that evolves as the AV approaches the RFLM. This time signature may be used to estimate where the RF lane marker is relative to the moving AV. By processing the AVPI responses from several RF lane markers simultaneously, the AV may determine its precise position within the lane.

Next consider the multilane roadway as shown in FIG. 166. FIG. 166 shows multiple RF positioning lane markers 16610, AV 16612, unique ID 16614, and roadway lane 16616. Each of the RFLMs is identified with a unique code. The RFLM ID code is directly correlated to a specific location along the road contained within an external digital map that was created when the RFLM system was deployed. Note that the RFLM code need not be too long as the identity scheme may be repeated down the road with a modulus that is related to the AV GPS position. In a plausible implementation, RFLM identities may be repeated every few hundred meters. As stated, GPS (or other location sensitive scheme) may easily resolve any RFLM identity ambiguities. Alternately, the AVPI processing may track the number of cycles to resolve this cyclical ambiguity.

As the AV is moving down the lane it will pick up the signal from multiple RFLMs simultaneously. Each tracked RFLM will provide an amplitude and Doppler profile with time such that the precise position of the AV may be robustly determined. A simpler processing scheme that is likely sufficient in terms of performance is simply operating on the envelope of the coherently demodulated signal, as will be shown. In this scheme the processing required of the AVPI is negligible, although the AVPI is not resource constrained.

An immediate issue is that there will be many AV's moving at the same time. Each AVPI will have a unique vehicle code, that could include the vehicle's VIN number among other information, as part of its signal modulation that is selected to be orthogonal. The RFLM ATLF operates in a linear fashion and merely modulates the overall superposition of multiple AVPI signals with the RFLM identity. In this way then the AVPI tracks the amplitude and Doppler signature from multiple RFLMs with minimal interference of other vehicles.

A key to this system is the redundancy of positioning signaling. Consider the freeway application where the AV is moving smoothly down the lane and observing the amplitude-Doppler response profile from several RFLMs simultaneously. The number of degrees of freedom (DOF) needed to represent the AV trajectory is small relative to the number of RFLM signatures that may be observed. Hence there may be a large percentage of missed RFLM's without compromising the AV position estimate. Furthermore, even partial RFLM signatures may provide information towards the vehicle tracking.

What is more, each AV, whether in autonomous mode or not, will be determining precise vehicle position information. This position information may be communicated to neighboring vehicles via vehicle to vehicle (V2V), enabling every AV to know the positions of the other AV vehicles around it. This information may augment and backup the auto bumper radars deployed for collision avoidance.

There is of course no end to the agent programming that may be done to minimize the probability of collision, mitigate traffic dynamics, and avoid dangerous road hazards. With V2V and V2I (vehicle to infrastructure) communication, the AV may be appropriately warned of such road hazards. Note that intelligent highways with these important features may only be implemented if there is a mechanism for each vehicle to 1) precisely locate itself within the absolute road reference coordinates; and 2) have a V2V and V2I system to share this information.

As the transition to fully AV traffic takes place, there will be many non-AV vehicles for the next decade or so. However, such non-AV vehicles may be fitted with a small self-contained system that tracks the RFLMs and communicates non-AVPI estimated positions via V2V and V2I channels. Surrounding AVs therefore will know precisely where the human driven vehicle is and may operate accordingly. There are endless innovations that will emerge along this theme that are beyond the current scope. However, the point to be stressed is that precise knowledge of vehicle position is essential.

A key feature of the disclosed RFLM is that it is autonomous and does not require complex networking with a highway infrastructure system to operate. The RFLM may of course be optionally augmented with a wireless connection to other highway infrastructure. However, the main objective remains that the RFLM is there primarily to assist the AV in accurately determining its position within the lane and within the roadway.

Of secondary priority is more sophisticated connectivity with the rest of the intelligent highway ITS network. However, it may readily be understood that a forward-up looking version of the RFLM could be easily deployed for connectivity with an ITS network.

The scope of this document is the innovation of how to implement a robust, very low power ATLF-based RF lane marker (RFLM) transponder that is ideally suited for the AV precision lane position application.

RFLM Signal Modulation Processing

In order to calculate the position of the AV, the signals from the RFLMs must be uniquely identifiable such that they may be registered with a location along the width of the road. Also, it is desirable to position the AV accurately along the length of the roadway lane. Also, there will be multiple AVs in a given segment of roadway. There are multiple methods of unique identification of the AV and RFLM combinations that may be achieved through modulation. Within this disclosure we will assume orthogonal coding as the preferred method. However, there are other methods possible.

In the orthogonal coding method, we start with the AV Positioning Interrogator (AVPI) that generates a carrier signal as $$Re(A_c \exp(j2\pi f_c t))$$

where AC is the complex amplitude of the carrier frequency $f_C$. The AVPI modulates this signal with a complex valued constant magnitude modulation of $m_1(t)$ such that the transmitted AVPI signal, denoted as $c_1(t)$ is $$c_1(t) = A_c m_1(t) \exp(j2\pi f_c t)$$

where it is understood that the actual signal is the real part of $c_1(t)$. The modulation of $m_1(t)$ is a unique coding for each AV. It is understood that each AVPI has a unique modulation waveform that is approximately orthogonal to the modulation waveforms used by other AVPIs. Hence if a single AV is fitted with a plurality of AVPIs, then each of the AVPIs will have a unique modulation.

This signal propagates to the RFLM where the input signal is $$c_2(t) = G_{LA} c_1\left(t - \frac{d_{LA}}{c}\right) \exp(-jk d_{LA}(t))$$

where $G_{LA}$ is the channel gain from the AVPI to the RFLM antenna output and $d_{LA}(t)$ is the physical distance between the car AVPI and the ATLF position within the RFLM which changes with time as a function of the radial velocity between the AV and the RFLM. Note that $d_{LA}/c$ is the delay from the AVPI to the ATLF position within the RFLM.

Next the signal is phase modulated by the ATLF that is accomplished by slight dithering of the phase shifter element in the ATLF feedback loop. This modulation is denoted by the complex function of $m_2(t)$. A gain is applied to the ATLF output such that we have the RFLM modulated antenna reflection signal as $$c_3(t) = G_{ATLF} c_2(t) m_2(t)$$
$$= G_{ATLF} G_{LA} c_1\left(t - \frac{d_{LA}}{c}\right) \exp(-jk d_{LA}(t)) m_2(t)$$

Finally, the modulated antenna reflection signal received at the AVPI is given as $$c_3(t) = G_{ATLF} c_2(t) m_2(t)$$
$$= G_{ATLF} G_{LA} c_1\left(t - \frac{d_{LA}}{c}\right) \exp(-jk d_{LA}(t)) m_2(t)$$

which is rewritten as $$c_4(t) = G_{ATLF} G_{LA}^2 A_c m_1\left(t - \frac{2 d_{LA}}{c}\right) \exp(j2\pi f_c t) \exp(-2jk d_{LA}(t)) m_2\left(t - \frac{d_{LA}}{c}\right)$$

The term $\exp(-2jk d_{LA}(t))$ contains the Doppler frequency shift which will be denoted ask $f_D$ which is $$f_D = f_c \frac{v_{rad}}{c}$$

where $v_{rad}$ is the radial velocity between the car AVPI and the RFLM. We can absorb the irrelevant offset phase of the Doppler term into the general gain and write the expression as $$c_4(t) = G_o(d_{LA}(t)) m_1\left(t - \frac{2 d_{LA}}{c}\right) \exp(j2\pi (f_c + f_d) t) m_2\left(t - \frac{d_{LA}}{c}\right)$$

The ultimate objective of the AVPI is to extract an estimate of $d_{LA}(t)$ from the modulated antenna reflection observation of $c_4(t)$. This is done by a likelihood search over the possible RFLM functions and the $d_{LA}(t)$. In FIG. 166 we show a set of 16 different RFLM objects. There could be more or less: this is an arbitrary configuration based on the roadway specification. It is assumed that there is a map available such that each RFLM has a unique location although the modulation functions of $m_2(t)$ repeat periodically along the roadway length as discussed above.

A complication is that we do not want to require that the RFLM have accurate time and therefore there will be an arbitrary offset such that we should write as $m_2(t-t_{LM})$. Hence the AVPI processing has to search over the RFLM type index and the offset as part of the demodulation process. Searching over the RFLM type is not complex as the cardinality of the RFLM types will be modest and the map is available such that the car AVPI may anticipate which RFLM type to expect. Hence once the RFLM tracking is established, processing for each new RFLM that shows up is straight forward and efficient.

The Doppler will actually vary with time as the RFLM will be offset from the trajectory of the car AVPI. It is also assumed that the AV has accurate knowledge of its velocity. From this the Doppler function of $f_D(t)$ may be mapped into an accurate estimate of the location of the RFLM relative to the car AVPI.

$G_0(d_{LA}(t))$ is also strongly dependent on $d_{LA}(t)$ and may be used. However it is not to be assumed that the RFLM operates entirely linearly as it is allowed to saturate to minimize the power consumption of the ATLF, as maintaining high linearity in the presence of a strong interrogator signal will require a higher power gain block in the ATLF. This obviously increases power consumption and is not necessary.

A key point is that the ATLF is extremely simple, consisting of a phase modulation impressing the function of $m_2(t)$ onto the antenna re-radiation signal from the ATLF antenna, regardless of the input signal. Hence multiple car AVPI signals are merely superimposed and treated to the same modulation. Also, the ATLF is allowed to saturate such that linearity requirements are modest. This is important as the signal levels will vary over a large range and that the power consumption of the ATLF-based RFLM must be minimized. Again, there is no sophisticated digital processing required in the ATLF-based RFLM and very low power analog processing is sufficient.

The complex processing of the AVPI is a maximum likelihood optimization that enables very precise estimation of $d_{LA}(t)$ as indicated. This is certainly possible with current processing technology and is no more complex than the processing found inside a standard GPS receiver ASIC. However, an alternate and simpler form of processing is now presented, based on tracking the envelope signal of the coherent demodulated output of the AVPI.

Adjusting the ATLF within the RF Lane Marker (RFLM)

As a short summary of this section, the steps involved in adjusting the ATLF are:
  Tuning to the carrier signal center frequency;
  Adjusting the phase of ATLF-antenna resonator;
  Adjusting the ATLF loop gain
  Tuning the RFLM Center Frequency In the RFLM application, the signals from the AVPI at the ATLF antenna will be much larger than thermal noise. Hence this is an interference-limited problem, as multiple AVPI signals will be entering the ATLF. If the ATLF is operated in the small signal linear region then the superposition of multiple input signals will not be an issue. However, if the signals become large, such as when the AV is next to the RFLM, then the ATLF will go into a soft saturation. This will cause some cross-coupling of signals which may become an issue if the in-band intermodulation is too large.

Thus, the ATLF loop gain should be reduced to avoid adverse nonlinear effects in the ATLF.

As it may be difficult to maximize the signal output of the ATLF, what is needed is to have the ATLF maximize the sensitivity to incoming AVPI signals without 1) excessive saturation and self-oscillation at one extreme; and 2) vulnerability to general background noise in the other extreme. A simple low power and low complexity solution is to put a simple envelope detector on the output of the ATLF within the RFLM and analyze the signal envelope. This may be accomplished with a passive diode detector and a simple envelope analysis processing as shown in the block diagram of FIG. 167, which shows antenna 16710, phase shifter 16712, negative impedance gain 16714, envelope detector 16716, envelope analysis filter 16718, control feedback 16720, and sum 16722. The three blocks in the upper left of the ATLF kernel itself are based on a negative impedance amplifier, antenna, and phase shifter. The envelope detector and analysis filter are shown, with feedback for the gain block and the phase shifter, said phase shifter being controlled by the phase modulation which is the higher speed modulation of $m_2(t)$.

The envelope analysis would adjust the gain upward such that the envelope level exceeds a lower threshold. Then it would look for slow variation, and perhaps features indicative of car traffic passing by the RFLM. These features could include, but are not limited to audio or detection of magnetic field variation. The car AVPIs have a specific envelope profile shape in time as the vehicle passes. Then the phase is adjusted for maximum variation. Note that some assumptions regarding short term stationary distribution of traffic around the RFLM is assumed. When the phase is optimized (maximum desired variation in the envelope signal for a given gain level) then the gain is increased by an increment and process repeated. Note this calibration process may be both intermittent and independent of the normal function of the RFLM: it is essentially a background task.

The tuning of the ATLF does not have to be done continuously, but just once every few minutes or so. Hence the tuning calibration processing may be optimized such that it only consumes a small portion of the average power consumption of the ATLF.

To demonstrate how such a control scheme may be implemented, a simplified simulation is considered of a 2D roadway surface as shown in FIG. 168. FIG. 168 shows multiple RF positioning lane markers 16810, roadway lanes 16812, and AV 16814. Start with the velocity vector being constant at $$v = \begin{bmatrix} v_x \\ v_y \end{bmatrix} = \begin{bmatrix} v_x \\ 0 \end{bmatrix}$$

such that there is no velocity in the transverse direction of the roadway. The RFLM locations are given as $$p_{LM}[p_x, p_y]$$

As we assume the state variable vector to be fairly accurate, we can generate hypotheses from this. We therefore have more of a tracking problem, where we can synthesize the expected signal from the RFLM, and then determine the noise and interference from the other RFLM antenna re-radiation signals.

FIG. 169 shows a plot of the location of the RFLMs 16910 and the trajectory of the car AVPI 16912. Trajectory starts on the left at t=0 and ends on the right at t=3 seconds. The assumed car velocity is 10 m/sec.

FIG. 170 is a plot of the signals at the RFLMs due to the signal from the passing AVPI. Clearly the fluctuation of the envelope of the signal in each RFLM will depend on $d_{LA}(t)$. Assuming random traffic, the fluctuation of the envelope in the ATLF will be a random process. If traffic is a reasonably stationary random process then we may tune the ATLF with the objective of observing maximum envelope fluctuation. Note that the relative fluctuation may be more than 35 dB for AVPIs travelling close to the RFLM. Hence it should be straightforward to tune the ATLF.

Adjusting the Phase and Gain of the ATLF

Consider one example of an ATLF that is just powered up and is starting to tune. In this example, the frequency bandwidth (Q) of the ATLF may be set to the lowest level, which is a broadband response that will result in a significant amount of broadband noise. This in turn will result in high frequency envelope fluctuations. These rapid fluctuations will essentially be filtered out with a low pass filter. The center of the ATLF is not referenced to any external device and may be several percent off. However, as the initial Q is low then the bandwidth is significantly larger than this center frequency error. Now traffic starts, and the fluctuations start. Note that we can add in such criteria as we expect the envelope of a passing AVR to generate a profile such as in FIG. 170. This specific feature is something the ATLF envelope processor may easily search for. Note from FIG. 170 that this signal envelope is slow and almost has a deterministic shape. The ATLF processing will then adjust the phase shifter of the ATLF as seen in FIG. 167. The drift of the ATLF filter characteristics for a constant control setting will be very slow, on the order of minutes or hours. Hence the tuning of the phase does not have to be fast. Once the phase setting has been completed based on achieving the maximum low frequency envelope fluctuation, commensurate with the antenna re-radiation profiles of FIG. 170, and now we can start increasing the gain of the ATLF negative feedback shown in FIG. 167. Again, after the gain is set a small adjustment is required for the phase. We incrementally increase the gain until the deviation of the low frequency envelope fluctuations start to decrease with further increases in gain. This could be due to the ATLF going into an unstable mode. Note that at this stage of adjusting, we will not have the problem of too narrow a bandwidth of the ATLF as the signal bandwidth will only be several MHz which corresponds to a very large Q enhancement and hence a large gain. As such the envelope will saturate and the deviation of the fluctuation will decrease. This will therefore limit Q.

For the RFLM to be robust, there should be a minimum amount of strongly interfering wireless emission generated by the AV in the immediate bandwidth of AVPI. This is a limitation as the ATLF may possibly converge to an incorrect passband and therefore not respond to the AVR signaling. For example, if the AV has wireless tire pressure sensors at a carrier frequency close to the AVPI carrier frequency, then there is a finite probability that the ATLF will converge to the tire sensor wireless channel instead. While a majority of automobile networking is done using Bluetooth frequencies at 2.4 GHz, some radio frequency planning may be required.

Once the ATLF is tuned to the AVR then maintaining it should be robust. There is the problem of the roadway that goes quiet at night with no traffic. Hence the ATLF will build into the processing some quality metric that is proportional to the time averaged deviation of the envelope fluctuations. Suppose, for example, that an otherwise busy roadway becomes progressively quieter throughout the nighttime. Then the quality metric that was initially large will start to decrease with time. A decrease in the quality metric starts to decrease the gain of the ATLF feedback, which increases the ATLF bandwidth. In the middle of the night when a single vehicle passes, the ATLF-based RFLM will still be active and respond to the vehicles AVPI but the response to the AVPI will be weaker. The AVPI can respond to this weaker signal by increasing its transmit power up to 100 mW instead of the nominal 10 mW. Also, during the periods of very low traffic, the level of interference will be less, and hence the RFLM system response should still be sufficient. In the morning when traffic builds once again, the ATLF starts from its broadest bandwidth and then slowly converges to a narrow bandwidth.

Envelope Processing of the RFLM Signal Response in the AVPI

Consider again the simulations of FIG. 168 and FIG. 169 for a single AV travelling down the road. Now consider that the AVPI coherently demodulates the return signal for each possible RFLM. This implies the processing of $$s = \{\text{input signal}\} \times \exp(-j2\pi f_c t) m_1(t)^*$$

where $m_1(t)$ is the data modulation signal applied by the AVPI, and $\exp(-j2\pi f_c t)$ is just the conjugate of the carrier signal created by the ATLF within the RFLM, and s is the coherently demodulated signal which contains the modulation of the individual and superimposed RFLMs and their respective Doppler frequency components. The individual envelope of a specific RFLM with modulation of $m_2(t)$ can be extracted as $$LPF\{|s \times m_2(t)^*|^2\}$$

and then further analyzed. FIG. 171 the coherent demodulation and envelope processing of the superimposed RFLMs A3, B3, and C3 of FIG. 170.

The envelope in FIG. 171 corresponds to the AVPI being on the side of the lane as shown in FIG. 169. If the AVPI is in the middle of the lane, then the envelope changes significantly in amplitude as shown in FIG. 172.

An implementation of the AVPI may consist of two units on either side of the AV at the front:
AVPI-A and AVPI-B. FIG. 173 shows the location of the RFLMs 17310 and two parallel trajectories 17312 corresponding to the right and left side AVPIs of a single AV along the road. If the AV is properly centered in the middle of the lane then the responses of the two AVRs to the closest RFLMs will be accurately the same, assuming that the RFLMs have been properly positioned and calibrated—assumptions that are readily met during RFLM deployment. Consider the change in the envelope signatures if the AV is shifted 10 centimeters to one side. As the AVPI response to a RFLM varies as the fourth power of the range, the signal difference is significant. FIG. 174 shows the two-position interrogation response signal envelopes from the AVPIs that are significantly different in amplitude. In other words, accurate positioning of the AV within the lane is possible even if the two AVPIs are not accurately calibrated. Also noted is that the AVPI processing may be very simple and efficient without having to implement more elaborate maximum likelihood processing of the complex signal.

RFLM Discrimination Filtering

It is important to note that because all of the RFLMs have a different modulation, which is much faster than any modulation caused by the AV motion, then the RFLM antenna re-radiation from an individual RFLM will appear orthogonal to the antenna re-radiation from any other RFLM. Hence there will not be any issue with slow beating effect due to any differences in carrier phase.

Note also that the ATLF in the RFLM, when the operation is linear, could have the same antenna re-radiation gain for all of the RFLMs. When one of the RFLM's is close to a car AVPI, that RFLM will of course generate a stronger antenna re-radiation just by proximity. Now suppose that the AVPI signal received by the nearby ATLF becomes sufficiently strong that the ATLF starts to soft saturate with subsequent gain reduction as described above. In this case, with the gain reduction of a specific RFLM, this naturally suppresses other AVPI signals from that specific RFLM. This further assists in filtering of the RFLM antenna re-radiation signals.

Another useful discrimination feature is that the RFLM modulation signal of $m_2(t)$ may have a moderately high chipping rate of say $10^7$ chips per second. In this case, the RFLM responses further than 15 meters will be fully de-correlated and hence will be filtered out. Thus, a variation of the ATLF chip rate may be used to control the response range of the network of RFLMs.

Further, the RFLM Doppler shift at 5.8 GHz with an AV velocity of 30 m/sec (about km/hr) is about 500 Hz. This is another possible filter such that the envelope responses is only maximum for RFLM signals close to the side of the AV where the radial velocity goes towards zero and then becomes negative. Hence responses of RFLM's ahead and behind the AV may be filtered out if desired.

RFLM Intermodulation Mitigation

As indicated above, if the AVPI signals become large at an RFLM, such as when the AV is next to the RFLM, then the ATLF will go into a soft saturation. This will cause some cross-coupling of signals which may become an issue if the in-band intermodulation is too large. Hence the ATLF loop gain is reduced to avoid self-oscillation of the ATLF.

Consider the case when two AVs are side by side as in FIG. 175, with AVPIs approximately equal distant from the RFLMs in row 2. FIG. 175 shows AV 17510, multiple RF positioning lane markers 1752, and roadway lanes 17514.

The combined modulation ignoring delays and gain factors is $$s = G_o \exp(j2\pi f_c t) m_2(t) (m_A(t) \exp(j2\pi (f_{dA})t) + m_B(t) \exp(j2\pi (f_{dB})t))$$

where $m_A(t)$ and $m_B(t)$ are the modulating signals of the AVPIs of car A and car B respectively. Again, we may provide some soft gain control such that the ATLF operates fairly linearly as described above. Assuming that such gain control is provided, then we avoid distortion that would result in the intermodulation of the two antenna re-radiation signals. Such intermodulation terms may result in inaccuracies of positioning the AVs relative to the LMs.

Positioning Module Processing and Vehicle Position Determination

We have presented a system and method for maintaining lane centering of an AV. For the purpose of estimating the actual vehicle position, the positioning module in the vehicle, as it interrogates the LM array, may determine an estimate of the radial distance to the LM at a specific time using various signal processing means. This range estimate is used in the vehicle navigation system as but one of several inputs used to estimate the absolute location of the vehicle, whether a driven vehicle or an AV.

When the LM contains its position and transfers the same to the vehicle interrogation system, the accurate time available from GPS may be used to create the distance to the responding RFLMs. If three or more RFLMs respond to the vehicle positioning interrogator, the resulting distances may be used to triangulate the position of the vehicle in GPS coordinates.

For reasonable flat driving environments, the flatness of the terrain may be used to increase the accuracy of the vehicle position determined by the triangulation. In mountainous terrain and winding roads, the triangulation is more constrained. In these driving environments, RFLM range calculations may augment positioning calculations for vehicles equipped with a navigation system.

A block diagram of the overall vehicle navigation system is shown in FIG. 176. FIG. shows GPS 17610, clock frequency 17612, vehicle positioning module 17614, LM's 17616, IMU 17618, wireless roadside infrastructure 17620, cellular signals 17622, camera, LIDAR sensors 17624, vehicle location 17626, vehicle orientation 17628, vehicle navigation processor 17630, and electronic map 17632. Starting with the GPS (or GNSS) signal sources, the AV has a GPS receiver that tracks the available GPS signals and determines from this 1) a frequency reference; and b) a precise time signal. The frequency reference is passed to the vehicle positioning module that generates the interrogation signals to which a plurality of LMs respond. Based on various processing means, including, but not limited to, the maximum likelihood method and RFLM envelope processing described above, the vehicle determines the radial distance to the LMs as a function of time. Multiple range measurements are taken to a plurality of LMs at a plurality of sample time instances using the clock frequency to determine distance based on the round-trip signal time to the various LMs. These range measurements are associated with the unique identity of the LM. The range measurements are passed to the vehicle navigational processor. From the navigational processor come the estimates of the absolute position of the vehicle (x,y,z referenced to the coordinates of the electronic map) and the orientation of the vehicle (yaw, pitch and roll angles) from the Inertial Measurement Unit (IMU). To do this computation the navigational processor (NP) uses whatever information is available, including GPS information;
Available cellular signals;
Information from available wireless roadside infrastructure; and
Inertial information from the vehicle IMU.

Additionally, the NP will likely have cameras and perhaps a LIDAR system to provide sensor input for the navigation system: there are many forms of correlative processing algorithms that compare features as extracted from the camera and LIDAR with the electronic map. The point is that there are a number of inputs that may go into the NP, of which the vehicle positioning information from the RFLM measurements are one type.

The IMU contains three axis accelerometers and three axis rate gyros. The IMU together with the LM responses provide the NP with sufficient information to accurately navigate when there is insufficient visibility for computer vision algorithms to operate on both the camera and LIDAR signals, extracting useful features.

Typically the NP algorithms would be based on some form of Bayesian filter that would treat the 6 degree of freedom (DOF) of the vehicle motion (x, y, z, roll, pitch, yaw) as a state vector that is a multivariable random process. This Bayesian processor would contain a dynamic model of the vehicle as it would behave mechanically in normal traffic situations. That is, a vehicle at highway speeds would have significant forward momentum and limited agility, providing a smoothness mechanism for combining multiple disparate input sensor measurements sampled at different time instances.

As a result, the combination of the RFLMs and vehicle positioning module operates as part of a complex navigation system that provides a continuous estimate of the vehicle motion and position. Hence, while we can describe the errors of the range estimate between the LM and vehicle, it may be difficult to describe the overall accuracy of the Navigation Processor output.

However, the RFLM system may be able to provide accurate lane positioning information to the vehicle. If this vehicle is an AV, then automatic lane positioning control results.

RFLM Power Considerations

We now consider the energy requirements of the RFLM. Suppose that the AVPI generates a low power between 10 mW to 100 mW of carrier power. The car's forward looking AVPI may have an antenna gain of about 10 dBi which is easily achievable in a small conformal package at microwave frequencies in general, and 5.8 GHz specifically.

Now suppose it is desired to interact with the RFLM that is maximum about 50 meters in front of the car to the point where it is beside the car. The ATLF will utilize an ESA with a gain of about 5 dBi. The ideal RFLM antenna re-radiation radiation pattern is sketched in FIG. 165. Such a pattern would correspond to about 10 dBi generated by a small microstrip antenna array that is conformal with the RFLM surface. Vertical polarization would likely be easier to implement but is not necessarily a constraint.

We note that the RFLM antenna reflection radiation may only need to be in one direction. There are tracking advantages in the AV trajectory estimation for looking both forward and backward. This is due to the valid assumption that may be made that the AV moves quite smoothly along the road. Hence adding backward looking information may help. We may have an AV with four AVPIs, one in each corner, and the RFLM having to support both a forward and a backward looking AVPI. This is an overall AV system deployment issue to be addressed by implementers.

We can briefly put a link budget together based on this. Start with the car AVPI which radiates at 10 dBm into a 10 dBi antenna resulting in 20 dBm EIRP. Now this propagates for the range r=50 meters and is partially intercepted by the ATLF antenna. Assume that the ATLF antenna has a gain G of about 5 dBi. Therefore, the effective area of the RFLM antenna is $$A_{RFLM} = \frac{G\lambda^2}{4\pi} \approx 0.001 \ sq.m$$

where λ=0.052 meters at 5.8 GHz. Then we have the propagation loss from the AV to the RFLM at 50 meters of $$Loss_{AV \to RFLM} = -10\log\frac{4\pi r^2}{A_{RFLM}} = -10\log\frac{4\pi(50)^2}{.001} = 75 \ dB$$

Hence the received signal into the RFLM is about 20 dBm−75 dB=−55 dBm.

We boost the RFLM antenna re-radiation with a gain G of 30 dB in the ATLF within the RFLM, providing an RFLM radiated antenna re-radiation from the RFLM antenna which can have an antenna gain 5 dBi. The final radiated antenna re-radiation signal from the RFLM is now about −20 dBm.

At the AV, the effective area of the AVPI antenna, for a 10 dBi antenna gain, is $$A_{AVPI} = \frac{G_{AVPI}\lambda^2}{4\pi} \approx 0.0021 \ sq. \ meters$$

The RFLM re-transmitted signal at −20 dBm propagates back to the car AVPI antenna at range r of 50 meters with a loss of $$Loss_{RFLM \to AVPI} = -10\log\frac{4\pi r^2}{A_{AV}} = -10\log\frac{4\pi(50)^2}{.0029} = -72 \ dB$$

We thus have −91 dBm back at the AVPI, which is easily detectable. If the range between the AVPI and the RFLM is increased to 100 meters, the received power to the AVPI processing decreases to −103 dBm, which is still readily detectable.

If we increase the radiated power from the AV from 10 dBm up to 100 dBm, we have the received power from the RFLM at the AVPI processing unit of −8 dBm, at an RFLM range of 100 meters. If the RFLM scavenges 90% of the energy from the net AVPI transmit power of 110 dBm EIRP, we still have a received RFLM antenna re-radiation power at the AVPI processing unit of −70.8 dBm with the 100 meter range from the AVPI to the RFLM. There is clearly plenty of margin in this link budget for significant local transmission loss at the RFLM due to road dirt and sludge plus weather conditions.

As the AV approaches the RFLM, the signal will grow quickly, approximately as $R^{-4}$ where R is the range between the RFLM and the AV. As discussed above, we can let the ATLF output saturate at some power level or actively control the transponder gain of the RFLM by reducing the Q. This can be tied to a form of AGC (automatic gain control) circuit that reduces the gain of the ATLF feedback once the signal amplitude within the ATLF loop increases beyond a given level.

Powering the RFLM

The RFLM must be configured with some sort of rechargeable battery and/or super-capacitor to enable continuous operation. It should be noted that there are several forms of energy available for harvesting such as mechanical motion of the cars moving next to the RFLM. This section, however, will discuss more common sources of power for maintaining RFLM charge.

Solar Cell as Power Source for RFLM

The efficiency of solar cells varies widely depending on technology used. A reasonable design might be a cell size of 5 cm by 20 cm so that we have 100 sq. cm or 0.01 square meters. The solar radiation at the equator is about 1600 W/m², so potentially we have 16 W available. However, this diminishes for latitudes away from the equator, also the road tilt will be in the unfavorable direction in a fraction of the road segments. Conversion efficiencies of solar cells are improving such that assuming 20% is reasonable. Hence, consider that an additional 10 dB loss due to solar efficiency and orientation mismatch (deviation from orthogonal) seems reasonable, bringing us to 1.6 W. Then we have another 16 dB of loss budget due to penetration loss through the solar cell cover which accounts for the transparency loss of the ruggedized cell cover, dirt, water layer and a modest amount of snow and cloud cover. Note that the cell cover has to be sufficiently rugged that it may withstand vehicle and snowplow traffic. Now we are down to 40 mW. Then we have the issue of the daily sun cycle such that 10 mW average power over a 24 hour cycle is reasonable. As stated, the energy from the solar cell would be stored in a super-capacitor and/or used to replenish a rechargeable battery.

This brings us to the conclusion that the RFLM power consumption has to be limited to about 10 mW. Fortunately, this is more than sufficient output power for the RFLM, based on the link budget calculations above.

RFLM Deployment Options

FIG. 177 shows a possible implementation of a ruggedized RFLM. FIG. 177 shows RF positioning lane markers 17710, solar cells 17712, and reflector 17714. Rectangle 17716 outlines the RFLM system at about 3-4 inches wide by 3 or 4 feet long. Of course, this may vary depending on local roadway standards followed. The top view shows small solar cells 17712 that collect just enough energy to power the RFLM 17710. It is recognized that this solar source is ruggedized and may be compromised with dirt, gravel, snow layer, water from rain and some runoff and therefore has a low efficiency. However, the RFLM will only consume power in the range of 1 mW. Hence large collection surfaces are not required. The solar cell will charge a super-capacitor or other short-term battery device that will power the RFLM. The energy storage should be long enough that the RFLM may operate for a 24-hour period without light. Hence it may be used to cover the nighttime period, as well as times where the RFLM could be covered with a shallow snow layer pending road clearance. The lower image in FIG. 177 shows a cross-section of the RFLM that is slightly recessed into the asphalt layer.

Limited Application Examples for Sensor Data Transfer Using Modulated Antenna Reflection Railroads The train sensor network application is illustrated in FIG. 178, which shows sensors 17810 (S) along the track, track 17812, train 17814, reader 17816 along the track, and stationary reader 17818 offset from the track. This specifically addresses a railroad issue where the range from the reader (R) on the rolling stock to the trackside sensor (S) is up to 100 meters. The link budget above shows that this is a readily possible architecture. The sensor itself has to have more power output and hence will require more instantaneous power. However, the trains will typically be infrequent (relative to roadway traffic considered before). The problem is shown in FIG. 178 where the sensors on the train cars may be read from either an R on the train engine, or a stationary R on the side of the track. Another implementation might be where the S sensors are along the track and the R reader on the engine may read them. A third possibility is that the reader on the train engine reads sensors (TS) placed on the train cars, or the cargo of the train.

As with the RFLM application, the ATLF in the sensor (S) modulates the data on top of the received signal from the reader (R) mounted on the train engine, for example. Denote this as the train reader (TR). Stepping through the signal modulation we start with the carrier signal of the TR of the form $$Re(A_c \exp(j2\pi f_c t))$$

where $A_c$ is the complex amplitude of the carrier and $f_c$ is the carrier frequency. The radar modulates this signal with a complex valued constant magnitude modulation of $m_1(t)$ such that the transmitted signal, denoted as $c_1(t)$ is $$c_1(t) = A_c m_1(t) \exp(j2\pi f_c t)$$

where it is understood that the actual observable signal is the real part of $c_1(t)$. The modulation of $m_1(t)$ is a unique coding for each TR. Hence two trains may simultaneously interrogate a given sensor without an issue of data packet collision failure.

This modulated carrier signal propagates from the TR to the ATLF of the sensor where the input signal into the ATLF is $$c_2(t) = G_{TS} c_1 \left( t - \frac{d_{ts}}{c} \right) \exp(-jkd_{TS}(t))$$

where $G_{TS}$ is the channel gain from the TR to the TS sensor antenna and $d_{ts}$ is the physical distance between the TR and TS sensor which changes with time as a function of the radial velocity. Note that $d_{ts}/c$ is the time delay from the TR to the TS sensor.

The rest of the calculations follow the form of those presented above for the RFLM.

Smart Bandages

Smart Bandages (SB) are seeing widespread deployment, but remain, for the large part, bulky. Much of this bulk is due to the battery that powers the SB module. These modules typically use a Bluetooth networking concept for sending patient information to independent monitoring stations.

In a hospital setting, due to limited indoor range of Bluetooth, getting the patient information to the appropriate level requires the use of either repeaters or links for monitors to an infrastructure network. The cost of this information system may be significantly reduced, we feel, by use of the ATLF modulating the SB antenna reflection with patient information. In so doing, the battery power dedicated for Bluetooth operation is eliminated, as the low power ATLF may scavenge energy for operation from the powered monitoring system transmission.

In a home setting, the same SB would be used as in the hospital. The mobile home patient would be linked to a home monitoring station, and the strength of the antenna re-radiation signal from the ATLF modulated SB antenna reflection would allow free motion throughout the house without repeaters.

As discussed in the referenced ATLF patent filing, the ATLF will automatically adjust the matching of the SB antenna to the ATLF in any setting. For a patient, changes to the local impedance of the antenna, due to, for example, patient positioning or changes in the patient's skin condition, are automatically accounted for.

Distributed Sensors for Infrastructure Monitoring

For applications where sensors are distributed over large structures (such as buildings and bridges) or widely spaced over a long distance (such as pipelines), the ATLF antenna re-radiation enhanced approach may be used to respond to an inquiry from an overhead drone fly-by or a vehicle passing the sensor node.

In this manner, a small part of energy, from either a wired or solar cell powered remote sensor, is minimized by use of the low power ATLF antenna re-radiation enhanced data signal that is modulated onto the antenna reflection.

Incorporating Moving Sensors into AV Location Module Processing

It is possible to incorporate moving sensors analogously to the method described above for fixed sensors. In this case, the moving sensor would contain information about its position, as well as specific sensor data. The network module of this filing would respond to AV interrogators providing the unique sensor identifier that would include a special marker as a moving sensor, along with sensor position data and relevant sensor data.

In the special case of a moving sensor, attached to a pedestrian or other moving vehicle, the AV processing would maintain a separate database for such moving sensors. By updates of the moving sensor data, the AV could project potential collisions at a large distance from the moving sensor and operate to mitigate said collision, and optionally notify AV occupants.

This application might be particularly useful for robotic vehicles in, for example, warehousing operations, where robotic vehicles are programmed to avoid such collisions.

ATLXR Coupled with Multi-Pole, High-Q Devices as External Resonators

External BAW/SAW Resonator Example

An example of an inter-digit SAW device, based on surface wave excitation on the acoustic crystal, is shown in FIG. 196. FIG. 196 shows metal lines 19610, electrical port 19612, interdigital transducer 19614, surface acoustic wave 19616, and piezoelectric substrate 19618. The coupling through the electrical ports has a sharp high Q resonance in the frequency response. The acoustic wave traverses back and forth as shown which efficiently couples the two electrodes at a specific frequency.

An example of a BAW resonator is shown in FIG. 197. FIG. 197 shows electrical port 19710, metal electrode 19712, and quartz substrate 19714. The BAW requires electrodes on top and bottom of the acoustic crystal wafer. Illustrated is a wafer 170 um thick for a 10 MHz resonator. Microwave BAWs are much thinner as the frequency is so much higher. As a result, there is a large capacitance which shunts the signal through the crystal electromagnetically. Consequently, there is a limit to how high in frequency the BAW may operate. It is necessary to use material with the highest acoustic velocity possible such that the electrodes may be further separated.

Mitigating Temperature Change Effects of the SAW/BAW

It is generally understood that SAWs and BAWs have some sensitivity to temperature, generally due to the stiffness of the substrate material, which tends to decrease at higher temperatures, causing the acoustic velocity to diminish. This may cause frequency shifts of the resonant poles of several MHz as the temperature changes. The ATLXR may compensate for this shift by a compensating shift in the resonance frequency of the coupled ATLn resonators (R) in the ATLXR feedback.

Reducing the Q of SAW/BAW Devices During Fabrication

Notably, the Q of the SAW may be readily be decreased by placing some acoustic absorbing medium on top of the electrodes during fabrication. Hence SAWs may be designed to have specified Q values.

It is likewise possible to decrease the Q of the BAW by adding an external electrical resistance to the electrodes during fabrication. Reducing the Q of the BAW makes it easier to tune in frequency with the ATLXR. Note that BAWs are generally single resonator devices but several may be mounted on the same acoustic substrate and connected to form a higher order filter. The flexibility of the SAW in terms of designing the electrode to get multiple poles for a higher order filter is not possible with the BAW.

Enhancing the Q of Primary Resonator Having Low to Moderate Q

Implementation of the ATLXR is not limited to situations where the primary resonator, such as an external resonator XR, is high Q. To provide an example of the Q enhancement of the primary resonator 18420, consider the Category 1 implementation of the ATLXR as shown in FIG. where three variable secondary resonators 18410 are used in the ATLXR feedback loop 18412. Between the three R variable resonators is a gain block of G 18414 used to isolate the R resonators 18410. P is the phase shifter 18416 and DC is the directional coupler 18418 of coupling ratio "c" to provide the feedback signal.

The Q enhancement of the primary resonator XR poles for the example where the initial open loop Q of the primary resonator is 50 and the Q of R is 5 is shown FIG. 185. The dominant poles of the primary resonator XR are closest to the jω axis on the right, starting with the pole location corresponding to Q of 50. As the ATLXR loop gain G is increased, the dominant pole of the primary resonator XR moves toward the jω axis providing a potentially substantial increase in the Q of the external resonator F.

By detuning the frequency of variable resonator R slightly, we can Q enhance the primary resonator XR as shown in FIG. 186, with the root locus point moving toward the jω axis. At the same time, one can see that the root locus is also moving higher in the s plane, indicating that the resonant frequency of the circuit has increased slightly (less than 0.5% in this specific example). As discussed later, this frequency shift may be controlled to place the closed loop resonant pole precisely in the s-plane.

Tuning of the ATLXR variable resonator R also allows for the compensation of the arbitrary phase shift that exists in the ATLXR signal loop.

FIG. 187 shows the response for a 90-degree phase shift induced by parasitic delay. Note the shift in frequency of the enhanced pole of the primary resonator F. This may be compensated for by controlling f of the variable resonators R. Note that the more the primary resonator XR is moved in the s-plane, the movement of the secondary R poles will become larger. Hence the limit of movement of the primary resonator XR pole is the point where the variable resonator R poles start interfering with the passband response, thereby generating spurious bands.

Tunable SAW/BAW Resulting from an ATLXR Implementation

An ATLXR low-Q resonator may facilitate changes to both tuning range and Q value when coupled with a high Q characteristic component such as a SAW or BAW. As an example, consider the triple high-Q resonators shown in FIG. 198. Each of the three resonators f1, f2, f3 has a Q well over 100 and are staggered in frequency such that there is little interaction between the resonators. Resonance frequencies for this example are selected to be $\omega_1=0.99$, $\omega_2=1$ and $\omega_3=1.01$.

These fixed frequency, high-Q resonators are coupled with an ATLXR signal loop as shown in FIG. 199, where F1, F2 and F3 are the resonators, R is a resonator block, such as an ATL-base resonator, G is a gain block, P is a phase shifter, and DC is a directional coupler. This ATLXR implementation with the external resonator XR consists of:

Three external high Q resonators of Q≈100 in parallel and

A signal loop with three variable secondary resonators R with low Q≈5, separated by Gain buffer blocks of G, a phase shifter P, and directional coupler DC The variable secondary ATL resonators (R) of the coupled ATLXR signal loop are frequency swept over the normalized frequency range of ω=0.96 to 1.03. As observed in the root locus plots of FIG. 200 for various samples in this tuning range, the following features may be observed:

Tunable in the Frequency Response of the Coupled Resonators:

That a tunable high-Q filter may result over a relatively broad tuning range by incorporating these parallel high-performance, high-Q resonators into an ATLXR configuration using ATL resonators of low Q. In FIG. 200 the poles of the external high-Q resonators XR are given by the 'x' symbols, and the zeros by the 'o' symbols: the zeros arise due to the parallel resonator connection structure of the BAWs. The change in operating frequency of the coupled ATLXR and high-Q BAW resonators is seen as a change in slope of the primary root locus as it moves horizontally in the s-plane in response to sweeping the coupled ATLXR resonators over frequency. Hence a high Q, dominant closed loop pole gives this filter a very narrow band response that is tunable over a relatively broad frequency range—broad relative to the narrow bandwidth of the ATLXR bandpass response.

Providing a Q Increase of the Coupled Resonators:

Another key point of the chart sequences of FIG. 200 is that the relatively broad range in frequency tuning is accompanied by controllable changes in the Q of the coupled resonators, made possible by the multiple SAW/BAW resonators that are sequentially Q-enhanced as the coupled tunable secondary ATL resonance (R) is changed. The change in Q of the coupled ATLXR and high-Q BAW resonators is seen as the primary root locus moves horizontally in the s-plane in response to sweeping the ATLXR resonators over frequency.

Providing a Q Decrease of the Coupled Resonators Post Fabrication:

While not shown in this example, closed loop Q-spoiling of the ATLXR is similarly achieved by making the gain of the ATLXR gain block a negative value. This results in the dominant ATLXR pole moving away from the jω axis in the charts of FIG. 200, corresponding to Q reduction. For the ATLXR, it may be advantageous to have the Q a little lower so that it is easier to tune.

Implementation of a Coupled Line Bandpass Filter in an ATLXR

Another possible implementation is to use a coupled line bandpass filter as illustrated in FIG. 201 that has the equivalent of several higher Q poles in parallel and ATLXR feedback circuit 20110. Combining this within an ATLXR signal loop, we can achieve a large tuning range that runs the extent of the bandwidth of the coupled line filter without incurring the difficulties of high Q-enhancement as emphasized in the previous example. Here is an example of a coupled microstrip line filter with multiple poles that can be Q enhanced in sequence resulting in a broad tuning range with modest Q enhancement required As one example of the Q enhancement with such a multiple external resonator F, consider a 3rd order Butterworth filter as an external resonator example, with a frequency response as shown at the top of FIG. 202. This filter may be partitioned into three cascaded SOS sections. Therefore, it represents three poles in series but without the zeros between the poles as in the parallel structure of the prior example. When this filter response is placed into the ATLXR signal loop, the root locus response of FIG. 203 follows, seen on the right side, indicating that the center pole of the external resonator XR is Q enhanced and the two flanking poles are moved further into the left hand plane. Referring to FIG. 210, an ATLXR configuration with a high Q external resonator 21002 provided in series with a phase shifter 21004 and gain block 21006 is shown.

As before, if the R resonators are tuned higher in resonance frequency, then the upper pole of the external filter resonator is Q enhanced as it moves toward the jω axis. Likewise, if the R resonators are tuned lower in resonance frequency, then the lower pole of the external filter resonator is Q spoiled as it moves away from the jω axis.

Finally, it is stated that as an alternate to the planar printed circuit filters as in FIG. 201, a waveguide filter 20410 may be used as shown in FIG. 204

What is claimed is:

1. A resonant circuit, comprising:
    a signal loop having an input, an output, and a closed loop frequency response, the signal loop comprising:
    a primary resonator having a primary frequency response, and a primary Q-factor;
    at least one adjustable resonator having an adjustable frequency and a secondary Q-factor, the primary Q-factor being greater than the secondary Q-factor by a factor of about 10 or more; and
    an adjustable scaling block that applies a gain factor; and
    a controller connected to the at least one adjustable resonator and the adjustable scaling block, the controller comprising instructions to adjust the closed loop frequency response toward a desired closed loop frequency response by controlling the adjustable frequency of the at least one adjustable resonator and the gain factor of the adjustable scaling block.

2. The resonant circuit of claim 1, wherein the primary Q-factor is greater than the secondary Q-factor by a factor of about 100 or more.

3. The resonant circuit of claim 1, wherein the primary frequency response of the primary resonator is within a predetermined error factor of the desired frequency response, and the controller controls the closed loop frequency response within the predetermined error factor of the primary resonator.

4. The resonant circuit of claim 1, wherein the primary resonator is a fixed resonator or a resonator that is tunable in frequency.

5. The resonant circuit of claim 1, wherein the primary resonator is an antenna, and the antenna comprises the input of the signal loop.

6. The resonant circuit of claim 1, wherein the signal loop further comprises a phase shifter that applies an adjustable delay factor, the controller being connected to control the phase shifter.

7. The resonant circuit of claim 1, further comprising a plurality of adjustable resonators connected in series or in parallel.

8. The resonant circuit of claim 1, wherein the primary resonator is an electrical resonator, an electromagnetic resonator, a mechanical resonator, or a resonator based on material properties.

9. The resonant circuit of claim 1, further comprising a plurality of primary resonators connected in parallel or in series within the signal loop.

10. The resonant circuit of claim 1, wherein the signal loop comprises:
    a first component comprising the primary resonator; and
    a second component comprising the at least one adjustable resonator;
    wherein the first component is fabricated from a first material, and the second component is fabricated from a second material that is different than the first material.

11. The resonant circuit of claim 10, wherein the first component and the second component are fabricated as separate and distinct components.

12. A method of modifying a closed loop frequency response of a resonant circuit, the resonant circuit comprising a signal loop having an input, an output, a primary resonator that has a primary frequency response, at least one adjustable resonator having an adjustable frequency, and an adjustable scaling block having a gain factor, the method comprising the steps of:

controlling the frequency of the at least one adjustable resonator and the gain factor of the adjustable scaling block to adjust the closed loop frequency response of the resonant circuit toward a desired closed loop frequency response, wherein a Q-factor of the primary resonator is greater than a Q-factor of the at least one adjustable resonator by a factor of about 10 or more.

13. The method of claim 12, wherein the Q-factor of the primary resonator is greater than the Q-factor of the at least one adjustable resonator by a factor of about 100 or more.

14. The method of claim 12, further comprising the step of adjusting the primary frequency response of the primary resonator.

15. The method of claim 12, wherein the primary resonator is an antenna, and the antenna comprises the input of the signal loop.

16. The method of claim 12, wherein the signal loop further comprises a phase shifter, and wherein adjusting the closed loop frequency response further comprises adjusting the phase of the phase shifter.

17. The method of claim 12, further comprising a plurality of adjustable resonators connected in series or in parallel.

18. The method of claim 12, wherein the primary resonator is an electrical resonator, an electromagnetic resonator, a mechanical resonator, or a resonator based on material properties.

19. The method of claim 12, further comprising a plurality of primary resonators connected in parallel or in series within the signal loop.

20. The method of claim 12, wherein the signal loop comprises:
a first component comprising the primary resonator; and
a second component comprising the at least one adjustable resonator;
wherein the first component is fabricated from a first material, and the second component is fabricated from a second material that is different than the first material.

21. The method of claim 20, wherein the first component and the second component are fabricated as separate and distinct components.

* * * * *